(12) United States Patent
Watanabe

(10) Patent No.: US 12,123,974 B2
(45) Date of Patent: Oct. 22, 2024

(54) LIGHT-RECEIVING ELEMENT AND DISTANCE-MEASURING MODULE

(71) Applicant: SONY SEMICONDUCTOR SOLUTIONS CORPORATION, Kanagawa (JP)

(72) Inventor: Ryota Watanabe, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 768 days.

(21) Appl. No.: 17/250,340

(22) PCT Filed: Jul. 4, 2019

(86) PCT No.: PCT/JP2019/026590
§ 371 (c)(1),
(2) Date: Jan. 7, 2021

(87) PCT Pub. No.: WO2020/017342
PCT Pub. Date: Jan. 23, 2020

(65) Prior Publication Data
US 2021/0270940 A1    Sep. 2, 2021

(30) Foreign Application Priority Data
Jul. 18, 2018   (JP) ................... 2018-135396

(51) Int. Cl.
*G01S 7/481*    (2006.01)
*H01L 31/02*    (2006.01)
(Continued)

(52) U.S. Cl.
CPC ...... *G01S 7/4811* (2013.01); *H01L 31/02005* (2013.01); *H01L 31/02164* (2013.01); *H01L 31/02327* (2013.01)

(58) Field of Classification Search
CPC .... G01S 7/4811; G01S 7/4816; G01S 7/4914; G01S 17/36; G01S 17/931;
(Continued)

(56) References Cited

U.S. PATENT DOCUMENTS 9,117,712 B1 * 8/2015 Oggier .............. H01L 27/14609
2006/0284275 A1 * 12/2006 Deimel .............. G01D 5/34715
257/432
(Continued)

FOREIGN PATENT DOCUMENTS

BE    1023562 B1    5/2017
CN    101800231 A    8/2010
(Continued)

OTHER PUBLICATIONS

Yuichi, et al., "320×240 Back-illuminated 10[mu]m CAPO pixels for high speed modulation Time-of-Flight CMOS Image sensor", 2017 Symposium on VLSI Circuits, JSAP, XP033141468, Jun. 5, 2017, 2 Pages.
(Continued)

*Primary Examiner* — Thanh Luu
*Assistant Examiner* — Monica T Taba
(74) *Attorney, Agent, or Firm* — CHIP LAW GROUP

(57) ABSTRACT

The present technology relates to a light-receiving element and a distance-measuring module for enabling improvement of characteristics. A light-receiving element includes an on-chip lens, a wiring layer, and a semiconductor layer arranged between the on-chip lens and the wiring layer, the semiconductor layer includes a first voltage application portion to which a first voltage is applied, a second voltage application portion to which a second voltage different from the first voltage is applied, a first charge detection portion arranged near the first voltage application portion, and a second charge detection portion arranged near the second
(Continued)

voltage application portion, and each of the first voltage application portion and the second voltage application portion is covered with an insulating film in the semiconductor layer. The present technology can be applied to, for example, a light-receiving element that generates distance information by a ToF method.

18 Claims, 94 Drawing Sheets

(51) Int. Cl.
*H01L 31/0216* (2014.01)
*H01L 31/0232* (2014.01)

(58) Field of Classification Search
CPC ......... H01L 31/02005; H01L 31/02164; H01L 31/02327; H01L 27/14609; H01L 27/14627; H01L 27/14636; H01L 27/14603; H01L 27/14623; H01L 27/1464; H01L 27/144; H01L 27/14629; H01L 27/1463; H01L 27/14643; H01L 27/14685; H01L 31/103; G01C 3/06; G01J 1/02; G01J 1/04; H04N 5/33
See application file for complete search history.

(56) References Cited

U.S. PATENT DOCUMENTS

| | | | |
|---|---|---|---|
| 2014/0312206 A1* | 10/2014 | Okhonin | G01S 17/10 250/206.1 |
| 2016/0073093 A1 | 3/2016 | Kautzsch | |
| 2016/0119562 A1 | 4/2016 | Takase et al. | |
| 2017/0171485 A1* | 6/2017 | Kawahito | H01L 27/1461 |
| 2017/0194367 A1* | 7/2017 | Fotopoulou | H01L 27/14609 |
| 2017/0301708 A1 | 10/2017 | Fotopoulou et al. | |
| 2018/0054581 A1 | 2/2018 | Sano et al. | |
| 2018/0115767 A1 | 4/2018 | Kautzsch | |
| 2018/0182806 A1* | 6/2018 | Jin | H01L 27/14627 |
| 2018/0372846 A1* | 12/2018 | Izuhara | H01L 27/14605 |
| 2019/0252442 A1 | 8/2019 | Tanaka | |

FOREIGN PATENT DOCUMENTS

| | | |
|---|---|---|
| CN | 105405855 A | 3/2016 |
| CN | 106575658 A | 4/2017 |
| CN | 109643722 A | 4/2019 |
| DE | 102014113037 A1 | 3/2016 |
| EP | 2960952 A1 | 12/2015 |
| JP | 2011-086904 A | 4/2011 |
| JP | 2017-522727 A | 8/2017 |
| JP | 2018-088488 A | 6/2018 |
| JP | 6485880 B2 | 3/2019 |
| JP | 2019-134167 A | 8/2019 |
| JP | 6930805 B2 | 9/2021 |
| KR | 101436504 B1 * | 9/2014 |
| KR | 10-2016-0030459 A | 3/2016 |
| KR | 10-2017-0017984 A | 2/2017 |
| KR | 10-2017-0040124 A | 4/2017 |
| TW | 201633524 A | 9/2016 |
| WO | 2004/109235 A2 | 12/2004 |
| WO | 2015/197685 A1 | 12/2015 |
| WO | 2016/167044 A1 | 10/2016 |
| WO | WO-2017121820 A1 | 7/2017 |
| WO | WO-2017150391 A1 | 9/2017 |
| WO | 2018/101033 A1 | 6/2018 |

OTHER PUBLICATIONS

Partial Supplementary European Search Report of EP Application No. 19837182.5, issued on Dec. 2, 2021, 13 pages.
International Search Report and Written Opinion of PCT Application No. PCT/JP2019/026590, issued on Sep. 17, 2019, 11 pages of ISRWO.
Office Action for CN Patent Application No. 201980045810.X issued on Jun. 28, 2024, 03 pages of English Translation and 04 pages of Office Action.

* cited by examiner

FIG. 5
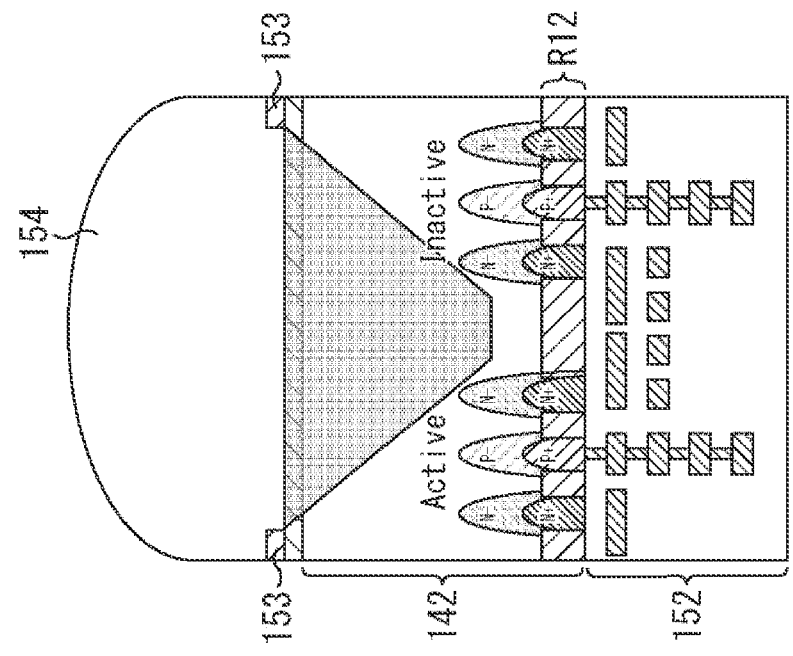
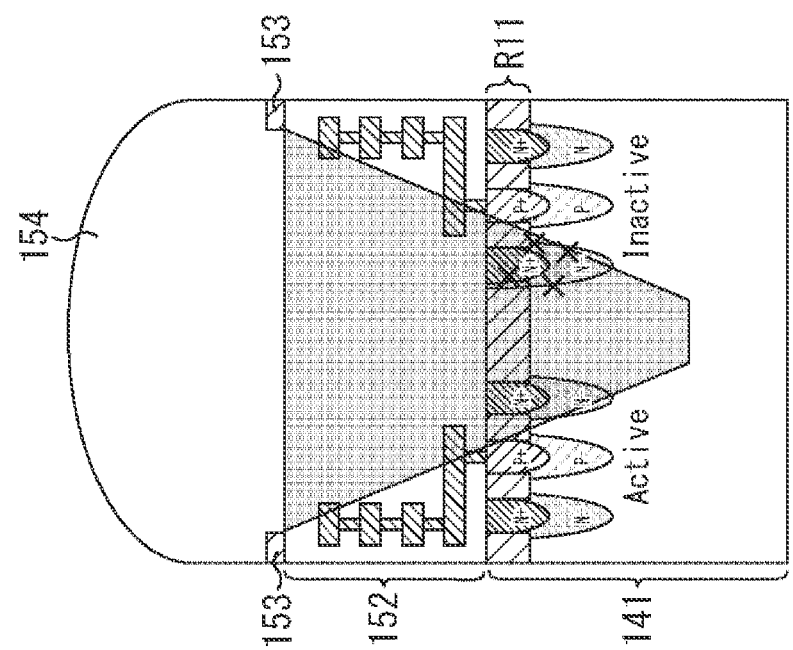

FIG. 7
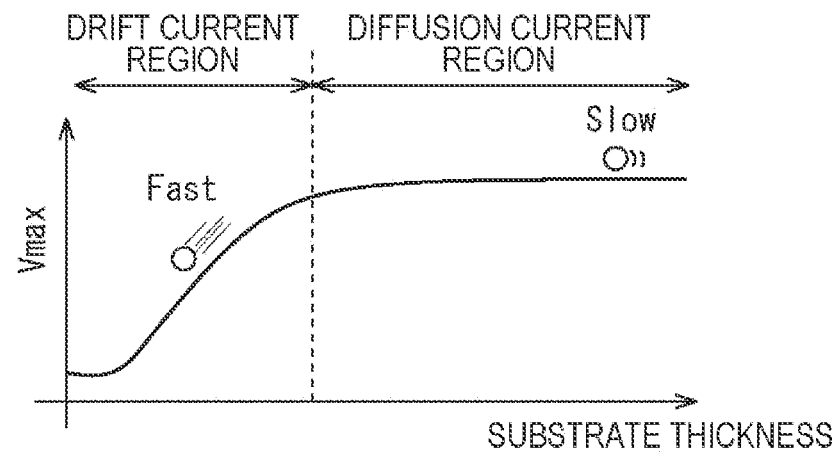
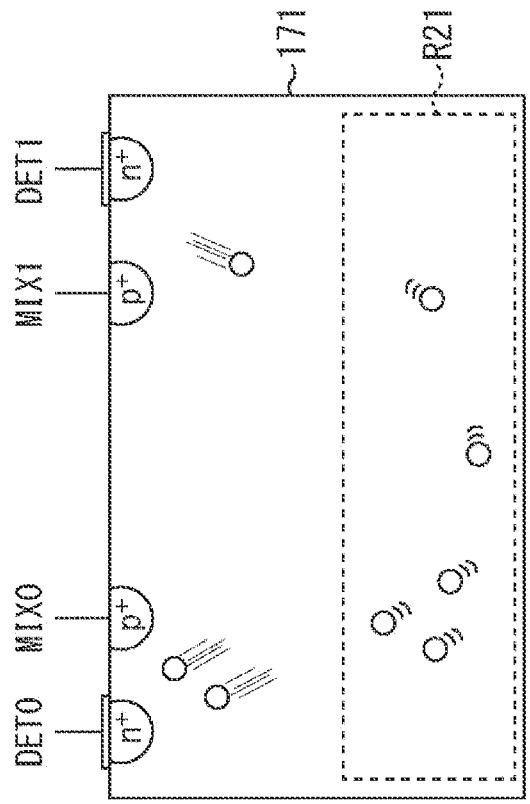

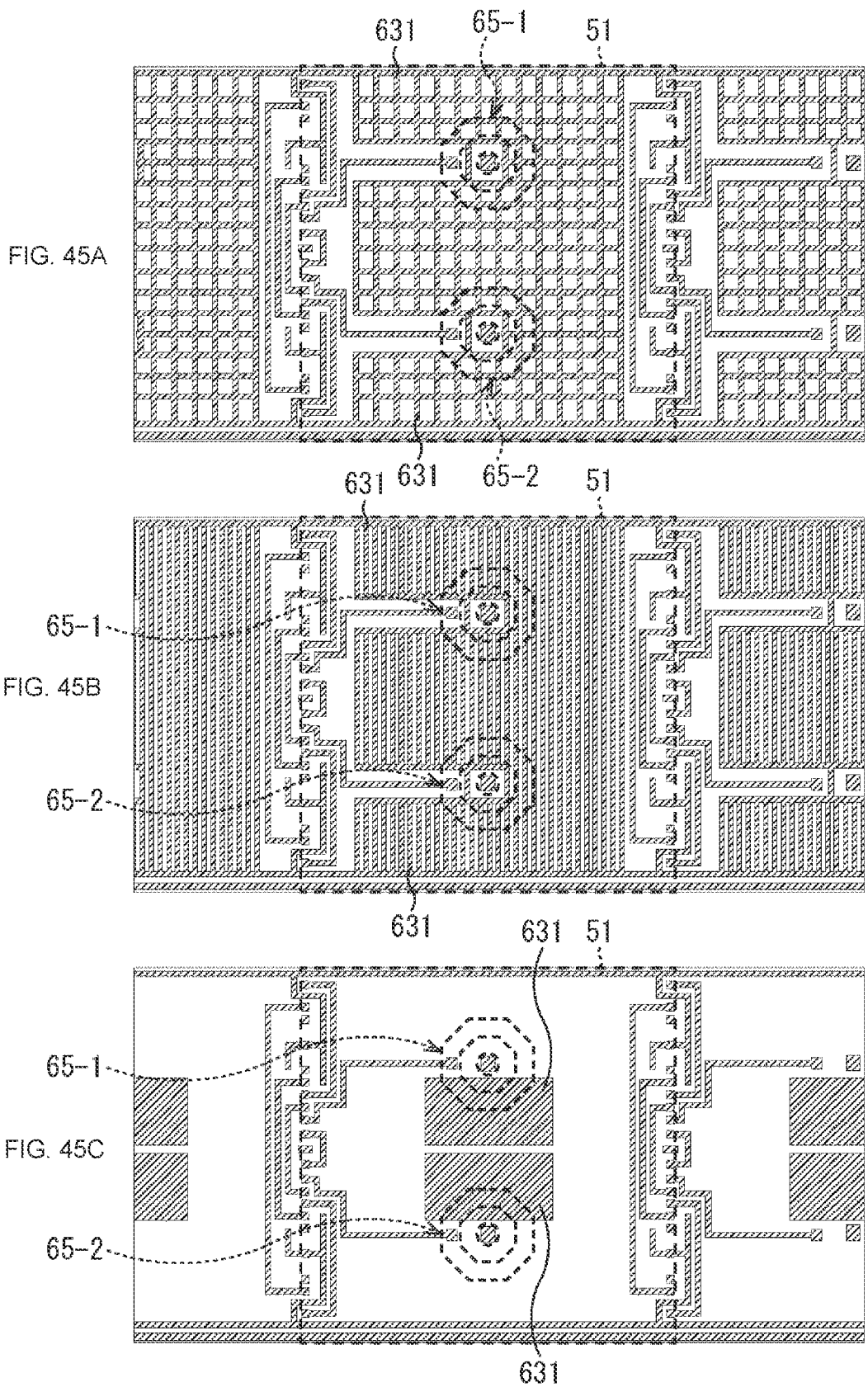

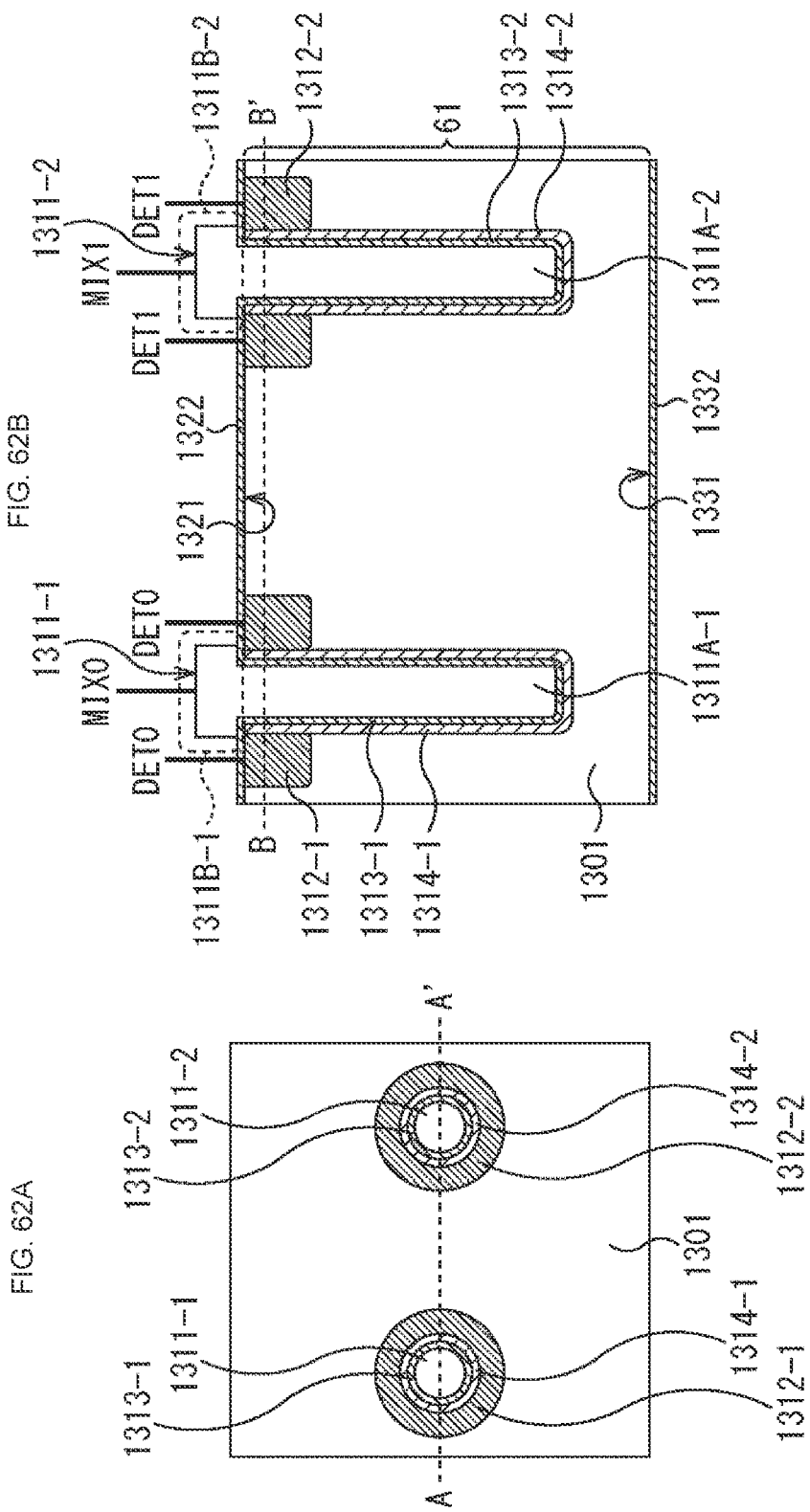

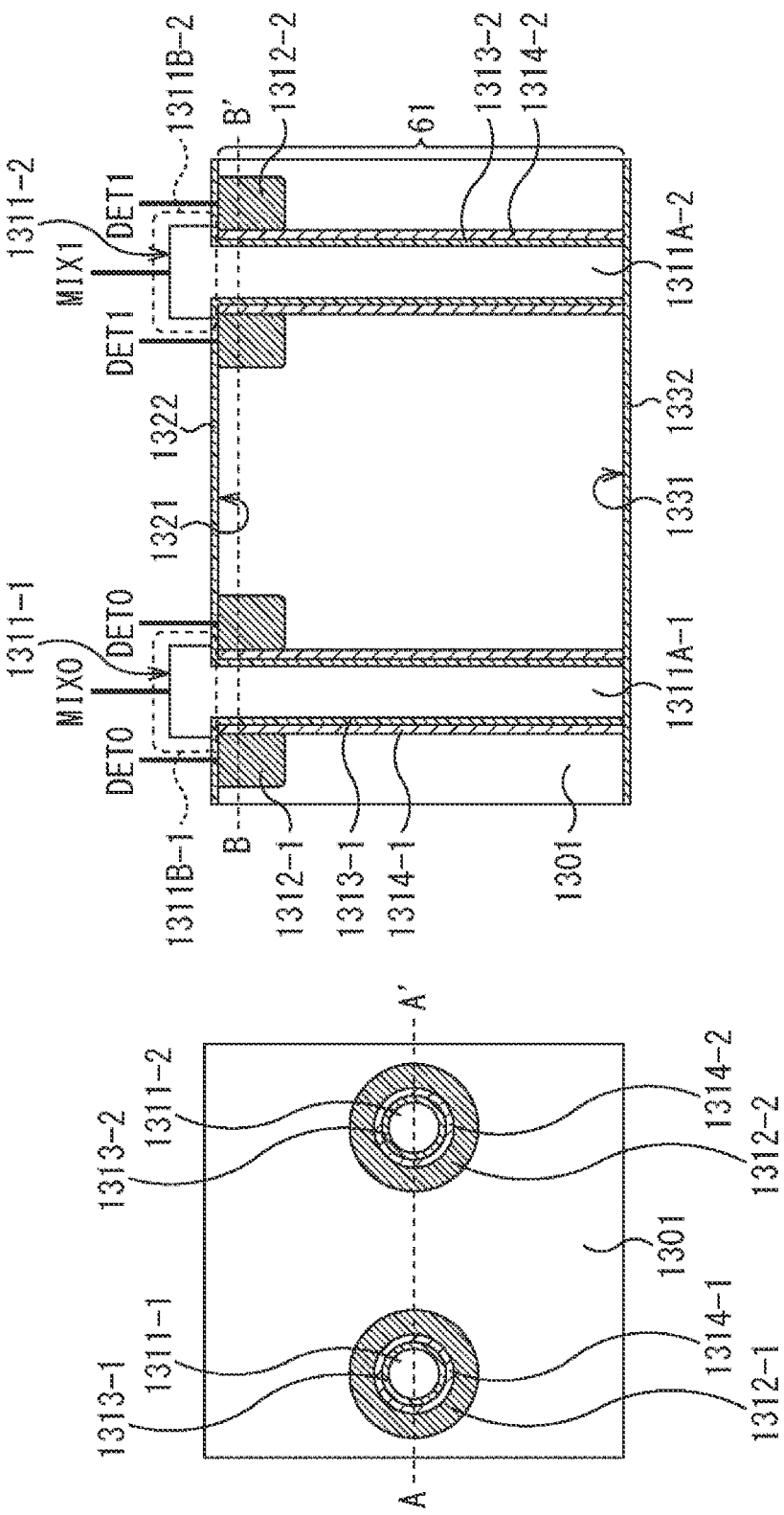
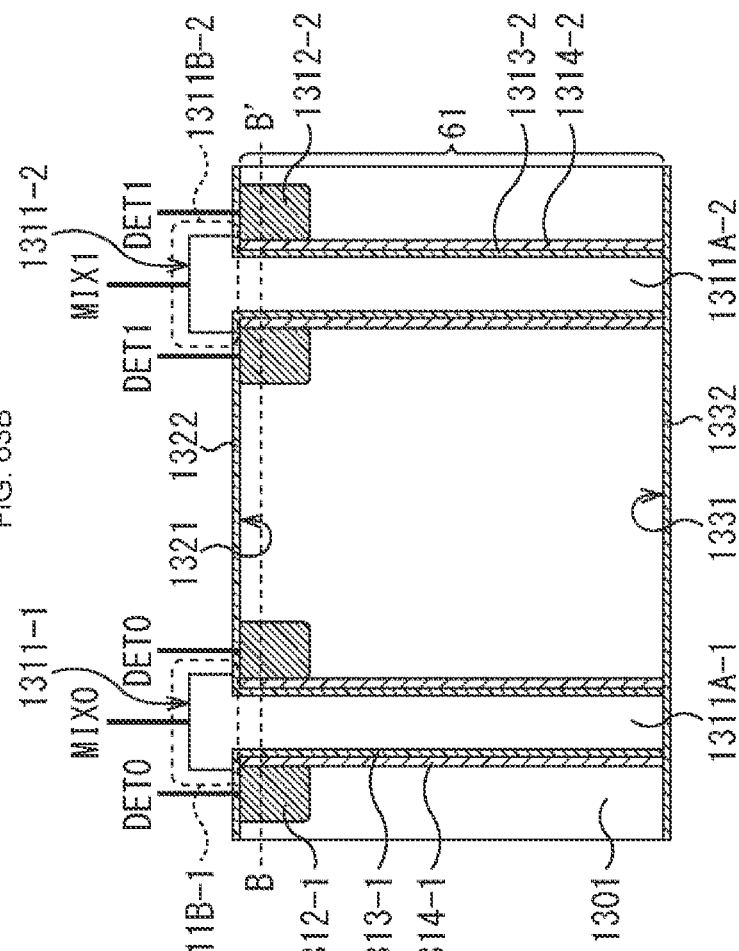

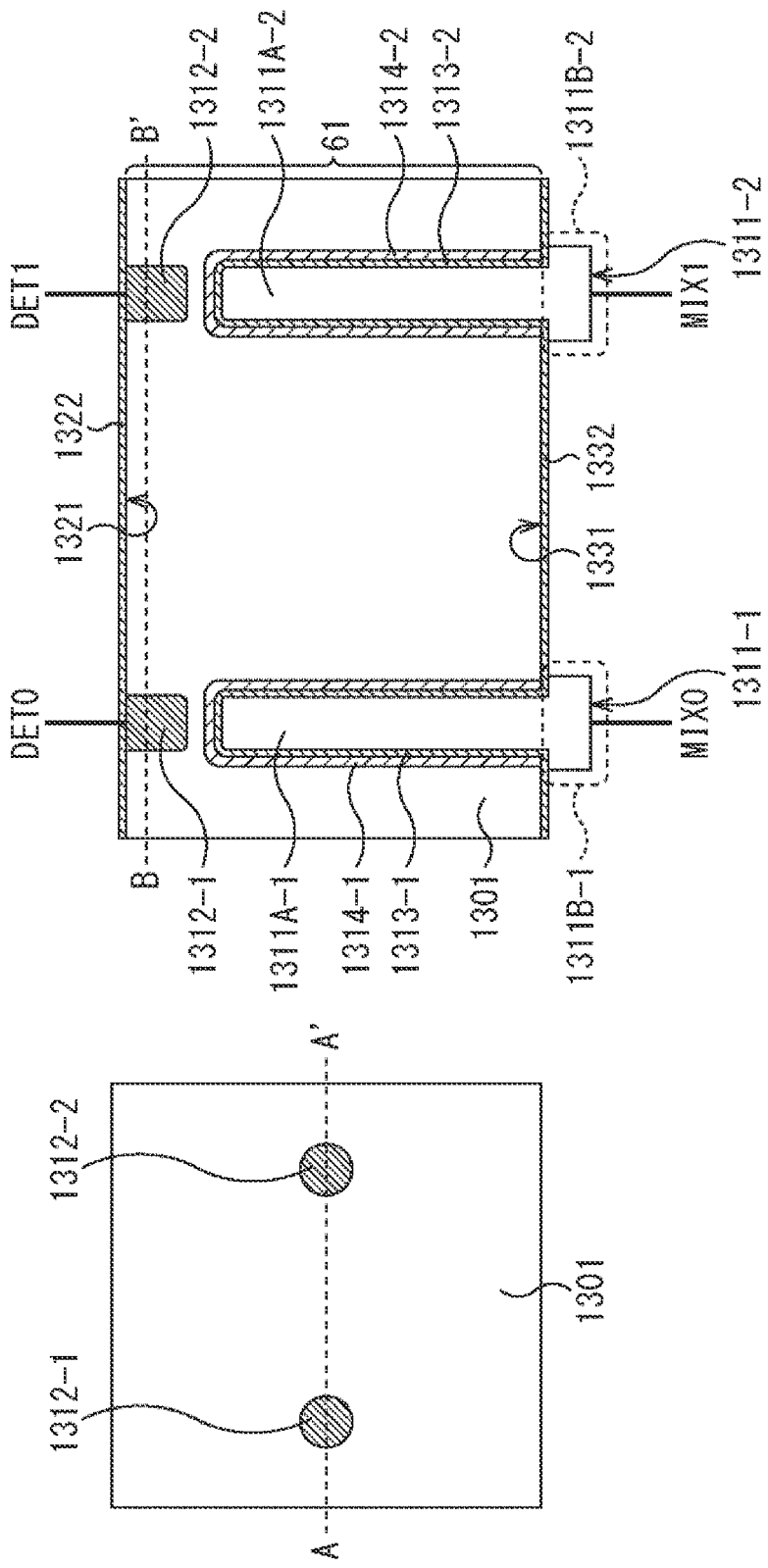

FIG. 88

| APPLIED VOLTAGE | mode1 | mode2 | mode3 | mode4 | mode5 |
|---|---|---|---|---|---|
| Tap TA | H | 0 | H (IMAGE HEIGHT WEIGHTING) | H | H (IMAGE HEIGHT WEIGHTING) |
| Tap TB | 0 | H | H (IMAGE HEIGHT WEIGHTING) | H | H (IMAGE HEIGHT WEIGHTING) |
| PIXEL Tr | VSS | VSS | VSS | L | L |

H(High) : 1.5V, VSS:0V, L(Low) = −1.5V

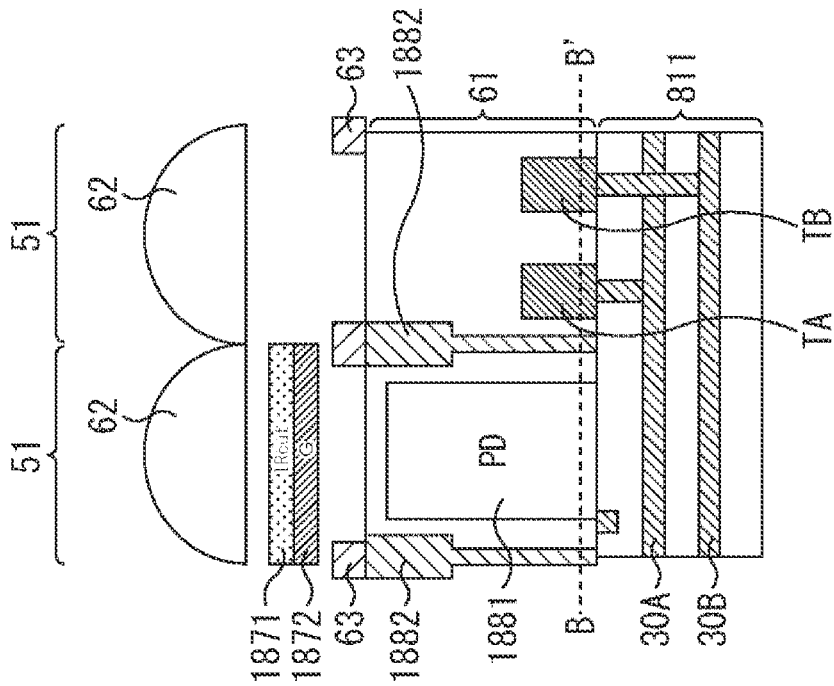
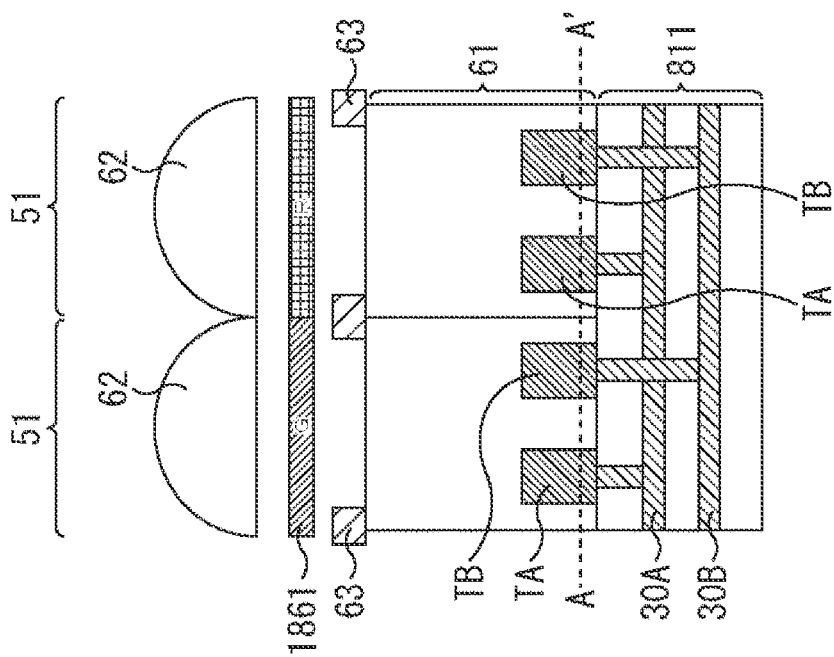

LIGHT-RECEIVING ELEMENT AND DISTANCE-MEASURING MODULE

CROSS REFERENCE TO RELATED APPLICATIONS

This application is a U.S. National Phase of International Patent Application No. PCT/JP2019/026590 filed on Jul. 4, 2019, which claims priority benefit of Japanese Patent Application No. JP 2018-135396 filed in the Japan Patent Office on Jul. 18, 2018. Each of the above-referenced applications is hereby incorporated herein by reference in its entirety.

TECHNICAL FIELD

The present technology relates to a light-receiving element and a distance-measuring module, and particularly relates to a light-receiving element and a distance-measuring module for enabling improvement of characteristics.

BACKGROUND ART

Conventionally, distance-measuring systems using an indirect time of flight (ToF) method are known. In such distance-measuring systems, a sensor capable of distributing signal charges in different regions at a high speed, the signal charges being obtained by receiving light hitting and reflected at an object, the light being active light radiated using a light emitting diode (LED) or a laser at a certain phase, is indispensable.

Therefore, for example, there is proposed a technology of causing a wide-range of region in a substrate of a sensor to be modulated at a high speed by directly applying a voltage in the substrate to generate a current in the substrate (for example, see Patent Document 1). Such a sensor is also called a current assisted photonic demodulator (CAPD) sensor.

CITATION LIST

Patent Document

Patent Document 1: Japanese Patent Application Laid-Open No. 2011-86904

SUMMARY OF THE INVENTION

Problems to be Solved by the Invention

However, it has been difficult to obtain a CAPD sensor with sufficient characteristics by the above-described technology.

For example, the above-described CAPD sensor is a front-illuminated sensor having wiring and the like arranged on a surface of the substrate, the surface receiving light from the outside.

To secure a photodiode conversion region, it is desirable not to have wiring or the like that blocks an optical path of incoming light on the light-receiving surface side of a photodiode, that is, a photoelectric conversion unit. However, in the front-illuminated CAPD sensor, there is no choice but to arrange wiring for charge extraction, various control lines and signal lines on the light-receiving surface side of the PD depending on a structure, which limits the photoelectric conversion region. That is, a sufficient photo-electric conversion region cannot be secured, and characteristics of pixels, such as sensitivity, deteriorate.

Furthermore, in a case of considering use of a CAPD sensor in a place with external light, an external light component becomes a noise component for the indirect ToF method for measuring distance using active light. Therefore, a sufficient saturation signal amount (Qs) needs to be secured in order to secure a sufficient signal to noise (SN) ratio and obtain distance information. However, in the front-illuminated CAPD sensor, the wiring layout is limited. Therefore, it is necessary to devise a method other than the wiring capacitance, such as providing an additional transistor for securing a capacitance.

Moreover, in the front-illuminated CAPD sensor, a signal extraction portion called Tap is arranged on the side in the substrate on which light is incident. Meanwhile, in a case of considering photoelectric conversion in a Si substrate, a rate of occurrence of photoelectric conversion on the light incident surface side is high although there is a difference in an attenuation rate depending a wavelength of the light. Therefore, in the surface-type CAPD sensor, a probability that photoelectric conversion is performed in an Inactive Tap region may be high, the Inactive Tap region being a Tap region to which the signal charge is not distributed, of the Tap region in which the signal extraction portion is provided. Since the indirect ToF sensor obtains distance measurement information using a signal distributed to each charge accumulation region according to a phase of the active light, a directly photoelectrically converted component in the Inactive Tap region becomes a noise, and as a result, the distance-measuring accuracy may become worse. That is, the characteristics of the CAPD sensor may deteriorate.

The present technology has been made in view of such a situation and enables improvement of characteristics.

Solutions to Problems

A light-receiving element according to the first aspect of the present technology includes:
an on-chip lens;
a wiring layer; and
a semiconductor layer arranged between the on-chip lens and the wiring layer, in which
the semiconductor layer includes
  a first voltage application portion to which a first voltage is applied,
  a second voltage application portion to which a second voltage different from the first voltage is applied,
  a first charge detection portion arranged near the first voltage application portion, and
  a second charge detection portion arranged near the second voltage application portion, and
each of the first voltage application portion and the second voltage application portion is covered with an insulating film in the semiconductor layer.

In the first aspect of the present technology, an on-chip lens, a wiring layer, and a semiconductor layer arranged between the on-chip lens and the wiring layer are provided, the semiconductor layer is provided with a first voltage application portion to which a first voltage is applied, a second voltage application portion to which a second voltage different from the first voltage is applied, a first charge detection portion arranged near the first voltage application portion, and a second charge detection portion arranged near the second voltage application portion, and each of the first voltage application portion and the second voltage application portion is covered with an insulating film in the semiconductor layer.

A distance-measuring module according to the second aspect of the present technology includes:
  a light-receiving element including
    an on-chip lens,
    a wiring layer, and
    a semiconductor layer arranged between the on-chip lens and the wiring layer,
    the semiconductor layer including
      a first voltage application portion to which a first voltage is applied,
      a second voltage application portion to which a second voltage different from the first voltage is applied,
      a first charge detection portion arranged around the first voltage application portion, and
      a second charge detection portion arranged around the second voltage application portion, and
    each of the first voltage application portion and the second voltage application portion being covered with an insulating film in the semiconductor layer;
  a light source configured to radiate irradiation light in which brightness periodically varies; and
  a light-emission control unit configured to control irradiation timing of the irradiation light.

In the second aspect of the present technology, there are provided: a light-receiving element provided with an on-chip lens, a wiring layer, and a semiconductor layer arranged between the on-chip lens and the wiring layer, the semiconductor layer being provided with a first voltage application portion to which a first voltage is applied, a second voltage application portion to which a second voltage different from the first voltage is applied, a first charge detection portion arranged around the first voltage application portion, and a second charge detection portion arranged around the second voltage application portion, and each of the first voltage application portion and the second voltage application portion being covered with an insulating film in the semiconductor layer; a light source configured to radiate irradiation light in which brightness periodically varies; and a light-emission control unit configured to control irradiation timing of the irradiation light.

Effects of the Invention

According to the first and second aspects of the present technology, the characteristics can be improved.

Note that the effects described here are not necessarily limited, and any of effects described in the present disclosure may be exhibited.

BRIEF DESCRIPTION OF DRAWINGS

FIG. 5 is a view for describing improvement of charge separation efficiency.
FIG. 7 is a diagram for describing a moving speed of a signal carrier in a front-illuminated type.

FIGS. 45A, 45B, and 45C are views illustrating a modification of a reflective member formed in a metal film.

FIGS. 62A and 62B are plan view and a cross-sectional view of a pixel according to a first configuration example of a nineteenth embodiment.

FIGS. 63A and 63B are plan view and a cross-sectional view of a pixel according to a second configuration example of the nineteenth embodiment.

FIGS. 66A and 66B are plan view and a cross-sectional view of a pixel according to a third configuration example of the nineteenth embodiment.

FIG. 88 is a diagram for describing driving modes of the first and second taps.

FIGS. 93A and 93B are cross-sectional views of pixels according to a twenty-second embodiment.

MODE FOR CARRYING OUT THE INVENTION

Hereinafter, embodiments to which the present technology is applied will be described with reference to the drawings.

First Embodiment

<Configuration Example of Light-Receiving Element>

The present technology enables improvement of characteristics such as pixel sensitivity by causing a CAPD sensor to have a back-illuminated configuration.

The present technology can be applied to, for example, a light-receiving element that constitutes a distance-measuring system that measures distance by an indirect ToF method, an imaging device including such a light-receiving element, or the like.

The distance-measuring system can be applied to, for example, an in-vehicle system mounted on a vehicle and which measures the distance to an object outside the vehicle, a system for gesture recognition that measures the distance to an object such as a hand of a user and recognizes a gesture of the user on the basis of a measurement result, or the like. In this case, the gesture recognition result can be used for, for example, operating a car navigation system or the like.

Figure 1:
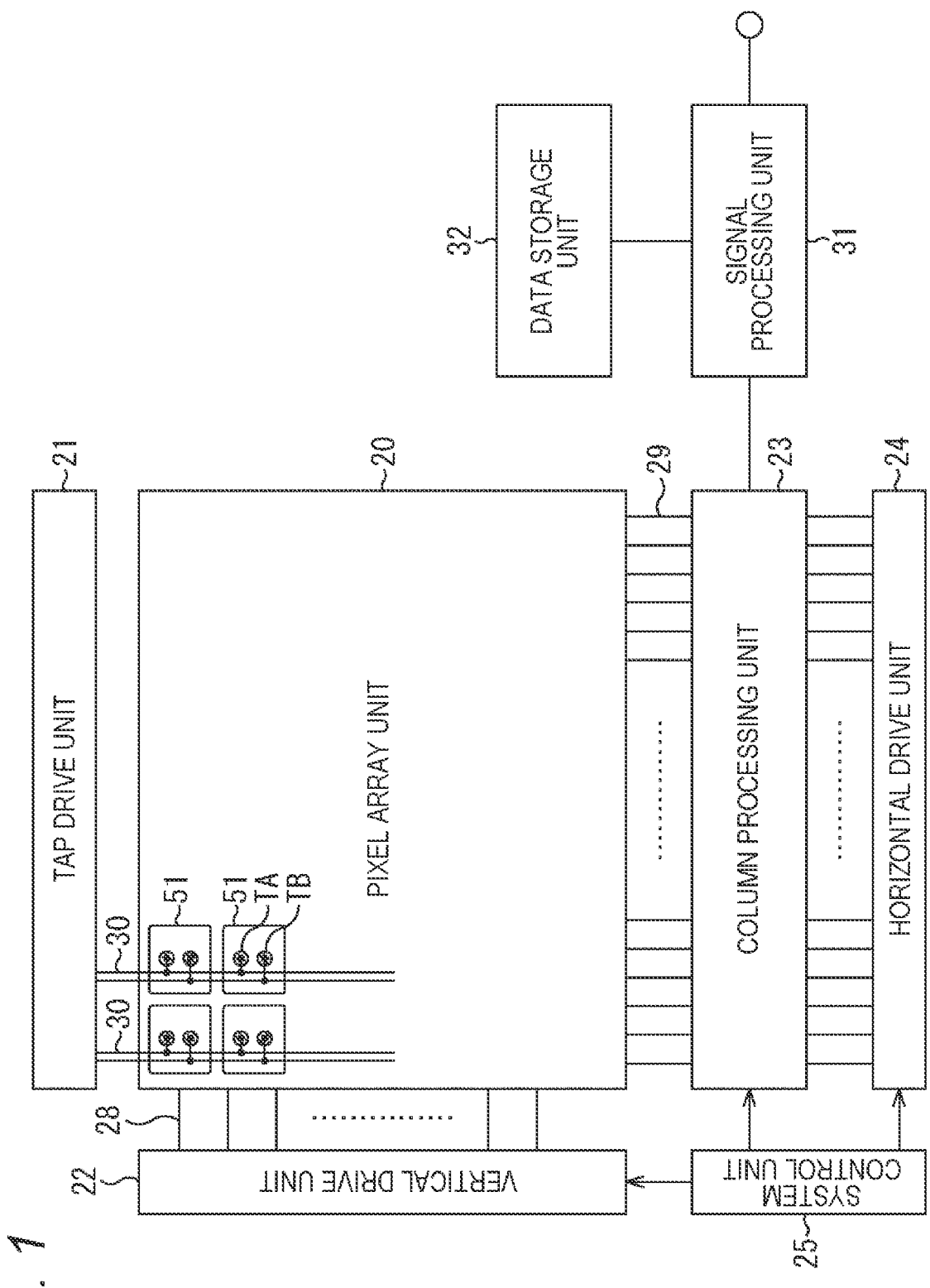
FIG. 1 is a block diagram illustrating a configuration example of a light-receiving element.

FIG. 1 is a block diagram illustrating a configuration example of an embodiment of a light-receiving element to which the present technology is applied.

A light-receiving element 1 illustrated in FIG. 1 is a back-illuminated CAPD sensor and is provided in, for example, an imaging device having a distance-measuring function.

The light-receiving element 1 has a configuration including a pixel array unit 20 formed on a semiconductor substrate (not illustrated) and a peripheral circuit unit integrated on the same semiconductor substrate as the pixel array unit 20. The peripheral circuit unit includes, for example, a tap drive unit 21, a vertical drive unit 22, a column processing unit 23, a horizontal drive unit 24, and a system control unit 25.

The light-receiving element 1 is also provided with a signal processing unit 31 and a data storage unit 32. Note that the signal processing unit 31 and the data storage unit 32 may be mounted on the same substrate as the light-receiving element 1 or may be arranged on a substrate different from the substrate of the light-receiving element 1 in the imaging device.

The pixel array unit 20 has a configuration in which pixels 51 that each generate a charge according to an amount of received light and outputs a signal corresponding to the charge are two-dimensionally arranged in a matrix in a row direction and a column direction. That is, the pixel array unit 20 includes a plurality of pixels 51 each photoelectrically converting incident light and outputting a signal corresponding to the charge obtained as a result of the photoelectric conversion. Here, the row direction refers to an array direction of the pixels 51 in a horizontal direction, and the column direction refers to an array direction of the pixels 51 in a vertical direction. The row direction is a cross direction in FIG. 1 and the column direction is a vertical direction in FIG. 1.

The pixel 51 receives light incident from an outside, in particular, infrared light, photoelectrically converts the received light, and outputs a pixel signal according to a charge obtained as a result of the photoelectric conversion. The pixel 51 includes a first tap TA that applies a predetermined voltage MIX0 (first voltage) to detect the photoelectrically converted charge and a second tap TB that applies a predetermined voltage MIX1 (second voltage) to detect the photoelectrically converted charge.

The tap drive unit 21 supplies the predetermined voltage MIX0 to the first tap TA via a predetermined voltage supply line 30 and supplies the predetermined voltage MIX1 to the second tap TB via a predetermined voltage supply line 30, of each pixel 51 of the pixel array unit 20. Therefore, one pixel column of the pixel array unit 20 is wired with the two voltage supply lines 30, which are the voltage supply line 30 that transmits the voltage MIX0 and the voltage supply line 30 that transmits the voltage MIX1.

In the pixel array unit 20, a pixel drive line 28 is wired along the row direction for each pixel row and two vertical signal lines 29 are wired along the column direction for each pixel column with respect to the pixel array in the matrix. For example, the pixel drive line 28 transmits a drive signal for driving the pixel when reading a signal from the pixel. Note that, in FIG. 1, one wire is illustrated for the pixel drive line 28 but the number of wires is not limited to one. One end of the pixel drive line 28 is connected to an output end corresponding to each row of the vertical drive unit 22.

The vertical drive unit 22 is configured by a shift register, an address decoder, and the like, and drives all the pixels of the pixel array unit 20 at the same time, on a row basis, or the like. That is, the vertical drive unit 22 constitutes a drive unit that controls the operation of each pixel of the pixel array unit 20 together with the system control unit 25 that controls the vertical drive unit 22.

The signal output from each pixel 51 of the pixel row according to the drive control by the vertical drive unit 22 is input to the column processing unit 23 via the vertical signal line 29. The column processing unit 23 performs predetermined signal processing for a pixel signal output from each pixel 51 through the vertical signal line 29, and temporarily stores the pixel signal after the signal processing.

Specifically, the column processing unit 23 performs noise removal processing, analog to digital (AD) conversion processing, and the like as the signal processing.

The horizontal drive unit 24 is configured by a shift register, an address decoder, and the like, and sequentially selects a unit circuit corresponding to the pixel column of the column processing unit 23. By the selective scanning by the horizontal drive unit 24, pixel signals processed in the column processing unit 23 for each unit circuit are sequentially output.

The system control unit 25 is configured by a timing generator that generates various timing signals, and the like, and drives and controls the tap drive unit 21, the vertical drive unit 22, the column processing unit 23, the horizontal drive unit 24, and the like on the basis of the various timing signals generated by the timing generator.

The signal processing unit 31 has at least an arithmetic processing function and performs various types of signal processing such as arithmetic processing on the basis of the pixel signal output from the column processing unit 23. The data storage unit 32 temporarily stores data necessary for the signal processing in the signal processing unit 31.

<Configuration Example of Pixel>

Next, a configuration example of the pixel provided in the pixel array unit 20 will be described. The pixel provided in the pixel array unit 20 is configured as illustrated in FIG. 2, for example.

Figure 2:
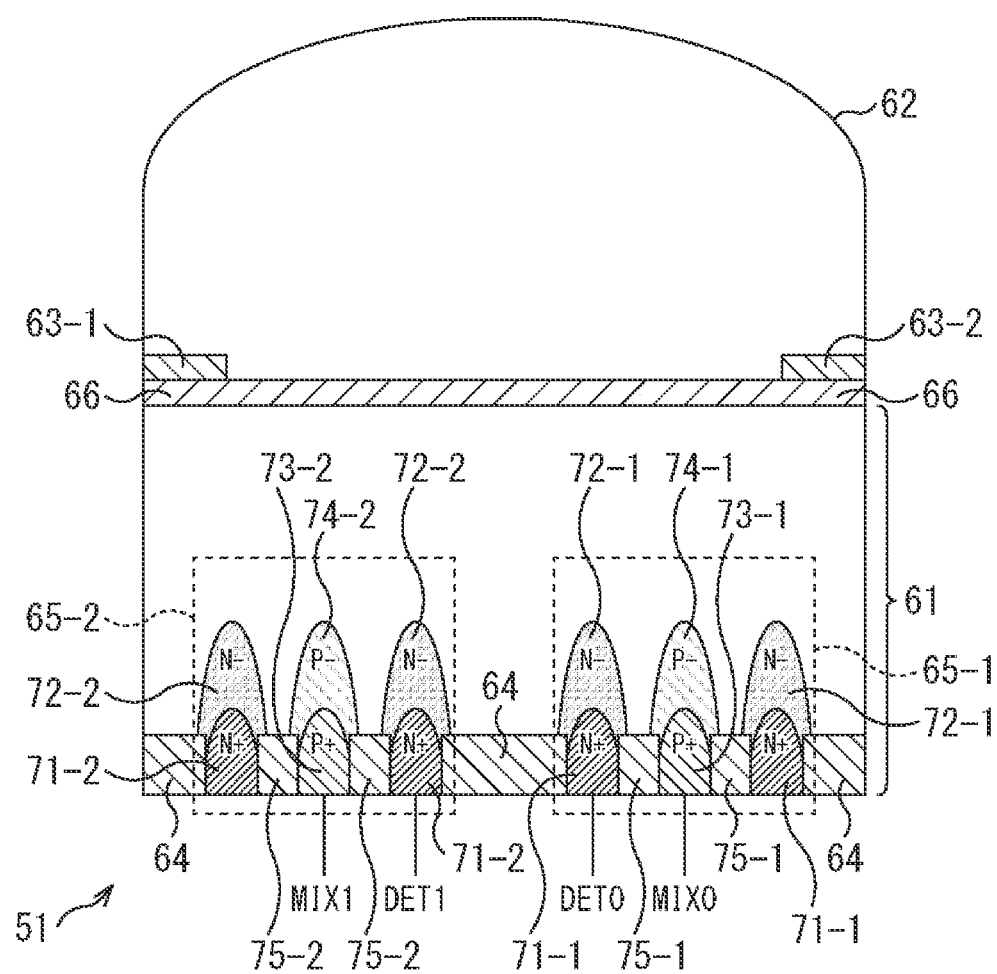
FIG. 2 is a view illustrating a configuration example of a pixel.

FIG. 2 illustrates a cross-section of one pixel 51 provided in the pixel array unit 20, and the pixel 51 receives light incident from the outside, in particular, infrared light, photoelectrically converts the received light, and outputs a signal according to the charge obtained as a result of the photoelectric conversion.

The pixel 51 includes, for example, a substrate 61 formed using a P-type semiconductor layer such as a silicon substrate, and an on-chip lens 62 formed on the substrate 61.

For example, in the substrate 61, the thickness in the vertical direction in FIG. 2, that is, the thickness in a direction perpendicular to the surface of the substrate 61, is 20 μm or less. Note that the thickness of the substrate 61 may be 20 μm or more, and the thickness may be determined according to a target characteristic of the light-receiving element 1, or the like.

Furthermore, the substrate 61 is, for example, a high-resistance P-Epi substrate having a substrate concentration of 1E+13 order or less, and the resistance (resistivity) of the substrate 61 is, for example, 500 [Ωcm] or more.

Here, the relationship between the substrate concentration and the resistance of the substrate 61 is, for example, the resistance of 2000 [Ωcm] when the substrate concentration is 6.48E+12 [cm$^3$], the resistance of 1000 [Ωcm] when the substrate concentration is 1.30E+13 [cm$^3$], the resistance of 500 [Ωcm] when the substrate concentration is 2.59E+13 [cm$^3$], the resistance of 100 [Ωcm] when the substrate concentration is 1.30E+14 [cm$^3$], and the like.

In FIG. 2, an upper surface of the substrate 61 is a back surface of the substrate 61 and is a light incident surface of the substrate 61 on which the light from the outside is incident. Meanwhile, a lower surface of the substrate 61 is a front surface of the substrate 61 and a multilayer wiring layer (not illustrated) is formed. A fixed charge film 66 including a single-layer film or a stacked film having a positive fixed charge is formed on the light incident surface of the substrate 61, and the on-chip lens 62 that condenses the light incident from the outside and guides the light into the substrate 61 is formed on an upper surface of the fixed charge film 66. The fixed charge film 66 causes the light incident surface side of the substrate 61 to be in a hall-accumulated state and suppresses generation of a dark current.

Moreover, in the pixel 51, an inter-pixel light-shielding film 63-1 and an inter-pixel light-shielding film 63-2 for preventing crosstalk between adjacent pixels are formed in end portions of the pixel 51 and on the fixed charge film 66. Hereinafter, in a case where there is no need to distinguish the inter-pixel light-shielding film 63-1 and the inter-pixel light-shielding film 63-2, they are also simply referred to as inter-pixel light-shielding film (s) 63.

In this example, the light from the outside enters the substrate 61 via the on-chip lens 62. The inter-pixel light-shielding film 63 is formed not to cause the light incident from the outside to enter another pixel region provided adjacent to the pixel 51 in the substrate 61. That is, the light entering the on-chip lens 62 from the outside and directed to another pixel adjacent to the pixel 51 is shielded by the inter-pixel light-shielding film 63-1 or the inter-pixel light-shielding film 63-2 and is prevented from entering the another adjacent pixel.

Since the light-receiving element 1 is a back-illuminated CAPD sensor, the light incident surface of the substrate 61 is a so-called back surface, and no wiring layer including wiring and the like is formed on the back surface. Furthermore, the wiring layer in which wiring for driving a transistor and the like formed in the pixel 51 and wiring for reading a signal from the pixel 51 and the like are formed is stacked and formed on a surface opposite to the light incident surface of the substrate 61.

An oxide film 64, and a signal extraction portion 65-1 and a signal extraction portion 65-2 are formed in a portion inside a surface of the substrate 61, the surface being opposite to the light incident surface, that is, inside the lower surface in FIG. 2. The signal extraction portion 65-1 corresponds to the first tap TA described in FIG. 1, and the signal extraction portion 65-2 corresponds to the second tap TB described in FIG. 1.

In this example, the oxide film 64 is formed in a central portion of the pixel 51 near the surface opposite to the light incident surface of the substrate 61, and the signal extraction portion 65-1 and the signal extraction portion 65-2 are each formed in one of both ends of the oxide film 64.

Here, the signal extraction portion 65-1 includes an N+ semiconductor region 71-1 that is an N-type semiconductor region and an N− semiconductor region 72-1 having a lower donor impurity concentration than the N+ semiconductor region 71-1, and a P+ semiconductor region 73-1 that is a P-type semiconductor region and a P− semiconductor region 74-1 having a lower acceptor impurity concentration than the P+ semiconductor region 73-1. Here, examples of the donor impurity include elements belonging to Group 5 in the periodic table of elements such as phosphorus (P) and arsenic (As) for Si, and examples of the acceptor impurity include elements belonging to Group 3 in the periodic table of elements such as boron (B) for Si. An element that serves as a donor impurity is called donor element, and an element that serves as an acceptor impurity is called acceptor element.

In FIG. 2, the N+ semiconductor region 71-1 is formed at a position adjacent on the right side of the oxide film 64 in a portion inside a front surface of the substrate 61, the front surface being opposite to the light incident surface. Furthermore, the N− semiconductor region 72-1 is formed to cover (surround) the N+ semiconductor region 71-1 on the N+ semiconductor region 71-1 in FIG. 2.

Moreover, the P+ semiconductor region 73-1 is formed on the right side of the N+ semiconductor region 71-1. Furthermore, the P− semiconductor region 74-1 is formed to cover (surround) the P+ semiconductor region 73-1 on the P+ semiconductor region 73-1 in FIG. 2.

Moreover, the N+ semiconductor region 71-1 is formed on the right side of the P+ semiconductor region 73-1. Furthermore, the N− semiconductor region 72-1 is formed to cover (surround) the N+ semiconductor region 71-1 on the N+ semiconductor region 71-1 in FIG. 2.

Similarly, the signal extraction portion 65-2 includes an N+ semiconductor region 71-2 that is an N-type semiconductor region and an N− semiconductor region 72-2 having a lower donor impurity concentration than the N+ semiconductor region 71-2, and a P+ semiconductor region 73-2 that is a P-type semiconductor region and a P− semiconductor region 74-2 having a lower acceptor impurity concentration than the P+ semiconductor region 73-2.

In FIG. 2, the N+ semiconductor region 71-2 is formed at a position adjacent on the left side of the oxide film 64 in a portion inside the front surface of the substrate 61, the front surface being opposite to the light incident surface. Furthermore, the N− semiconductor region 72-2 is formed to cover (surround) the N+ semiconductor region 71-2 on the N+ semiconductor region 71-2 in FIG. 2.

Moreover, the P+ semiconductor region 73-2 is formed on the left side of the N+ semiconductor region 71-2. Furthermore, the P− semiconductor region 74-2 is formed to cover (surround) the P+ semiconductor region 73-2 on the P+ semiconductor region 73-2 in FIG. 2.

Moreover, the N+ semiconductor region 71-2 is formed on the left side of the P+ semiconductor region 73-2. Furthermore, the N− semiconductor region 72-2 is formed to cover (surround) the N+ semiconductor region 71-2 on the N+ semiconductor region 71-2 in FIG. 2.

An oxide film 64 similar to that in the central portion of the pixel 51 is formed in an end portion of the pixel 51 in the portion inside the front surface of the substrate 61, the front surface being opposite to the light incident surface.

Hereinafter, in a case where there is no need to distinguish the signal extraction portion 65-1 and the signal extraction portion 65-2, they are also simply referred to as signal extraction portion (s) 65.

Furthermore, hereinafter, in a case where there is no need to distinguish the N+ semiconductor region 71-1 and the N+ semiconductor region 71-2, they are also simply referred to as N+ semiconductor region (s) 71, and in a case where there is no need to distinguish the N− semiconductor region 72-1 and the N− semiconductor region 72-2, they are also simply referred to as N− semiconductor region (s) 72.

Moreover, hereinafter, in a case where there is no need to distinguish the P+ semiconductor region 73-1 and the P+ semiconductor region 73-2, they are also simply referred to as P+ semiconductor region (s) 73, and in a case where there is no need to distinguish the P− semiconductor region 74-1 and the P− semiconductor region 74-2, they are also simply referred to as P− semiconductor region (s) 74.

Furthermore, in the substrate 61, a separation portion 75-1 for separating the N+ semiconductor region 71-1 and the P+ semiconductor region 73-1 is formed using an oxide film and the like between the N+ semiconductor region 71-1 and the P+ semiconductor region 73-1. Similarly, a separation portion 75-2 for separating the N+ semiconductor region 71-2 and the P+ semiconductor region 73-2 is formed using an oxide film and the like between the N+ semiconductor region 71-2 and the P+ semiconductor region 73-2. Hereinafter, in a case where there is no need to distinguish the separation portion 75-1 and the separation portion 75-2, they are also simply referred to as separation portion (s) 75.

The N+ semiconductor region 71 provided in the substrate 61 functions as a charge detection portion for detecting the amount of light incident on the pixel 51 from the outside, that is, the amount of signal carriers generated by the photoelectric conversion by the substrate 61. Note that the N− semiconductor region 72 having a low donor impurity concentration in addition to the N+ semiconductor region 71 can be regarded as the charge detection portion. Furthermore, the P+ semiconductor region 73 functions as a voltage application portion for injecting a large number of carrier currents into the substrate 61, that is, for directly applying a voltage to the substrate 61 to generate an electric field in the substrate 61. Note that the P− semiconductor region 74 having a low acceptor impurity concentration in addition to the P+ semiconductor region 73 can be regarded as the voltage application portion.

In pixel 51, a floating diffusion (FD) portion (hereinafter, also referred to as FD portion A) that is a floating diffusion region (not illustrated) is directly connected to the N+ semiconductor region 71-1, and further, the FD portion A is connected to the vertical signal line 29 via an amplification transistor (not illustrated) and the like.

Similarly, another FD portion (hereinafter, also referred to as FD portion B) different from the FD portion A is directly connected to the N+ semiconductor region 71-2, and the FD portion B is connected to the vertical signal line 29 via an amplification transistor (not illustrated) and the like. Here, the FD portion A and the FD portion B are connected to the vertical signal lines 29 different from each other.

For example, in the case of measuring the distance to an object by the indirect ToF method, infrared light is emitted toward the object from the imaging device provided with the light-receiving element 1. Then, when the infrared light is reflected by the object and returning to the imaging device as reflected light, the substrate 61 of the light-receiving element 1 receives and photoelectrically converts the incident reflected light (infrared light). The tap drive unit 21 drives the first tap TA and the second tap TB of the pixel 51, and distributes a signal corresponding to a charge DET obtained by photoelectric conversion to the FD portion A and the FD portion B.

For example, at certain timing, the tap drive unit 21 applies a voltage to the two P+ semiconductor regions 73 via a contact or the like. Specifically, for example, the tap drive unit 21 applies the voltage of MIX0=1.5 V to the P+ semiconductor region 73-1 that is the first tap TA, and applies the voltage of MIX1=0 V to the P+ semiconductor region 73-2 that is the second tap TB.

Then, an electric field is generated between the two P+ semiconductor regions 73 in the substrate 61, and a current flows from the P+ semiconductor region 73-1 to the P+ semiconductor region 73-2. In this case, holes in the substrate 61 move in the direction of the P+ semiconductor region 73-2, and electrons move in the direction of the P+ semiconductor region 73-1.

Therefore, in such a state, when infrared light (reflected light) from the outside enters the substrate 61 through the on-chip lens 62, and the infrared light is photoelectrically converted into a pair of electrons and holes in the substrate 61, the obtained electrons are guided in the direction of the P+ semiconductor region 73-1 by the electric field between the P+ semiconductor regions 73 and move into the N+ semiconductor region 71-1.

In this case, the electrons generated by the photoelectric conversion are used as a signal carrier for detecting the signal corresponding to the amount of infrared light incident on the pixel 51, that is, the amount of received infrared light.

As a result, a charge corresponding to the electrons that have moved into the N+ semiconductor region 71-1 is accumulated in the N+ semiconductor region 71-1, and this charge is detected by the column processing unit 23 via the FD portion A, the amplification transistor, the vertical signal line 29, and the like.

That is, the accumulated charge DET0 in the N+ semiconductor region 71-1 is transferred to the FD portion A directly connected to the N+ semiconductor region 71-1, and the signal corresponding to the charge DET0 transferred to the FD portion A is read by the column processing unit 23 via the amplification transistor and the vertical signal line 29. Then, the column processing unit 23 applies processing such as AD conversion processing to the read signal, and a pixel signal obtained as a result of the processing is supplied to the signal processing unit 31.

The pixel signal is a signal indicating a charge amount according to the electrons detected by the N+ semiconductor region 71-1, that is, the amount of the charge DET0 accumulated in the FD portion A. In other words, the pixel signal can be said to be a signal indicating the amount of infrared light received by the pixel 51.

Note that, at this time, the pixel signal corresponding to the electrons detected in the N+ semiconductor region 71-2 may be appropriately used for distance measurement, similarly to the case of the N+ semiconductor region 71-1.

Furthermore, at the next timing, the tap drive unit 21 applies a voltage to the two P+ semiconductor regions 73 via a contact or the like so that an electric field is generated in the direction opposite to the electric field previously generated in the substrate 61. Specifically, for example, the tap drive unit 21 applies the voltage of MIX0=0 V to the P+ semiconductor region 73-1 that is the first tap TA, and applies the voltage of MIX1=1.5 V to the P+ semiconductor region 73-2 that is the second tap TB.

Thereby, an electric field is generated between the two P+ semiconductor regions 73 in the substrate 61, and a current flows from the P+ semiconductor region 73-2 to the P+ semiconductor region 73-1.

In such a state, when infrared light (reflected light) from the outside enters the substrate 61 through the on-chip lens 62, and the infrared light is photoelectrically converted into a pair of electrons and holes in the substrate 61, the obtained electrons are guided in the direction of the P+ semiconductor region 73-2 by the electric field between the P+ semiconductor regions 73 and move into the N+ semiconductor region 71-2.

As a result, a charge corresponding to the electrons that have moved into the N+ semiconductor region 71-2 is accumulated in the N+ semiconductor region 71-2, and this charge is detected by the column processing unit 23 via the FD portion B, the amplification transistor, the vertical signal line 29, and the like.

That is, the accumulated charge DET1 in the N+ semiconductor region 71-2 is transferred to the FD portion B directly connected to the N+ semiconductor region 71-2, and the signal corresponding to the charge DET1 transferred to the FD portion B is read by the column processing unit 23 via the amplification transistor and the vertical signal line 29. Then, the column processing unit 23 applies processing such as AD conversion processing to the read signal, and a pixel signal obtained as a result of the processing is supplied to the signal processing unit 31.

Note that, at this time, the pixel signal corresponding to the electrons detected in the N+ semiconductor region 71-1 may be appropriately used for distance measurement, similarly to the case of the N+ semiconductor region 71-2.

When the pixel signals obtained by the photoelectric conversion in periods different from each other are obtained in the same pixel 51, the signal processing unit 31 calculates distance information indicating the distance to the object on the basis of the pixel signals and outputs the distance information to the subsequent stage.

Such a method of distributing the signal carriers to the N+ semiconductor regions 71 different from each other and calculating the distance information on the basis of the signals according to the signal carriers is called indirect ToF method.

Figure 3:
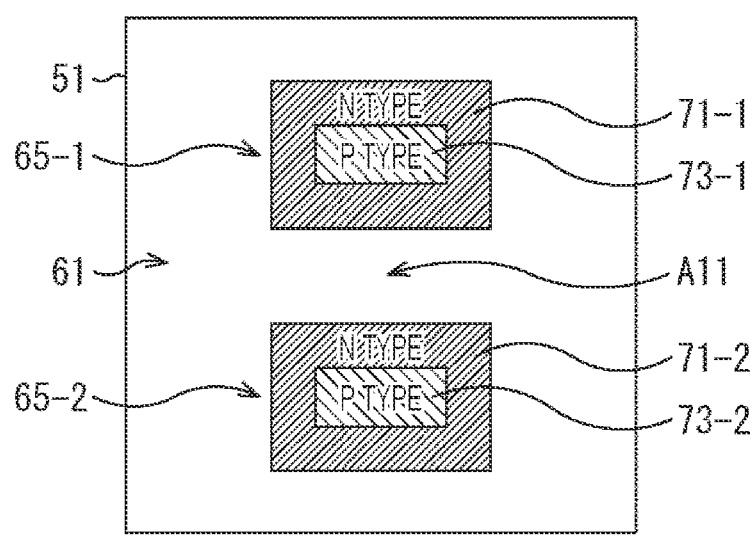
FIG. 3 is a view illustrating a configuration example of a signal extraction portion of a pixel.

When looking at the signal extraction portion 65 in the pixel 51 from a top-to-down direction in FIG. 2, that is, the direction perpendicular to the surface of the substrate 61, the signal extraction portion 65 has a structure in which the P+ semiconductor region 73 is surrounded by the N+ semiconductor region 71, as illustrated in FIG. 3, for example. Note that, in FIG. 3, a portion corresponding to the case in FIG. 2 is denoted by the same reference numeral, and description thereof is omitted as appropriate.

In the example illustrated in FIG. 3, the oxide film 64 (not illustrated) is formed in a central portion of the pixel 51, and the signal extraction portion 65 is formed in a portion on a slightly end side from the center of the pixel 51. In particular, here, the two signal extraction portions 65 are formed in the pixel 51.

Then, in each signal extraction portion 65, the P+ semiconductor region 73 is formed in a rectangular shape at a center position thereof, and a periphery of the P+ semiconductor region 73 as a center is surrounded by the N+ semiconductor region 71 having a rectangular shape, more specifically, a rectangular frame shape. That is, the N+ semiconductor region 71 is formed to surround the P+ semiconductor region 73.

Furthermore, in the pixel 51, the on-chip lens 62 is formed to condense the infrared light incident from the outside to the central portion of the pixel 51, that is, the portion indicated by the arrow A11. In other words, the infrared light incident on the on-chip lens 62 from the outside is condensed by the on-chip lens 62 at the position indicated by the arrow A11, that is, at an upper position in FIG. 2 of the oxide film 64 in FIG. 2.

Therefore, the infrared light is condensed at a position between the signal extraction portion 65-1 and the signal extraction portion 65-2. Thereby, it is possible to suppress the infrared light from entering the pixel adjacent to the pixel 51 and occurrence of crosstalk, and also suppress the infrared light from directly entering the signal extraction portion 65.

For example, if infrared light directly enters the signal extraction portion 65, the charge separation efficiency, that is, contrast between active and inactive taps (Cmod) and modulation contrast will decrease.

Here, the signal extraction portion 65 from which the signal according to the charge DET obtained by the photoelectric conversion is read, that is, the signal extraction portion 65 on which the charge DET obtained by the photoelectric conversion should be detected is also referred to as active tap.

On the contrary, basically, the signal extraction portion 65 from which the signal according to the charge DET obtained by the photoelectric conversion is not read, that is, the signal extraction portion 65 that is not the active tap is also referred to as inactive tap.

In the above-described example, the signal extraction portion 65 in which the voltage of 1.5 V is applied to the P+ semiconductor region 73 is the active tap, and the signal extraction portion 65 in which the voltage of 0 V is applied to the P+ semiconductor region 73 is the inactive tap.

The Cmod is calculated by the following expression (1), is an index representing what percentage of the charge generated by the photoelectric conversion of the incident infrared light can be detected in the N+ semiconductor region 71 of the signal extraction portion 65 that is the active tap, that is, whether the signal according to the charge can be extracted, and indicates the charge separation efficiency. In the expression (1), I0 represents the signal detected in one of the two charge detection portions (P+ semiconductor regions 73), and I1 represents the signal detected in the other charge detection portion.

$$Cmod = \{|I0 - I1|/(I0 + I1)\} \times 100 \quad (1)$$

Therefore, for example, when the infrared light incident from the outside enters the region of the inactive tap and is photoelectrically converted in the inactive tap, there is a high possibility that the electrons as the signal carrier generated by the photoelectric conversion move to the N+ semiconductor region 71 in the inactive tap. Then, the charge of some of the electrons obtained by the photoelectric conversion is not detected in the N+ semiconductor region 71 in the active tap, and the Cmod, that is, the charge separation efficiency decreases.

Therefore, in the pixel 51, the infrared light is condensed near the central portion of the pixel 51, the central portion being located at a substantially equal distance from the two signal extraction portions 65, whereby the probability that the infrared light incident from the outside is photoelectrically converted in the region of the inactive tap is reduced, and the charge separation efficiency can be improved. Furthermore, the modulation contrast can be improved in the pixel 51. In other words, the electrons obtained by the photoelectric conversion can be easily guided to the N+ semiconductor region 71 in the active tap.

According to the above light-receiving element 1, the following effects can be exerted.

That is, first, since the light-receiving element 1 is a back-illuminated type, the light-receiving element 1 can maximize quantum efficiency (QE)×an aperture ratio (fill factor (FF)) and can improve distance-measuring characteristics by the light-receiving element 1.

Figure 4:
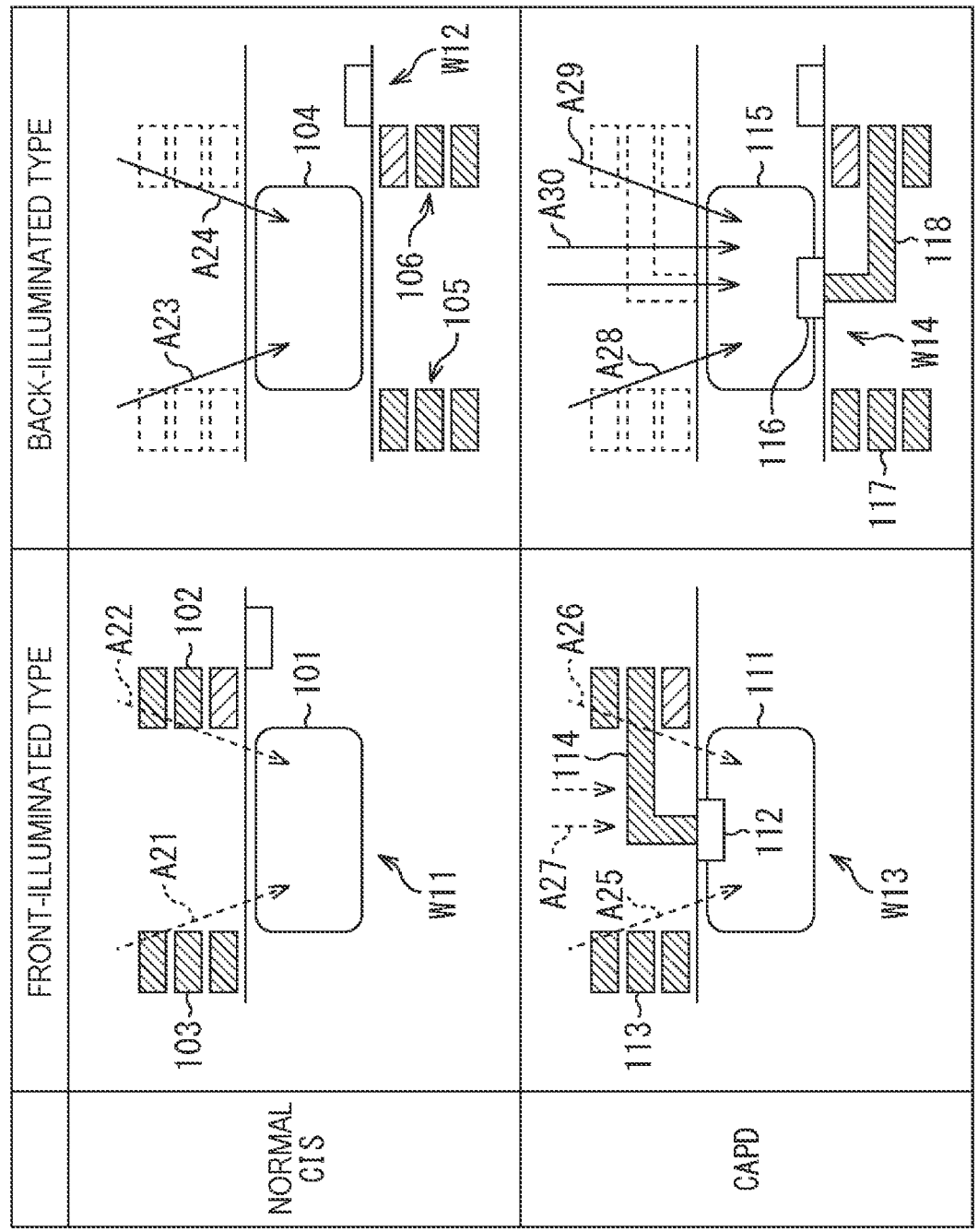
FIG. 4 is a diagram for describing sensitivity improvement.

For example, as illustrated by the arrow W11 in FIG. 4, a normal front-illuminated image sensor has a structure in which wiring 102 and wiring 103 are formed on a light incident surface side on which light from the outside is incident of a PD 101 as a photoelectric conversion unit.

Therefore, for example, some of light obliquely entering the PD 101 at certain angles as illustrated by the arrows A21 and A22 from the outside are blocked by the wiring 102 and the wiring 103 and do not enter the PD 101.

In contrast, a back-illuminated image sensor has a structure in which wiring 105 and wiring 106 are formed on a surface opposite to the light incident surface on which the light from the outside is incident of a PD 104 as a photoelectric conversion unit, as illustrated by the arrow W12, for example.

Therefore, a sufficient aperture ratio can be secured as compared with the case of the front-illuminated type. That is, for example, light obliquely entering the PD 104 at certain angles as illustrated by the arrows A23 and A24 from the outside enters the PD 104 without being blocked by the wiring. Thereby, more light can be received and the sensitivity of the pixel can be improved.

Such an effect of improving the pixel sensitivity, which is obtained by the back-illuminated type configuration, can also be obtained in the light-receiving element 1 that is the back-illuminated CAPD sensor.

Furthermore, in the front-illuminated CAPD sensor, for example, a signal extraction portion 112 called tap, more specifically, a P+ semiconductor region and an N+ semiconductor region of the tap, are formed inside a PD 111 as a photoelectric conversion unit on the light incident surface on which the light from the outside is incident, as illustrated by the arrow W13. Furthermore, the front-illuminated CAPD sensor has the structure in which the wiring 113, and the wiring 114 such as a contact or a metal connected to the signal extraction portion 112 are formed on the light incident surface.

Therefore, for example, some of light obliquely entering the PD 111 at certain angles as illustrated by the arrows A25 and A26 from the outside are blocked by the wiring 113 and the like and do not enter the PD 111, and in addition, the light perpendicularly entering the PD 111 as illustrated by the arrow A27 is also blocked by the wiring 114 and does not enter the PD 111.

In contrast, for example, the back-illuminated CAPD sensor has a structure in which a signal extraction portion 116 is formed in a surface portion in a PD 115 as a photoelectric conversion unit, the surface portion being opposite to the light incident surface on which the light from the outside is incident, as illustrated by the arrow W14. Furthermore, wiring 117, and wiring 118 such as a contact or a metal connected to a signal extraction portion 116 are formed on the surface opposite to the light incident surface of the PD 115.

Here, the PD 115 corresponds to the substrate 61 illustrated in FIG. 2, and the signal extraction portion 116 corresponds to the signal extraction portion 65 illustrated in FIG. 2.

The back-illuminated CAPD sensor having such a structure can secure a sufficient aperture ratio as compared with the case of the front-illuminated CAPD sensor. Therefore, the quantum efficiency (QE)×the aperture ratio (FF) can be maximized, and the distance-measuring characteristics can be improved.

That is, for example, light obliquely entering the PD 115 at certain angles as illustrated by the arrows A28 and A29 from the outside enters the PD 115 without being blocked by the wiring. Similarly, light perpendicularly entering the PD 115 enters the PD 115 without being blocked by the wiring or the like, as illustrated by the arrow A30.

As described above, the back-illuminated CAPD sensor can receive not only the light incident at a certain angle but also the light perpendicularly entering the PD 115, which is reflected by the wiring or the like connected to the signal extraction portion (tap) in the front-illuminated CAPD sensor. Thereby, more light can be received and the sensitivity of the pixel can be improved. In other words, the quantum efficiency (QE)×the aperture ratio (FF) can be maximized, and as a result, the distance-measuring characteristics can be improved.

In particular, in the case where the tap is arranged near the center of the pixel instead of an outer edge of the pixel, the front-illuminated CAPD sensor cannot secure a sufficient aperture ratio and the sensitivity of the pixel decreases, whereas the light-receiving element 1 that is the back-illuminated CAPD sensor can secure the sufficient aperture ratio regardless of the arrangement position of the tap and can improve the pixel sensitivity.

Furthermore, in the back-illuminated light-receiving element 1, the signal extraction portion 65 is formed near the surface opposite to the light incident surface on which the infrared light from the outside is incident, in the substrate 61. Therefore, occurrence of the photoelectric conversion for the infrared light in the inactive tap region can be reduced. Thereby, the Cmod, that is, the charge separation efficiency can be improved.

FIG. 5 illustrates cross-sectional views of front-illuminated and back-illuminated CAPD sensors of pixels.

In the front-illuminated CAPD sensor on the left side in FIG. 5, an upper side of a substrate 141 in FIG. 5 is the light incident surface, and a wiring layer 152 including wiring of a plurality of layers, an inter-pixel light-shielding portion 153, and an on-chip lens 154 are stacked on the light incident surface side of the substrate 141.

In the back-illuminated CAPD sensor on the right side in FIG. 5, the wiring layer 152 including wiring of a plurality of layers is formed on a lower side of a substrate 142, which is opposite to the light incident surface in FIG. 5, and the inter-pixel light-shielding portion 153 and the on-chip lens 154 are stacked on an upper side of the substrate 142 that is the light incident surface.

Note that the gray trapezoidal shapes in FIG. 5 illustrate regions with strong light intensity due to the on-chip lens 154 condensing the infrared light.

For example, the front-illuminated CAPD sensor has a region R11 in which an inactive tap and an active tap are present on the light incident surface of the substrate 141. Therefore, when a lot of components directly enter the inactive tap and are photoelectrically converted in the inactive tap region, the signal carrier obtained by the photoelectric conversion is not detected in the N+ semiconductor region of the active tap.

In the front-illuminated CAPD sensor, the intensity of the infrared light is strong in the region R11 near the light incident surface of the substrate 141, and thus a probability that the infrared light is photoelectrically converted in the region R11 is high. That is, since the amount of infrared light entering the vicinity of the inactive tap is large, signal carriers that cannot be detected in the active tap increases, and the charge separation efficiency decreases.

In contrast, the back-illuminated CAPD sensor has a region R12 in which an inactive tap and an active tap are present at a position distant from the light incident surface of the substrate 142, that is, a position near the surface opposite to the light incident surface. Here, the substrate 142 corresponds to the substrate 61 illustrated in FIG. 2.

In this example, the region R12 is located in a portion of the surface opposite to the light incident surface of the substrate 142, and is located at the position distant from the light incident surface. Therefore, the intensity of the incident infrared light is relatively weak near the region R12.

The signal carrier obtained by the photoelectric conversion in the region with strong intensity of the infrared light, such as the region near the center of the substrate 142 and the vicinity of the light incident surface, is guided to the active tap by an electric field generated in the substrate 142 and is detected in the N+ semiconductor region of the active tap.

Meanwhile, the intensity of the incident infrared light is relatively weak near the region R12 including the inactive tap, and thus the probability that the infrared light is photoelectrically converted in the region R12 is low. That is, since the amount of infrared light entering the vicinity of the inactive tap is small, the number of signal carriers (electrons) generated by the photoelectric conversion in the vicinity of the inactive tap and move to the N+ semiconductor region of the inactive tap becomes small, and the charge separation efficiency can be improved. As a result, the distance-measuring characteristics can be improved.

Moreover, in the back-illuminated light-receiving element 1, the substrate 61 can be thinned. Therefore, efficiency of extracting electrons (charges) as signal carriers can be improved.

Figure 6:
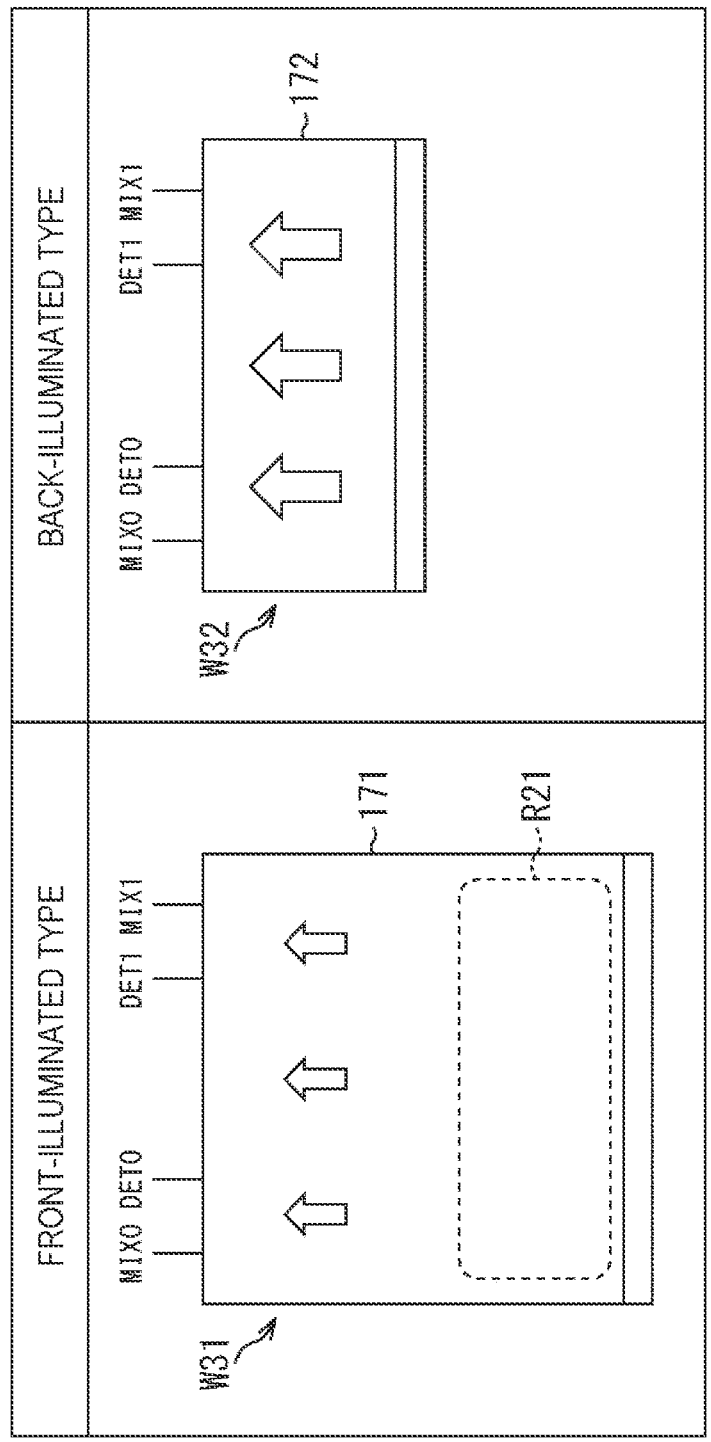
FIG. 6 is a view for describing improvement of electron extraction efficiency.

For example, since the front-illuminated CAPD sensor cannot sufficiently secure the aperture ratio, a substrate 171 needs to be thickened to some extent to secure higher quantum efficiency and suppress the decrease in the quantum efficiency×the aperture ratio, as illustrated by the arrow W31 in FIG. 6.

Then, inclination of a potential becomes gentle in the region of the substrate 171 near the surface opposite to the light incident surface, for example, in a region R21, and the electric field in the direction substantially perpendicular to the substrate 171 becomes weak. In this case, since a moving speed of the signal carrier becomes slow, the time required from the photoelectric conversion to the detection of the signal carrier in the N+ semiconductor region of the active tap becomes long. Note that, in FIG. 6, the arrows in the substrate 171 represent the electric field in the substrate 171 in the direction perpendicular to the substrate 171.

Furthermore, when the substrate 171 is thick, a moving distance of the signal carrier from the position distant from the active tap in the substrate 171 to the N+ semiconductor region in the active tap becomes long. Therefore, at the position distant from the active tap, the time required from the photoelectric conversion to the detection of the signal carrier in the N+ semiconductor region of the active tap becomes longer. FIG. 7 illustrates a relationship between the position of the substrate 171 in a thickness direction and the moving speed of the signal carrier. The region R21 corresponds to a diffusion current region.

When the substrate 171 is thick in this manner, for example, the electrons generated at the position distant from the active tap such as the region R21 cannot be completely drawn into the N+ semiconductor region of the active tap when a drive frequency is high, that is, when switching of the active tap and the inactive tap of the signal extraction portion is performed at a high speed. That is, if the time in which the tap is active is short, the electrons (charges) generated in the region R21 or the like cannot be detected in the N+ semiconductor region of the active tap, and the electron extraction efficiency decreases.

In contrast, the back-illuminated CAPD sensor can secure the sufficient aperture ratio, and thus can secure the sufficient quantum efficiency×aperture ratio even if a substrate 172 is thinned, as illustrated by the arrow W32 in FIG. 6, for example. Here, the substrate 172 corresponds to the substrate 61 in FIG. 2, and the arrows in the substrate 172 represent the electric field in the direction perpendicular to the substrate 172.

Figure 8:
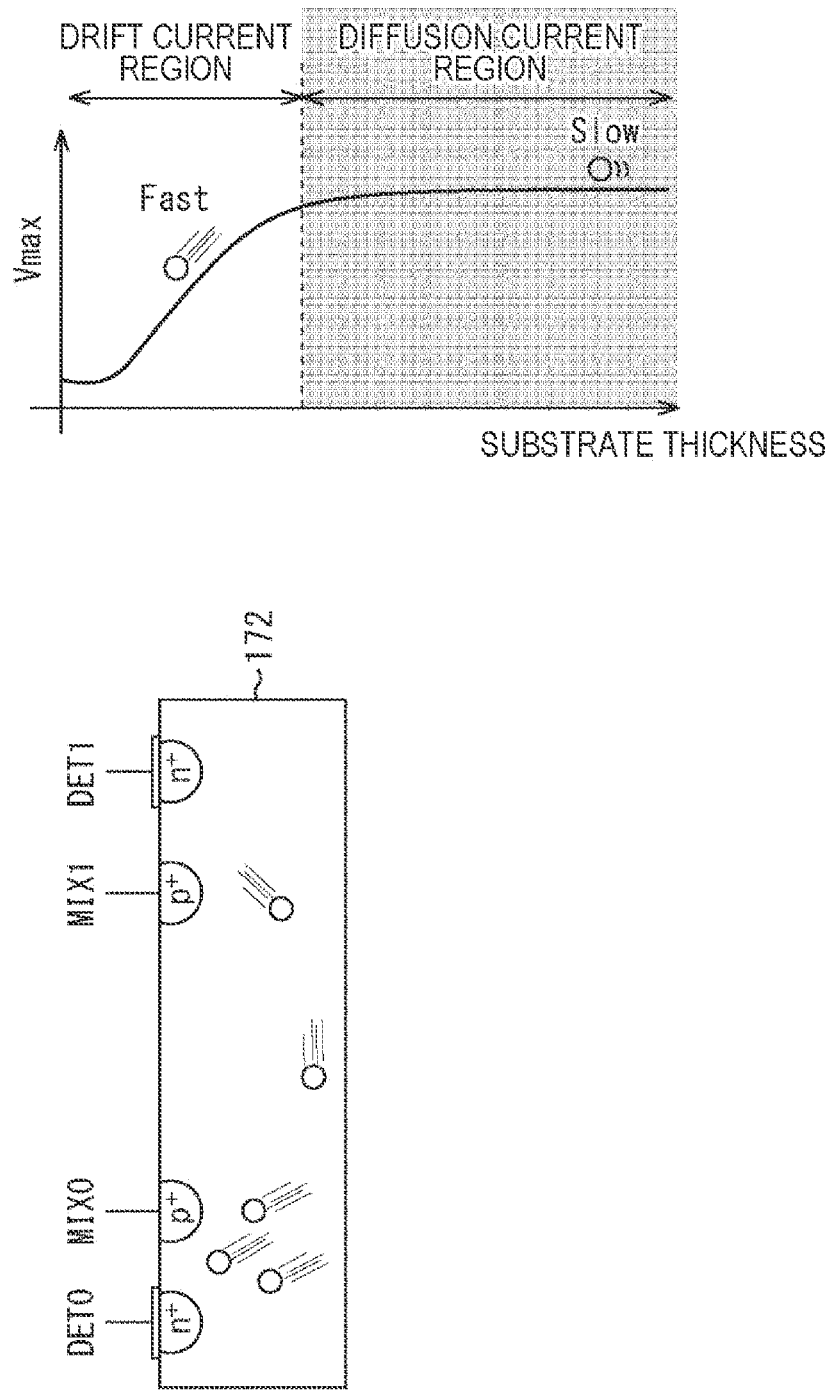
FIG. 8 is a diagram for describing a moving speed of a signal carrier in a back-illuminated type.

FIG. 8 illustrates a relationship between the position of the substrate 172 in the thickness direction and the moving speed of the signal carrier.

When the thickness of the substrate 172 in the direction perpendicular to the substrate 172 is thinned in this manner, the electric field in the direction perpendicular to the substrate 172 becomes substantially strong, and only the electrons (charges) only in a drift current region where the moving speed of the signal carrier is fast are used and the electrons in the diffusion current region where the moving speed of the signal carrier is slow are not used. By using only the electrons (charges) only in the drift current region, the time required from the photoelectric conversion to the detection of the signal carrier in the N+ semiconductor region of the active tap becomes short. Furthermore, the moving distance of the signal carrier to the N+ semiconductor region in the active tap becomes shorter as the thickness of the substrate 172 becomes thinner.

From the above facts, the back-illuminated CAPD sensor can sufficiently draw the signal carriers (electrons) generated in each region in the substrate 172 into the N+ semiconductor region of the active tap even if the drive frequency is high, and can improve the electron extraction efficiency.

Furthermore, the back-illuminated CAPD sensor can secure the electron extraction efficiency with the thinned substrate 172 even in the case of a high drive frequency and can improve high-speed drive resistance.

In particular, the back-illuminated CAPD sensor can directly apply the voltage to the substrate 172, that is, the substrate 61, and thus has a high response speed of switching the active tap and the inactive tap, and can be driven at a high drive frequency. Furthermore, since the back-illuminated CAPD sensor can directly apply the voltage to the substrate 61, a modifiable region in the substrate 61 becomes wide.

Moreover, since the back-illuminated light-receiving element 1 (CAPD sensor) can obtain the sufficient aperture ratio, the pixels can be miniaturized, and pixel miniaturization resistance can be improved.

In addition, by adopting the back-illuminated type for the light-receiving element 1, a back end of Line (BEOL) capacitance design can be liberalized, which can improve the design freedom of a saturation signal amount (Qs).

Modification 1 of First Embodiment

<Configuration Example of Pixel>

Note that, in the above description, the case where the signal extraction portion 65 in the substrate 61 has the rectangular N+ semiconductor region 71 and P+ semiconductor region 73 has been described as an example, as illustrated in FIG. 3. However, the shapes of the N+ semiconductor region 71 and the P+ semiconductor region 73 as viewed from the direction perpendicular to the substrate 61 can be any shapes.

Figure 9:
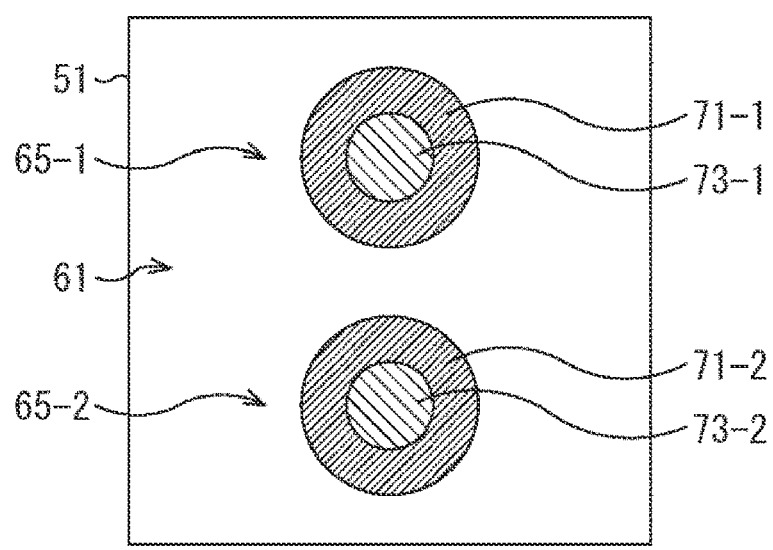
FIG. 9 is a view illustrating another configuration example of the signal extraction portion of a pixel.

Specifically, for example, as illustrated in FIG. 9, the N+ semiconductor region 71 and the P+ semiconductor region 73 can have circular shapes. Note that, in FIG. 9, a portion corresponding to the case in FIG. 3 is denoted by the same reference numeral, and description thereof is omitted as appropriate.

FIG. 9 illustrates the N+ semiconductor region 71 and the P+ semiconductor region 73 when the signal extraction portions 65 in the pixel 51 are viewed from the direction perpendicular to the substrate 61.

In the example, the oxide film 64 (not illustrated) is formed in the central portion of the pixel 51, and the signal extraction portion 65 is formed in a portion on a slightly end side from the center of the pixel 51. In particular, here, the two signal extraction portions 65 are formed in the pixel 51.

Then, in each signal extraction portion 65, the circular P+ semiconductor region 73 is formed at a center position thereof, and a periphery of the P+ semiconductor region 73 as a center is surrounded by the N+ semiconductor region 71 having a circular shape, more specifically, an annular shape.

Figure 10:
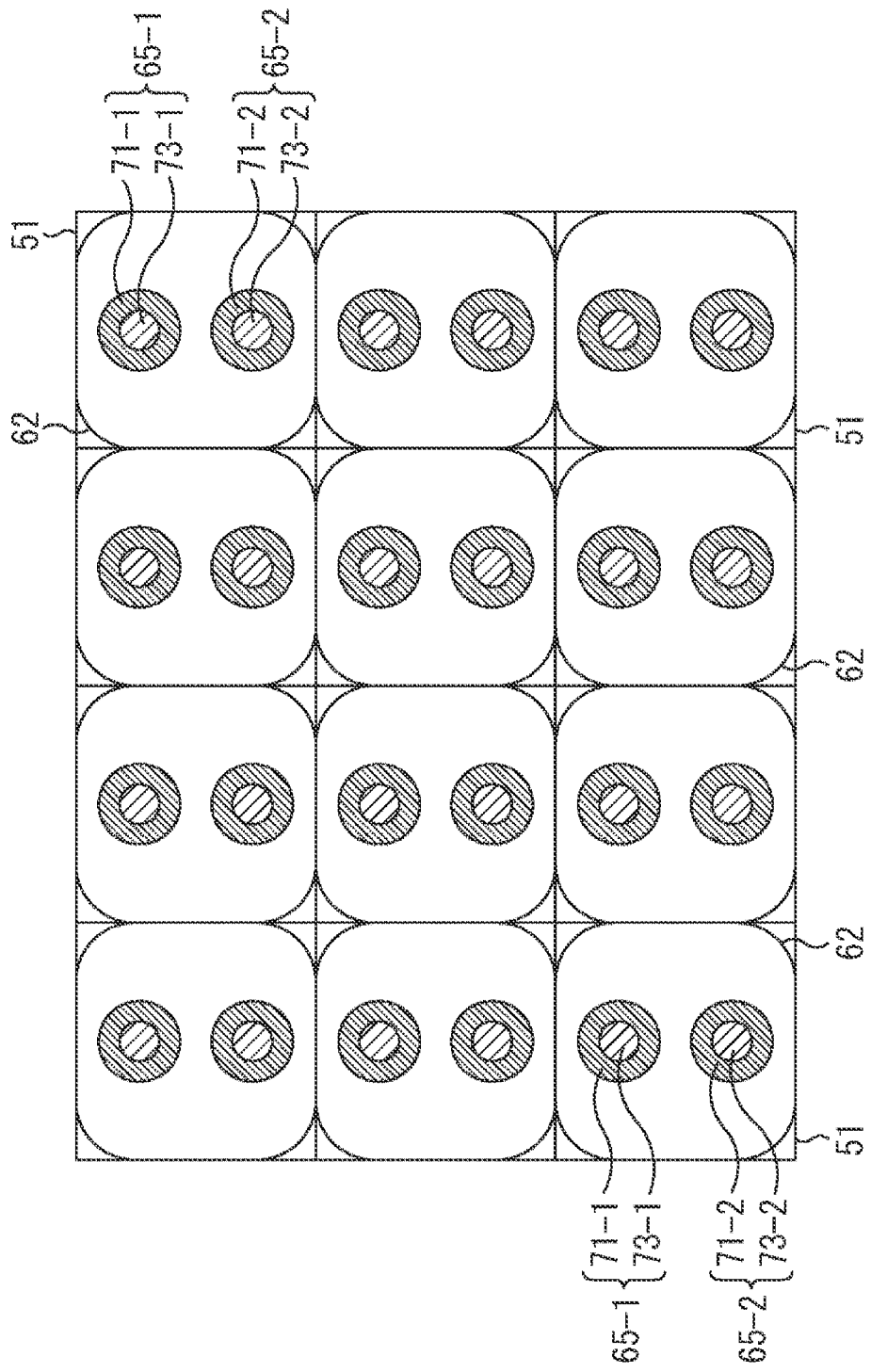
FIG. 10 is a view for describing a relationship between a pixel and an on-chip lens.

FIG. 10 is a plan view in which the on-chip lens 62 is superimposed on a part of the pixel array unit 20 having the pixels 51 each including the signal extraction portions 65 illustrated in FIG. 9 two-dimensionally arranged in a matrix.

The on-chip lens 62 is formed on a pixel basis as illustrated in FIG. 10. In other words, a unit region in which one on-chip lens 62 is formed corresponds to one pixel.

Note that, in FIG. 2, a separation portion 75 formed using an oxide film and the like is arranged between the N+ semiconductor region 71 and the P+ semiconductor region 73. However, the separation portion 75 may or may not be present.

Modification 2 of First Embodiment

<Configuration Example of Pixel>

Figure 11:
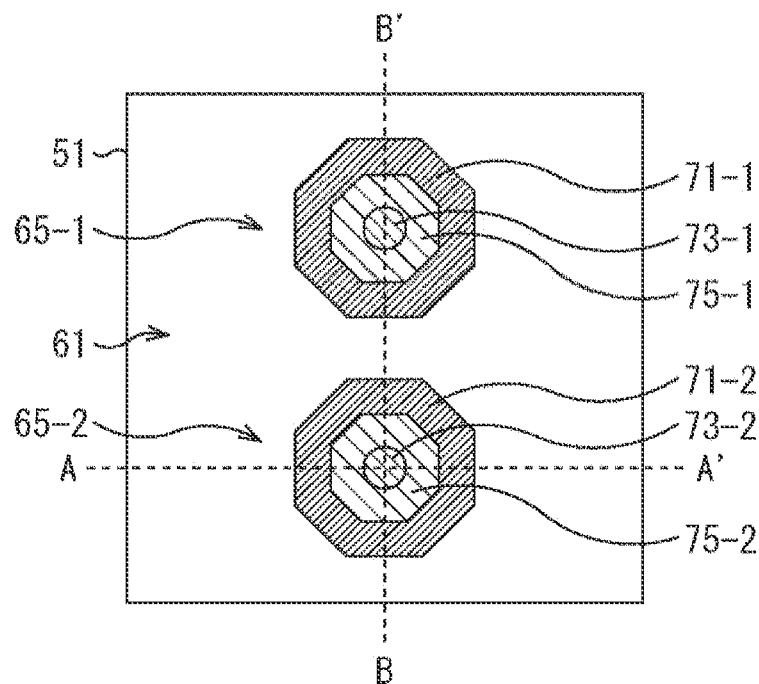
FIG. 11 is a view illustrating another configuration example of a signal extraction portion of a pixel.

FIG. 11 is a plan view illustrating a modification of the planar shape of the signal extraction portion 65 in the pixel 51.

The signal extraction portion 65 may have a shape obtained by forming the planar shape into a rectangular shape illustrated in FIG. 3, a circular shape illustrated in FIG. 9, or an octagonal shape illustrated in FIG. 11, for example.

Furthermore, FIG. 11 illustrates a plan view of a case where the separation portion 75 formed using an oxide film and the like is formed between the N+ semiconductor region 71 and the P+ semiconductor region 73.

The line A-A' illustrated in FIG. 11 represents the cross-sectional line in FIG. 37 to be described below, and the line B-B' represents the cross-sectional line in FIG. 36 to be described below.

Second Embodiment

<Configuration Example of Pixel>

Moreover, the configuration in which the P+ semiconductor region 73 is surrounded by the N+ semiconductor region 71 in the signal extraction portion 65 has been described as an example. However, an N+ semiconductor region may be surrounded by a P+ semiconductor region.

Figure 12:
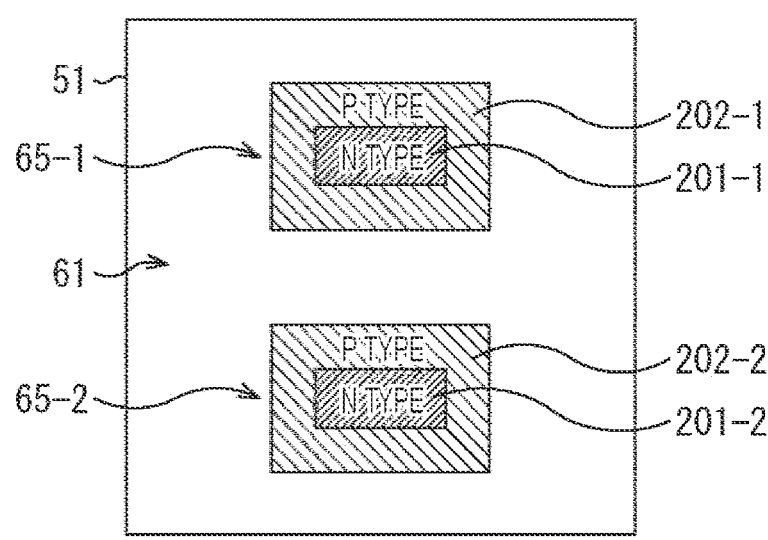
FIG. 12 is a view illustrating another configuration example of a signal extraction portion of a pixel.

In such a case, a pixel 51 is configured as illustrated in FIG. 12, for example. Note that, in FIG. 12, a portion corresponding to the case in FIG. 3 is denoted by the same reference numeral, and description thereof is omitted as appropriate.

FIG. 12 illustrates arrangement of the N+ semiconductor regions and the P+ semiconductor regions when signal extraction portions 65 in the pixel 51 are viewed from a direction perpendicular to a substrate 61.

In this example, an oxide film 64 (not illustrated) is formed in a central portion of the pixel 51, and a signal extraction portion 65-1 is formed in a slightly upper portion from the center of the pixel 51 and a signal extraction portion 65-2 is formed in a slightly lower portion from the center of the pixel 51. In particular, in this example, formation positions of the signal extraction portions 65 in the pixel 51 are the same position as in the case in FIG. 3.

In the signal extraction portion 65-1, a rectangular N+ semiconductor region 201-1 corresponding to the N+ semiconductor region 71-1 illustrated in FIG. 3 is formed in the center of the signal extraction portion 65-1. Then, the N+ semiconductor region 201-1 is surrounded by a P+ semiconductor region 202-1 having a rectangular shape, more specifically, a rectangular frame shape corresponding to the P+ semiconductor region 73-1 illustrated in FIG. 3. That is, the P+ semiconductor region 202-1 is formed to surround the N+ semiconductor region 201-1.

Similarly, in the signal extraction portion 65-2, a rectangular N+ semiconductor region 201-2 corresponding to the N+ semiconductor region 71-2 illustrated in FIG. 3 is formed in the center of the signal extraction portion 65-2. Then, the N+ semiconductor region 201-2 is surrounded by a P+ semiconductor region 202-2 having a rectangular shape, more specifically, a rectangular frame shape corresponding to the P+ semiconductor region 73-2 illustrated in FIG. 3.

Note that, hereinafter, in a case where there is no need to distinguish the N+ semiconductor region 201-1 and the N+ semiconductor region 201-2, they are also simply referred to as N+ semiconductor region (s) 201. Furthermore, hereinafter, in a case where there is no need to distinguish the P+ semiconductor region 202-1 and the P+ semiconductor region 202-2, they are also simply referred to as P+ semiconductor region (s) 202.

Even in the case where the signal extraction portions 65 have the configuration illustrated in FIG. 12, the N+ semiconductor region 201 functions as a charge detection portion for detecting an amount of signal carriers, and the P+ semiconductor region 202 functions as a voltage application portion for directly applying a voltage to the substrate 61 to generate an electric field, similarly to the case of the configuration illustrated in FIG. 3.

Modification 1 of Second Embodiment

<Configuration Example of Pixel>

Furthermore, similarly to the example illustrated in FIG. 9, the N+ semiconductor region 201 and the P+ semiconductor region 202 can have any shapes even in the case of the arrangement in which the N+ semiconductor region 201 is surrounded by the P+ semiconductor region 202.

Figure 13:
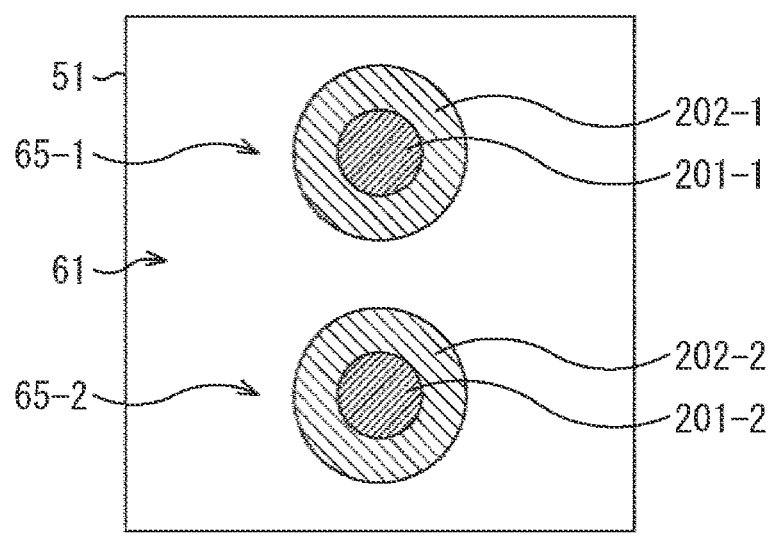
FIG. 13 is a view illustrating another configuration example of a signal extraction portion of a pixel.

That is, for example, as illustrated in FIG. 13, the N+ semiconductor region 201 and the P+ semiconductor region 202 can have circular shapes. Note that, in FIG. 13, a portion corresponding to the case in FIG. 12 is denoted by the same reference numeral, and description thereof is omitted as appropriate.

FIG. 13 illustrates an N+ semiconductor region 201 and a P+ semiconductor region 202 when signal extraction portions 65 in a pixel 51 are viewed from a direction perpendicular to a substrate 61.

In the example, the oxide film 64 (not illustrated) is formed in the central portion of the pixel 51, and the signal extraction portion 65 is formed in a portion on a slightly end side from the center of the pixel 51. In particular, here, the two signal extraction portions 65 are formed in the pixel 51.

Then, in each signal extraction portion 65, the circular N+ semiconductor region 201 is formed at a center position thereof, and a periphery of the N+ semiconductor region 201 as a center is surrounded by the P+ semiconductor region 202 having a circular shape, more specifically, an annular shape.

Third Embodiment

<Configuration Example of Pixel>

Moreover, an N+ semiconductor region and a P+ semiconductor region formed in a signal extraction portion 65 may have a line shape (rectangular shape).

Figure 14:
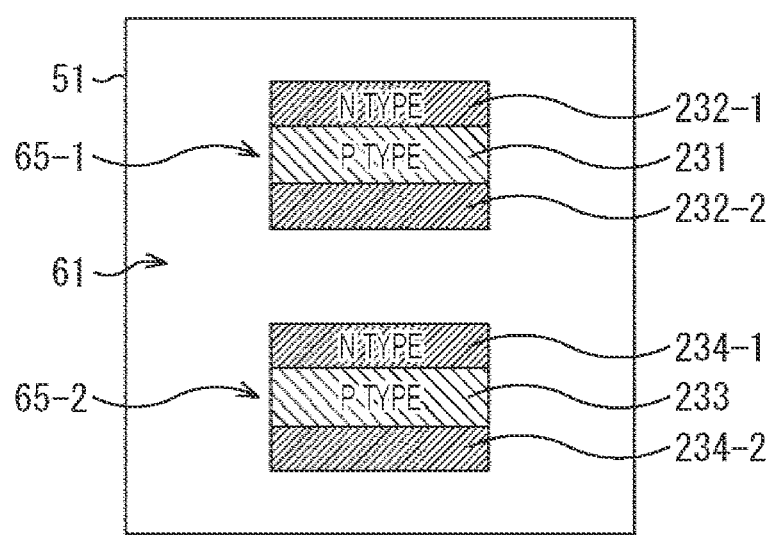
FIG. 14 is a view illustrating another configuration example of a signal extraction portion of a pixel.

In such a case, for example, a pixel 51 is configured as illustrated in FIG. 14. Note that, in FIG. 14, a portion corresponding to the case in FIG. 3 is denoted by the same reference numeral, and description thereof is omitted as appropriate.

FIG. 14 illustrates arrangement of the N+ semiconductor regions and the P+ semiconductor regions when signal extraction portions 65 in the pixel 51 are viewed from a direction perpendicular to a substrate 61.

In this example, an oxide film 64 (not illustrated) is formed in a central portion of the pixel 51, and a signal extraction portion 65-1 is formed in a slightly upper portion from the center of the pixel 51 and a signal extraction portion 65-2 is formed in a slightly lower portion from the center of the pixel 51. In particular, in this example, formation positions of the signal extraction portions 65 in the pixel 51 are the same position as in the case in FIG. 3.

In the signal extraction portion 65-1, a P+ semiconductor region 231 having a line shape corresponding to the P+ semiconductor region 73-1 illustrated in FIG. 3 is formed in the center of the signal extraction portion 65-1. Then, an N+ semiconductor region 232-1 and an N+ semiconductor region 232-2 having a line shape corresponding to the N+ semiconductor region 71-1 illustrated in FIG. 3 are formed around the P+ semiconductor region 231 to sandwich the P+ semiconductor region 231. That is, the P+ semiconductor region 231 is formed at a position sandwiched by the N+ semiconductor region 232-1 and the N+ semiconductor region 232-2.

Note that, hereinafter, in a case where there is no need to distinguish the N+ semiconductor region 232-1 and the N+ semiconductor region 232-2, they are also simply referred to as N+ semiconductor region (s) 232.

FIG. 3 illustrates the example of the structure in which the P+ semiconductor region 73 is surrounded by the N+ semiconductor region 71. However, FIG. 14 illustrates an example of a structure in which the P+ semiconductor region 231 is sandwiched by the adjacently provided two N+ semiconductor regions 232.

Similarly, In the signal extraction portion 65-2, a P+ semiconductor region 233 having a line shape corresponding to the P+ semiconductor region 73-2 illustrated in FIG. 3 is formed in the center of the signal extraction portion 65-2. Then, an N+ semiconductor region 234-1 and an N+ semiconductor region 234-2 having a line shape corresponding to the N+ semiconductor region 71-2 illustrated in FIG. 3 are formed around the P+ semiconductor region 233 to sandwich the P+ semiconductor region 233.

Note that, hereinafter, in a case where there is no need to distinguish the N+ semiconductor region 234-1 and the N+ semiconductor region 234-2, they are also simply referred to as N+ semiconductor region (s) 234.

In the signal extraction portions 65 in FIG. 14, the P+ semiconductor region 231 and the P+ semiconductor region 233 function as voltage application portions corresponding to the P+ semiconductor regions 73 illustrated in FIG. 3, and the N+ semiconductor regions 232 and the N+ semiconductor regions 234 function as charge detection portions corresponding to the N+ semiconductor regions 71 illustrated in FIG. 3. In this case, for example, both the N+ semiconductor region 232-1 and the N+ semiconductor region 232-2 are connected to an FD portion A.

Furthermore, each of the P+ semiconductor region 231, the N+ semiconductor regions 232, the P+ semiconductor region 233, and the N+ semiconductor regions 234 having the line shape may have any length in a cross direction in FIG. 14, or each of these regions may not have the same length.

Fourth Embodiment

<Configuration Example of Pixel>

Moreover, in the example illustrated in FIG. 14, the structure in which the P+ semiconductor region 231 and the P+ semiconductor region 233 are sandwiched by the N+ semiconductor regions 232 and the N+ semiconductor regions 234 has been described as an example. However, conversely, an N+ semiconductor region may be sandwiched by P+ semiconductor regions.

Figure 15:
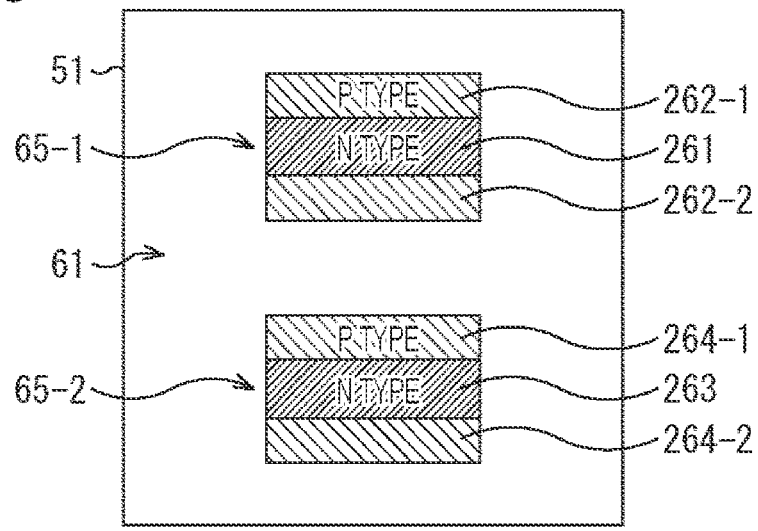
FIG. 15 is a view illustrating another configuration example of a signal extraction portion of a pixel.

In such a case, for example, a pixel 51 is configured as illustrated in FIG. 15. Note that, in FIG. 15, a portion corresponding to the case in FIG. 3 is denoted by the same reference numeral, and description thereof is omitted as appropriate.

FIG. 15 illustrates arrangement of the N+ semiconductor regions and the P+ semiconductor regions when signal extraction portions 65 in a pixel 51 are viewed from a direction perpendicular to a substrate 61.

In the example, the oxide film 64 (not illustrated) is formed in the central portion of the pixel 51, and the signal extraction portion 65 is formed in a portion on a slightly end side from the center of the pixel 51. In particular, in this example, formation positions of each of the two signal extraction portions 65 in the pixel 51 are the same position as in the case in FIG. 3.

In a signal extraction portion 65-1, an N+ semiconductor region 261 having a line shape corresponding to the N+ semiconductor region 71-1 illustrated in FIG. 3 is formed in the center of the signal extraction portion 65-1. Then, a P+ semiconductor region 262-1 and a P+ semiconductor region 262-2 having a line shape corresponding to the P+ semiconductor region 73-1 illustrated in FIG. 3 are formed around the N+ semiconductor region 261 to sandwich the N+ semiconductor region 261. That is, the N+ semiconductor region 261 is formed at a position sandwiched by the P+ semiconductor region 262-1 and the P+ semiconductor region 262-2.

Note that, hereinafter, in a case where there is no need to distinguish the P+ semiconductor region 262-1 and the P+ semiconductor region 262-2, they are also simply referred to as P+ semiconductor region (s) 262.

Similarly, in a signal extraction portion 65-2, an N+ semiconductor region 263 having a line shape corresponding to the N+ semiconductor region 71-2 illustrated in FIG. 3 is formed in the center of the signal extraction portion 65-2. Then, a P+ semiconductor region 264-1 and a P+ semiconductor region 264-2 having a line shape corresponding to the P+ semiconductor region 73-2 illustrated in FIG. 3 are formed around the N+ semiconductor region 263 to sandwich the N+ semiconductor region 263.

Note that, hereinafter, in a case where there is no need to distinguish the P+ semiconductor region 264-1 and the P+ semiconductor region 264-2, they are also simply referred to as P+ semiconductor region (s) 264.

In the signal extraction portions 65 in FIG. 15, the P+ semiconductor region 262 and the P+ semiconductor region 264 function as voltage application portions corresponding to the P+ semiconductor regions 73 illustrated in FIG. 3, and the N+ semiconductor regions 261 and the N+ semiconductor regions 263 function as charge detection portions corresponding to the N+ semiconductor regions 71 illustrated in FIG. 3. Note that, each of the N+ semiconductor region 261, the P+ semiconductor regions 262, the N+ semiconductor region 263, and the P+ semiconductor regions 264 having the line shape may have any length in a cross direction in FIG. 15, or each of these regions may not have the same length.

Fifth Embodiment

<Configuration Example of Pixel>

Moreover, in the above description, the examples in which two signal extraction portions 65 are provided in each pixel constituting the pixel array unit 20 have been described. However, the number of signal extraction portions provided in a pixel may be one, or may be three or more.

Figure 16:
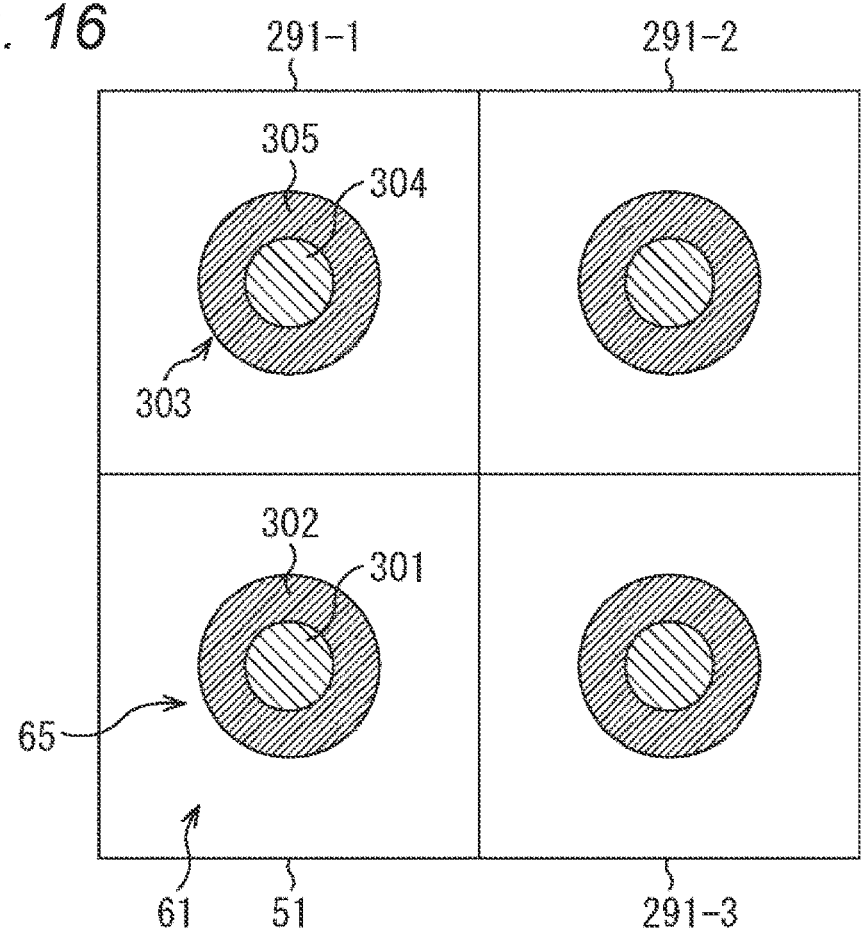
FIG. 16 is a view illustrating another configuration example of the pixel.

In a case where one signal extraction portion is formed in a pixel 51, for example, the pixel is configured as illustrated in FIG. 16 or the like. Note that, in FIG. 16, a portion corresponding to the case in FIG. 3 is denoted by the same reference numeral, and description thereof is omitted as appropriate.

FIG. 16 illustrates arrangement of N+ semiconductor regions and P+ semiconductor regions when signal extraction portions in some pixels provided in a pixel array unit 20 are viewed from a direction perpendicular to a substrate.

In this example, the pixel 51 provided in the pixel array unit 20, and pixels 291-1 to 291-3 distinguishably denoted as pixels 51 adjacent to the aforementioned pixel 51, and one signal extraction portion is formed in each pixel.

That is, in the pixel 51, one signal extraction portion 65 is formed in a central portion of the pixel 51. Then, in the signal extraction portion 65, a circular P+ semiconductor region 301 is formed at a center position thereof, and a periphery of the P+ semiconductor region 301 as a center is surrounded by an N+ semiconductor region 302 having a circular shape, more specifically, an annular shape.

Here, the P+ semiconductor region 301 corresponds to the P+ semiconductor region 73 illustrated in FIG. 3 and functions as a voltage application portion. Furthermore, the N+ semiconductor region 302 corresponds to the N+ semiconductor region 71 illustrated in FIG. 3 and functions as a charge detection portion. Note that the P+ semiconductor region 301 and the N+ semiconductor region 302 may have any shapes.

Furthermore, the pixels 291-1 to 291-3 around the pixel 51 have a similar structure to the pixel 51.

That is, for example, one signal extraction portion 303 is formed in the central portion of the pixel 291-1. Then, in the signal extraction portion 303, a circular P+ semiconductor region 304 is formed at a center position thereof, and a periphery of the P+ semiconductor region 304 as a center is surrounded by an N+ semiconductor region 305 having a circular shape, more specifically, an annular shape.

The P+ semiconductor region 304 and N+ semiconductor region 305 correspond to the P+ semiconductor region 301 and the N+ semiconductor region 302, respectively.

Note that, hereinafter, in a case where there is no need to distinguish the pixels 291-1 to 291-3, they are also simply referred to as pixel (s) 291.

In the case where one signal extraction portion (tap) is formed for each pixel in this way, distance information is calculated on the basis of pixel signals obtained for some pixels adjacent to one another when trying to measure the distance to an object by an indirect ToF method.

Focusing on the pixel 51, for example, in a state where the signal extraction portion 65 of the pixel 51 is an active tap, some pixels 291 adjacent to the pixel 51, including, for example, the pixel 291-1, are each driven such that the signal extraction portions 303 of the pixels 291 serve as inactive taps.

As an example, the signal extraction portions of the pixels 51 adjacent above, below, right, or left in FIG. 16, such as the pixel 291-1 and the pixel 291-3, are driven to serve as the inactive taps.

Thereafter, when a voltage to be applied is switched to set the signal extraction portion 65 of the pixel 51 to be the inactive tap, then next, the signal extraction portions 303 of some pixels 291 adjacent to the pixel 51, including the pixel 291-1, are driven to serve as the active taps.

Then, the distance information is calculated on the basis of a pixel signal read from the signal extraction portion 65 in the state where the signal extraction portion 65 is the active tap, and a pixel signal read from the signal extraction portion 303 in the state where the signal extraction portion 303 is the active tap.

Even in the case where the number of signal extraction portions (taps) provided in the pixel is one, the distance can be measured by the indirect ToF method using the pixels adjacent to one another.

Sixth Embodiment

<Configuration Example of Pixel>

Furthermore, three or more signal extraction portions (taps) may be provided in each pixel, as described above.

Figure 17:
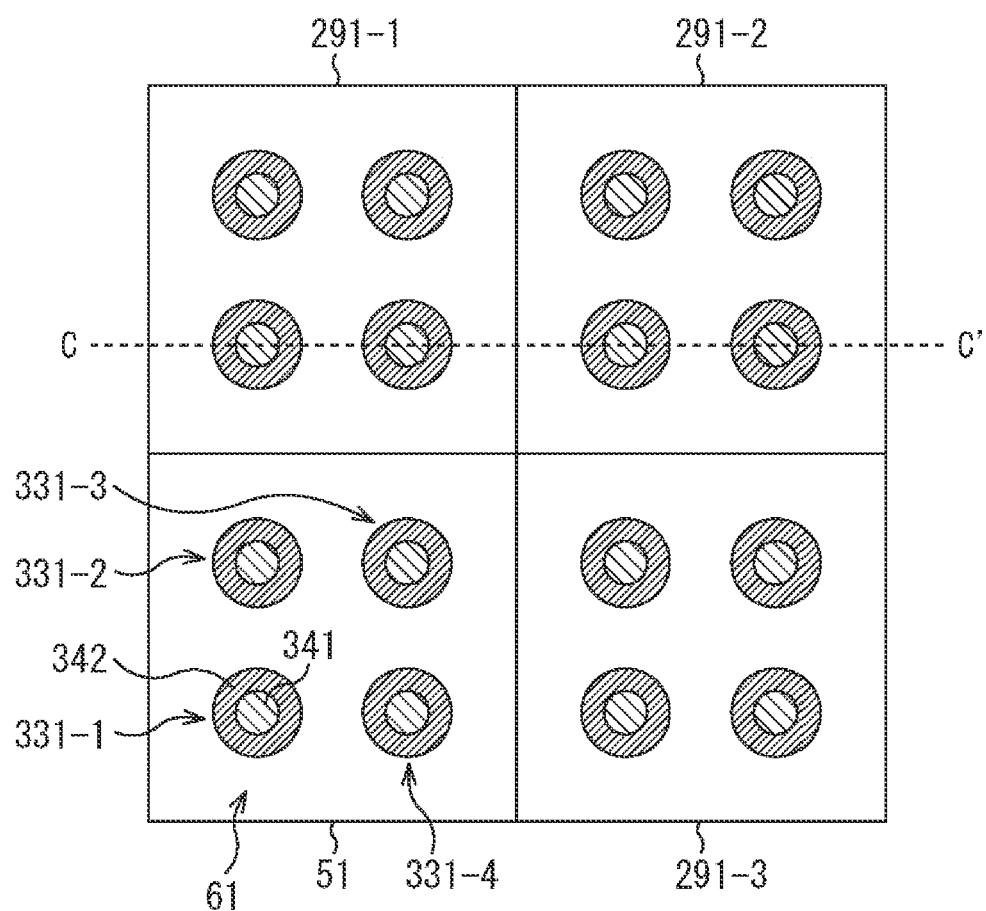
FIG. 17 is a view illustrating another configuration example of the pixel.

In a case where four signal extraction portions (taps) are provided in a pixel, for example, each pixel in a pixel array unit 20 is configured as illustrated in FIG. 17. Note that, in FIG. 17, a portion corresponding to the case in FIG. 16 is denoted by the same reference numeral, and description thereof is omitted as appropriate.

FIG. 17 illustrates arrangement of N+ semiconductor regions and P+ semiconductor regions when signal extraction portions in some pixels provided in the pixel array unit 20 are viewed from a direction perpendicular to a substrate.

Figure 36:
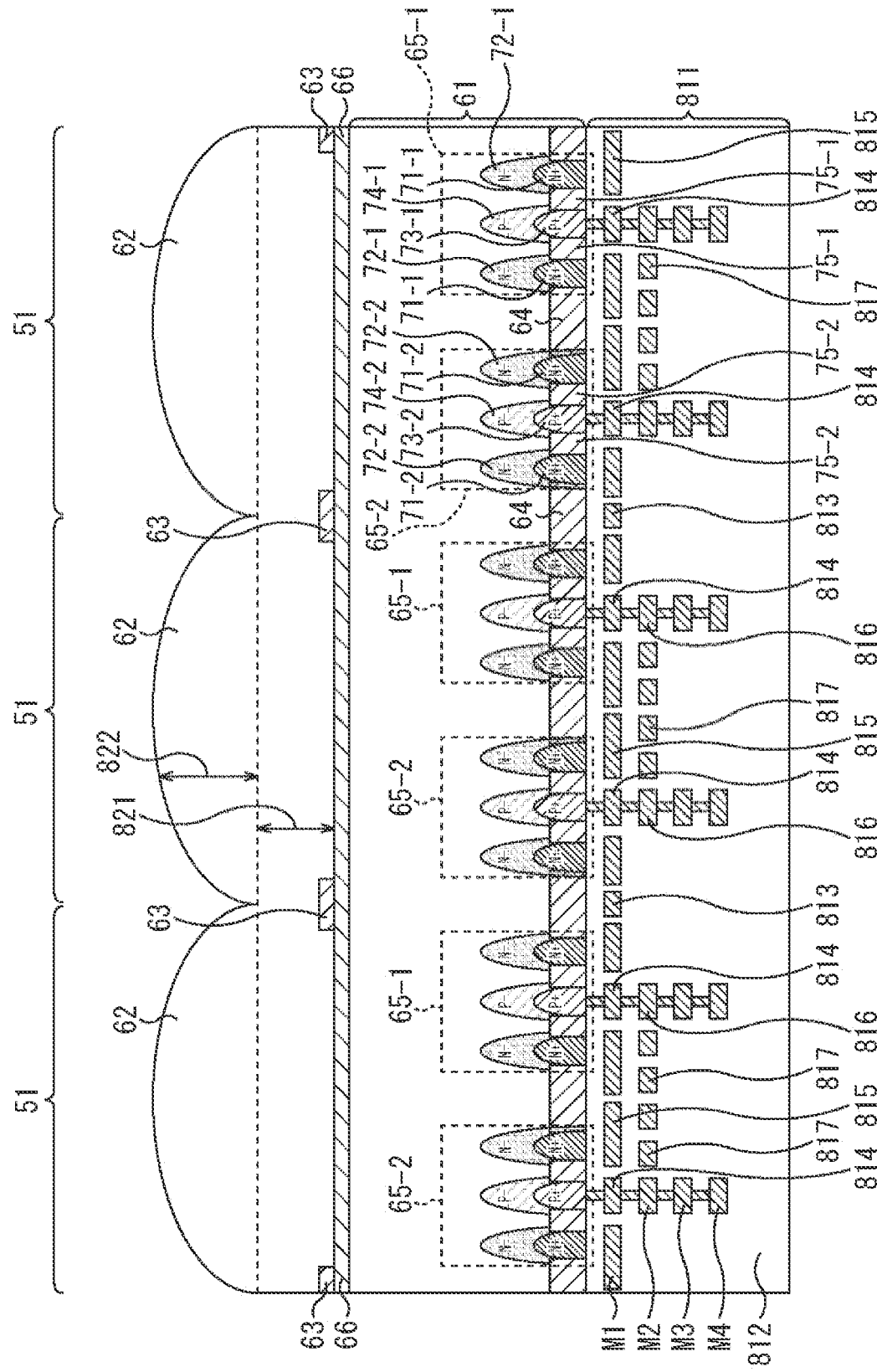
FIG. 36 is a cross-sectional view of a plurality of pixels in a fourteenth embodiment.

The cross-sectional view cut by the line C-C' illustrated in FIG. 17 is as illustrated in FIG. 36 to be described below.

In this example, a pixel 51 and pixels 291 provided in the pixel array unit 20 are illustrated, and four signal extraction portions are formed in each of the pixels.

That is, in pixel 51, a signal extraction portion 331-1, a signal extraction portion 331-2, a signal extraction portion 331-3, and a signal extraction portion 331-4 are formed at positions between a center of the pixel 51 and end portions of the pixel 51, that is, at a lower left position, an upper left position, an upper right position, and a lower right position with respect to the center of the pixel 51 in FIG. 17.

These signal extraction portions 331-1 to 331-4 correspond to the signal extraction portions 65 illustrated in FIG. 16.

For example, in the signal extraction portion 331-1, a circular P+ semiconductor region 341 is formed at a center position thereof, and a periphery of the P+ semiconductor region 341 as a center is surrounded by an N+ semiconductor region 342 having a circular shape, more specifically, an annular shape.

Here, the P+ semiconductor region 341 corresponds to the P+ semiconductor region 301 illustrated in FIG. 16 and functions as a voltage application portion. Furthermore, the N+ semiconductor region 342 corresponds to the N+ semiconductor region 302 illustrated in FIG. 16 and functions as a charge detection portion. Note that the P+ semiconductor region 341 and the N+ semiconductor region 342 may have any shapes.

Furthermore, the signal extraction portions 331-2 to 331-4 have a configuration similar to the signal extraction portion 331-1, and each includes the P+ semiconductor region that functions as a voltage application portion and the N+ semiconductor region that functions as a charge detection portion. Moreover, the pixels 291 formed around the pixel 51 have a similar structure to the pixel 51.

Note that, hereinafter, in a case where there is no need to distinguish the signal extraction portions 331-1 to 331-4, they are also simply referred to as signal extraction portion (s) 331.

In the case where four signal extraction portions are provided in each pixel, as described above, distance information is calculated using the four signal extraction portions in the pixel at the time of measuring a distance by an indirect ToF method, for example.

Focusing on the pixel 51 as an example, in a state where the signal extraction portions 331-1 and 331-3 are active taps, the pixel 51 is driven such that the signal extraction portions 331-2 and 331-4 serve as inactive taps.

Thereafter, a voltage to be applied to each signal extraction portion 331 is switched. That is, the pixel 51 is driven such that the signal extraction portions 331-1 and 331-3 serve as inactive taps, and the signal extraction portions 331-2 and 331-4 serve as active taps.

Then, the distance information is calculated on the basis of pixel signals read from the signal extraction portions 331-1 and 331-3 in the state where the signal extraction portions 331-1 and 331-3 are the active taps, and pixel signals read from the signal extraction portions 331-2 and 331-4 in the state where the signal extraction portions 331-2 and 331-4 are the active taps.

Seventh Embodiment

<Configuration Example of Pixel>

Moreover, a signal extraction portion (tap) may be shared between pixels adjacent to each other of a pixel array unit 20.

Figure 18:
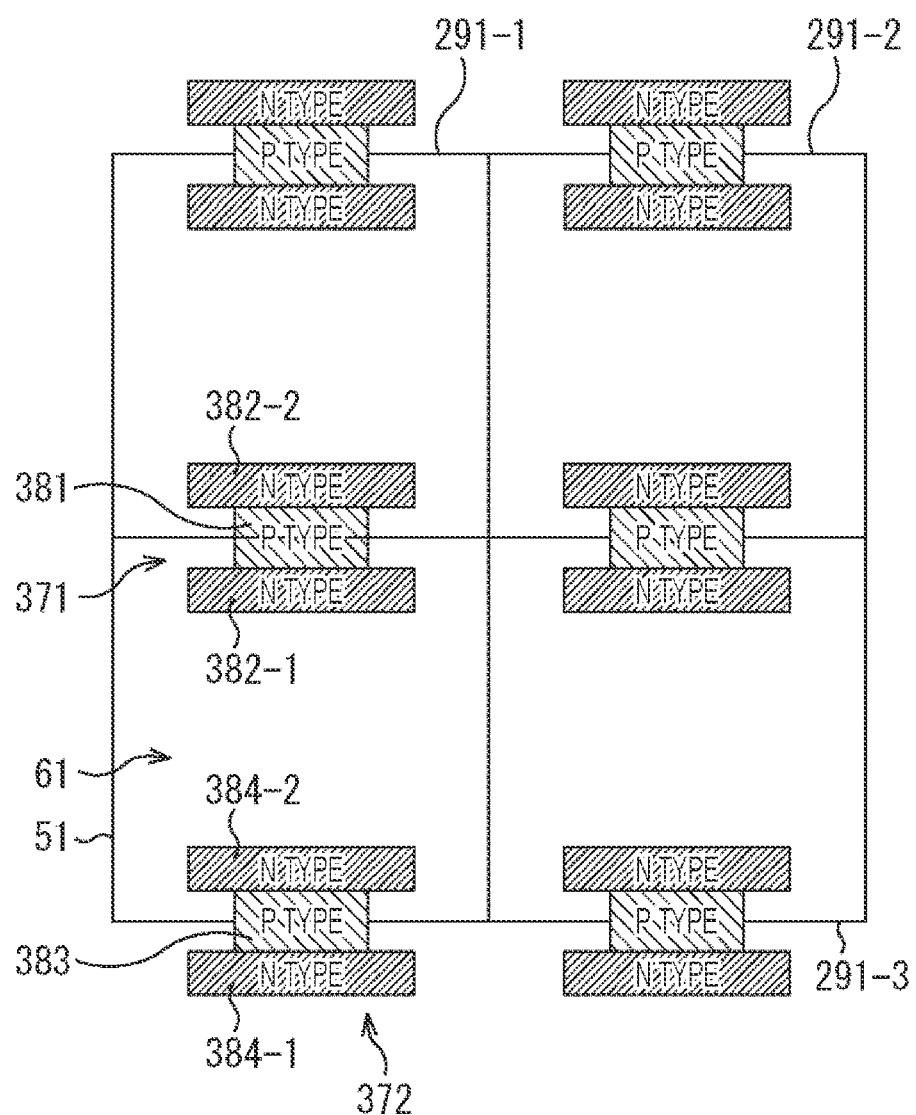
FIG. 18 is a view illustrating another configuration example of the pixel.

In such a case, each pixel in the pixel array unit 20 is configured as illustrated in FIG. 18, for example. Note that, in FIG. 18, a portion corresponding to the case in FIG. 16 is denoted by the same reference numeral, and description thereof is omitted as appropriate.

FIG. 18 illustrates arrangement of N+ semiconductor regions and P+ semiconductor regions when signal extraction portions in some pixels provided in the pixel array unit 20 are viewed from a direction perpendicular to a substrate.

In this example, a pixel 51 and pixels 291 provided in the pixel array unit 20 are illustrated, and two signal extraction portions are formed in each of the pixels.

For example, in the pixel 51, a signal extraction portion 371 is formed in an upper end portion in FIG. 18 of the pixel 51, and a signal extraction portion 372 is formed in a lower end portion in FIG. 18 of the pixel 51.

The signal extraction portion 371 is shared by the pixel 51 and the pixel 291-1. That is, the signal extraction portion 371 is used as a tap of the pixel 51 and is also used as a tap of the pixel 291-1. Furthermore, the signal extraction portion 372 is shared by the pixel 51 and a lower pixel (not illustrated) adjacent to the pixel 51 in FIG. 18.

A P+ semiconductor region 381 having a line shape corresponding to the P+ semiconductor region 231 illustrated in FIG. 14 is formed in a center position in the signal extraction portion 371. Then, an N+ semiconductor region 382-1 and an N+ semiconductor region 382-2 having a line shape corresponding to the N+ semiconductor regions 232 illustrated in FIG. 14 are formed at upper and lower positions in FIG. 18 of the P+ semiconductor region 381 to sandwich the P+ semiconductor region 381.

In particular, in this example, the P+ semiconductor region 381 is formed at a boundary portion between the pixel 51 and the pixel 291-1. Furthermore, the N+ semiconductor region 382-1 is formed in the region in the pixel 51, and the N+ semiconductor region 382-2 is formed in the region in the pixel 291-1.

Here, the P+ semiconductor region 381 functions as a voltage application portion, and the N+ semiconductor region 382-1 and the N+ semiconductor region 382-2 function as charge detection portions. Note that, hereinafter, in a case where there is no need to distinguish the N+ semiconductor region 382-1 and the N+ semiconductor region 382-2, they are also simply referred to as N+ semiconductor region (s) 382.

Furthermore, the P+ semiconductor region 381 and the N+ semiconductor region 382 may have any shapes. Further, the N+ semiconductor region 382-1 and the N+ semiconductor region 382-2 may be connected to the same FD portion or may be connected to different FD portions.

A P+ semiconductor region 383, an N+ semiconductor region 384-1, and an N+ semiconductor region 384-2 having a line shape are formed in the signal extraction portion 372.

The P+ semiconductor region 383, N+ semiconductor region 384-1, and N+ semiconductor region 384-2 correspond to the P+ semiconductor region 381, the N+ semiconductor region 382-1, and the N+ semiconductor region 382-2, respectively, and have similar arrangement, shapes, and functions. Note that, hereinafter, in a case where there is no need to distinguish the N+ semiconductor region 384-1 and the N+ semiconductor region 384-2, they are also simply referred to as N+ semiconductor region (s) 384.

As described above, even in the case where the signal extraction portion (tap) is shared between adjacent pixels, the distance can be measured by an indirect ToF method, by an operation similar to the example illustrated in FIG. 3.

In the case where the signal extraction portion is shared between pixels as illustrated in FIG. 18, the distance between a pair of P+ semiconductor regions for generating an electric field, that is, a current, such as the distance between the P+ semiconductor region 381 and the P+ semiconductor region 383, becomes long. In other words, the distance between the P+ semiconductor regions can be maximized by causing the pixels to share the signal extraction portion.

Thereby, the current is less easily flow between the P+ semiconductor regions, and thus power consumption of the pixel can be reduced, and the pixel can be advantageously miniaturized.

Note that, here, the example in which one signal extraction portion is shared by the two pixels adjacent to each other has been described. However, one signal extraction portion may be shared by three or more pixels adjacent to one another. Furthermore, in the case where the signal extraction portion is shared by two or more pixels adjacent to one another, only the charge detection portion for detecting a signal carrier may be shared or only the voltage application portion for generating an electric field of the signal extraction portion may be shared.

Eighth Embodiment

<Configuration Example of Pixel>

Moreover, an on-chip lens and an inter-pixel light-shielding portion provided in each pixel such as a pixel 51 of a pixel array unit 20 may not be particularly provided.

Figure 19:
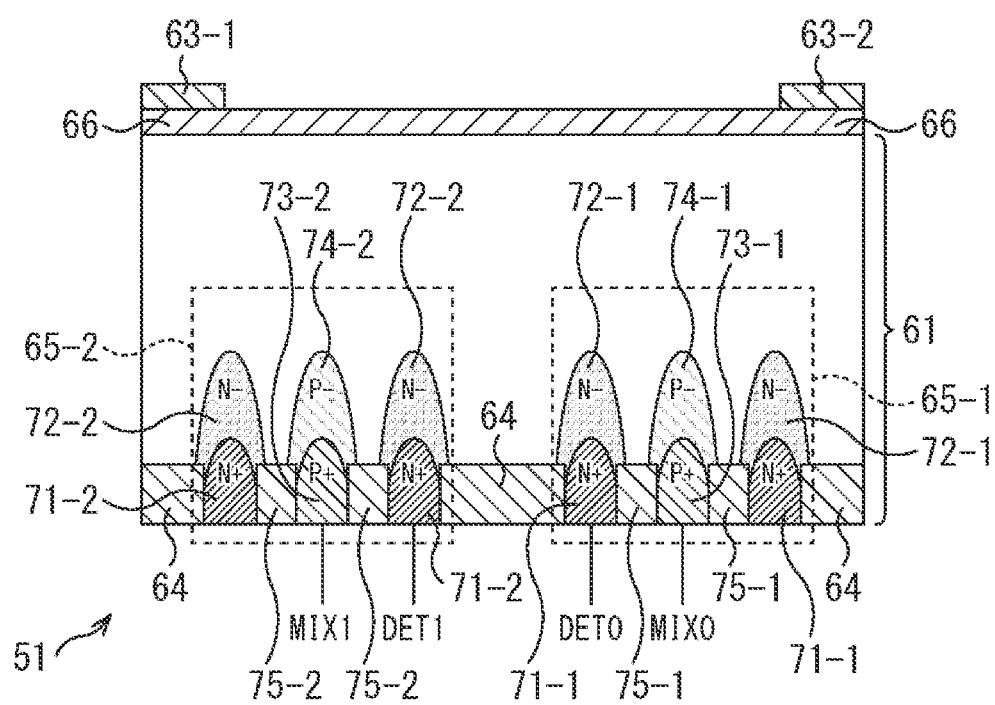
FIG. 19 is a view illustrating another configuration example of the pixel.

Specifically, for example, the pixel 51 can be configured as illustrated in FIG. 19. Note that, in FIG. 19, a portion corresponding to the case in FIG. 2 is denoted by the same reference numeral, and description thereof is omitted as appropriate.

The configuration of the pixel 51 illustrated in FIG. 19 is different from that of the pixel 51 illustrated in FIG. 2 in that no on-chip lens 62 is provided, and is the same as that of the pixel 51 in FIG. 2 in the other points.

Since the on-chip lens 62 is not provided on a light incident surface of a substrate 61 in the pixel 51 illustrated in FIG. 19, attenuation of infrared light entering the substrate 61 from an outside can be further reduced. Thereby, the amount of infrared light receivable by the substrate 61 increases, and sensitivity of the pixel 51 can be improved.

Modification 1 of Eighth Embodiment

<Configuration Example of Pixel>

Figure 20:
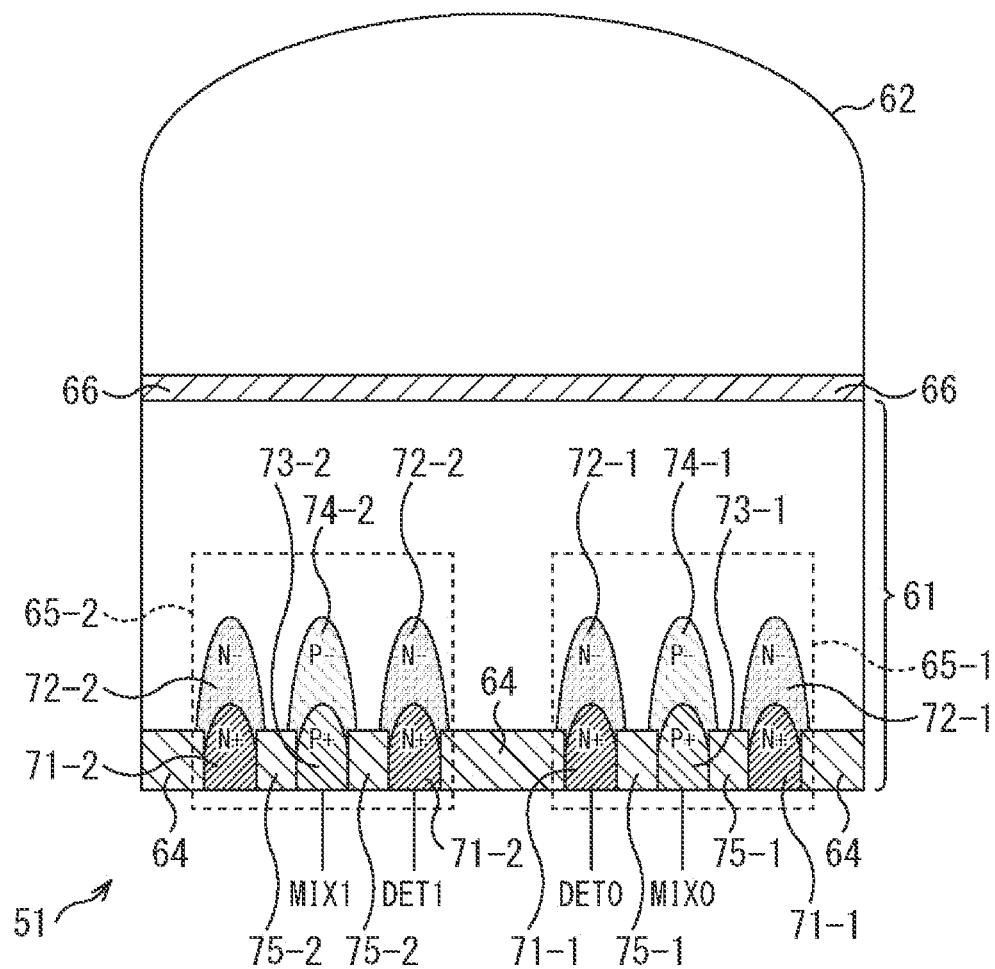
FIG. 20 is a view illustrating another configuration example of the pixel.

Furthermore, the pixel 51 may be configured as illustrated in FIG. 20, for example. Note that, in FIG. 20, a portion corresponding to the case in FIG. 2 is denoted by the same reference numeral, and description thereof is omitted as appropriate.

The configuration of the pixel 51 illustrated in FIG. 20 is different from that of the pixel 51 illustrated in FIG. 2 in that no inter-pixel light-shielding film 63-1 and inter-pixel light-shielding film 63-2 are provided, and is the same as that of the pixel 51 in FIG. 2 in the other points.

In the example illustrated in FIG. 20, crosstalk suppression effect is reduced because the inter-pixel light-shielding films 63 are not provided on the light incident surface of the substrate 61 but the infrared light, which is shielded by the inter-pixel light-shielding films 63, becomes incident on the substrate 61 and thus the sensitivity of the pixel 51 can be improved.

Note that neither on-chip lens 62 nor inter-pixel light-shielding films 63 may be provided in the pixel 51.

Modification 2 of Eighth Embodiment

<Configuration Example of Pixel>

Figure 21:
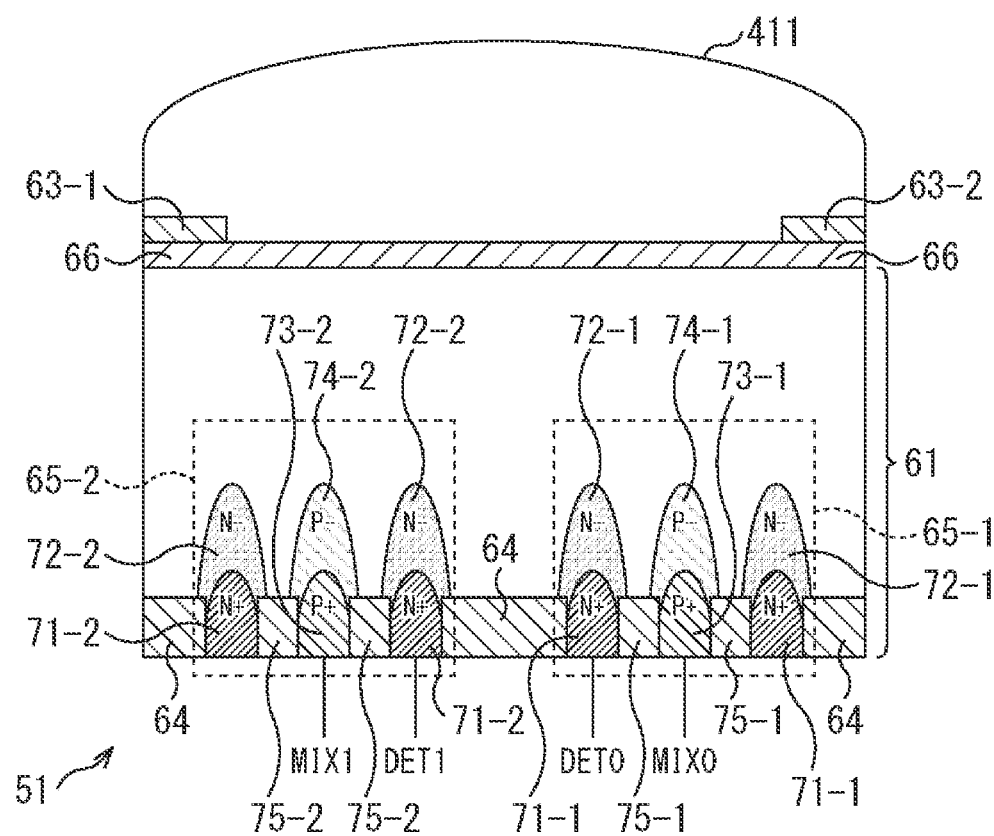
FIG. 21 is a view illustrating another configuration example of the pixel.

In addition, the thickness of the on-chip lens in an optical axis direction may be optimized, as illustrated in FIG. 21, for example. Note that, in FIG. 21, a portion corresponding to the case in FIG. 2 is denoted by the same reference numeral, and description thereof is omitted as appropriate.

The configuration of the pixel 51 illustrated in FIG. 21 is different from that of the pixel 51 illustrated in FIG. 2 in that an on-chip lens 411 is provided instead of the on-chip lens 62, and is the same as that of the pixel 51 in FIG. 2 in the other points.

In the pixel 51 illustrated in FIG. 21, the on-chip lens 411 is formed on the light incident surface of the substrate 61, that is, on an upper side in FIG. 21. The on-chip lens 411 is smaller in thickness in the optical axis direction than the on-chip lens 62 illustrated in FIG. 2, that is, the on-chip lens 411 is thin in the vertical direction in FIG. 21.

In general, the thicker the on-chip lens provided on the surface of the substrate 61, the more advantageous for condensing light entering the on-chip lens. However, by making the on-chip lens 411 thinner, transmittance becomes high and can improve the sensitivity of the pixel 51. Therefore, the thickness of the on-chip lens 411 can be appropriately determined according to the thickness of the substrate 61, the position to which the infrared light is condensed, or the like.

Ninth Embodiment

<Configuration Example of Pixel>

Moreover, a separation region for improving separation characteristics between adjacent pixels and suppressing crosstalk may be provided between pixels formed in a pixel array unit 20.

Figure 22:
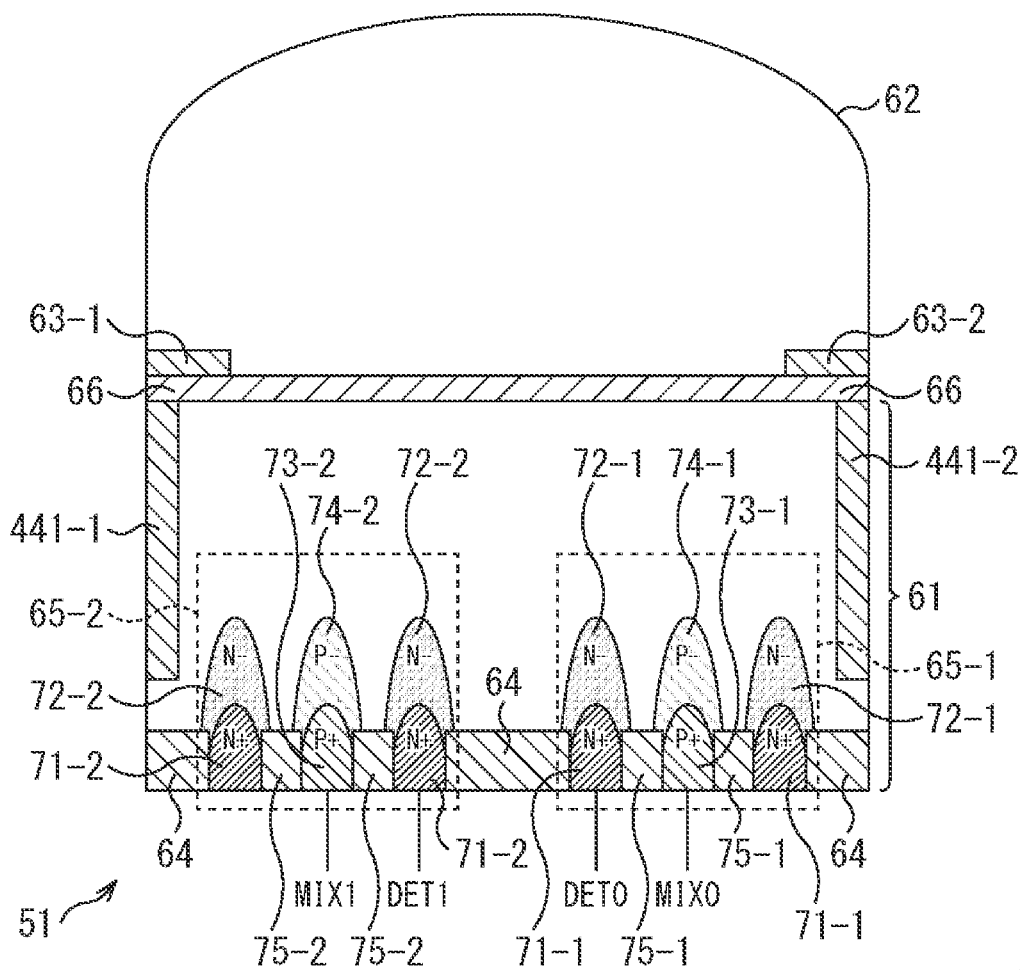
FIG. 22 is a view illustrating another configuration example of the pixel.

In such a case, a pixel 51 is configured as illustrated in FIG. 22, for example. Note that, in FIG. 22, a portion corresponding to the case in FIG. 2 is denoted by the same reference numeral, and description thereof is omitted as appropriate.

The configuration of the pixel 51 illustrated in FIG. 22 is different from that of the pixel 51 illustrated in FIG. 2 in that a separation region 441-1 and a separation region 441-2 are provided in a substrate 61, and is the same as that of the pixel 51 in FIG. 2 in the other points.

In the pixel 51 illustrated in FIG. 22, the separation region 441-1 and the separation region 441-2 for separating adjacent pixels are formed using a light-shielding film and the like in a boundary portion in the substrate 61 between the pixel 51 and another pixel adjacent to the pixel 51, that is, in right and left end portions in FIG. 22 of the pixel 51. Note that, hereinafter, in a case where there is no need to distinguish the separation region 441-1 and the separation region 441-2, they are also simply referred to as separation region (s) 441.

For example, at the time of forming the separation region 441, a long groove (trench) is formed in the substrate 61 with a predetermined depth downward (a direction perpendicular to a surface of the substrate 61) in FIG. 22 from a light incident surface of the substrate 61, that is, from an upper surface in FIG. 22, and a light-shielding film is embedded in the groove portion to form the separation region 441. This separation region 441 functions as a pixel separation region that shields infrared light entering the substrate 61 from the light incident surface and heading to another pixel adjacent to the pixel 51.

By forming the embedded separation region 441 in this way, the separation characteristics of infrared light between pixels can be improved, and occurrence of crosstalk can be suppressed.

Modification 1 of Ninth Embodiment

<Configuration Example of Pixel>

Figure 23:
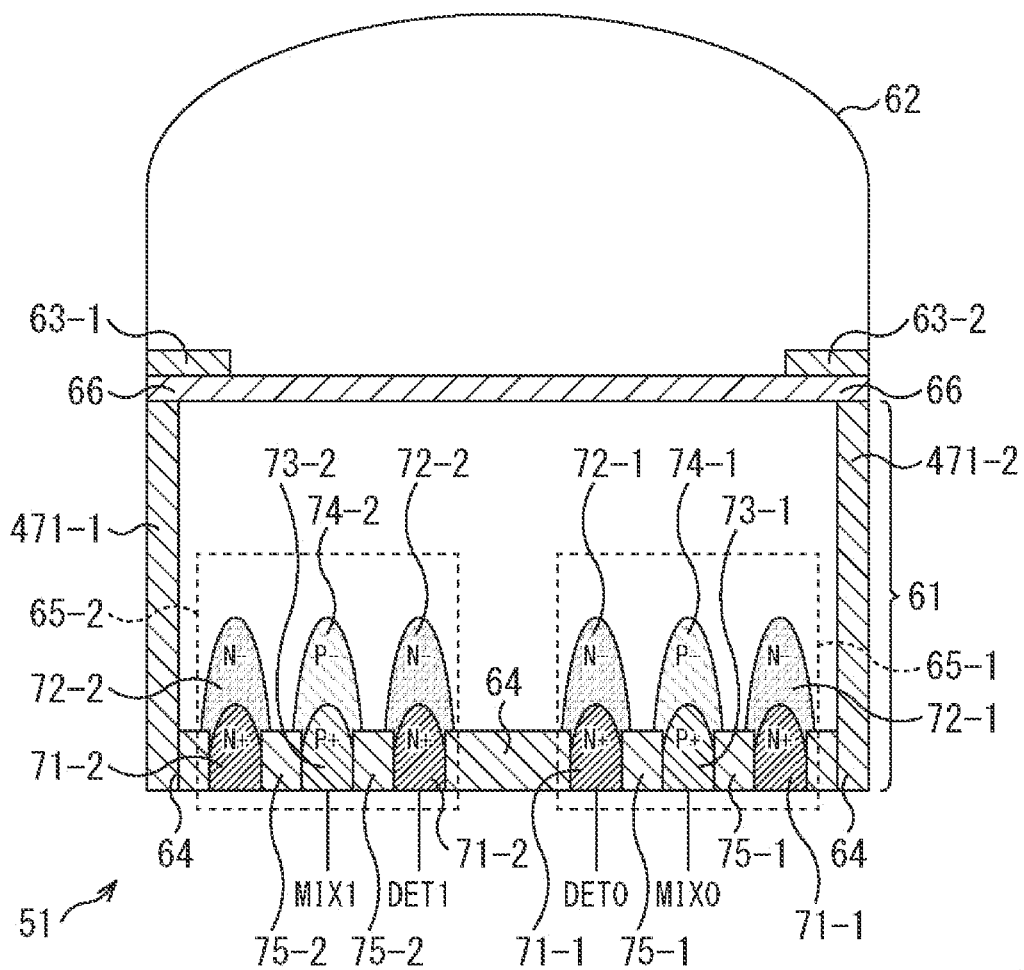
FIG. 23 is a view illustrating another configuration example of the pixel.

Moreover, in the case of forming the embedded separation region in the pixel 51, a separation region 471-1 and a separation region 471-2 penetrating the entire substrate 61 may be provided, as illustrated in FIG. 23, for example. Note that, in FIG. 23, a portion corresponding to the case in FIG. 2 is denoted by the same reference numeral, and description thereof is omitted as appropriate.

The configuration of the pixel 51 illustrated in FIG. 23 is different from that of the pixel 51 illustrated in FIG. 2 in that a separation region 471-1 and a separation region 471-2 are provided in the substrate 61, and is the same as that of the pixel 51 in FIG. 2 in the other points. That is, the pixel 51 illustrated in FIG. 23 has a configuration in which the separation region 471-1 and the separation region 471-2 are provided in place of the separation regions 441 of the pixel 51 illustrated in FIG. 22.

In the pixel 51 illustrated in FIG. 23, the separation region 471-1 and the separation region 471-2 penetrating the entire substrate 61 are formed using a light-shielding film and the like in a boundary portion in the substrate 61 between the pixel 51 and another pixel adjacent to the pixel 51, that is, in right and left end portions in FIG. 22 of the pixel 51. Note that, hereinafter, in a case where there is no need to distinguish the separation region 471-1 and the separation region 471-2, they are also simply referred to as separation region (s) 471.

For example, at the time of forming the separation region 471, a long groove (trench) is formed upward from a surface opposite to the light incident surface of the substrate 61, that is, from a lower surface in FIG. 23. At this time, the grooves are formed to penetrate the substrate 61 until the grooves reach the light incident surface of the substrate 61. Then, a light-shielding film is embedded in the groove portion thus formed to form the separation region 471.

Even with such an embedded type separation region 471, the separation characteristics of infrared light between pixels can be improved, and occurrence of crosstalk can be suppressed.

Tenth Embodiment

<Configuration Example of Pixel>

Moreover, the thickness of a substrate in which a signal extraction portion 65 is formed can be determined according to, for example, various characteristics of pixels.

Figure 24:
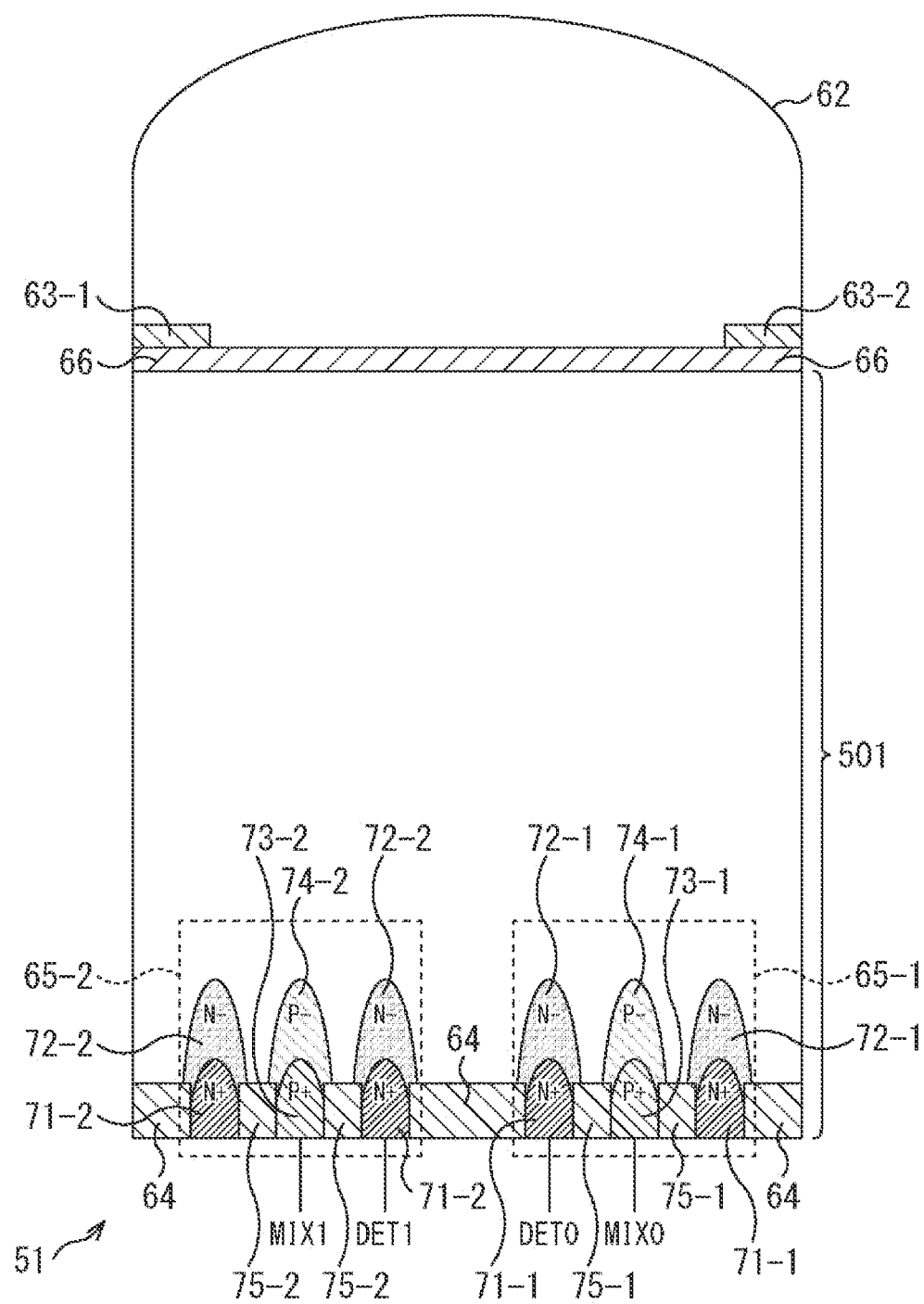
FIG. 24 is a view illustrating another configuration example of the pixel.

Therefore, as illustrated in FIG. 24, a substrate 501 constituting a pixel 51 can be made thicker than the substrate 61 illustrated in FIG. 2, for example. Note that, in FIG. 24, a portion corresponding to the case in FIG. 2 is denoted by the same reference numeral, and description thereof is omitted as appropriate.

The configuration of the pixel 51 illustrated in FIG. 24 is different from that of the pixel 51 illustrated in FIG. 2 in that the substrate 501 is provided instead of the substrate 61, and is the same as that of the pixel 51 in FIG. 2 in the other points.

That is, in the pixel 51 illustrated in FIG. 24, an on-chip lens 62, a fixed charge film 66, and inter-pixel light-shielding films 63 are formed on a light incident surface side of the substrate 501. Furthermore, an oxide film 64, signal extraction portions 65, and separation portions 75 are formed near a front surface of the substrate 501, the front surface being opposite to the light incident surface side.

The substrate 501 is formed using, for example, a P-type semiconductor substrate with a thickness of 20 µm or more. The substrate 501 and the substrate 61 are different only in the thickness of the substrate, and the positions at which the oxide film 64, the signal extraction portions 65, and the separation portions 75 are formed are the same position between the substrate 501 and the substrate 61.

Note that the thicknesses of the various layers (films) appropriately formed on the light incident surface side and the like of the substrate 501 and the substrate 61 may be optimized according to the characteristics of the pixel 51 and the like.

Eleventh Embodiment

<Configuration Example of Pixel>

Figure 25:
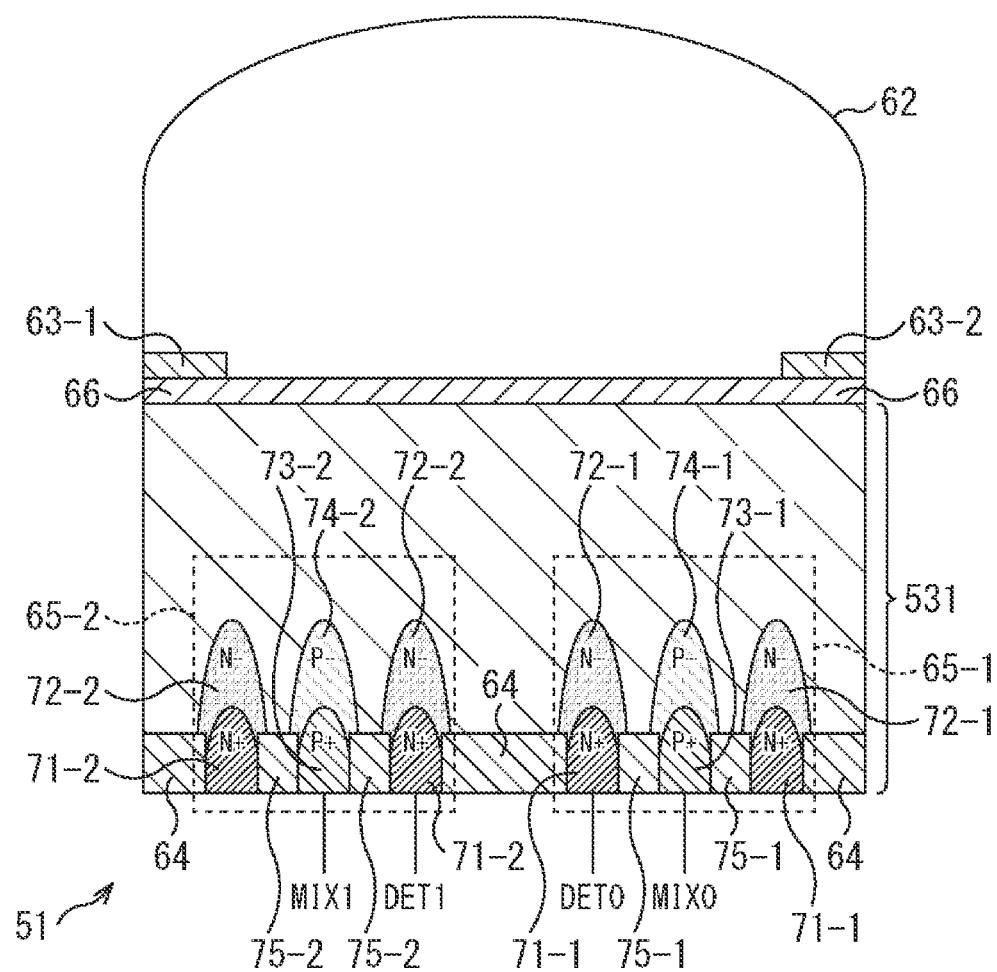
FIG. 25 is a view illustrating another configuration example of the pixel.

Moreover, in the above description, the example in which the substrate constituting the pixel 51 is formed using a P-type semiconductor substrate has been described. However, the substrate may be formed using an N-type semiconductor substrate, as illustrated in FIG. 25, for example. Note that, in FIG. 25, a portion corresponding to the case in FIG. 2 is denoted by the same reference numeral, and description thereof is omitted as appropriate.

The configuration of the pixel 51 illustrated in FIG. 25 is different from that of the pixel 51 illustrated in FIG. 2 in that a substrate 531 is provided instead of the substrate 61, and is the same as that of the pixel 51 in FIG. 2 in the other points.

In the pixel 51 illustrated in FIG. 25, an on-chip lens 62, a fixed charge film 66, and inter-pixel light-shielding films 63 are formed on a light incident surface side of the substrate 531 formed using an N-type semiconductor layer such as a silicon substrate.

Furthermore, an oxide film 64, signal extraction portions 65, and separation portions 75 are formed near a front surface of the substrate 531, the front surface being opposite to the light incident surface side. The positions at which the oxide film 64, the signal extraction portions 65, and the separation portions 75 are formed are the same position between the substrate 531 and the substrate 61, and the configuration of the signal extraction portion 65 is the same between the substrate 531 and the substrate 61.

For example, in the substrate 531, the thickness in a vertical direction in FIG. 25, that is, the thickness in a direction perpendicular to a surface of the substrate 531, is 20 μm or less.

Furthermore, the substrate 531 is, for example, a high-resistance N-Epi substrate having a substrate concentration of 1E+13 order or less, and the resistance (resistivity) of the substrate 531 is, for example, 500 [Ωcm] or more. As a result, the power consumption of the pixel 51 can be reduced.

Here, the relationship between the substrate concentration and the resistance of the substrate 531 is, for example, the resistance of 2000 [Ωcm] when the substrate concentration is 2.15E+12 [cm$^3$], the resistance of 1000 [Ωcm] when the substrate concentration is 4.30E+12 [cm$^3$], the resistance of 500 [Ωcm] when the substrate concentration is 8.61E+12 [cm$^3$], the resistance of 100 [Ωcm] when the substrate concentration is 4.32E+13 [cm$^3$], and the like.

As described above, even if the N-type semiconductor substrate is used for the substrate 531 of the pixel 51, similar effects can be obtained by a similar operation to the example illustrated in FIG. 2.

Twelfth Embodiment

<Configuration Example of Pixel>

Moreover, the thickness of an N-type semiconductor substrate can be determined according to various characteristics of pixels and the like, similarly to the example described with reference to FIG. 24.

Figure 26:
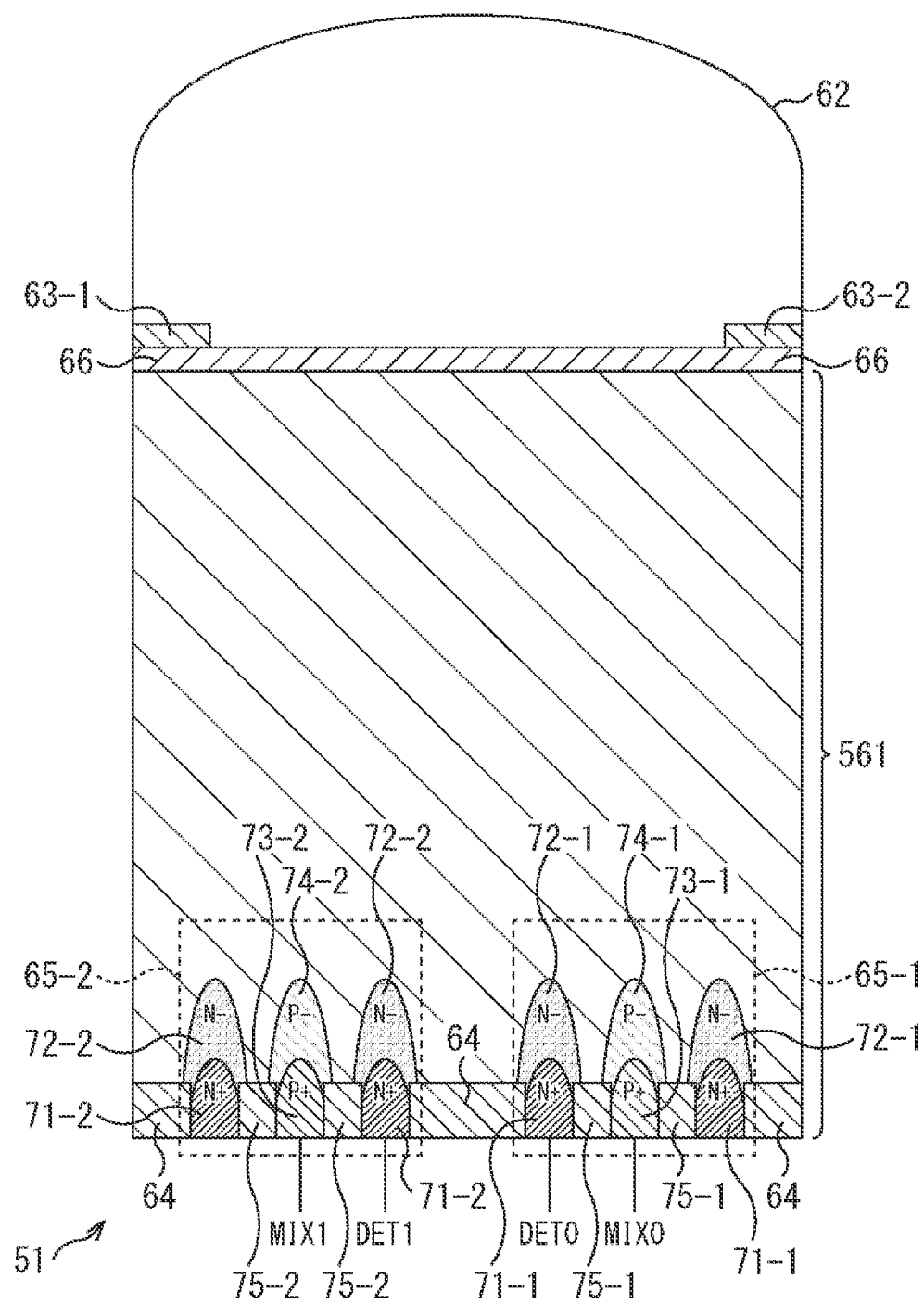
FIG. 26 is a view illustrating another configuration example of the pixel.

Therefore, as illustrated in FIG. 26, a substrate 561 constituting a pixel 51 can be made thicker than the substrate 531 illustrated in FIG. 25, for example. Note that, in FIG. 26, a portion corresponding to the case in FIG. 25 is denoted by the same reference numeral, and description thereof is omitted as appropriate.

The configuration of the pixel 51 illustrated in FIG. 26 is different from that of the pixel 51 illustrated in FIG. 25 in that the substrate 561 is provided instead of the substrate 531, and is the same as that of the pixel 51 in FIG. 25 in the other points.

That is, in the pixel 51 illustrated in FIG. 26, an on-chip lens 62, a fixed charge film 66, and inter-pixel light-shielding films 63 are formed on a light incident surface side of the substrate 561. Furthermore, an oxide film 64, signal extraction portions 65, and separation portions 75 are formed near a front surface of the substrate 561, the front surface being opposite to the light incident surface side.

The substrate 561 is formed using, for example, an N-type semiconductor substrate with a thickness of 20 μm or more. The substrate 561 and the substrate 531 are different only in the thickness of the substrate, and the positions at which the oxide film 64, the signal extraction portions 65, and the separation portions 75 are formed are the same position between the substrate 561 and the substrate 531.

Thirteenth Embodiment

<Configuration Example of Pixel>

Further, for example, by biasing a light incident surface side of a substrate 61, an electric field in the substrate 61 in a direction perpendicular to a surface of the substrate 61 (hereinafter, also referred to as a Z direction) may be strengthened.

Figure 27A:
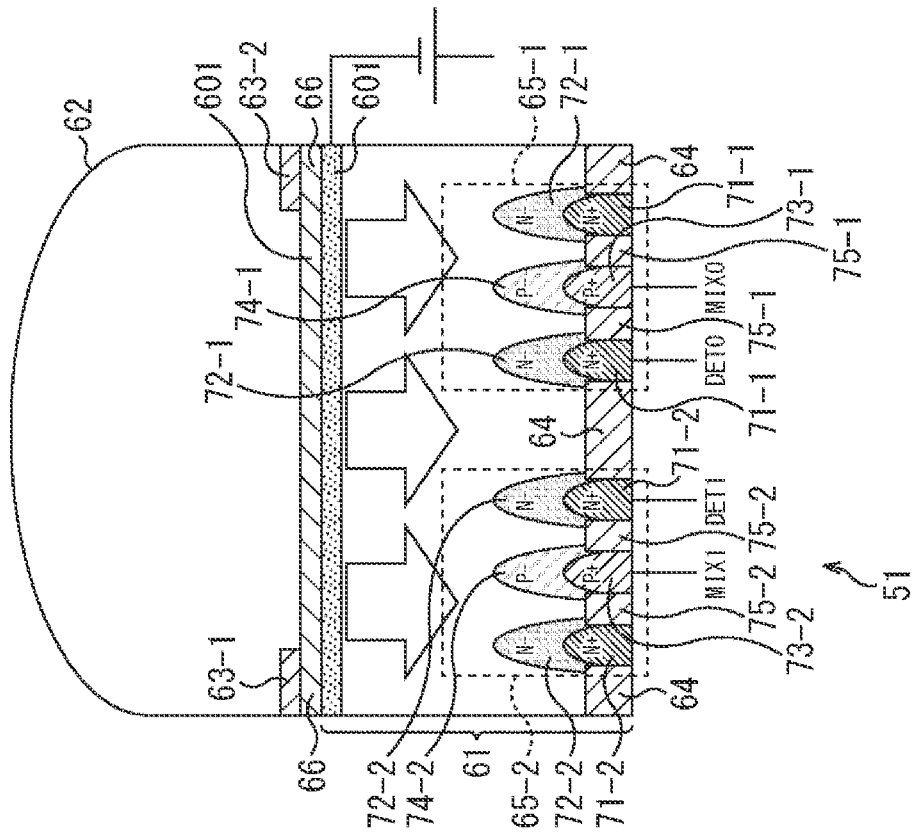
FIGS. 27A and 27B are views illustrating another configuration example of the pixel.
Figure 27B:
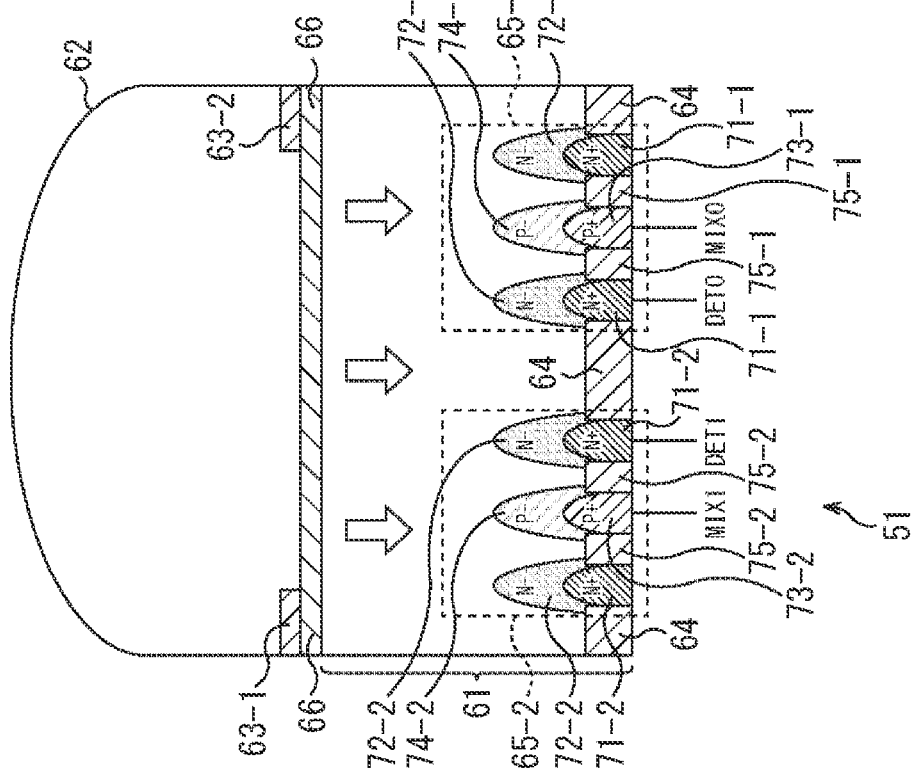

In such a case, a pixel 51 is configured as illustrated in FIGS. 27A and 27B, for example. Note that, in FIGS. 27A and 27B, a portion corresponding to the case in FIG. 2 is denoted by the same reference numeral, and description thereof is omitted as appropriate.

FIG. 27A illustrates the pixel 51 illustrated in FIG. 2, and the arrows in the substrate 61 of the pixel 51 represent the strength of the electric field in the Z direction in the substrate 61.

In contrast, FIG. 27B illustrates a configuration of the pixel 51 in a case of biasing (applying a voltage to) the light incident surface of the substrate 61. The configuration of the pixel 51 in FIG. 27B is basically the same as the configuration of the pixel 51 illustrated in FIG. 2, but a P+ semiconductor region 601 is newly added to an interface on the light incident surface of the substrate 61.

A voltage (negative bias) of 0 V or less is applied to the P+ semiconductor region 601 formed at the interface on the light incident surface side of the substrate 61 from inside or outside of a pixel array unit 20, so that the electric field in the Z direction is strengthened. The arrows in the substrate 61 of the pixel 51 in FIG. 27B represent the strength of the electric field in the Z direction in the substrate 61. The arrow drawn in the substrate 61 in FIG. 27B is thicker in the thickness than the arrow of the pixel 51 in FIG. 27A, and the electric field in the Z direction is stronger in FIG. 27B than that in FIG. 27A. By applying a negative bias to the P+ semiconductor region 601 formed on the light incident surface side of the substrate 61, the electric field in the Z direction can be strengthened and electron extraction efficiency in signal extraction portions 65 can be improved.

Note that the configuration for applying the voltage to the light incident surface side of the substrate 61 is not limited to the configuration provided with the P+ semiconductor region 601, and any configuration can be adopted. For example, a transparent electrode film may be stacked between the light incident surface of the substrate 61 and an on-chip lens 62, and a negative bias may be applied by applying a voltage to the transparent electrode film.

Fourteenth Embodiment

<Configuration Example of Pixel>

Moreover, to improve sensitivity of a pixel 51 to infrared light, a large-area reflective member may be provided on a surface of a substrate 61, the surface being opposite to a light incident surface.

Figure 28:
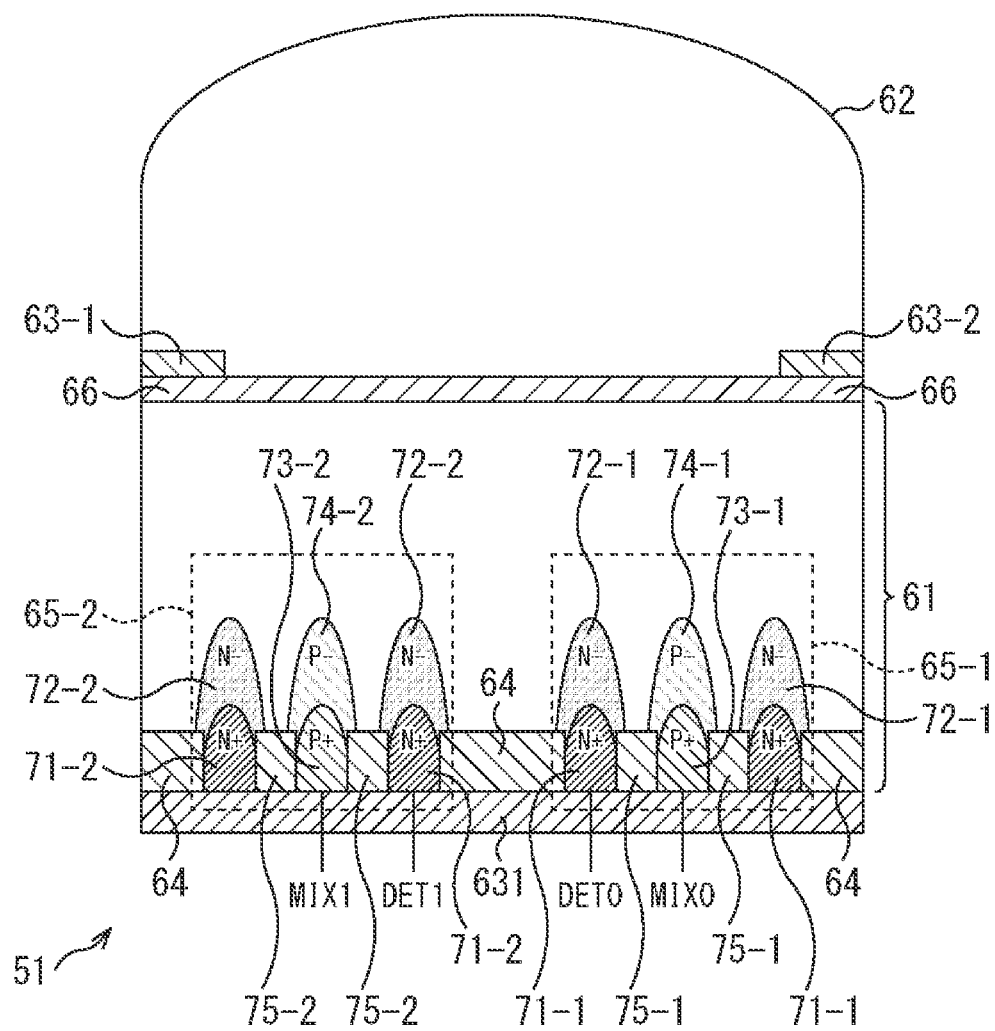
FIG. 28 is a view illustrating another configuration example of the pixel.

In such a case, a pixel 51 is configured as illustrated in FIG. 28, for example. Note that, in FIG. 28, a portion corresponding to the case in FIG. 2 is denoted by the same reference numeral, and description thereof is omitted as appropriate.

The configuration of the pixel 51 illustrated in FIG. 28 is different from that of the pixel 51 in FIG. 2 in that a reflective member 631 is provided on the surface of the substrate 61, the surface being opposite to the light incident surface, and is the same as that of the pixel 51 in FIG. 2 in the other points.

In the example illustrated in FIG. 28, the reflective member 631 that reflects the infrared light is provided to cover the entire surface of the substrate 61, the surface being opposite to the light incident surface.

The reflective member 631 may be any member as long as the member has high reflectance of infrared light. For example, a metal such as copper or aluminum provided in a multilayer wiring layer stacked on the surface of the substrate 61, the surface being opposite to the light incident surface, may be used as the reflective member 631, or a reflective structure of polysilicon, an oxide film, or the like may be formed on the surface of the substrate 61, the surface being opposite to the light incident surface, to form the reflective member 631.

By providing the reflecting member 631 in the pixel 51 in this way, the infrared light entering the substrate 61 from the light incident surface via the on-chip lens 62 and transmitted through the substrate 61 without being photoelectrically converted in the substrate 61 can be reflected by the reflective member 631 to re-enter the substrate 61. As a result, the amount of infrared light photoelectrically converted in the substrate 61 can be increased, and quantum efficiency (QE), that is, the sensitivity of the pixel 51 to infrared light can be improved.

Fifteenth Embodiment

<Configuration Example of Pixel>

Moreover, to suppress erroneous detection of light in a nearby pixel, a large-area light-shielding member may be provided on a surface of a substrate 61, the surface being opposite to a light incident surface.

In such a case, a pixel 51 can have a configuration in which the reflective member 631 illustrated in FIG. 28 is replaced with the light-shielding member, for example. That is, the reflective member 631 that covers the entire surface opposite to the light incident surface of the substrate 61 in the pixel 51 illustrated in FIG. 28 is replaced with a light-shielding member 631' that shields infrared light. The reflective member 631 of pixel 51 in FIG. 28 is used as the light-shielding member 631'.

The light-shielding member 631' may be any member as long as the member has a high light-shielding rate of infrared light. For example, a metal such as copper or aluminum provided in a multilayer wiring layer stacked on the surface of the substrate 61, the surface being opposite to the light incident surface, may be used as the light-shielding member 631', or a light-shielding structure of polysilicon, an oxide film, or the like may be formed on the surface of the substrate 61, the surface being opposite to the light incident surface, to form the light-shielding member 631'.

By providing the light-shielding member 631' in the pixel 51 in this way, the infrared light having entered the substrate 61 from the light incident surface via an on-chip lens 62 and transmitted through the substrate 61 without being photoelectrically converted in the substrate 61 can be suppressed from being scattered in a wiring layer and entering a nearby pixel. Thereby, the erroneous detection of light in the nearby pixel can be prevented.

Note that the light-shielding member 631' can also be used as the reflective member 631 by being formed using a material including metal, for example.

Sixteenth Embodiment

<Configuration Example of Pixel>

Moreover, a P-well region including a P-type semiconductor region may be provided instead of an oxide film 64 in a substrate 61 of a pixel 51.

Figure 29:
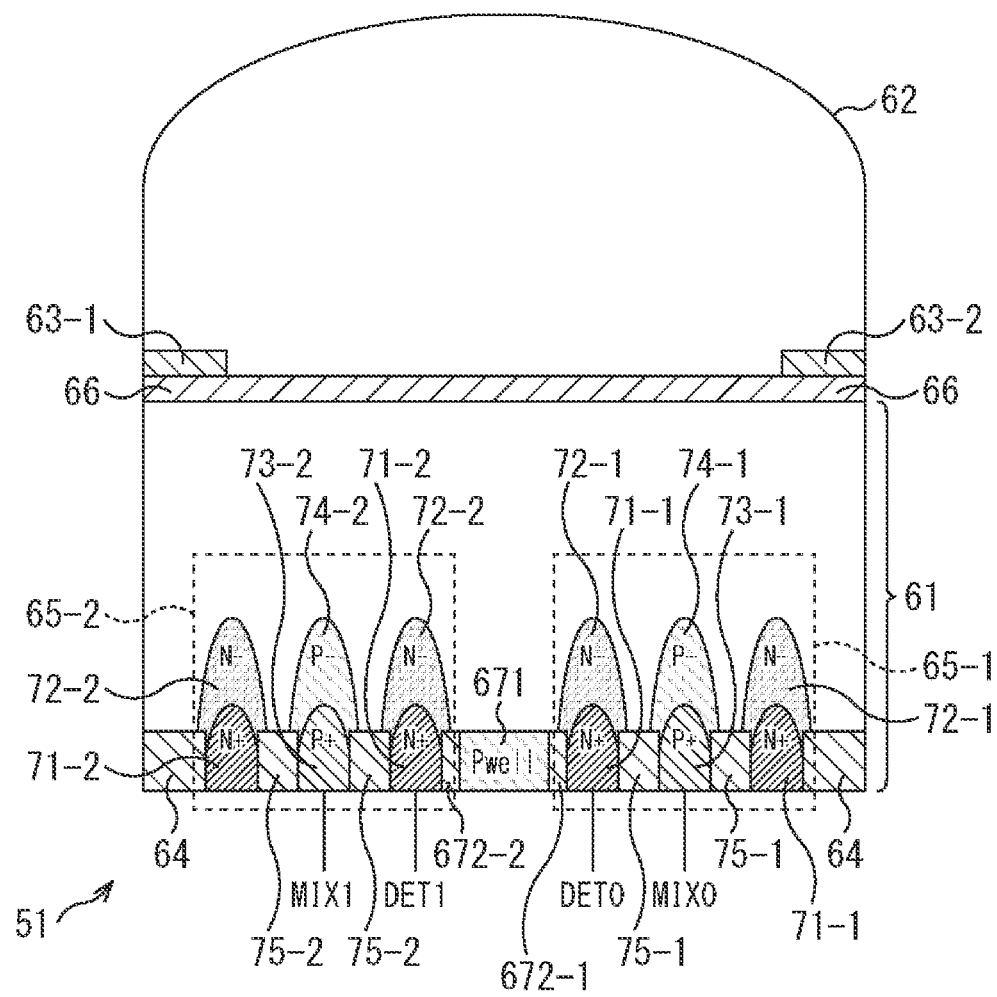
FIG. 29 is a view illustrating another configuration example of the pixel.

In such a case, the pixel 51 is configured as illustrated in FIG. 29, for example. Note that, in FIG. 29, a portion corresponding to the case in FIG. 2 is denoted by the same reference numeral, and description thereof is omitted as appropriate.

The configuration of the pixel 51 illustrated in FIG. 29 is different from that of the pixel 51 illustrated in FIG. 2 in that a P-well region 671, a separation portion 672-1, and a separation portion 672-2 are provided instead of the oxide film 64, and is the same as that of the pixel 51 in FIG. 2 in the other points.

In the example illustrated in FIG. 29, the P-well region 671 including the P-type semiconductor region is formed in a central portion inside the surface of the substrate 61, the surface being opposite to the light incident surface, that is, inside the lower surface in FIG. 29. Furthermore, a separation portion 672-1 for separating the P-well region 671 and an N+ semiconductor region 71-1 is formed using an oxide film and the like between the P-well region 671 and the N+ semiconductor region 71-1. Similarly, a separation portion 672-2 for separating the P-well region 671 and an N+ semiconductor region 71-2 is formed using an oxide film and the like between the P-well region 671 and the N+ semiconductor region 71-2. In the pixel 51 illustrated in FIG. 29, a P− semiconductor region 74 has a larger region upward in FIG. 29 than an N− semiconductor region 72.

Seventeenth Embodiment

<Configuration Example of Pixel>

Furthermore, a P-well region including a P-type semiconductor region may be further provided in addition to an oxide film 64 in a substrate 61 of a pixel 51.

Figure 30:
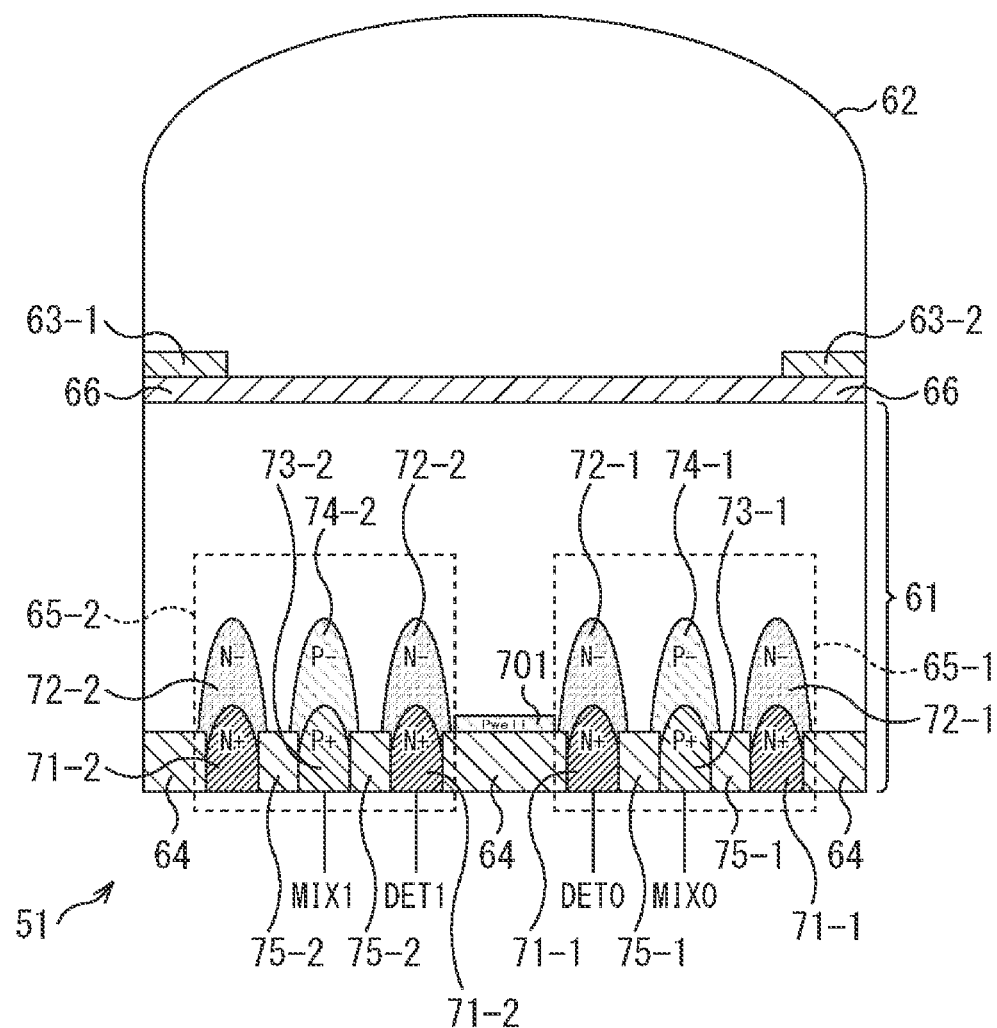
FIG. 30 is a view illustrating another configuration example of the pixel.

In such a case, the pixel 51 is configured as illustrated in FIG. 30, for example. Note that, in FIG. 30, a portion corresponding to the case in FIG. 2 is denoted by the same reference numeral, and description thereof is omitted as appropriate.

The configuration of the pixel 51 illustrated in FIG. 30 is different from that of the pixel 51 illustrated in FIG. 2 in that a P-well region 701 is newly provided, and is the same as that of the pixel 51 in FIG. 2 in the other points. That is, the P-well region 701 including a P-type semiconductor region is formed on an upper side of an oxide film 64 in a substrate 61 in the example illustrated in FIG. 30.

As described above, according to the present technology, a CAPD sensor has a back-illuminated configuration, thereby improving characteristics such as pixel sensitivity.

<Configuration Example of Equivalent Circuit of Pixel>

Figure 31:
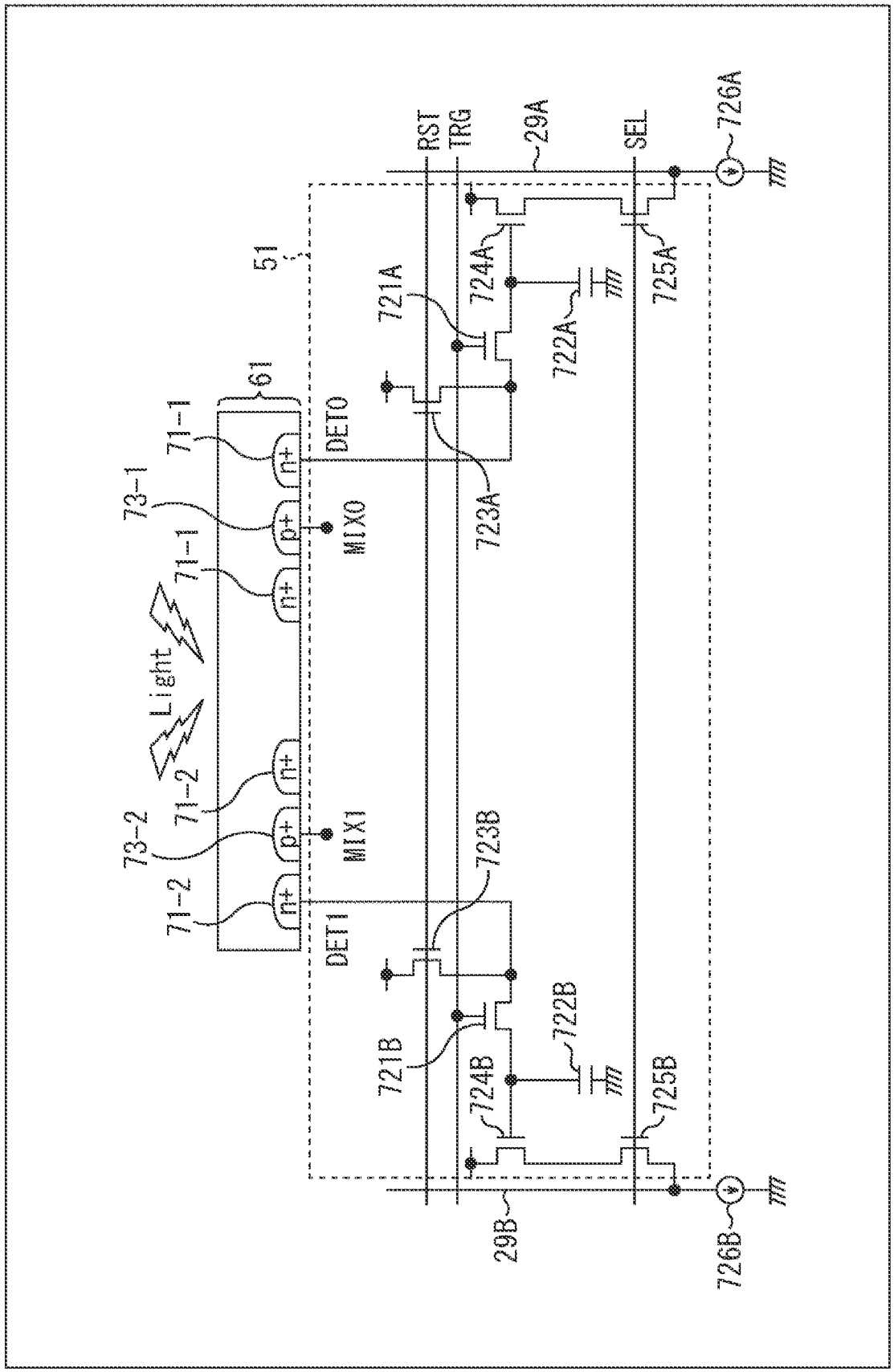
FIG. 31 is a diagram illustrating an equivalent circuit of a pixel.

FIG. 31 illustrates an equivalent circuit of the pixel 51.

The pixel 51 includes a transfer transistor 721A, an FD 722A, a reset transistor 723A, an amplification transistor 724A, and a selection transistor 725A for a signal extraction portion 65-1 including an N+ semiconductor region 71-1, a P+ semiconductor region 73-1, and the like.

Furthermore, the pixel 51 includes a transfer transistor 721B, an FD 722B, a reset transistor 723B, an amplification transistor 724B, and a selection transistor 725B for a signal extraction portion 65-2 including an N+ semiconductor region 71-2, a P+ semiconductor region 73-2, and the like.

A tap drive unit 21 applies a predetermined voltage MIX0 (first voltage) to the P+ semiconductor region 73-1, and applies a predetermined voltage MIX1 (second voltage) to the P+ semiconductor region 73-2. In the above example, one of the voltages MIX0 and MIX1 is 1.5 V and the other is 0 V. The P+ semiconductor regions 73-1 and 73-2 are voltage application portions to which the first voltage or the second voltage is applied.

The N+ semiconductor regions 71-1 and 71-2 are charge detection portions that detect and accumulate charges generated by photoelectrically converting the light having entered the substrate 61.

The transfer transistor 721A becomes conductive in response to an active state of a drive signal TRG supplied to a gate electrode, thereby transferring the charge accumulated in the N+ semiconductor region 71-1 to the FD 722A. The transfer transistor 721B becomes conductive in response to an active state of a drive signal TRG supplied to a gate electrode, thereby transferring the charge accumulated in the N+ semiconductor region 71-2 to the FD 722B.

The FD 722A temporarily retains a charge DET0 supplied from the N+ semiconductor region 71-1. The FD 722B temporarily retains a charge DET1 supplied from the N+ semiconductor region 71-2. The FD 722A corresponds to the FD portion A described with reference to FIG. 2, and the FD 722B corresponds to the FD portion B in FIG. 2.

The reset transistor 723A becomes conductive in response to an active state of a drive signal RST supplied to a gate electrode, thereby resetting a potential of the FD 722A to a predetermined level (power supply voltage VDD). The reset transistor 723B becomes conductive in response to an active state of a drive signal RST supplied to a gate electrode, thereby resetting a potential of the FD 722B to a predetermined level (power supply voltage VDD). Note that the transfer transistors 721A and 721B become active at the same time with the reset transistors 723A 723B becoming active.

The amplification transistor 724A has a source electrode connected to a vertical signal line 29A via the selection transistor 725A to configure a source-follower circuit with a load MOS of a constant current source circuit 726A connected to one end of the vertical signal line 29A. The amplification transistor 724B has a source electrode connected to a vertical signal line 29B via the selection transistor 725B to configure a source-follower circuit with a load MOS of a constant current source circuit 726B connected to one end of the vertical signal line 29B.

The selection transistor 725A is connected between the source electrode of the amplification transistor 724A and the vertical signal line 29A. The selection transistor 725A becomes conductive in response to an active state of a selection signal SEL supplied to a gate electrode, thereby outputting a pixel signal output from the amplification transistor 724A to the vertical signal line 29A.

The selection transistor 725B is connected between the source electrode of the amplification transistor 724B and the vertical signal line 29B. The selection transistor 725B becomes conductive in response to an active state of a selection signal SEL supplied to a gate electrode, thereby outputting a pixel signal output from the amplification transistor 724B to the vertical signal line 29B.

The transfer transistors 721A and 721B of pixel 51, the reset transistors 723A and 723B, the amplification transistors 724A and 724B, and the selection transistors 725A and 725B of the pixel 51 are controlled by, for example, a vertical drive unit 22.

<Configuration Example of Another Equivalent Circuit of Pixel>

Figure 32:
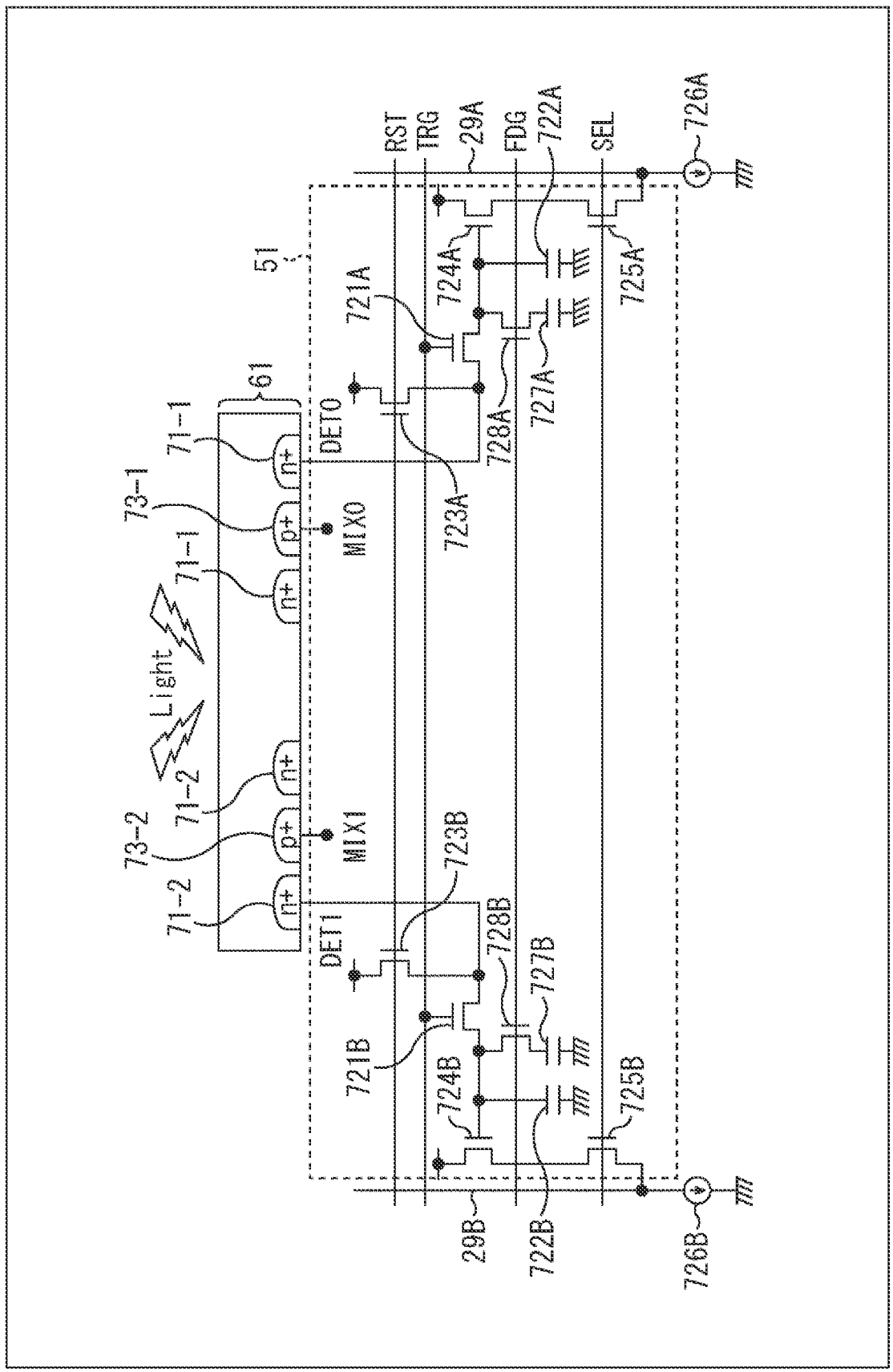
FIG. 32 is a diagram illustrating another equivalent circuit of the pixel.

FIG. 32 illustrates another equivalent circuit of the pixel 51.

Note that, in FIG. 32, a portion corresponding to FIG. 31 is denoted by the same reference numeral, and description thereof is omitted as appropriate.

In the equivalent circuit in FIG. 32, an additional capacitance 727 and a switching transistor 728 for controlling the connection of the additional capacitance 727 are added to both signal extraction portions 65-1 and 65-2 with respect to the equivalent circuit in FIG. 31.

Specifically, an additional capacitance 727A is connected between the transfer transistor 721A and the FD 722A via a switching transistor 728A, and an additional capacitance 727B is connected between the transfer transistor 721B and the FD 722B via a switching transistor 728B.

The switching transistor 728A becomes conductive in response to an active state of a drive signal FDG supplied to a gate electrode, thereby connecting the additional capacitance 727A to the FD 722A. The switching transistor 728B becomes conductive in response to an active state of a drive signal FDG supplied to a gate electrode, thereby connecting the additional capacitance 727B to the FD 722B.

For example, the vertical drive unit 22 connects the FD 722A and the additional capacitance 727A and connects the FD 722B and the additional capacitance 727B with the switching transistors 728A and 728B in the active state when the amount of incident light is high and illuminance is high. Thereby, more charges can be accumulated at the high illuminance.

Meanwhile, when the amount of incident light is low and the illuminance is low, the vertical drive unit 22 sets the switching transistors 728A and 728B to an inactive state and disconnects the additional capacitances 727A and 727B from the FD 722A and 722B, respectively.

Although the additional capacitances 727 may be omitted as in the equivalent circuit in FIG. 31, a high dynamic range can be ensured by providing the additional capacitances 727 and using the additional capacitances 727 properly according to the amount of incident light.

<Arrangement Example of Voltage Supply Line>

Next, arrangement of voltage supply lines for applying the predetermined voltage MIX0 or MIX1 to the P+ semiconductor regions 73-1 and 73-2 as voltage application portions of the signal extraction portions 65 of each pixel 51 will be described with reference to FIGS. 33A, 33B, 34A, 34B, 35A, and 35B. Voltage supply lines 741 illustrated in FIGS. 33A, 33B, 34A, and 34B correspond to voltage supply lines 30 illustrated in FIG. 1.

Note that, in FIGS. 33A, 33B, 34A, and 34B, the circular configuration illustrated in FIG. 9 is adopted as the configuration of the signal extraction portion 65 of each pixel 51, but it goes without saying that another configuration may be used.

Figure 33A:
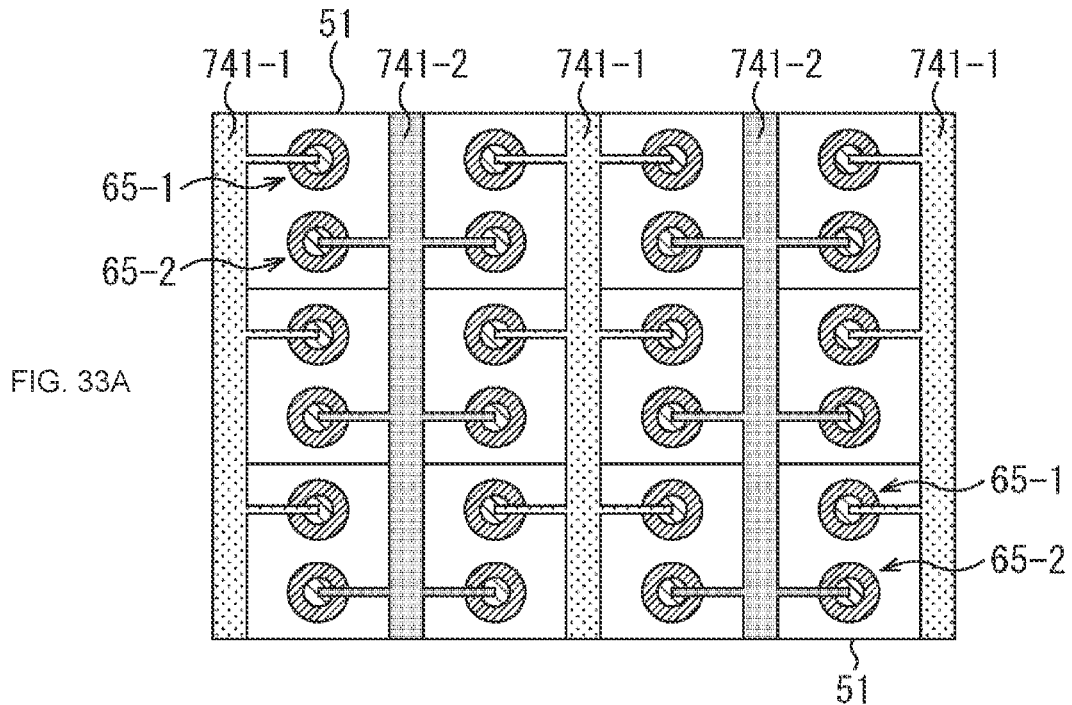
FIGS. 33A and 33B are views illustrating arrangement examples of voltage supply lines adopting Periodic arrangement.

FIG. 33A is a plan view illustrating a first arrangement example of voltage supply lines.

In the first arrangement example, the voltage supply line 741-1 or 741-2 is wired along a vertical direction (in a boundary) between two pixels adjacent in a horizontal direction in a plurality of pixels 51 two-dimensionally arranged in a matrix.

The voltage supply line 741-1 is connected to the P+ semiconductor region 73-1 of the signal extraction portion 65-1 that is one of the two signal extraction portions 65 in the pixel 51. The voltage supply line 741-2 is connected to the P+ semiconductor region 73-2 of the signal extraction portion 65-2 that is the other of the two signal extraction portions 65 in the pixel 51.

In the first arrangement example, the two voltage supply lines 741-1 and 741-2 are arranged for two columns of pixels, so that the number of voltage supply lines 741 arranged in a pixel array unit 20 becomes nearly equal to the number of columns of the pixels 51.

Figure 33B:
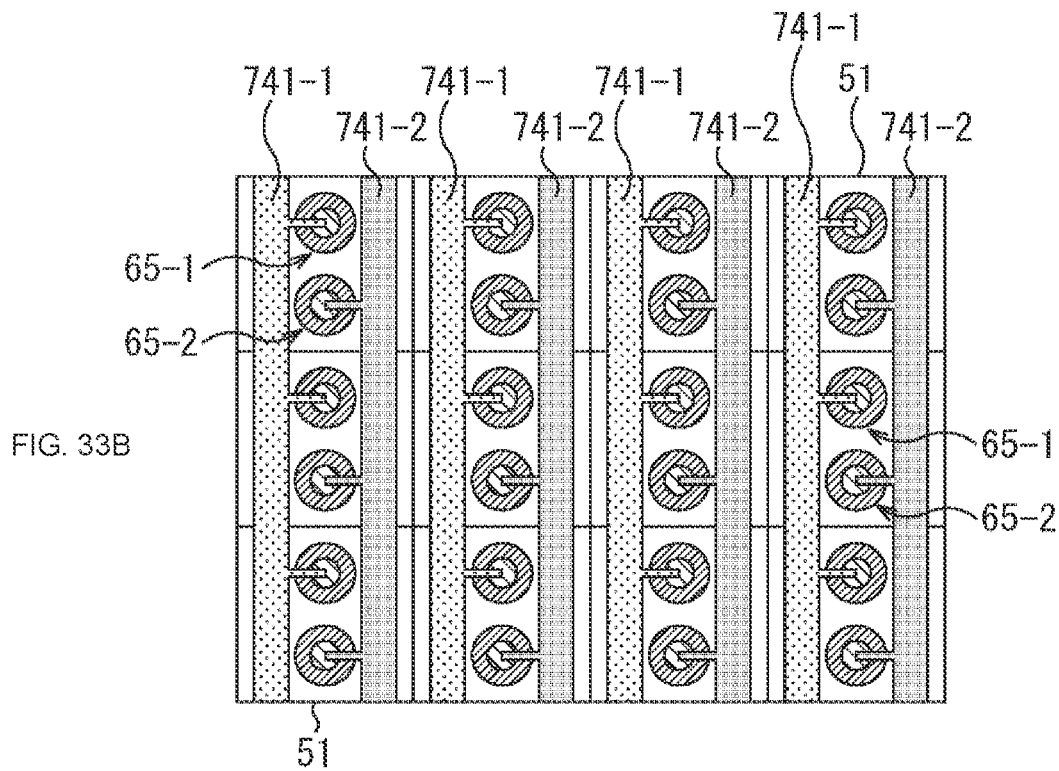

FIG. 33B is a plan view illustrating a second arrangement example of voltage supply lines.

In the second arrangement example, the two voltage supply lines 741-1 and 741-2 are wired along the vertical direction for one pixel column in a plurality of pixels 51 two-dimensionally arranged in a matrix.

The voltage supply line 741-1 is connected to the P+ semiconductor region 73-1 of the signal extraction portion 65-1 that is one of the two signal extraction portions 65 in the pixel 51. The voltage supply line 741-2 is connected to the P+ semiconductor region 73-2 of the signal extraction portion 65-2 that is the other of the two signal extraction portions 65 in the pixel 51.

In the second arrangement example, the two voltage supply lines 741-1 and 741-2 are wired for one pixel column, so that four voltage supply lines 741 are arranged for two pixel columns. In the pixel array unit 20, the number of arrayed voltage supply lines 741 is about twice the number of columns of the pixels 51.

Both the arrangement examples in FIGS. 33A and 33B are Periodic arrangement in which the configuration in which the voltage supply line 741-1 is connected to the P+ semiconductor region 73-1 of the signal extraction portion 65-1 and the voltage supply line 741-2 is connected to the P+ semiconductor region 73-2 of the signal extraction portion 65-2 is periodically repeated with respect to the pixels arranged in the vertical direction.

In the first arrangement example in FIG. 33A, the number of voltage supply lines 741-1 and 741-2 to be wired to the pixel array unit 20 can be reduced.

In the second arrangement example in FIG. 33B, the number of voltage supply lines to be wired is larger than that in the first arrangement example, but the number of signal extraction portions 65 connected to one voltage supply line 741 is ½. Therefore, a wiring load can be reduced, which is effective for high-speed driving and when the total number of pixels of the pixel array unit 20 is large.

Figure 34A:
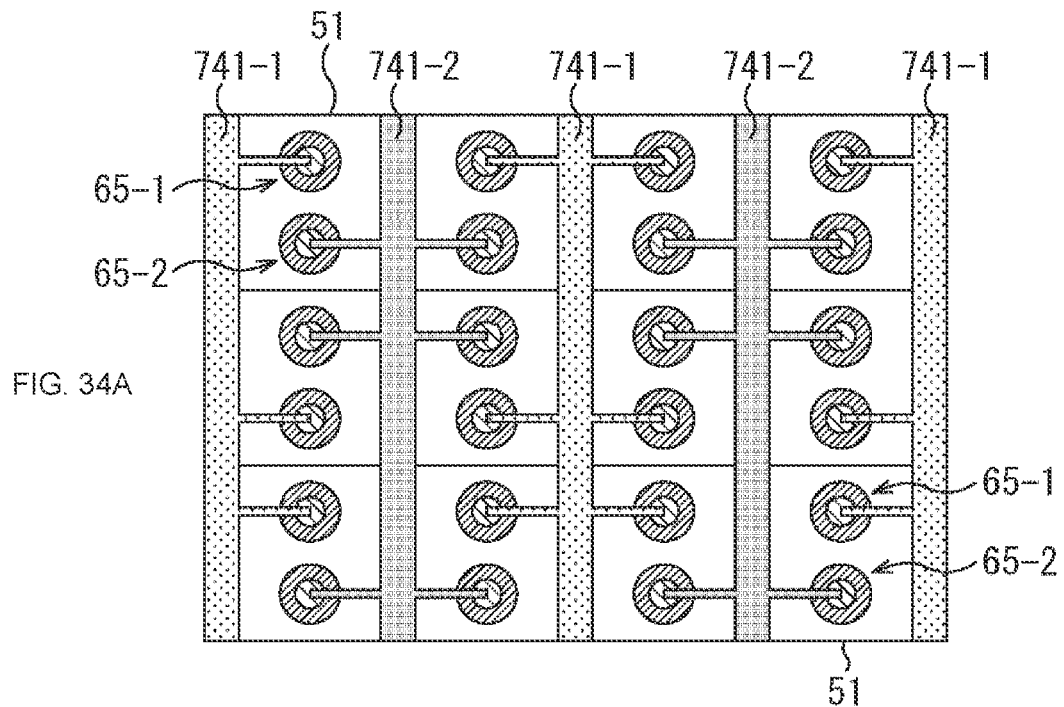
FIGS. 34A and 34B are views illustrating arrangement examples of voltage supply lines adopting Mirror arrangement.

FIG. 34A is a plan view illustrating a third arrangement example of voltage supply lines.

The third arrangement example is an example in which the two voltage supply lines 741-1 and 741-2 are arranged for two columns of pixels, similarly to the first arrangement example in A in-FIG. 33A.

The difference of the third arrangement example from the first arrangement example in FIG. 33A is that connection destinations of the signal extraction portions 65-1 and 65-2 are different in the two pixels arranged in the vertical direction.

Specifically, for example, in a certain pixel 51, the voltage supply line 741-1 is connected to the P+ semiconductor region 73-1 of the signal extraction portion 65-1, and the voltage supply line 741-2 is connected to the P+ semiconductor region 73-2 of the signal extraction portion 65-2. In a pixel 51 above or below the aforementioned pixel 51, the voltage supply line 741-1 is connected to the P+ semiconductor region 73-2 of the signal extraction portion 65-2, and the voltage supply line 741-2 is connected to the P+ semiconductor region 73-1 of the signal extraction portion 65-1.

Figure 34B:
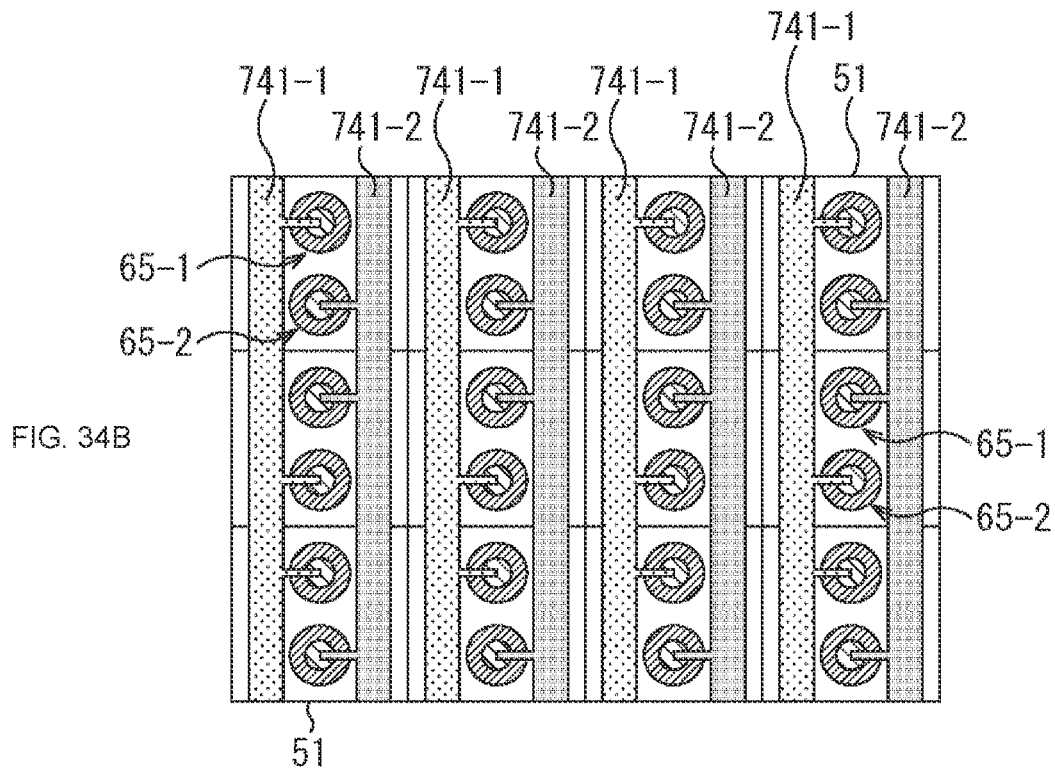

FIG. 34B is a plan view illustrating a fourth arrangement example of voltage supply lines.

The fourth arrangement example is an example in which the two voltage supply lines 741-1 and 741-2 are arranged for two columns of pixels, similarly to the second arrangement example in FIG. 33B.

The difference of the fourth arrangement example from the second arrangement example in FIG. 33B is that connection destinations of the signal extraction portions 65-1 and 65-2 are different in the two pixels arranged in the vertical direction.

Specifically, for example, in a certain pixel 51, the voltage supply line 741-1 is connected to the P+ semiconductor region 73-1 of the signal extraction portion 65-1, and the voltage supply line 741-2 is connected to the P+ semiconductor region 73-2 of the signal extraction portion 65-2. In a pixel 51 above or below the aforementioned pixel 51, the voltage supply line 741-1 is connected to the P+ semiconductor region 73-2 of the signal extraction portion 65-2, and the voltage supply line 741-2 is connected to the P+ semiconductor region 73-1 of the signal extraction portion 65-1.

In the third arrangement example in FIG. 34A, the number of voltage supply lines 741-1 and 741-2 to be wired to the pixel array unit 20 can be reduced.

In the fourth arrangement example in FIG. 34B, the number of voltage supply lines to be wired is larger than that in the third arrangement example, but the number of signal extraction portions 65 connected to one voltage supply line 741 is ½. Therefore, a wiring load can be reduced, which is effective for high-speed driving and when the total number of pixels of the pixel array unit 20 is large.

Both the arrangement examples in FIGS. 34A and 34B are Mirror arrangement in which the connection destinations of two pixels adjacent in an up-down direction (vertical direction) are mirror-inverted.

Figure 35A:
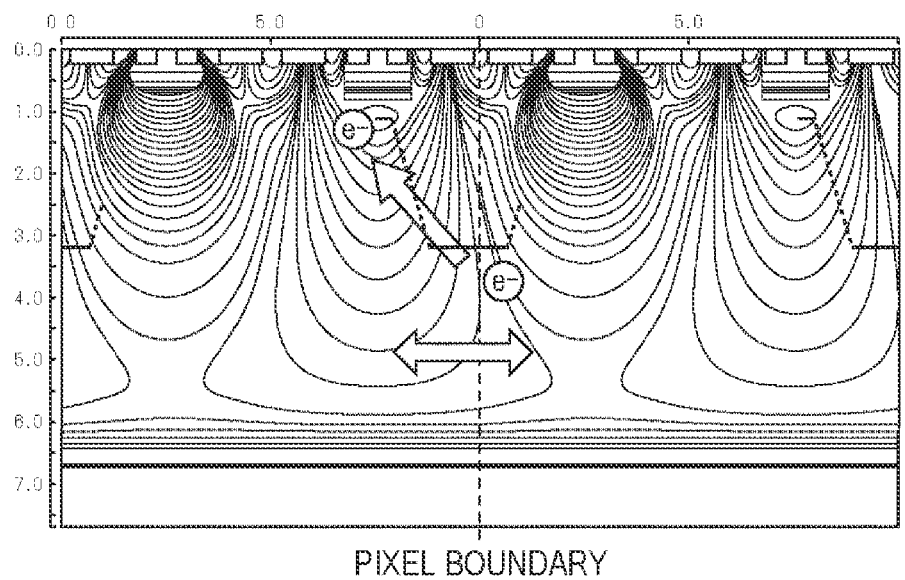
FIGS. 35A and 35B are diagrams for describing characteristics of the Periodic arrangement and the Mirror arrangement.

In the Periodic arrangement, the voltage to be applied to the two signal extraction portions 65 adjacent across the pixel boundary are different, and thus charges are exchanged between the adjacent pixels, as illustrated in FIG. 35A. Therefore, the charge transfer efficiency is better in the Periodic arrangement than the Mirror arrangement, but the crosstalk characteristics of adjacent pixels are inferior in the Periodic arrangement to the Mirror arrangement.

Figure 35B:
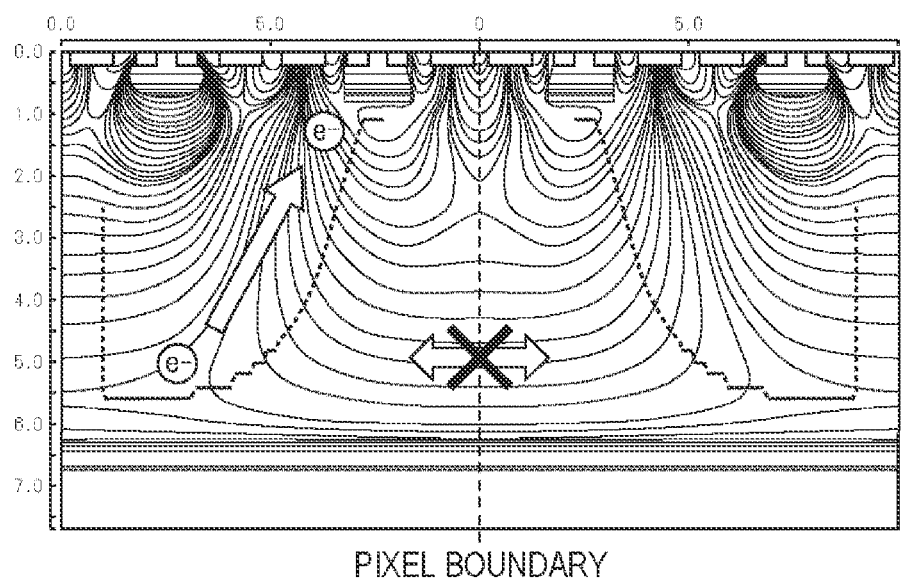

Meanwhile, in the Mirror arrangement, the voltage to be applied to the two signal extraction portions 65 adjacent across the pixel boundary are the same, and thus exchange of charges between the adjacent pixels is suppressed, as illustrated in FIG. 35B. Therefore, the charge transfer efficiency is inferior in the Mirror arrangement to the Periodic arrangement, but the crosstalk characteristics of adjacent pixels are better in the Mirror arrangement than the Periodic arrangement.

Cross-Sectional Configuration of Plurality of Pixels According to Fourteenth Embodiment In the cross-sectional configuration of the pixel illustrated in FIG. 2 or the like, illustration of the multilayer wiring layer formed on the front surface side opposite to the light incident surface of the substrate 61 has been omitted.

Therefore, hereinafter, cross-sectional views of a plurality of adjacent pixels will be illustrated in a form not omitting the multilayer wiring layer, for some of the above-described embodiments.

Figure 37:
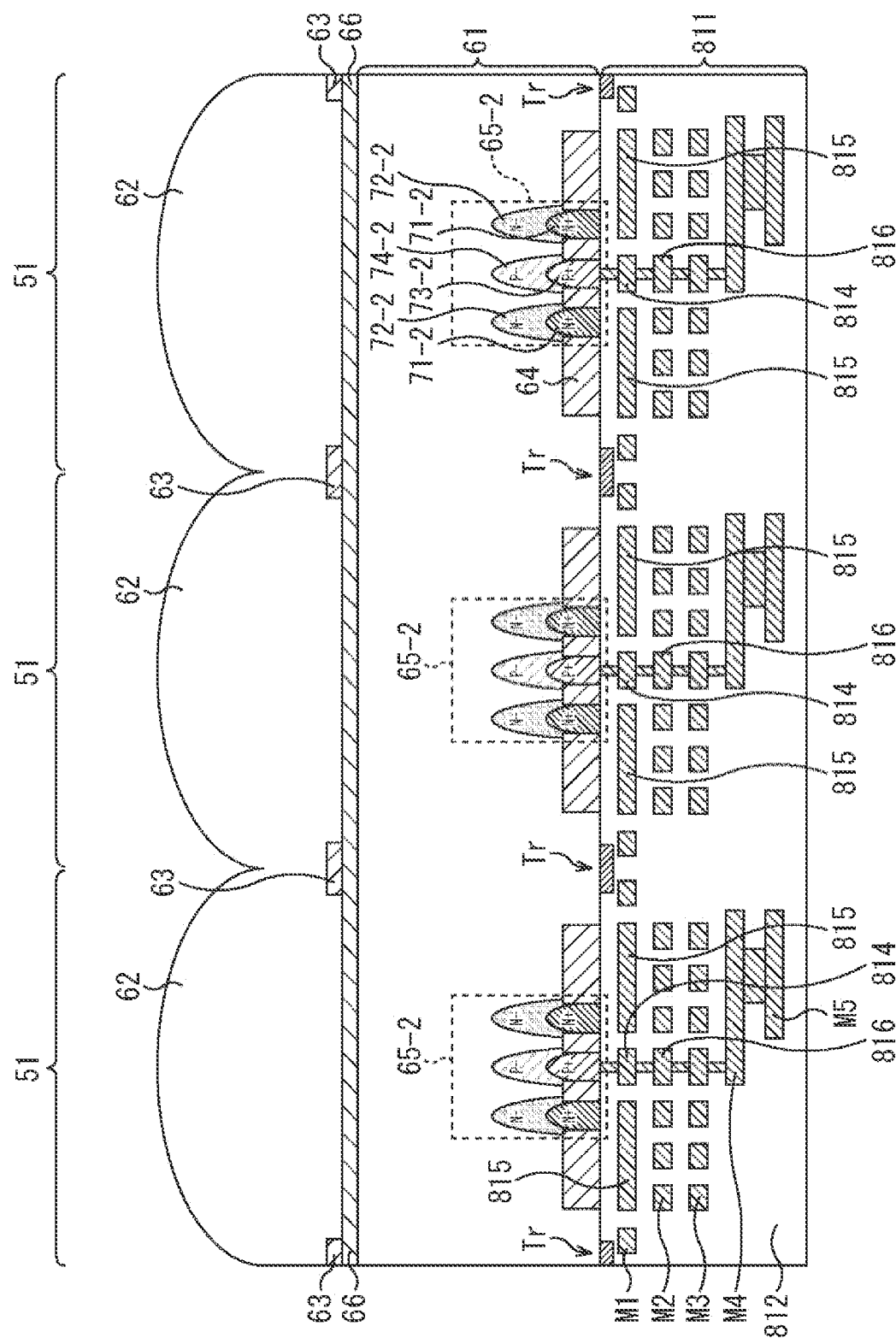
FIG. 37 is a cross-sectional view of a plurality of pixels in the fourteenth embodiment.

First, FIGS. 36 and 37 illustrate cross-sectional views of a plurality of the pixels according to the fourteenth embodiment illustrated in FIG. 28.

The fourteenth embodiment illustrated in FIG. 28 has the pixel configuration provided with the large-area reflective member 631 on the opposite side of the light incident surface of the substrate 61.

FIG. 36 corresponds to a cross-sectional view taken along the line B-B' in FIG. 11, and FIG. 37 corresponds to a cross-sectional view taken along the line A-A' in FIG. 11. Furthermore, the cross-sectional view taken along the line C-C' in FIG. 17 can also be illustrated as in FIG. 36.

As illustrated in FIG. 36, in each pixel 51, the oxide film 64 is formed in the central portion, and the signal extraction portion 65-1 and the signal extraction portion 65-2 are formed on both sides of the oxide film 64.

In the signal extraction portion 65-1, the N+ semiconductor region 71-1 and the N− semiconductor region 72-1 are formed to surround the P+ semiconductor region 73-1 and the P− semiconductor region 74-1 centered on the P+ semiconductor region 73-1 and the P− semiconductor region 74-1. The P+ semiconductor region 73-1 and the N+ semiconductor region 71-1 are in contact with a multilayer wiring layer 811. The P− semiconductor region 74-1 is arranged above the P+ semiconductor region 73-1 (on the on-chip lens 62 side) to cover the P+ semiconductor region 73-1, and the N− semiconductor region 72-1 is arranged above the N+ semiconductor region 71-1 (on the on-chip lens 62 side) to cover the N+ semiconductor region 71-1. In other words, the P+ semiconductor region 73-1 and the N+ semiconductor region 71-1 are arranged in the substrate 61 on the multilayer wiring layer 811 side, and the N− semiconductor region 72-1 and the P− semiconductor region 74-1 are arranged in the substrate 61 on the on-chip lens 62 side. Furthermore, the separation portion 75-1 for separating the N+ semiconductor region 71-1 and the P+ semiconductor region 73-1 is formed using oxide film or the like between the N+ semiconductor region 71-1 and the P+ semiconductor region 73-1.

In the signal extraction portion 65-2, the N+ semiconductor region 71-2 and the N− semiconductor region 72-2 are formed to surround the P+ semiconductor region 73-2 and the P− semiconductor region 74-2 centered on the P+ semiconductor region 73-2 and the P− semiconductor region 74-2. The P+ semiconductor region 73-2 and the N+ semiconductor region 71-2 are in contact with the multilayer wiring layer 811. The P− semiconductor region 74-2 is arranged above the P+ semiconductor region 73-2 (on the on-chip lens 62) to cover the P+ semiconductor region 73-2, and the N− semiconductor region 72-2 is arranged above the N+ semiconductor region 71-2 (on the on-chip lens 62 side) to cover the N+ semiconductor region 71-2. In other words, the P+ semiconductor region 73-2 and the N+ semiconductor region 71-2 are arranged in the substrate 61 on the multilayer wiring layer 811 side, and the N− semiconductor region 72-2 and the P− semiconductor region 74-2 are arranged in the substrate 61 on the on-chip lens 62 side. Furthermore, a separation portion 75-2 for separating the N+ semiconductor region 71-2 and the P+ semiconductor region 73-2 is formed using an oxide film and the like between the N+ semiconductor region 71-2 and the P+ semiconductor region 73-2.

The oxide film 64 is formed between the N+ semiconductor region 71-1 of the signal extraction portion 65-1 of a predetermined pixel 51 and the N+ semiconductor region 71-2 of the signal extraction portion 65-2 of a pixel 51 adjacent to the predetermined pixel 51, in a boundary region between the adjacent pixels 51.

The fixed charge film 66 is formed in the interface of the substrate 61 on the light incident surface side (upper side in FIGS. 36 and 37).

As illustrated in FIG. 36, when the on-chip lens 62 formed on the light incident surface side of the substrate 61 for each pixel is divided into a raised portion 821 in which the thickness is uniformly raised in a height direction in the entire region in the pixel, and a curved portion 822 in which the thickness is different depending on the position in the pixel, the thickness of the raised portion 821 is formed to be thinner than the thickness of the curved portion 822. Since the oblique incident light is more likely to be reflected by the inter-pixel light-shielding film 63 as the raised portion 821 becomes thicker, the oblique incident light can be taken into the substrate 61 by forming the raised portion 821 to be thinner in thickness. Furthermore, the incident light can be condensed to the pixel center as the curved portion 822 is formed to be thicker.

The multilayer wiring layer 811 is formed on the side of the substrate 61, the side being opposite to the light incident surface side on which the on-chip lens 62 is formed for each pixel. In other words, the substrate 61 that is a semiconductor layer is arranged between the on-chip lens 62 and the multilayer wiring layer 811. The multilayer wiring layer 811 includes five-layer metal films M1 to M5 and an interlayer insulating film 812 therebetween. Note that, in FIG. 36, the outermost metal film M5 among the five-layer metal films M1 to M5 of the multilayer wiring layer 811 is not illustrated because M5 is out of sight, but M5 is illustrated in FIG. 37 that is a cross-sectional view from a direction different from the cross-sectional view in FIG. 36.

As illustrated in FIG. 37, a pixel transistor Tr is formed in a pixel boundary region of an interface portion of the multilayer wiring layer 811 with the substrate 61. The pixel transistor Tr is one of the transfer transistor 721, the reset transistor 723, the amplification transistor 724, and the selection transistor 725 illustrated in FIGS. 31 and 32.

The metal film M1 closest to the substrate 61 among the five-layer metal films M1 to M5 of the multilayer wiring layer 811 includes a power supply line 813 for supplying a power supply voltage, voltage application wiring 814 for applying a predetermined voltage to the P+ semiconductor region 73-1 or 73-2, and a reflective member 815 that is a member that reflects the incident light. In the metal film M1 in FIG. 36, the wiring other than the power supply line 813 and the voltage application wiring 814 is the reflective member 815, but some reference numerals are omitted to prevent complication of the drawing. The reflective member 815 is dummy wiring provided for the purpose of reflecting incident light, and corresponds to the reflective member 631 illustrated in FIG. 28. The reflective member 815 is arranged below the N+ semiconductor regions 71-1 and 71-2 that are charge detection portions to overlap with the N+ semiconductor regions 71-1 and 71-2 in plan view. Note that, in a case where the light-shielding member 631' in the fifteenth embodiment is provided instead of the reflective member 631 in the fourteenth embodiment illustrated in FIG. 28, the reflective member 815 in FIG. 36 becomes the light-shielding member 631'.

Furthermore, in the metal film M1, charge extraction wiring (not illustrated in FIG. 36) connecting the N+ semiconductor region 71 and the transfer transistor 721 is also formed in order to transfer the charge accumulated in the N+ semiconductor region 71 to the FD 722.

Note that, in this example, the reflective member 815 (reflective member 631) and the charge extraction wiring are arranged in the same layer of the metal film M1. However, the arrangement is not necessarily limited to the arrangement in the same layer.

In the second-layer metal film M2 from the substrate 61 side, for example, voltage application wiring 816 connected to the voltage application wiring 814 of the metal film M1, a control line 817 for transmitting the drive signal TRG, the drive signal RST, the selection signal SEL, the drive signal FDG, and the like, and a ground line are formed. Furthermore, in the metal film M2, the FD 722B and the additional capacitance 727A are formed.

In the third-layer metal film M3 from the substrate 61 side, the vertical signal line 29, a VSS wire for shielding, and the like are formed, for example.

In the fourth-layer metal film M4 and the fifth-layer metal film M5 from the substrate 61 side, the voltage supply lines 741-1 and 741-2 (FIGS. 33A, 33B, 34A, and 34B) for applying the predetermined voltage MIX0 or MIX1 to the P+ semiconductor regions 73-1 and 73-2 that are voltage application portions of the signal extraction portions 65 are formed, for example.

Note that the planar arrangement of the five-layer metal films M1 to M5 of the multilayer wiring layer 811 will be described below with reference to FIGS. 42A, 42B, 42C, 43A, and 43B.

Figure 38:
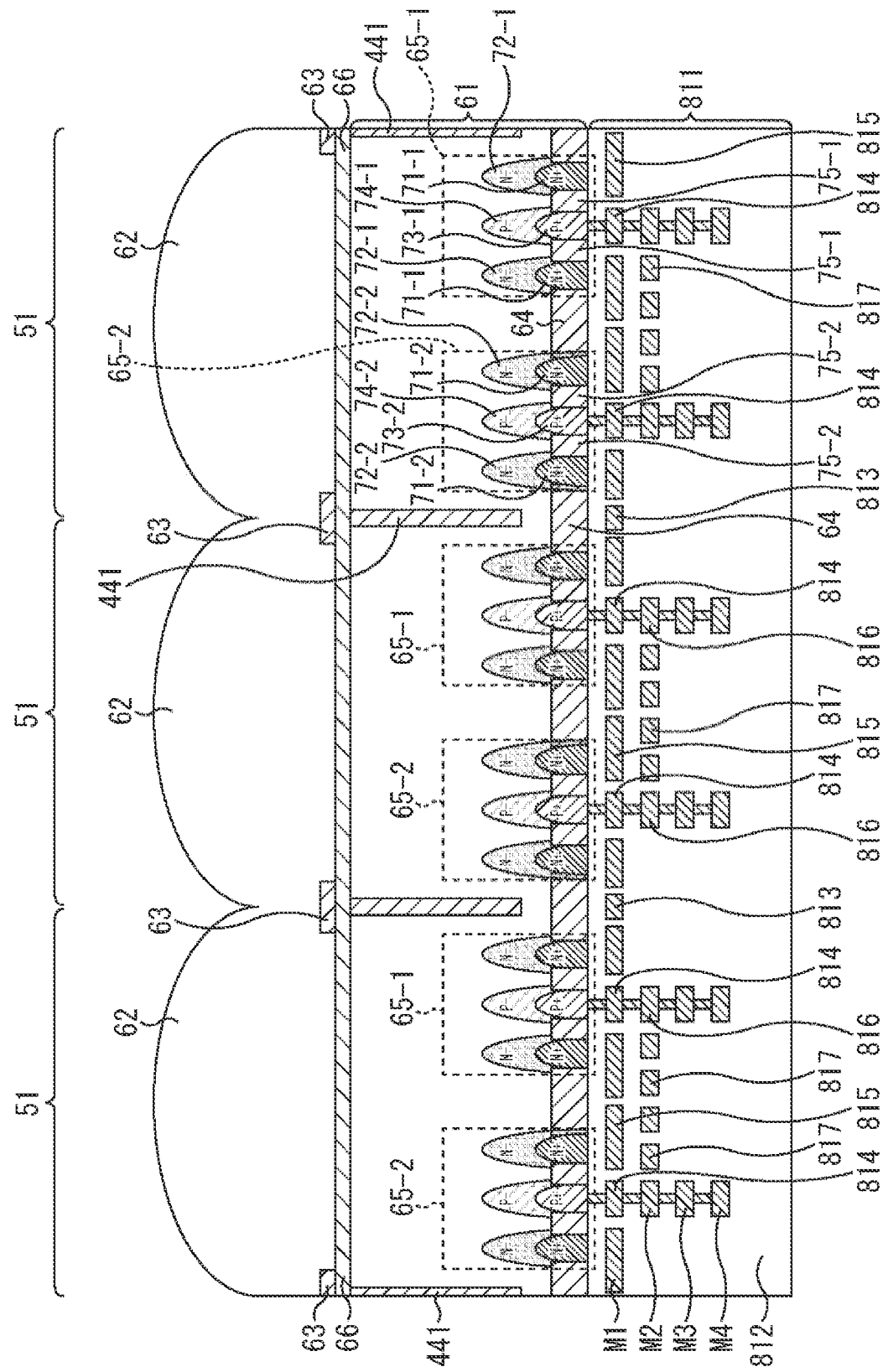
FIG. 38 is a cross-sectional view of a plurality of pixels in a ninth embodiment.

Cross-Sectional Configuration of Plurality of Pixels According to Ninth Embodiment FIG. 38 is a cross-sectional view illustrating a pixel structure according to the ninth embodiment illustrated in FIG. 22, for a plurality of pixels without omitting the multilayer wiring layer.

The ninth embodiment illustrated in FIG. 22 has the pixel configuration provided with the separation region 441 in the pixel boundary portion in the substrate 61, the separation region 441 being obtained by forming a long groove (trench) up to the predetermined depth from the back surface (light incident surface) side of the substrate 61 and embedding the light-shielding film.

The other configurations including, for example, the signal extraction portions 65-1 and 65-2 and the five-layer metal films M1 to M5 of the multilayer wiring layer 811 are similar to the configuration illustrated in FIG. 36.

Figure 39:
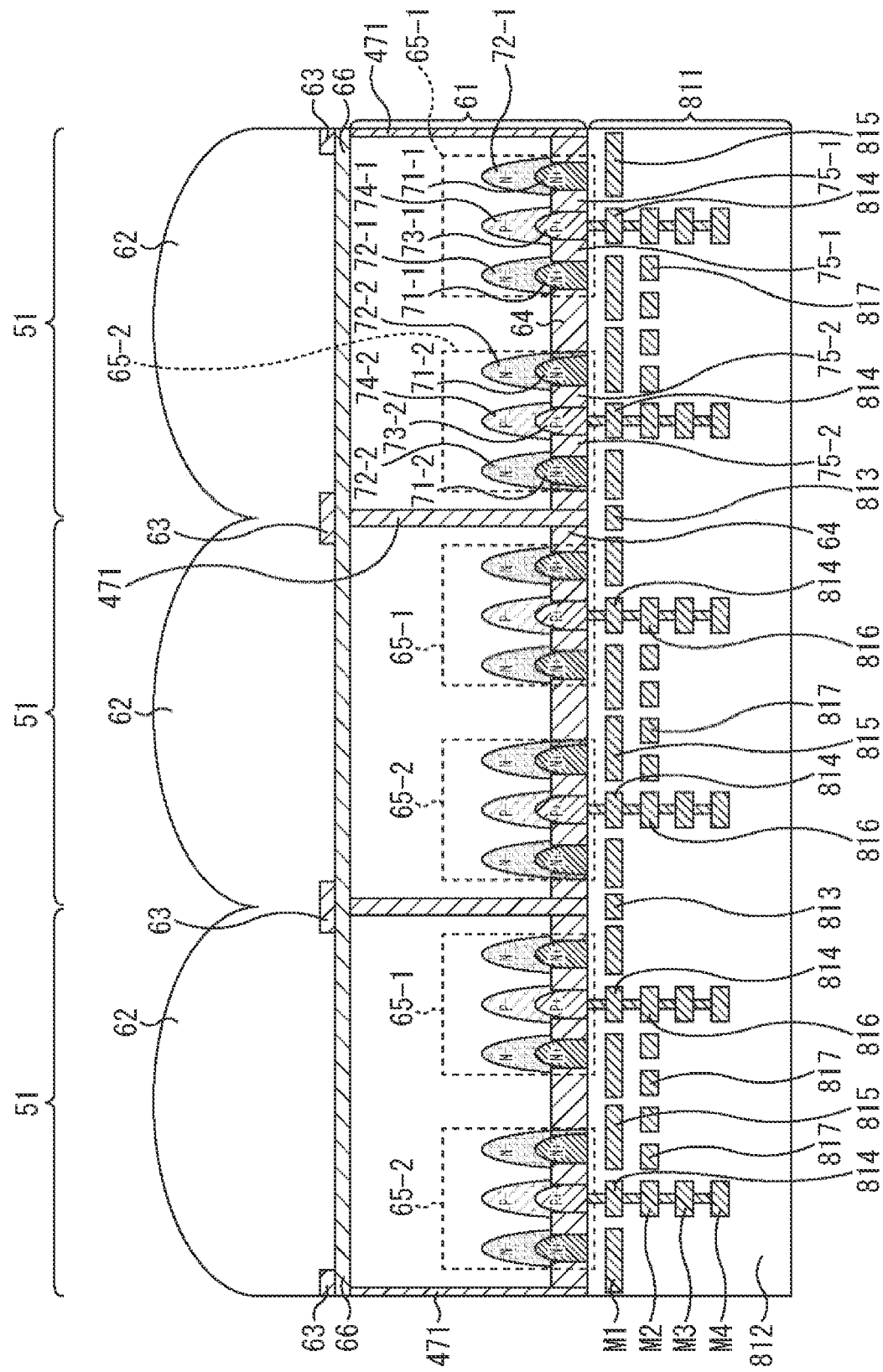
FIG. 39 is a cross-sectional view of a plurality of pixels in a modification 1 of the ninth embodiment.

Cross-Sectional Configuration of Plurality of Pixels According to Modification 1 of Ninth Embodiment FIG. 39 is a cross-sectional view illustrating a pixel structure according to Modification 1 of the ninth embodiment illustrated in FIG. 23, for a plurality of pixels without omitting the multilayer wiring layer.

Modification 1 of the ninth embodiment illustrated in FIG. 23 has the pixel configuration provided with the separation region 471 penetrating the entire substrate 61 in the pixel boundary portion in the substrate 61.

The other configurations including, for example, the signal extraction portions 65-1 and 65-2 and the five-layer metal films M1 to M5 of the multilayer wiring layer 811 are similar to the configuration illustrated in FIG. 36.

Figure 40:
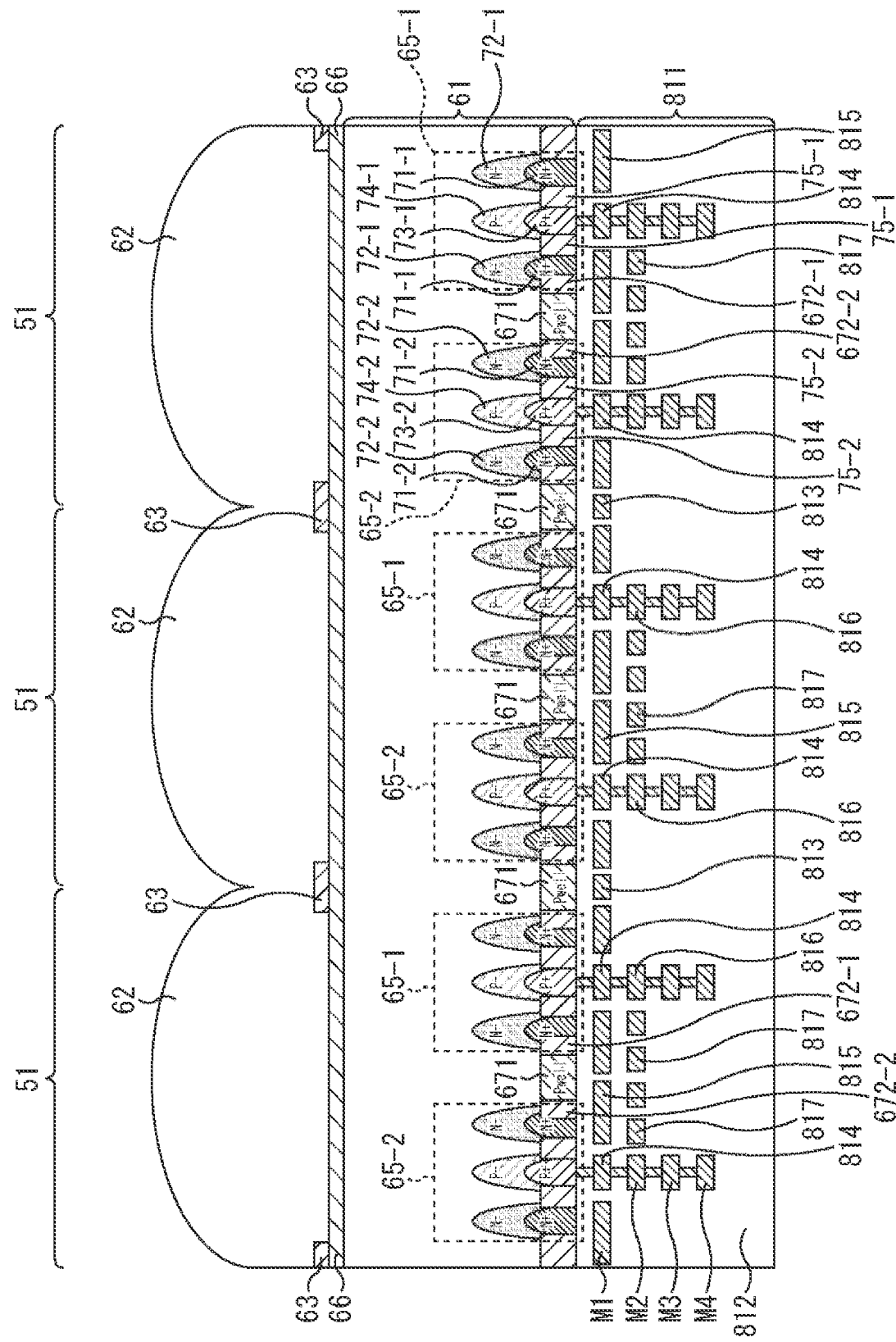
FIG. 40 is a cross-sectional view of a plurality of pixels in a fifteenth embodiment.

Cross-Sectional Configuration of Plurality of Pixels According to Sixteenth Embodiment FIG. 40 is a cross-sectional view illustrating a pixel structure according to the sixteenth embodiment illustrated in FIG. 29, for a plurality of pixels without omitting the multilayer wiring layer.

The sixteenth embodiment illustrated in FIG. 29 has a configuration provided with the P-well region 671 in the central portion inside the surface of the substrate 61, the surface being opposite to the light incident surface, that is, inside the lower surface in FIG. 29. Furthermore, the separation portion 672-1 is formed using an oxide film and the like between the P-well region 671 and the N+ semiconductor region 71-1. Similarly, the separation portion 672-2 is formed using an oxide film and the like between the P-well region 671 and the N+ semiconductor region 71-2. The P-well region 671 is also formed in a pixel boundary portion of the lower surface of the substrate 61.

The other configurations including, for example, the signal extraction portions 65-1 and 65-2 and the five-layer metal films M1 to M5 of the multilayer wiring layer 811 are similar to the configuration illustrated in FIG. 36.

Figure 41:
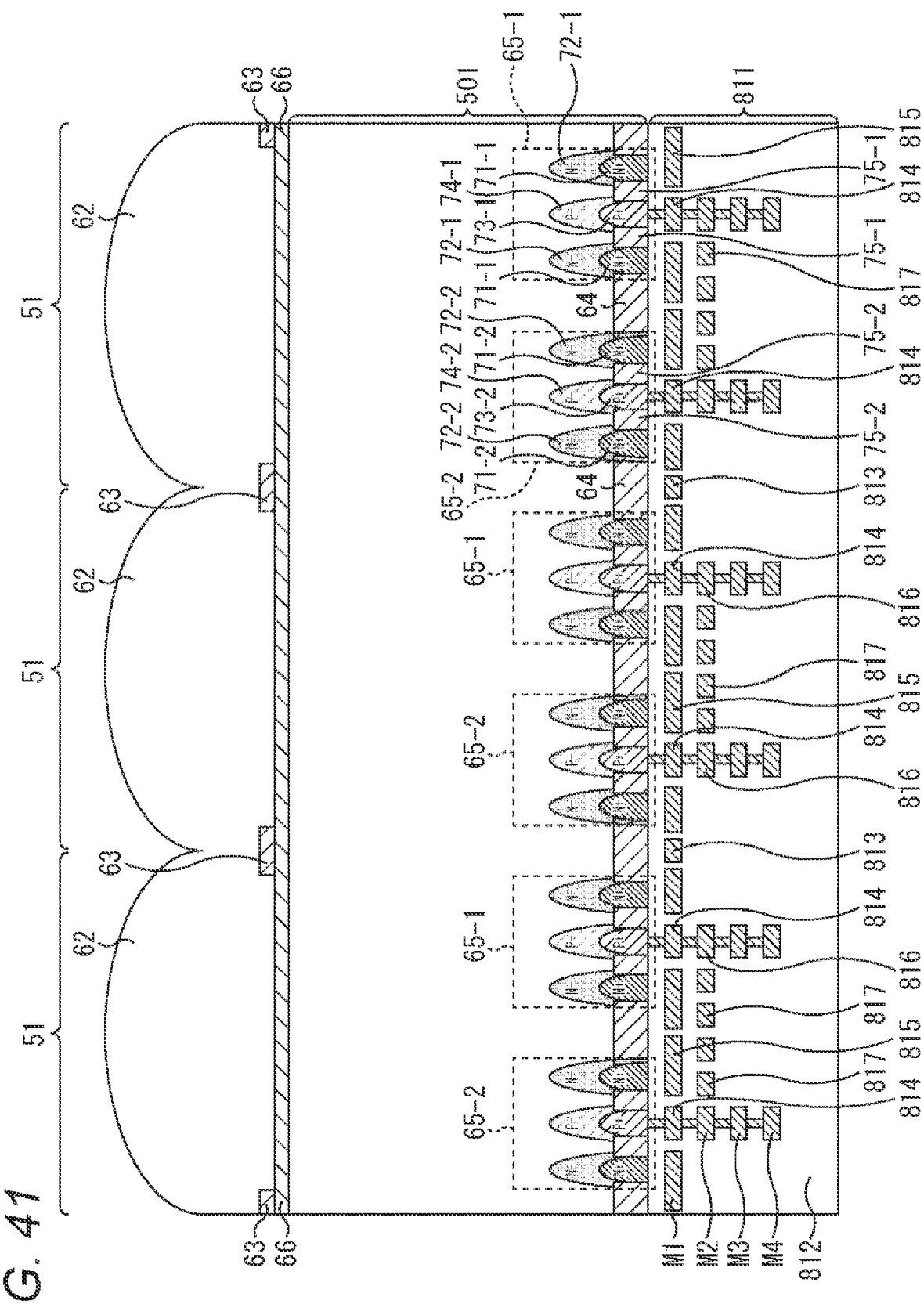
FIG. 41 is a cross-sectional view of a plurality of pixels in a tenth embodiment.

Cross-Sectional Configuration of Plurality of Pixels According to Tenth Embodiment FIG. 41 is a cross-sectional view illustrating a pixel structure according to the tenth embodiment illustrated in FIG. 24, for a plurality of pixels without omitting the multilayer wiring layer.

The tenth embodiment illustrated in FIG. 24 has the pixel configuration provided with the substrate 501 having a thick substrate instead of the substrate 61.

The other configurations including, for example, the signal extraction portions 65-1 and 65-2 and the five-layer metal films M1 to M5 of the multilayer wiring layer 811 are similar to the configuration illustrated in FIG. 36.

<Planar Arrangement Example of Five-Layer Metal Films M1 to M5>

Next, the planar arrangement example of the five-layer metal films M1 to M5 of the multilayer wiring layer 811 illustrated in FIGS. 36 to 41 will be described with reference to FIGS. 42A, 42B, 42C, 43A, and 43B.

Figure 42A:
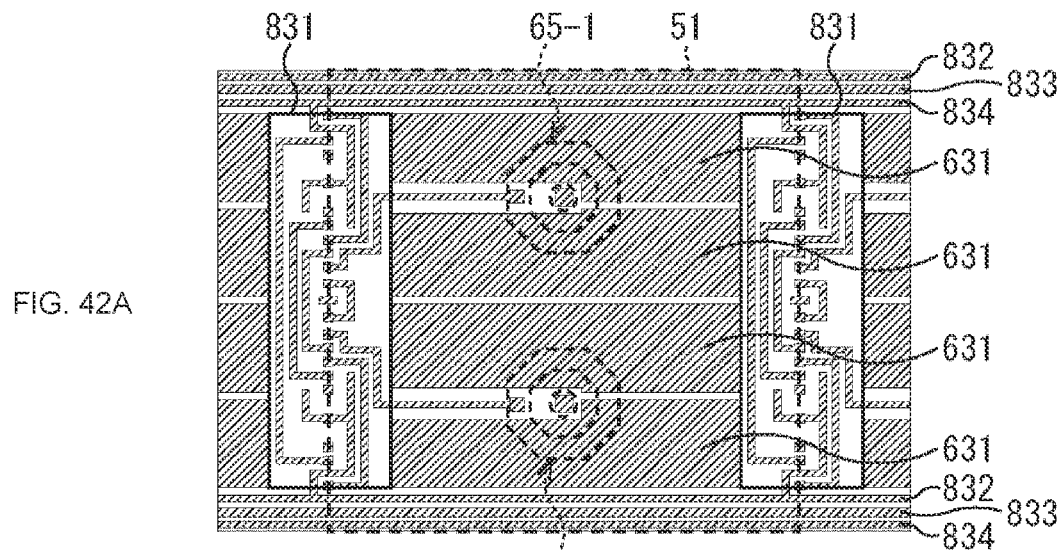
FIGS. 42A, 42B, and 42C are views for describing a five-layer metal film of a multilayer wiring layer.

FIG. 42A illustrates the planar arrangement example of the metal film M1 as the first layer among the five-layer metal films M1 to M5 of the multilayer wiring layer 811.

Figure 42B:
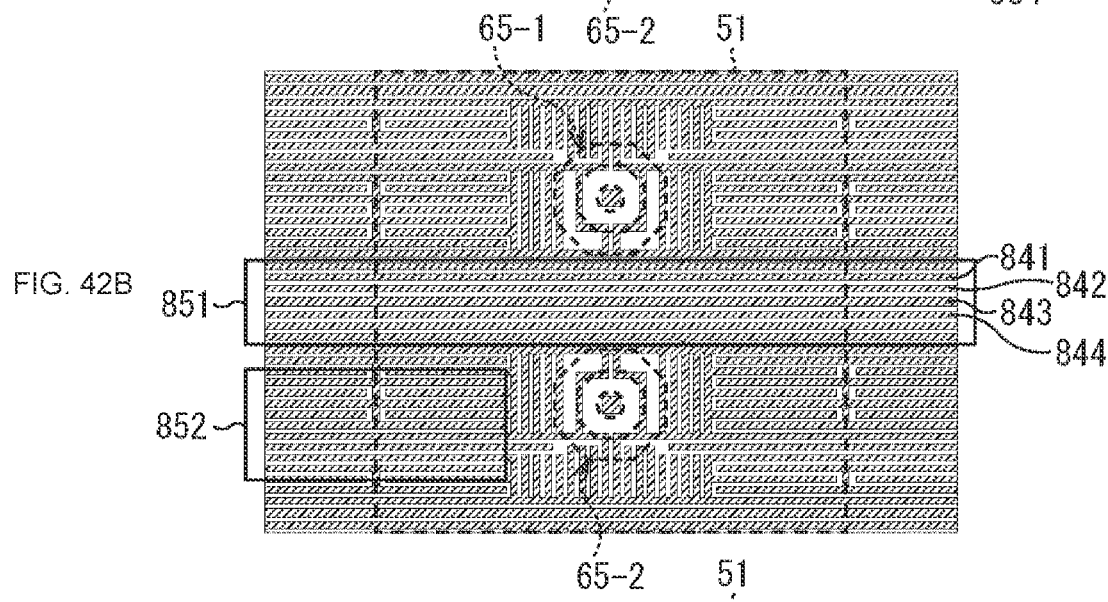

FIG. 42B illustrates the planar arrangement example of the metal film M2 as the second layer among the five-layer metal films M1 to M5 of the multilayer wiring layer 811.

Figure 42C:
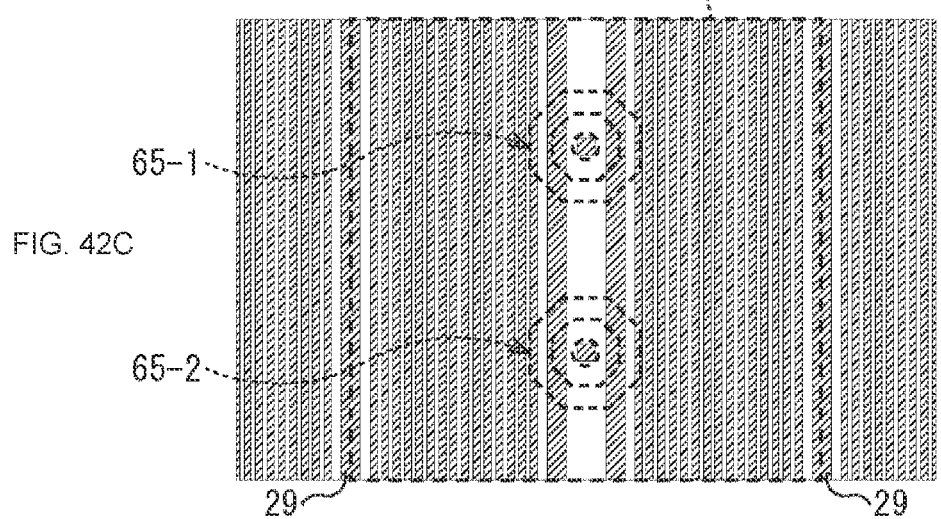

FIG. 42C illustrates the planar arrangement example of the metal film M3 as the third layer among the five-layer metal films M1 to M5 of the multilayer wiring layer 811.

Figure 43A:
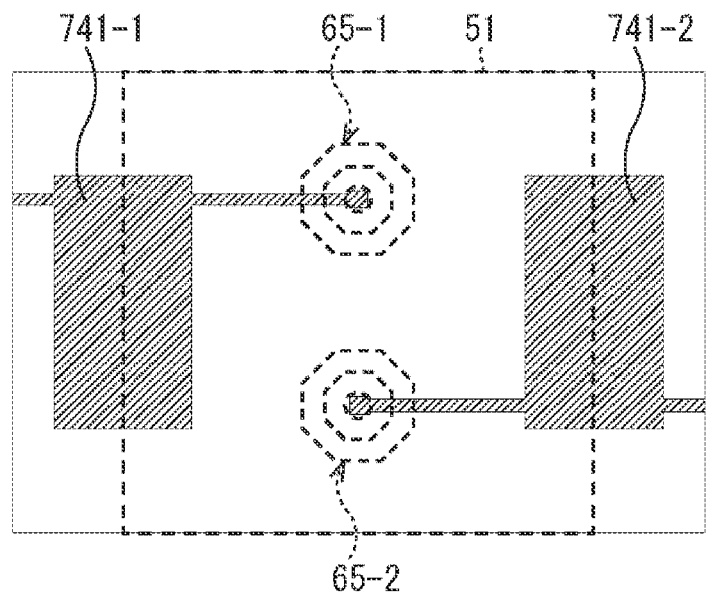
FIGS. 43A and 43B are views for describing a five-layer metal film of a multilayer wiring layer.

FIG. 43A illustrates the planar arrangement example of the metal film M4 as the fourth layer among the five-layer metal films M1 to M5 of the multilayer wiring layer 811.

Figure 43B:
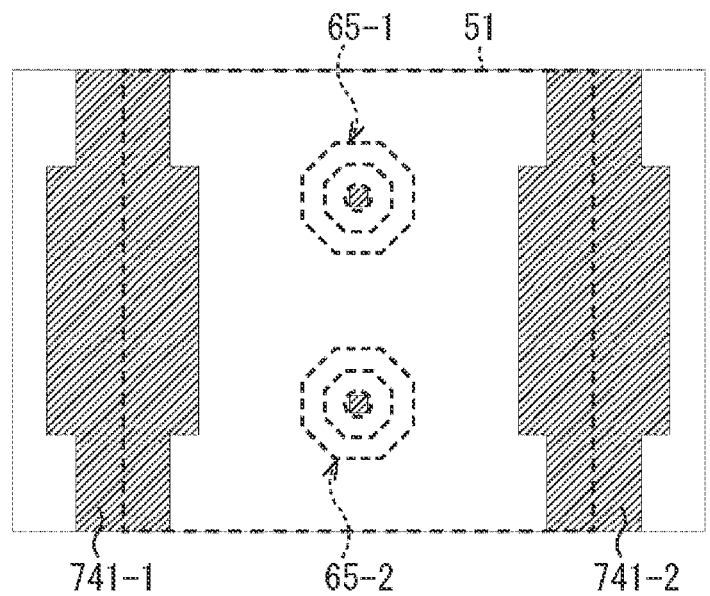

FIG. 43B illustrates the planar arrangement example of the metal film M5 as the fifth layer among the five-layer metal films M1 to M5 of the multilayer wiring layer 811.

In FIGS. 42A, 42B, 42C, 43A, and 43B, the region of the pixel 51 and the regions of the signal extraction portions 65-1 and 65-2 having an octagonal shape illustrated in FIG. 11 are illustrated by broken lines.

In FIGS. 42A, 42B, 42C, 43A, and 43B, the up-down direction in the drawings is the vertical direction of the pixel array unit 20, and the cross direction in the drawings is the horizontal direction of the pixel array unit 20.

As illustrated in FIG. 42A, the reflective member 631 that reflects the infrared light is formed in the metal film M1 that is the first layer of the multilayer wiring layer 811. In the region of the pixel 51, two reflective members 631 are formed for each of the signal extraction portions 65-1 and 65-2, and the two reflective members 631 for the signal extraction portion 65-1 and the two reflective members 631 for the signal extraction portion 65-1 are formed symmetrically in the vertical direction.

Furthermore, a pixel transistor wiring region 831 is arranged in a space between the reflective members 631 of the pixel 51 and reflective members 631 of a pixel 51 adjacent in the horizontal direction. In the pixel transistor wiring region 831, wiring for connecting the pixel transistors Tr of the transfer transistor 721, the reset transistor 723, the amplification transistor 724, or the selection transistor 725 is formed. The wiring for the pixel transistor Tr is also formed symmetrically in the vertical direction with reference to an intermediate line (not illustrated) of the two signal extraction portions 65-1 and 65-2.

Furthermore, wires such as a ground line 832, a power supply line 833, and a ground line 834 are formed in a space between the reflective member 631 of the pixel and a reflective member 631 of a pixel 51 adjacent in the vertical direction. These wires are also formed symmetrically in the vertical direction with reference to the intermediate line of the two signal extraction portions 65-1 and 65-2.

In this way, the first-layer metal film M1 is symmetrically arranged in the region on the signal extraction portion 65-1 side and the region on the signal extraction portion 65-2 side in the pixel, so that a wiring load is evenly adjusted between the signal extraction portions 65-1 and 65-2. Thereby, drive variation of the signal extraction portions 65-1 and 65-2 is reduced.

In the first-layer metal film M1, the large-area reflective members 631 are formed under the signal extraction portions 65-1 and 65-2 formed in the substrate 61, so that the infrared light having entered the substrate 61 via the on-chip lens 62 and transmitted through the substrate 61 without being photoelectrically converted in the substrate 61 can be reflected by the reflective members 631 to re-enter the substrate 61. As a result, the amount of infrared light photoelectrically converted in the substrate 61 can be increased, and quantum efficiency (QE), that is, the sensitivity of the pixel 51 to infrared light can be improved.

Meanwhile, in the first-layer metal film M1, in the case of arranging the light-shielding member 631' in the same region as the reflective members 631 instead of the reflective members 631, the infrared light having entered the substrate 61 from the light incident surface via the on-chip lens 62 and transmitted through the substrate 61 without being photoelectrically converted in the substrate 61 can be suppressed from being scattered in the wiring layer and entering a nearby pixel. Thereby, the erroneous detection of light in the nearby pixel can be prevented.

As illustrated in FIG. 42B, in the metal film M2 as the second layer of the multilayer wiring layer 811, a control line region 851 in which control lines 841 to 844 and the like for transmitting a predetermined signal in the horizontal direction are formed is arranged at a position between the signal extraction portions 65-1 and 65-2. The control lines 841 to 844 are lines for transmitting, for example, the drive signal TRG, the drive signal RST, the selection signal SEL, or the drive signal FDG.

By arranging the control line region 851 between the two signal extraction portions 65, influences on each of the signal extraction portions 65-1 and 65-2 become equal, and the drive variation of the signal extraction portions 65-1 and 65-2 can be reduced.

Furthermore, a capacitance region 852 in which the FD 722B and the additional capacitance 727A are formed is arranged in a predetermined region different from the control line region 851 of the metal film M2 as the second layer. In the capacitance region 852, the FD 722B or the additional capacitance 727A is configured by forming the metal film M2 in a comb-teeth shape.

By arranging the FD 722B or the additional capacitance 727A in the metal film M2 as the second layer, the pattern of the FD 722B or the additional capacitance 727A can be freely arranged according to a desired wiring capacitance in the design, and the design freedom can be improved.

As illustrated in FIG. 42C, in the metal film M3 as the third layer of the multilayer wiring layer 811, at least the vertical signal line 29 for transmitting the pixel signal output from each pixel 51 to the column processing unit 23 is formed. Three or more vertical signal lines 29 can be arranged for one pixel column in order to improve a read speed of the pixel signal. Furthermore, shielding wiring may be arranged to reduce a coupling capacitance, in addition to the vertical signal lines 29.

In the fourth-layer metal film M4 and the fifth-layer metal film M5 of the multilayer wiring layer 811, the voltage supply lines 741-1 and 741-2 for applying the predetermined voltage MIX0 or MIX1 are formed in the P+ semiconductor regions 73-1 and 73-2 of the signal extraction portions 65 of each pixel 51.

The metal film M4 and the metal film M5 illustrated in FIGS. 43A and 43B illustrate an example of adopting the voltage supply lines 741 of the first arrangement example illustrated in FIG. 33A.

The voltage supply line 741-1 of the metal film M4 is connected to the voltage application wiring 814 (for example, FIG. 36) of the metal film M1 via the metal films M3 and M2, and the voltage application wiring 814 is connected to the P+ semiconductor region 73-1 of the signal extraction portion 65-1 of the pixel 51. Similarly, the voltage supply line 741-2 of the metal film M4 is connected to the voltage application wiring 814 (for example, FIG. 36) of the metal film M1 via the metal films M3 and M2, and the voltage application wiring 814 is connected to the P+ semiconductor region 73-2 of the signal extraction portion 65-2 of the pixel 51.

The voltage supply lines 741-1 and 741-2 of the metal film M5 are connected to the tap drive unit 21 around the pixel array unit 20. The voltage supply line 741-1 of the metal film M4 and the voltage supply line 741-1 of the metal film M5 are connected by a via or the like (not illustrated) at a predetermined position in a plane region where both of the metal films are present. The predetermined voltage MIX0 or MIX1 from the tap drive unit 21 is transmitted through the voltage supply lines 741-1 and 741-2 of the metal film M5 and is supplied to the voltage supply lines 741-1 and 741-2 of the metal film M4, and is supplied from the voltage supply lines 741-1 and 741-2 to the voltage application wiring 814 of the metal film M1 via the metal films M3 and M2.

By adopting the back-illuminated CAPD sensor as the light-receiving element 1, the wiring width and layout of the drive wiring can be freely designed, such as the voltage supply lines 741-1 and 741-2 for applying the predetermined voltage MIX0 or MIX1 to the signal extraction portion 65 of each pixel 51 being wired in the vertical direction, as illustrated in FIGS. 43A and 43B. Furthermore, wiring suitable for high-speed driving and wiring considering load reduction are also possible.

<Planar Arrangement Example of Pixel Transistors>

Figure 44A:
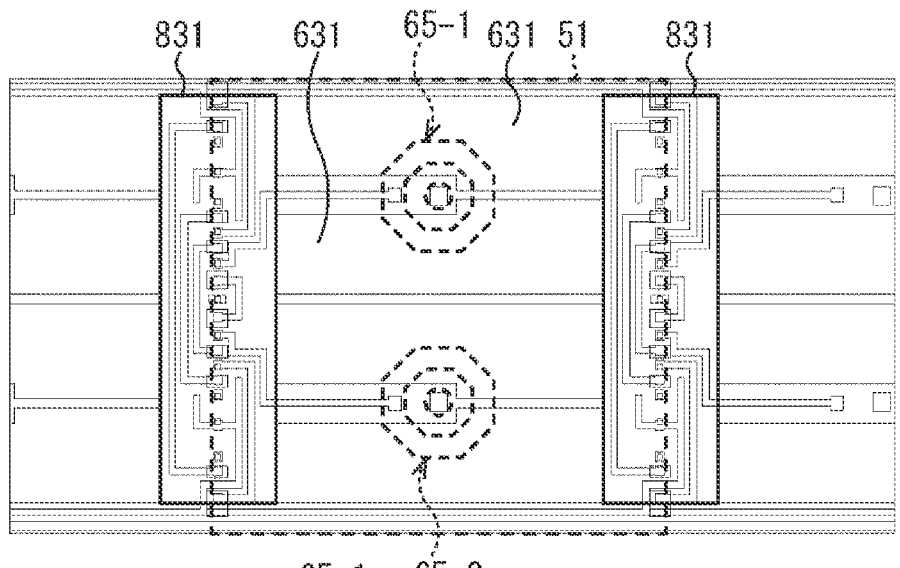
FIGS. 44A, 44B, and 44C are views for describing a polysilicon layer.
Figure 44B:
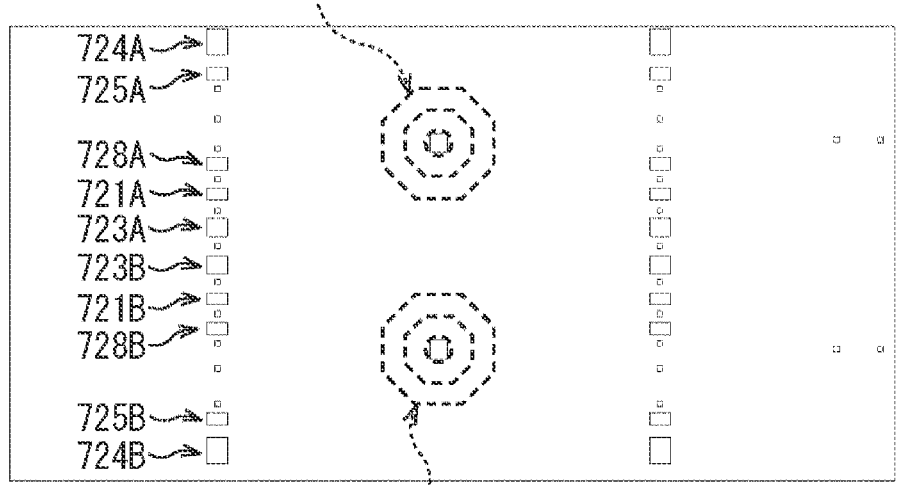
Figure 44C:
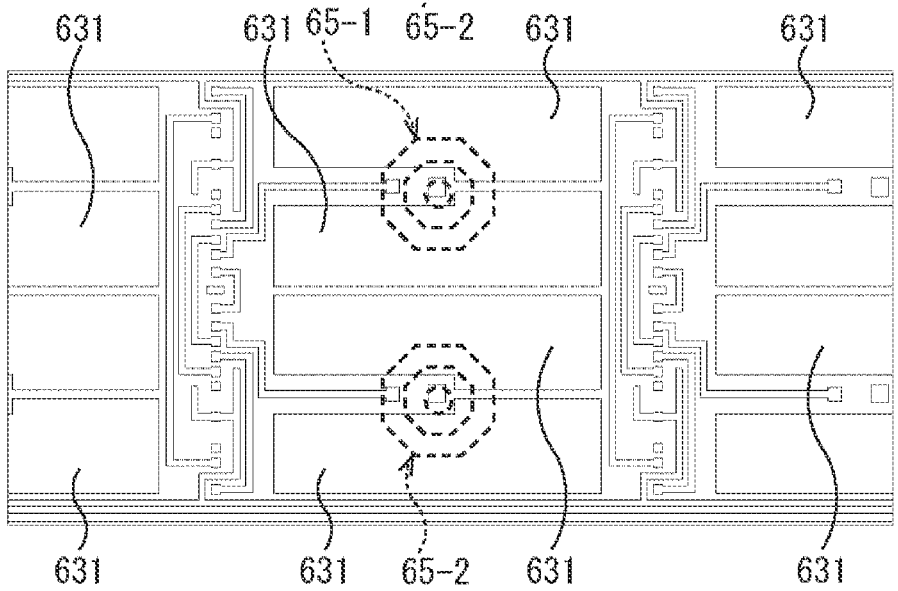

FIGS. 44A, 44B, and 44C are plan views in which the first-layer metal film M1 illustrated in FIG. 42A, and a polysilicon layer for forming a gate electrode of the pixel transistor Tr formed on the metal film M1 and the like are superposed.

FIG. 44A is a plan view in which the metal film M1 in FIG. 44C and the polysilicon layer in FIG. 44B are superimposed, FIG. 44B is a plan view of only the polysilicon layer, and FIG. 44C is a plan view of only the metal film M1. The plan view of the metal film M1 in FIG. 44C is the same as the plan view illustrated in FIG. 42A, but hatching is omitted.

As described with reference to FIG. 42A, the pixel transistor wiring region 831 is formed between the reflective members 631 of the respective pixels.

In the pixel transistor wiring region 831, the pixel transistors Tr each corresponding to the signal extraction portions 65-1 and 65-2 are arranged as illustrated in FIG. 44B, for example.

In FIG. 44B, gate electrodes of the reset transistors 723A and 723B, the transfer transistors 721A and 721B, the switching transistors 728A and 728B, the selection transistors 725A and 725B, and the amplification transistors 724A and 724B are formed from a side close to the intermediate line (not illustrated) of the two signal extraction portions 65-1 and 65-2 with reference to the intermediate line.

The wiring for connecting the pixel transistors Tr of the metal film M1 illustrated in FIG. 44C is also formed symmetrically in the vertical direction with reference to the intermediate line (not illustrated) of the two signal extraction portions 65-1 and 65-2.

By symmetrically arranging the plurality of pixel transistors Tr in the pixel transistor wiring region 831 in the region on the signal extraction portion 65-1 side and the region on the signal extraction portion 65-2 side in this manner, the drive variation of the signal extraction portions 65-1 and 65-2 can be reduced.

<Modification of Reflective Member 631>

Next, a modification of the reflective member 631 formed in the metal film M1 will be described with reference to FIGS. 45A, 45B, 45C, 46A, and 46B.

In the above example, the large-area reflective member 631 is arranged in the region around the signal extraction portion 65 in the pixel 51, as illustrated in FIG. 42A.

In contrast, the reflective member 631 can also be arranged in a grid-like pattern, as illustrated in FIG. 45A, for example. By forming the reflective member 631 in a grid-like pattern in this manner, pattern anisotropy can be eliminated and XY anisotropy of reflection ability can be reduced. In other words, by forming the reflective member 631 in a grid-like pattern, reflection of incident light biased to some region can be reduced and the incident light can be isotropically reflected, and thus the distance-measuring accuracy is improved.

Alternatively, the reflective member 631 may be arranged in a striped pattern, for example, as illustrated in FIG. 45B. By forming the reflective member 631 in a striped pattern in this manner, the pattern of the reflective member 631 can also be used as a wiring capacitance, and thus a configuration with a maximized dynamic range can be implemented.

Note that FIG. 45 illustrates an example of the vertical stripe shape, but a horizontal stripe shape may be adopted.

Alternatively, the reflective member 631 may be arranged only in a pixel center region, more specifically, only between the two signal extraction portions 65, as illustrated in FIG. 45C, for example. By forming the reflective member 631 in the pixel center region and not forming the reflective member 631 in a pixel center region end, components reflected to an adjacent pixel in the case where oblique light is incident can be suppressed while obtaining an effect of improving the sensitivity by the reflective member 631 with respect to the pixel center region, whereby a configuration emphasizing crosstalk suppression can be implemented.

Figure 46A:
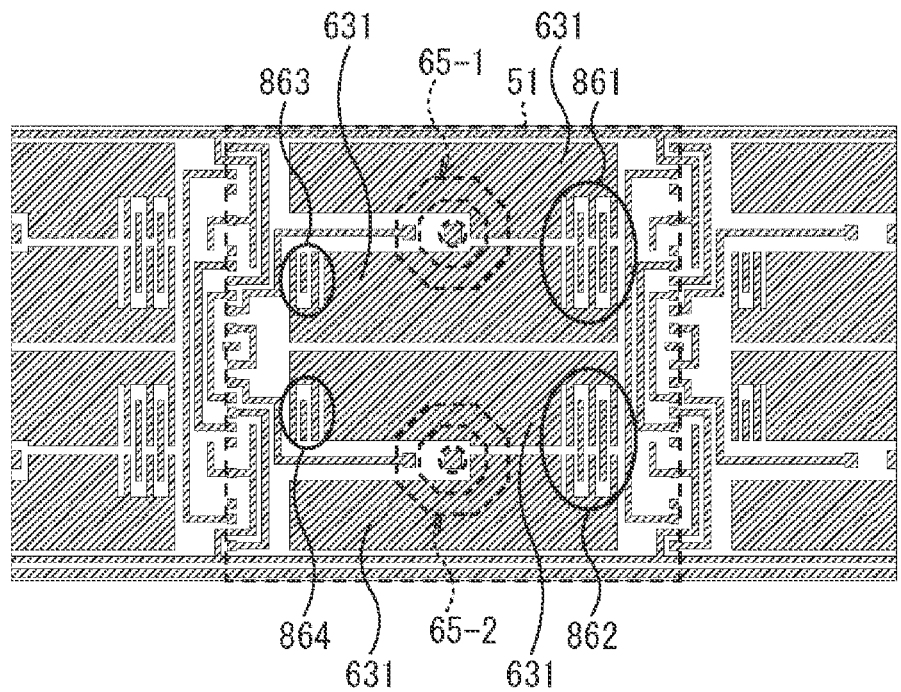
FIGS. 46A and 46B are views illustrating a modification of a reflective member formed in a metal film.

Furthermore, by arranging a part of the reflective member 631 in a comb-teeth pattern, as illustrated in FIG. 46A, a part of the metal film M1 may be allocated to the wiring capacitance of the FD 722 or the additional capacitance 727. In FIG. 46A, the comb-teeth shapes within regions 861 to 864 surrounded by the solid circles constitute at least a part of the FD 722 or the additional capacitance 727. The FD 722 or the additional capacitance 727 may be appropriately distributed and arranged in the metal film M1 and the metal film M2. The pattern of the metal film M1 can be arranged in a well-balanced manner in the reflective member 631 and in the capacitance of the FD 722 or the additional capacitance 727.

Figure 46B:
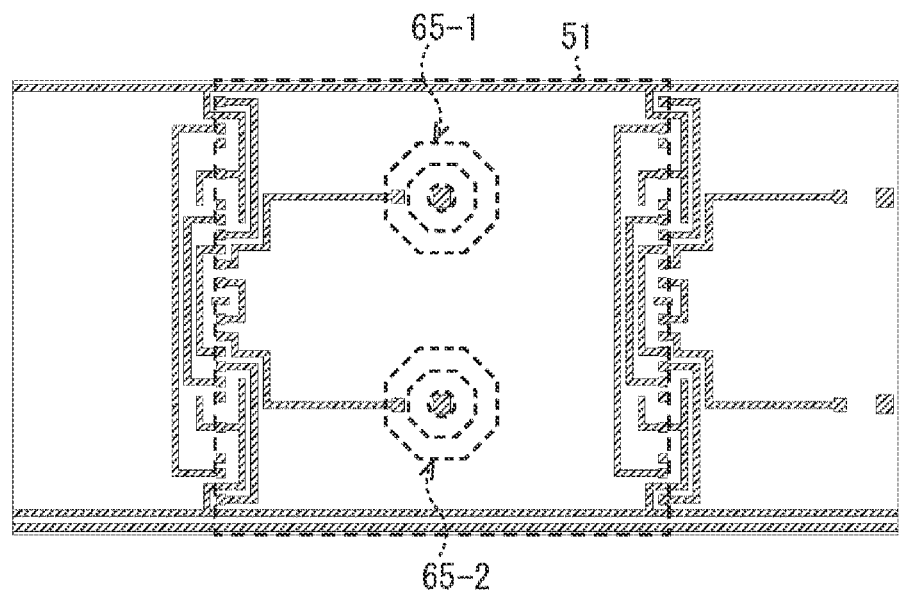

FIG. 46B illustrates the pattern of the metal film M1 in the case of not arranging the reflective member 631. To increase the amount of infrared light photoelectrically converted in the substrate 61 and improve the sensitivity of the pixel 51, it is favorable to arrange the reflective member 631 but a configuration in which no reflective member 631 is arranged can be adopted.

The arrangement examples of the reflective member 631 illustrated in FIGS. 45A, 45B, 45C, 46A, and 46B can be similarly applied to the light-shielding member 631'.

<Configuration Example of Substrate of Light-Receiving Element>

Figure 47A:
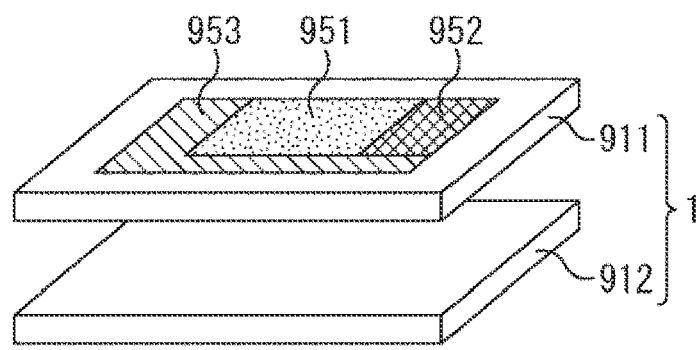
FIGS. 47A, 47B, and 47C are views for describing a substrate configuration of a light-receiving element.
Figure 47B:
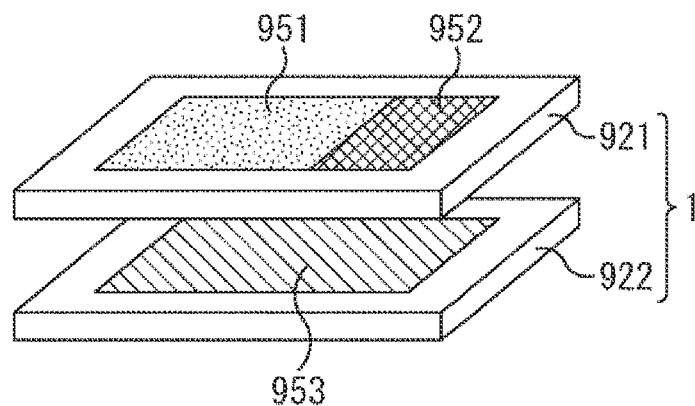
Figure 47C:
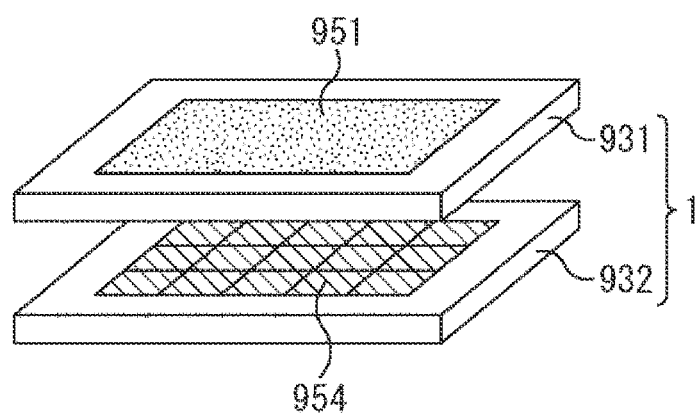

The light-receiving element 1 in FIG. 1 can adopt the substrate configuration of any one of FIGS. 47A, 47B, and 47C.

FIG. 47A illustrates an example in which the light-receiving element 1 is configured using one semiconductor substrate 911 and a support substrate 912 under the semiconductor substrate 911.

In this case, in the upper semiconductor substrate 911, a pixel array region 951 corresponding to the above-described pixel array unit 20, a control circuit 952 that controls each of the pixels in the pixel array region 951, and a logic circuit 953 including a signal processing circuit for the pixel signal are formed.

The control circuit 952 includes the tap drive unit 21, the vertical drive unit 22, the horizontal drive unit 24, and the like described above. The logic circuit 953 includes the column processing unit 23 that performs AD conversion processing for the pixel signal and the like, and the signal processing unit 31 that performs distance calculation processing of calculating a distance from a ratio of the pixel signals acquired in each of the two or more signal extraction portions 65 in the pixel, calibration processing, and the like.

Alternatively, as illustrated in FIG. 47B, the light-receiving element 1 can have a configuration in which a first semiconductor substrate 921 in which the pixel array region 951 and the control circuit 952 are formed, and a second semiconductor substrate 922 in which the logic circuit 953 is formed are stacked. Note that the first semiconductor substrate 921 and the second semiconductor substrate 922 are electrically connected by, for example, a through via or a Cu—Cu metal bond.

Alternatively, as illustrated in FIG. 47C, the light-receiving element 1 can also have a configuration in which a first semiconductor substrate 931 in which only the pixel array region 951 is formed, and a second semiconductor substrate 932 in which an area control circuit 954 is formed are stacked, the area control circuit 954 being provided with a control circuit that control each pixel and a signal processing circuit that processes the pixel signal on a pixel basis or on an area of a plurality of pixels basis. The first semiconductor substrate 931 and the second semiconductor substrate 932 are electrically connected by, for example, a through via or a Cu—Cu metal bond.

According to the configuration provided with the control circuit and the signal processing circuit on a pixel basis or on an area basis as in the light-receiving element 1 in FIG. 47C, optimum drive timing and gain can be set for each division control unit, and optimized distance information can be acquired regardless of the distance or reflectance. Furthermore, the distance information can be calculated by driving only a part of the pixel array region 951 instead of the entire pixel array region 951. Therefore, the power consumption can be suppressed according to an operation mode.

<Noise Countermeasure Example Around Pixel Transistors>

By the way, as illustrated in the cross-sectional view in FIG. 37, the pixel transistors Tr such as the reset transistor 723, the amplification transistor 724, and the selection transistor 725 are arranged in the boundary portion of the pixels 51 arranged in the horizontal direction in the pixel array unit 20.

Figure 48:
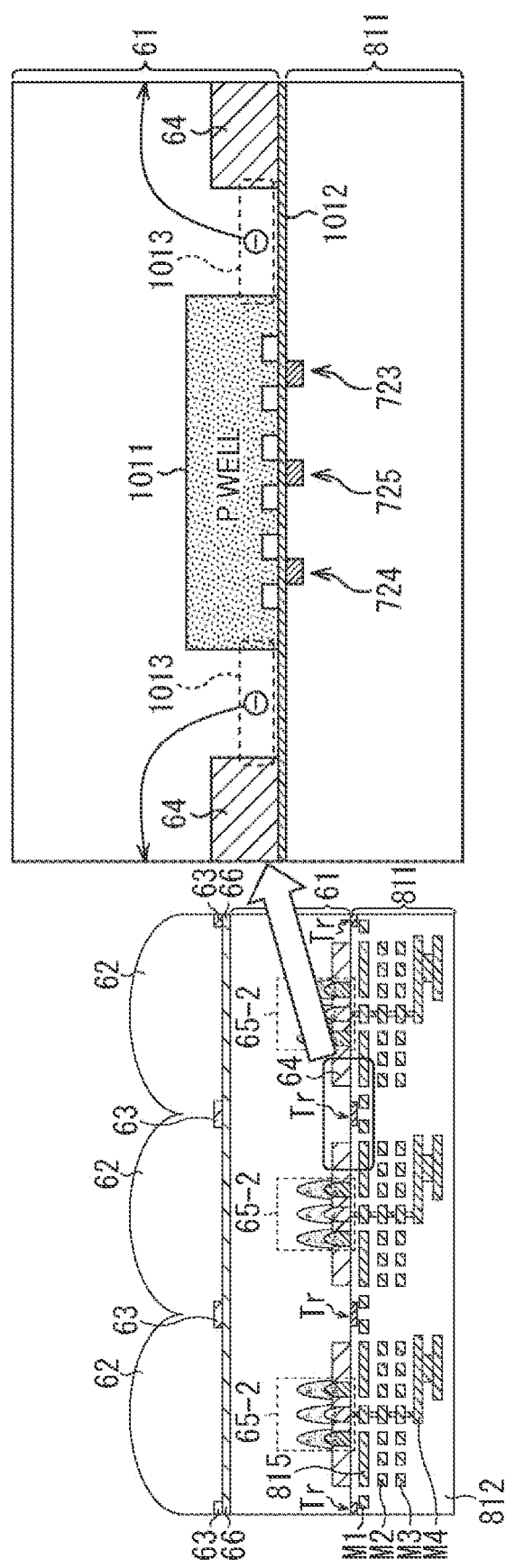
FIG. 48 is views for describing noise around a pixel transistor region.

When illustrating the pixel transistor arrangement region of the pixel boundary portion illustrated in FIG. 37 in more detail, the pixel transistors Tr such as the reset transistor 723, the amplification transistor 724, and the selection transistor 725 are arranged in a P-well region 1011 formed in the substrate 61 on the front surface side, as illustrated in FIG. 48.

The P-well region 1011 is formed to be isolated by a predetermined distance in a plane direction from the oxide film 64 such as shallow trench isolation (STI) formed around the N+ semiconductor region 71 of the signal extraction portion 65 Furthermore, an oxide film 1012 that also serves as a gate insulating film of the pixel transistor Tr is formed in a back-side interface of the substrate 61.

At this time, electrons are more likely to be accumulated in a gap region 1013 between the oxide film 64 and the P-well region 1011 by a potential created by positive charges in the oxide film 1012, in the back-side interface of the substrate 61, and in a case where there is no electron discharge mechanism, the electrons overflow and diffuse, and are collected in the N-type semiconductor region and become noise.

Figure 49A:
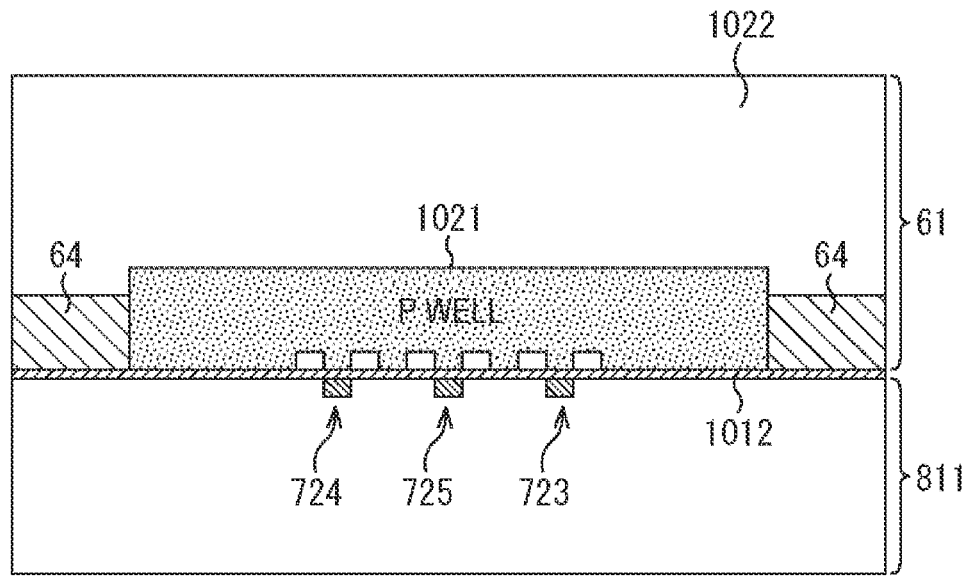
FIGS. 49A and 49B are views for describing a noise suppression structure around a pixel transistor region.

Therefore, as illustrated in FIG. 49A, a P-well region 1021 is formed to extend in the plane direction until it comes into contact with the adjacent oxide film 64 so as not to allow the gap region 1013 to exist in the back-side interface of the substrate 61. As a result, the electrons can be prevented from being accumulated in the gap region 1013 illustrated in FIG. 48, and therefore noise can be suppressed. The impurity concentration in the P-well region 1021 is formed to be higher than that in a P-type semiconductor region 1022 of the substrate 61 that is a photoelectric conversion region.

Figure 49B:
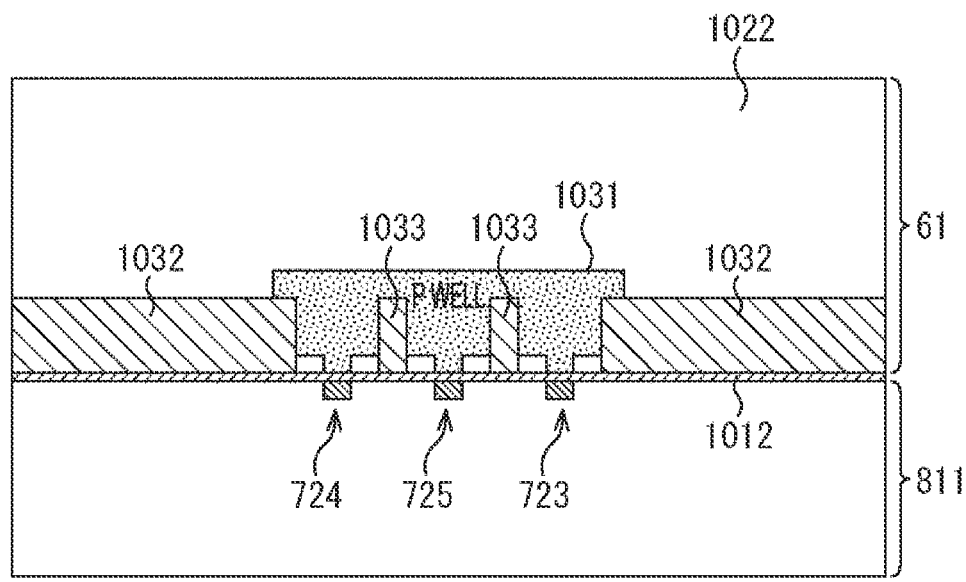

Alternatively, as illustrated in FIG. 49B, an oxide film 1032 formed around the N+ semiconductor region 71 of the signal extraction portion 65 may be formed to extend in the plane direction up to a P-well region 1031 so as not to allow the gap region 1013 to exist in the back-side interface of the substrate 61. In this case, the pixel transistors Tr such as the reset transistor 723, the amplification transistor 724, and the selection transistor 725 in the P-well region 1031 are also isolated by an oxide film 1033. The oxide film 1033 is formed using, for example, STI, and can be formed in the same process as the oxide film 1032.

The gap region 1013 can be eliminated as the insulating film (oxide film 64 and oxide film 1032) and the P-well region (P-well region 1021 and P-well region 1031) at the boundary portion of the pixel are in contact in the back-side interface of the substrate 61 by the configuration in FIG. 49A or 49B. Therefore, accumulation of electrons can be prevented and the noise can be suppressed. The configuration in FIG. 49A or 49B can be applied to any of the embodiments described in the present specification.

Figure 50:
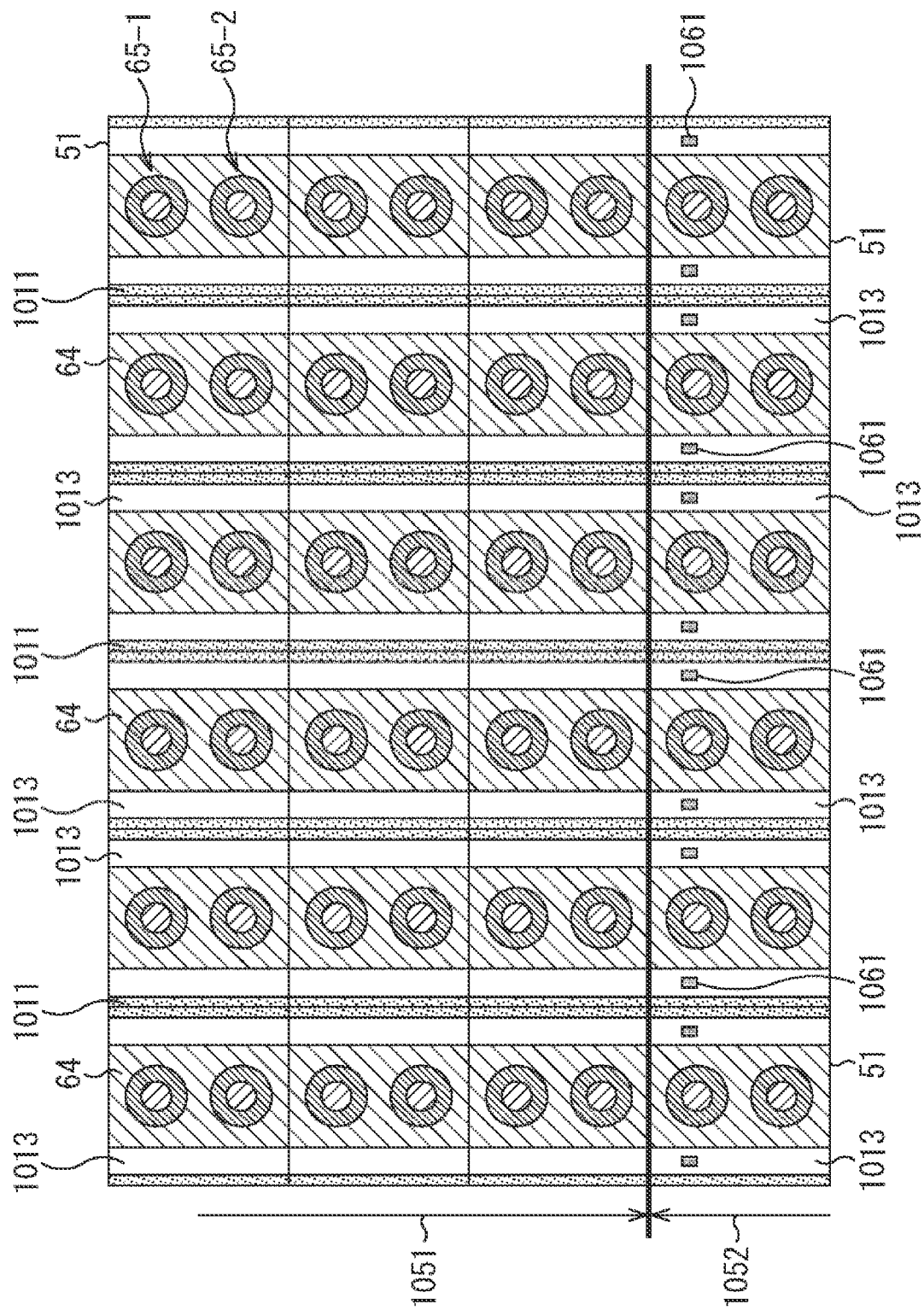
FIG. 50 is a view for describing a charge discharge structure around a pixel transistor region.
Figure 51:
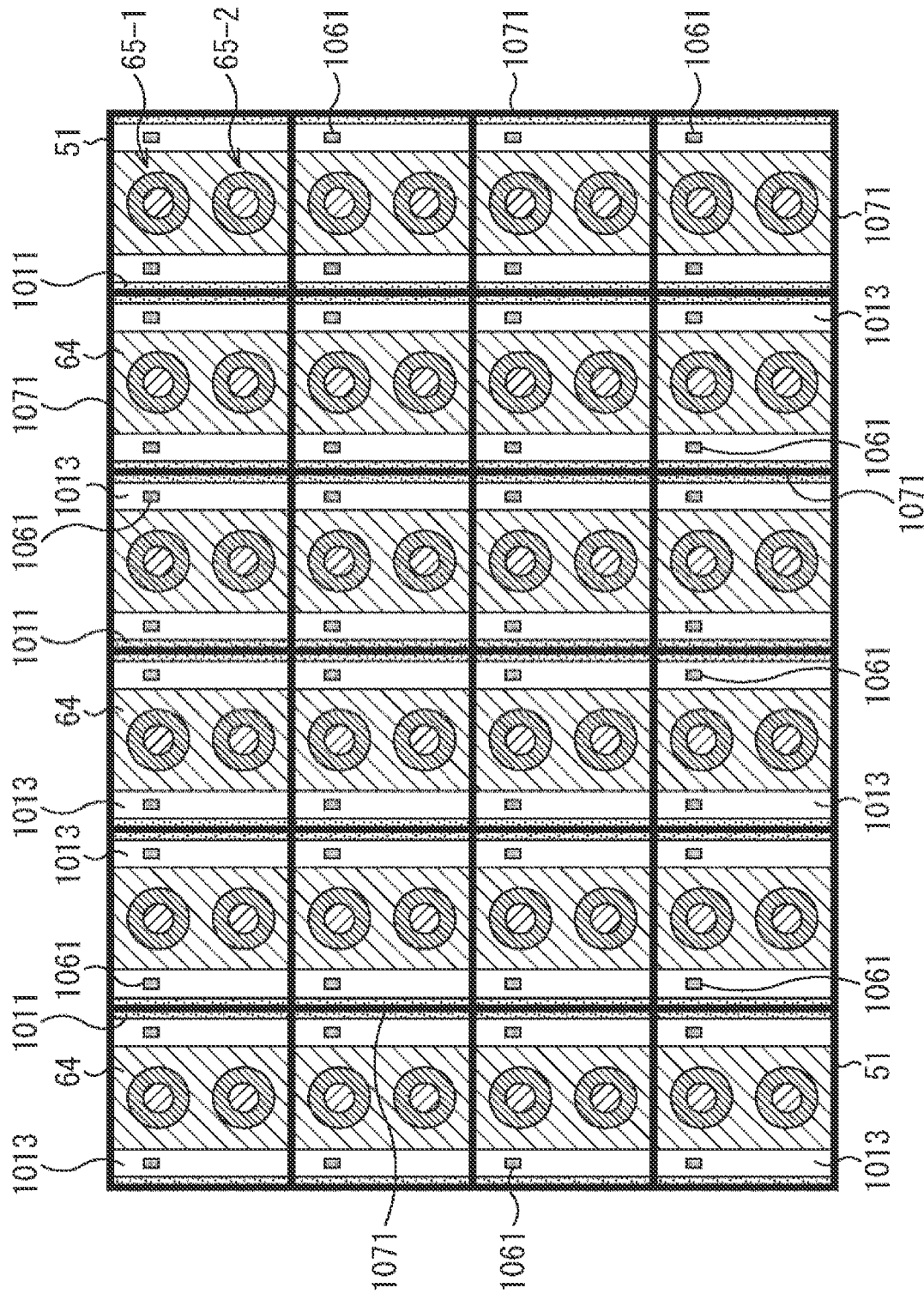
FIG. 51 is a view for describing a charge discharge structure around a pixel transistor region.

Alternatively, in the case where the gap region 1013 is left as it is, accumulation of electrons generated in the gap region 1013 can be suppressed by adopting a configuration as illustrated in FIG. 50 or 51.

FIG. 50 illustrates arrangement of the oxide film 64, the P-well region 1011, and the gap region 1013 in a plan view in which two-tap pixels 51 each including the two signal extraction portions 65-1 and 65-2 in one pixel are two-dimensionally arranged.

In a case where the two-dimensionally arranged pixels are not separated by STI or deep trench isolation (DTI), the P-well region 1011 is formed in a column manner lying along the plurality of pixels arrayed in the column direction, as illustrated in FIG. 50.

An N-type diffusion layer 1061 is provided as a drain for discharging charges in the gap region 1013 of the pixel 51 in an ineffective pixel region 1052 arranged outside an effective pixel region 1051 of the pixel array unit 20, and the electrons can be discharged to the N-type diffusion layer 1061. The N-type diffusion layer 1061 is formed in the back-side interface of the substrate 61, and GND (0 V) or a positive voltage is applied to the N-type diffusion layer 1061. The electrons generated in the gap region 1013 of each pixel 51 move in the vertical direction (column direction) to the N-type diffusion layer 1061 in the ineffective pixel region 1052 and are collected in the N-type diffusion layer 1061 shared by the pixel column. Therefore, the noise can be suppressed.

Meanwhile, in a case where the pixels are separated by a pixel separation portion 1071 using STI, DTI, or the like, as illustrated in FIG. 51, the N-type diffusion layer 1061 can be provided in the gap region 1013 of each pixel 51. As a result, the electrons generated in the gap region 1013 of each pixel 51 are discharged from the N-type diffusion layer 1061, so that the noise can be suppressed. The configurations in FIGS. 50 and 51 can be applied to any of the embodiments described in the present specification.

<Noise Around Effective Pixel Region>

Next, the charge discharge around the effective pixel region will be further described.

For example, a light-shielding pixel region in which light-shielding pixels are arranged is present in an outer peripheral portion adjacent to the effective pixel region.

Figure 52:
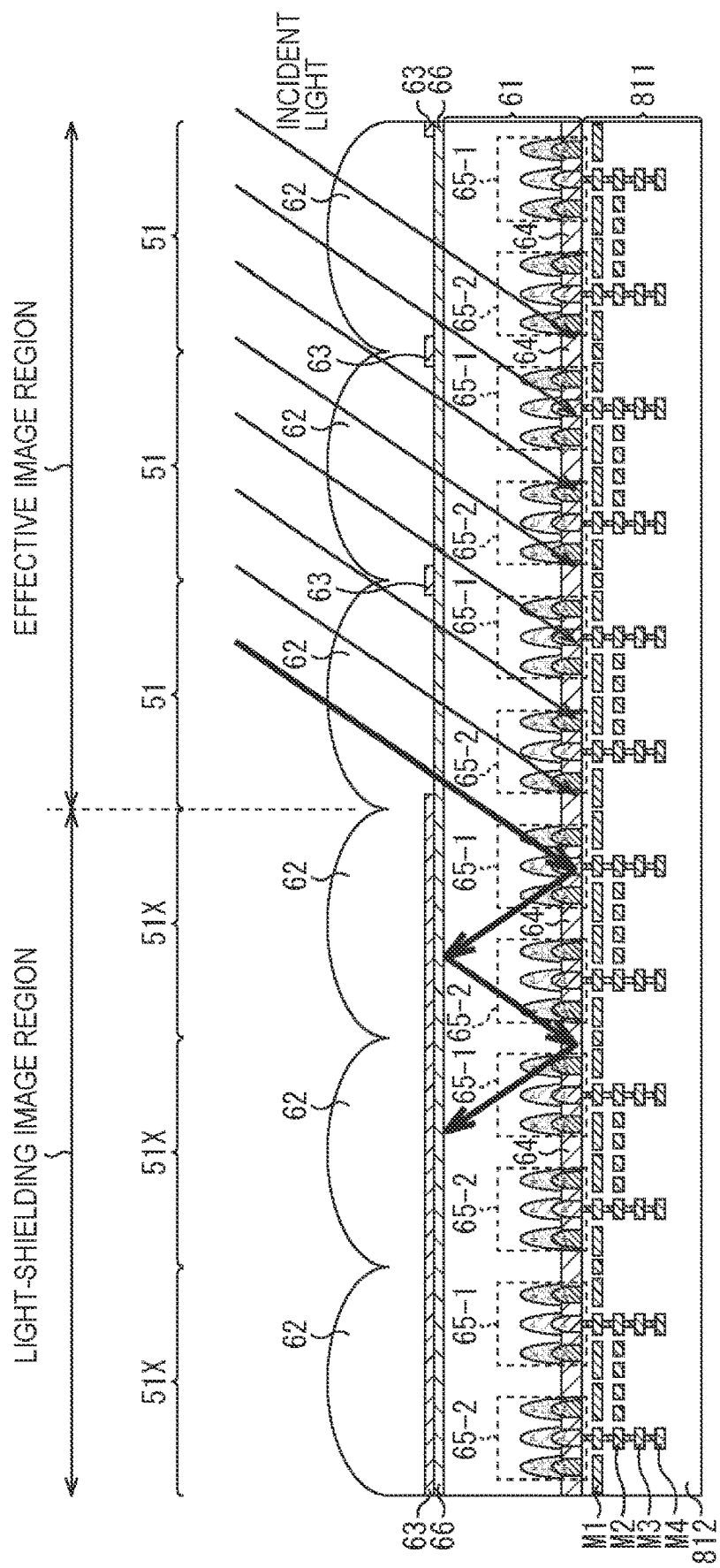
FIG. 52 is a view for describing charge discharge around an effective pixel region.

As illustrated in FIG. 52, signal extraction portions 65 and the like are formed in a light-shielding pixel 51X in the light-shielding pixel region, similarly to the pixel 51 in the effective pixel region. Furthermore, an inter-pixel light-shielding film 63 is formed on the entire surface of the pixel region of the light-shielding pixel 51X in the light-shielding pixel region, and light does not enter the light-shielding pixel 51X. Furthermore, a drive signal is often not applied to the light-shielding pixel 51X.

Meanwhile, in the light-shielding pixel region adjacent to the effective pixel region, oblique incident light from a lens, diffracted light from the inter-pixel light-shielding film 63, and reflected light from the multilayer wiring layer 811 are incident to generate photoelectrons. Since there is no emission destination, the generated photoelectrons are accumulated in the light-shielding pixel region, diffused in the effective pixel region due to a concentration gradient, mixed with a signal charge, and become noise. The noise around the effective pixel region becomes so-called frame unevenness.

Thus, as a countermeasure against the noise generated around the effective pixel region, the light-receiving element 1 can provide a charge discharge region 1101 of any one of FIGS. 53A, 53B, 53C, and 53D in the outer periphery of the effective pixel region 1051.

FIGS. 53A, 53B, 53C, and 53D are plan views illustrating configuration examples of the charge discharge region 1101 provided in the outer periphery of the effective pixel region 1051.

In any of FIGS. 53A, 53B, 53C, and 53D, the charge discharge region 1101 is provided in the outer periphery of the effective pixel region 1051 arranged in the central portion of the substrate 61, and an OPB region 1102 is further provided outside the charge discharge region 1101. The charge discharge region 1101 is a hatched region between the inner broken line rectangle and the outer broken line rectangle. The OPB region 1102 is a region in which the inter-pixel light-shielding film 63 is formed on the entire surface of the region, and an OPB pixel that is driven similarly to the pixel 51 in the effective pixel region and detects a black level signal is arranged. In FIGS. 53A, 53B, 53C, and 53D, the gray region indicates a region shielded as the inter-pixel light-shielding film 63 is formed.

Figure 53B:
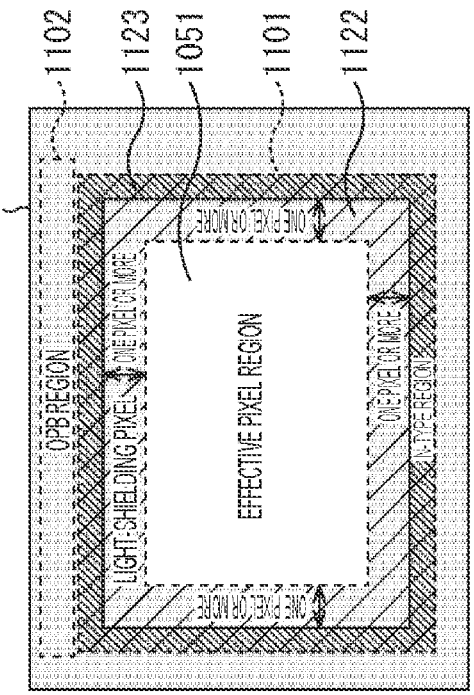
FIGS. 53A, 53B, 53C, and 53D are plan views illustrating configuration examples of a charge discharge region provided in an outer periphery of the effective pixel region.
Figure 53D:
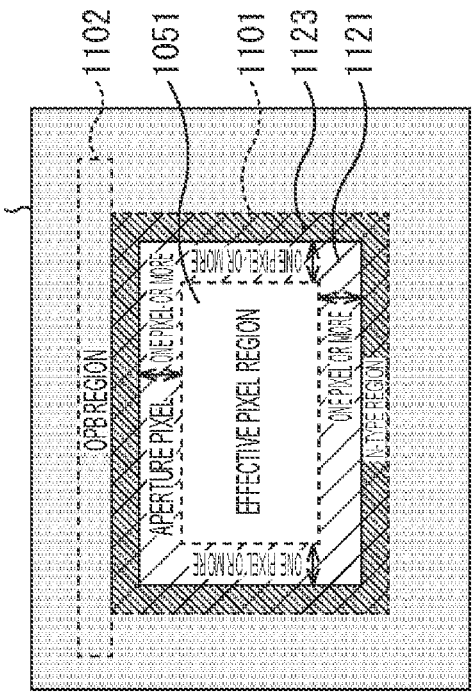
Figure 53A:
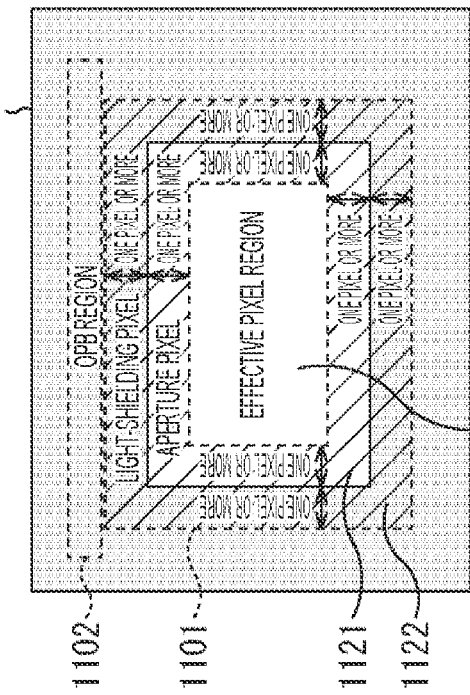

The charge discharge region 1101 in FIG. 53A includes an aperture pixel region 1121 in which an aperture pixel is arranged, and a light-shielding pixel region 1122 in which the light-shielding pixel 51X is arranged. The aperture pixel of the aperture pixel region 1121 has the same pixel structure as the pixel 51 of the effective pixel region 1051 and is a pixel that performs predetermined drive. The light-shielding pixel 51X in the light-shielding pixel region 1122 has the same pixel structure as the pixel 51 in the effective pixel region 1051 except that the inter-pixel light-shielding film 63 is formed on the entire surface of the pixel region, and is a pixel that performs predetermined drive.

The aperture pixel region 1121 includes one or more pixels of pixel columns or pixel rows in each column or each row in the four sides of the outer periphery of the effective pixel region 1051. The light-shielding pixel region 1122 also includes one or more pixels of pixel columns or pixel rows in each column or each row in the four sides of the outer periphery of the aperture pixel region 1121.

The charge discharge region 1101 in FIG. 53B includes the light-shielding pixel region 1122 in which the light-shielding pixel 51X is arranged, and an N-type region 1123 in which an N-type diffusion layer is arranged.

Figure 54:
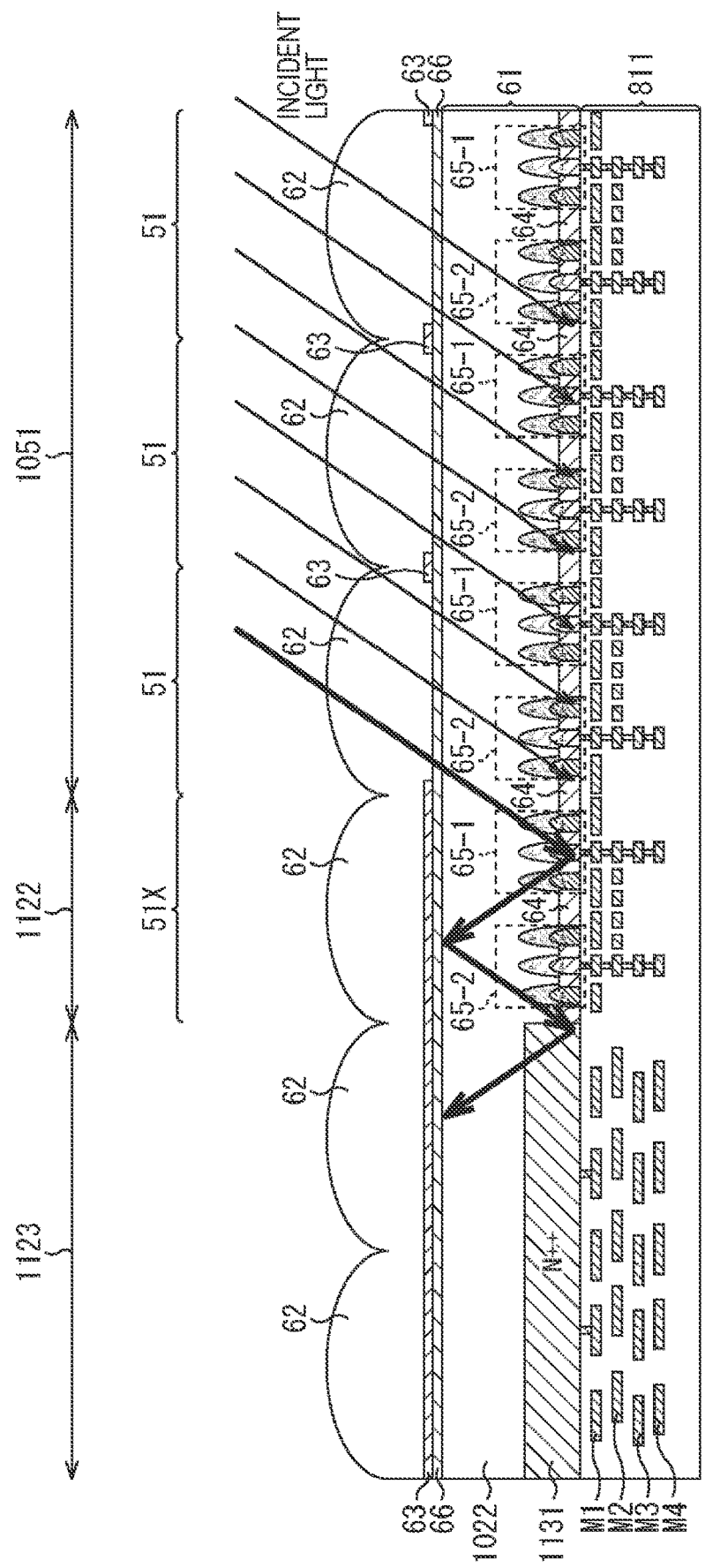
FIG. 54 is a cross-sectional view of a case where the charge discharge region is configured by a light-shielding pixel region and an N-type region.

FIG. 54 is a cross-sectional view of the case where the charge discharge region 1101 is configured by the light-shielding pixel region 1122 and the N-type region 1123.

The N-type region 1123 is a region in which the inter-pixel light-shielding film 63 shields the entire surface of the region, and an N-type diffusion layer 1131 as an N-type semiconductor region with high concentration is formed instead of the signal extraction portions 65 in the P-type semiconductor region 1022 of the substrate 61. 0 V or a positive voltage is constantly or intermittently applied to the N-type diffusion layer 1131 from the metal film M1 of the multilayer wiring layer 811. For example, the N-type diffusion layer 1131 may be formed in the entire P-type semiconductor region 1022 of the N-type region 1123 and formed in a continuous substantially annular shape in plan view, or may be partially formed in the P-type semiconductor region 1022 of the N-type region 1123 and the plurality of N-type diffusion layers 1131 may be arranged in a substantially annular and dotted manner in plan view.

Returning to FIG. 53B, the light-shielding pixel region 1122 includes one or more pixels of pixel columns or pixel rows in each column or each row in the four sides of the outer periphery of the effective pixel region 1051. The N-type region 1123 also has predetermined column width or row width in each column or each row of the four sides of the outer periphery of the light-shielding pixel region 1122.

Figure 53C:
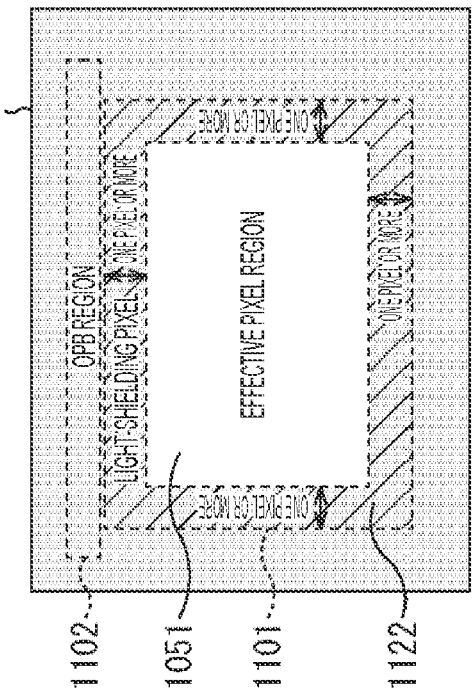

The charge discharge region 1101 in FIG. 53C includes the light-shielding pixel region 1122 in which a light-shielding pixel is arranged. The light-shielding pixel region 1122 includes one or more pixels of pixel columns or pixel rows in each column or each row in the four sides of the outer periphery of the effective pixel region 1051.

The charge discharge region 1101 in FIG. 53D includes the aperture pixel region 1121 in which the aperture pixel is arranged, and the N-type region 1123 in which the N-type diffusion layer is arranged.

The predetermined drive performed by the aperture pixel in the aperture pixel region 1121 and the light-shielding pixel 51X in the light-shielding pixel region 1122 is drive including an operation of constantly or intermittently applying the positive voltage to the N-type semiconductor region of the pixel, and is favorably an operation of applying a drive signal to the pixel transistors and the P-type semiconductor region or the N-type semiconductor region, similar to the drive of the pixel 51, at timing based on the pixel 51 in the effective pixel region 1051.

The configuration examples of the charge discharge region 1101 illustrated in FIGS. 53A, 53B, 53C, and 53D are examples, and the configuration is not limited to these examples. The charge discharge region 1101 has a configuration provided with any one of the aperture pixel that performs predetermined drive, the light-shielding pixel that performs predetermined drive, or the N-type region including the N-type diffusion layer to which 0 V or the positive voltage is constantly or intermittently applied. Therefore, for example, the aperture pixel, the light-shielding pixel, and the N-type region may be mixed in one pixel column or in one pixel row, or a different type of the aperture pixel, the light-shielding pixel, or the N-type region may be arranged in the pixel column or the pixel row of the four sides of the periphery of the effective pixel region.

By providing the charge discharge region 1101 in the outer periphery of the effective pixel region 1051 in this manner, accumulation of the electrons in a region other than the effective pixel region 1051 can be suppressed, and thus noise generation due to addition of photocharge diffused to the effective pixel region 1051 from the outside of the effective pixel region 1051, to the signal charge can be suppressed.

Furthermore, by providing the charge discharge region 1101 in front of the OPB region 1102, diffusion of electrons generated in the light-shielding region outside the effective pixel region 1051 to the OPB region 1102 can be prevented, and thus addition of noise to the black level signal can be prevented. The configurations in FIGS. 53A, 53B, 53C, and 53D can be applied to any of the embodiments described in the present specification.

Eighteenth Embodiment

Figure 55A:
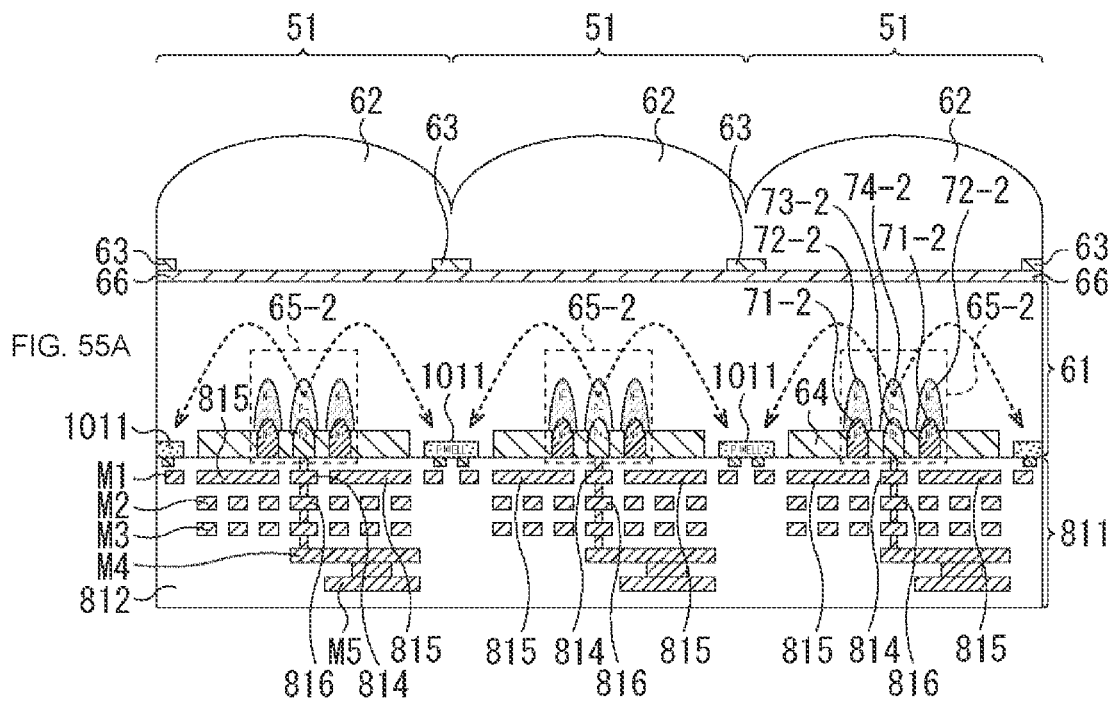
FIGS. 55A and 55B are views for describing a flow of a current in a case where a pixel transistor is arranged on a substrate having a photoelectric conversion region.

Next, a flow of a current in a case where pixel transistors are arranged in a substrate 61 having a photoelectric conversion region will be described with reference to FIGS. 55A and 55B.

In a pixel 51, for example, a positive voltage of 1.5 V and a voltage of 0 V are applied to P+ semiconductor regions 73 of two signal extraction portions 65 to generate an electric field in the two P+ semiconductor regions 73, and a current flows from the P+ semiconductor region 73 to which 1.5 V is applied to the P+ semiconductor region 73 to which 0 V is applied. However, since a P-well region 1011 formed in a pixel boundary portion is also GND (0 V), the current flows not only between the two signal extraction portions 65 but also flows from the P+ semiconductor region 73 to which 1.5 V is applied to the P-well region 1011, as illustrated in FIG. 55A.

Figure 55B:
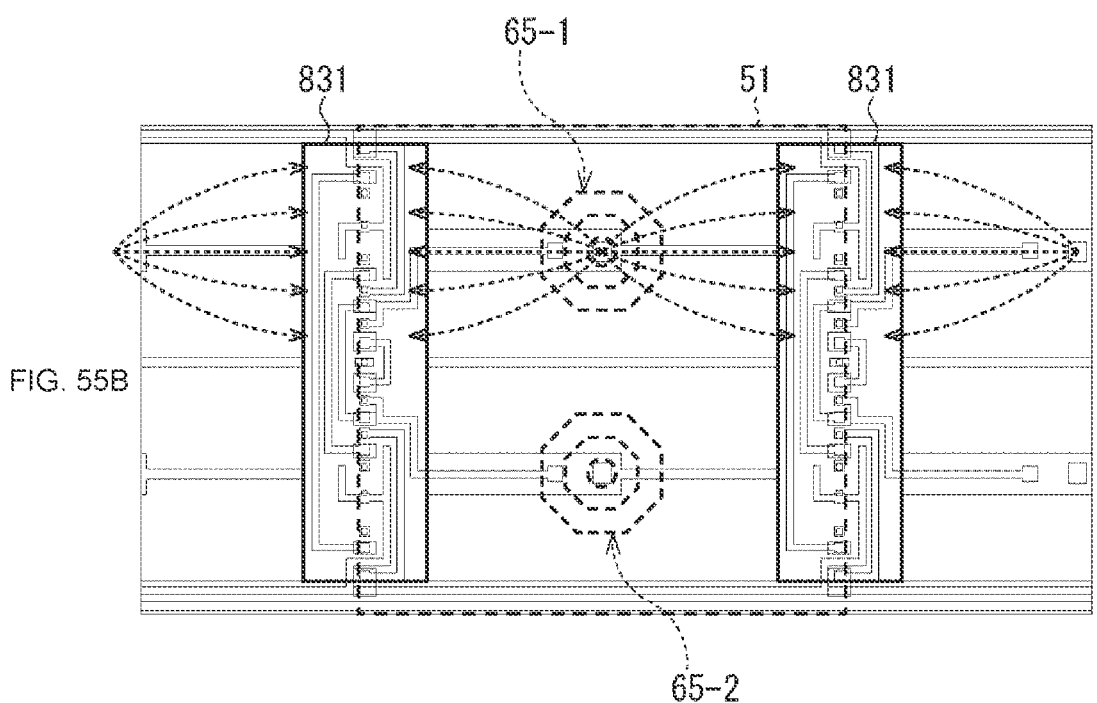

FIG. 55B is a plan view illustrating arrangement of a pixel transistor wiring region 831 illustrated in FIG. 42A.

The area of the signal extraction portion 65 can be reduced by changing a layout, whereas reduction of the area of the pixel transistor wiring region 831 only by devising the layout is difficult because the area of the pixel transistor wiring region 831 is determined by an occupied area by one pixel transistor, the number of pixel transistors, and a wiring area. Therefore, when trying to reduce the area of the pixel 51, the area of the pixel transistor wiring region 831 becomes a major limiting factor. To increase a resolution while maintaining an optical size of a sensor, reduction of a pixel size is necessary, but the area of the pixel transistor wiring region 831 becomes a limitation. Furthermore, when reducing the area of the pixel 51 while maintaining the area of the pixel transistor wiring region 831, a path of a current flowing in the pixel transistor wiring region 831, which is illustrated by the broken line arrows in FIG. 55B, is shortened, resistance decreases, and the current increases. Therefore, the area reduction of the pixel 51 leads to an increase in power consumption.

<Configuration Example of Pixel>

Figure 56:
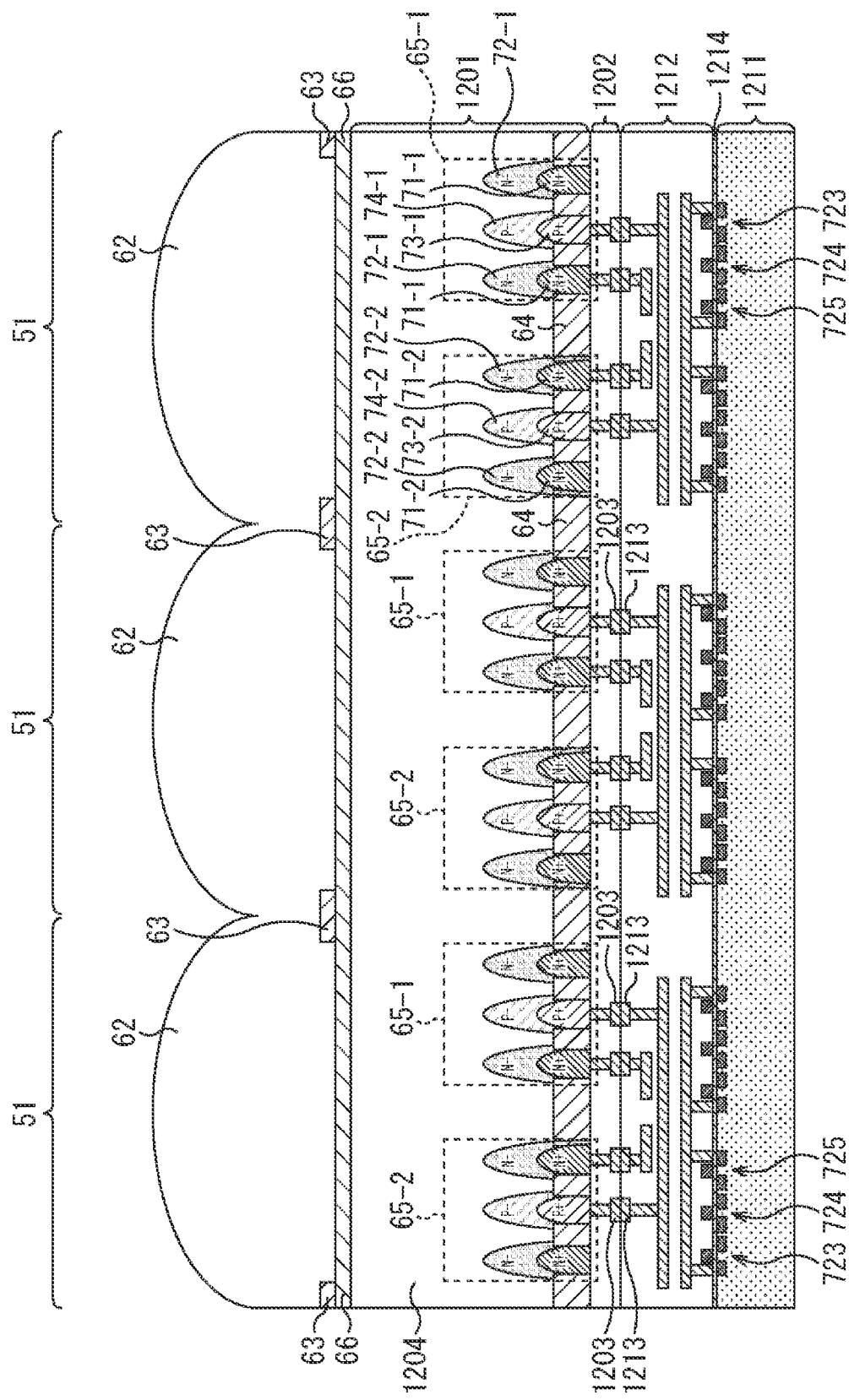
FIG. 56 is a cross-sectional view of a plurality of pixels in an eighteenth embodiment.

Therefore, as illustrated in FIG. 56, a configuration can be adopted, in which a light-receiving element 1 has a stacked structure in which two substrates are stacked, and all of pixel transistors are arranged in a substrate different from a substrate having a photoelectric conversion region.

FIG. 56 is a cross-sectional view of pixels according to the eighteenth embodiment.

FIG. 56 illustrates a cross-sectional view of a plurality of pixels corresponding to the line B-B' in FIG. 11, similarly to FIG. 36 and the like described above.

In FIG. 56, a portion corresponding to the cross-sectional view of the plurality of pixels in the fourteenth embodiment illustrated in FIG. 36 is denoted by the same reference numeral, and description thereof is omitted as appropriate.

In the eighteenth embodiment in FIG. 56, the light-receiving element 1 is configured by stacking two substrates of a substrate 1201 and a substrate 1211. The substrate 1201 corresponds to the substrate 61 in the fourteenth embodiment illustrated in FIG. 36, and is configured using a silicon substrate and the like having a P-type semiconductor region 1204 as a photoelectric conversion region, for example. The substrate 1211 is also configured using a silicon substrate and the like.

The substrate 1201 having a photoelectric conversion region may be configured using a compound semiconductor of GaAs, InP, or GaSb, a narrow bandgap semiconductor of Ge, or a glass substrate or a plastic substrate coated with an organic photoelectric conversion film, other than using the silicon substrate or the like. In the case of configuring the substrate 1201 using a compound semiconductor, improvement of quantum efficiency by a direct transition-type band structure, improvement of sensitivity, and a decrease in height of the sensor by thinning the substrate can be expected. Furthermore, electron collection efficiency can be improved because electron mobility is high, and power consumption can be reduced because hole mobility is low. In the case of configuring the substrate 1201 using a narrow bandgap semiconductor, improvement of the quantum efficiency in an infrared region by the narrow bandgap, and improvement of the sensitivity can be expected.

The substrate 1201 and the substrate 1211 are bonded such that a wiring layer 1202 of the substrate 1201 and a wiring layer 1212 of the substrate 1211 face each other. Then, metal wiring 1203 of the wiring layer 1202 on the substrate 1201 side and metal wiring 1213 of the wiring layer 1212 on the substrate 1211 side are electrically connected by, for example, Cu—Cu bonding. Note that the electrical connection between the wiring layers is not limited to Cu—Cu bonding and may be, for example, homogenous metal bonding such as Au—Au bonding or Al—Al bonding, or dissimilar metal bonding such as Cu—Au bonding, Cu—Al bonding, or Au—Al bonding. Furthermore, the reflective member 631 of the fourteenth embodiment or the light-shielding member 631' of the fifteenth embodiment can be further provided in either the wiring layer 1202 of the substrate 1201 or the wiring layer 1212 of the substrate 1211.

The difference of the substrate 1201 having a photoelectric conversion region from the substrates 61 of the first to seventeenth embodiments is that all of pixel transistors Tr such as a reset transistor 723, an amplification transistor 724, and a selection transistor 725 are not formed in the substrate 1201.

In the eighteenth embodiment in FIG. 56, the pixel transistors Tr such as the reset transistor 723, the amplification transistor 724, and the selection transistor 725 are formed on the lower substrate 1211 in FIG. 56. FIG. 56 illustrates the reset transistor 723, the amplification transistor 724, and the selection transistor 725 but a transfer transistor 721 is also formed in a region (not illustrated) of the substrate 1211.

An insulating film (oxide film) 1214 that also serves as a gate insulating film for the pixel transistors is formed between the substrate 1211 and the wiring layer 1212.

Therefore, although not illustrated, when the pixel according to the eighteenth embodiment is viewed in a cross-sectional view corresponding to the line A-A' in FIG. 11, the pixel transistor Tr formed in the pixel boundary portion in FIG. 37 is not formed in the substrate 1201.

Figure 57:
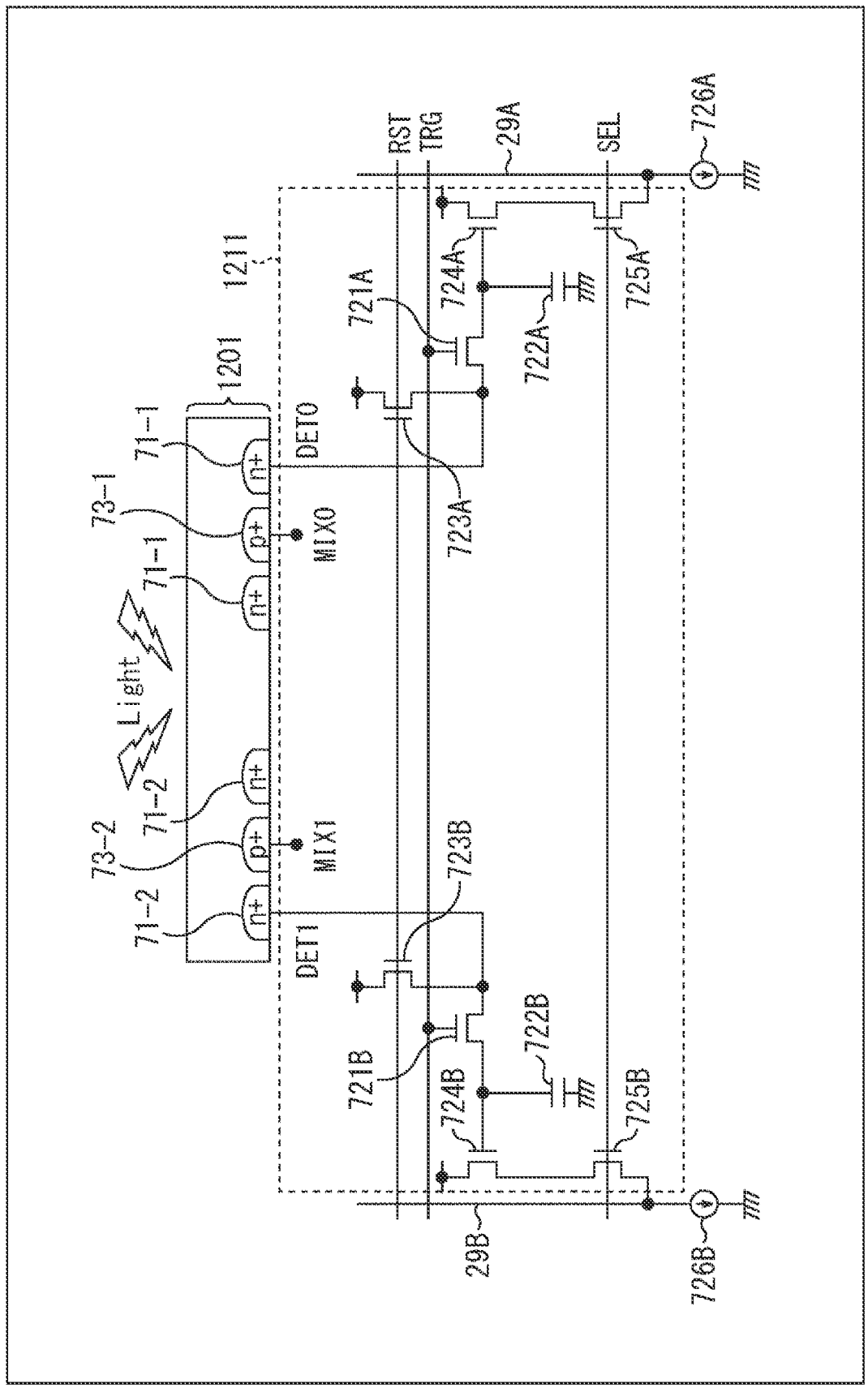
FIG. 57 is a view for describing circuit sharing by two substrates.

When illustrating the elements arranged in each of the substrate 1201 and the substrate 1211, using an equivalent circuit of the pixel 51 illustrated in FIG. 31, the P+ semiconductor region 73 as a voltage application portion and the N+ semiconductor region 71 as a charge detection portion are formed on the substrate 1201, and the transfer transistor 721, an FD 722, the reset transistor 723, the amplification transistor 724, and the selection transistor 725 are formed on the substrate 1211, as illustrated in FIG. 57.

Figure 58:
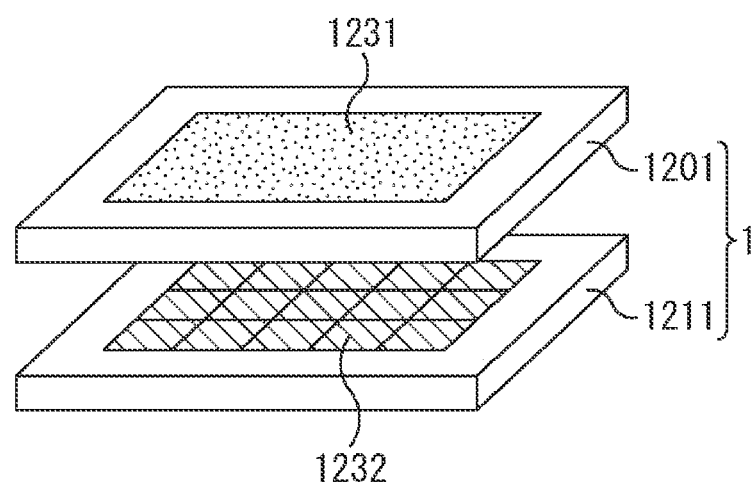
FIG. 58 is a view for describing a substrate configuration according to the eighteenth embodiment.

When the light-receiving element 1 according to the eighteenth embodiment is illustrated in accordance with FIGS. 47A, 47B, and 47C, the light-receiving element 1 is configured by stacking the substrate 1201 and the substrate 1211, as illustrated in FIG. 58.

In a pixel array region 1231 of the substrate 1201, a portion excluding the transfer transistor 721, the FD 722, the reset transistor 723, the amplification transistor 724, and the selection transistor 725 from the pixel array region 951 illustrated in FIG. 47C is formed.

In an area control circuit 1232 of the substrate 1211, the transfer transistor 721, FD 722, the reset transistor 723, the amplification transistor 724, and the selection transistor 725 of each pixel of the pixel array unit 20 are provided, in addition to the area control circuit 954 illustrated in FIG. 47C. A tap drive unit 21, a vertical drive unit 22, a column processing unit 23, a horizontal drive unit 24, a system control unit 25, a signal processing unit 31, and a data storage unit 32 illustrated in FIG. 1 are also formed on the substrate 1211.

Figure 59:
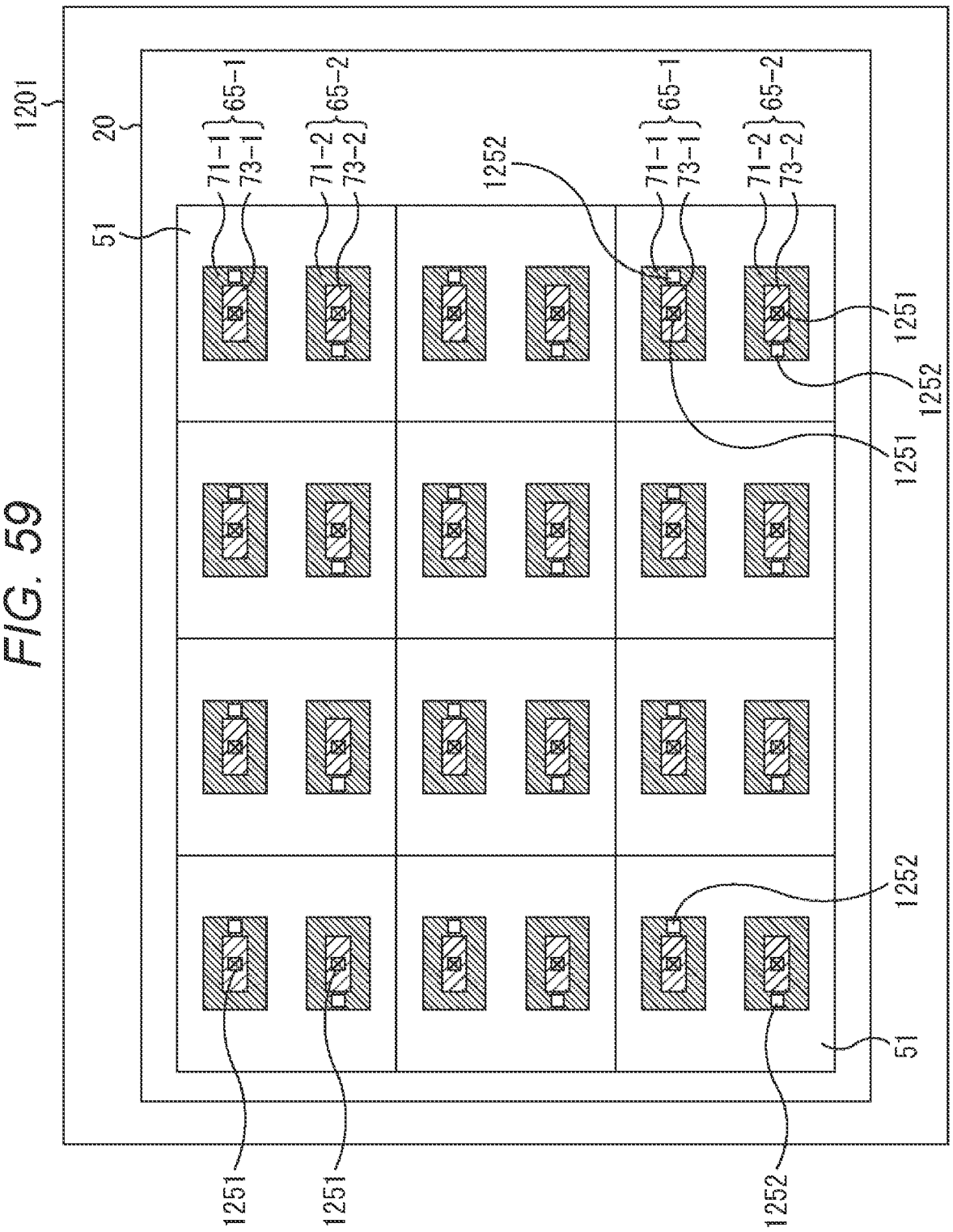
FIG. 59 is a plan view illustrating arrangement of a MIX bonded portion and a DET bonded portion.

FIG. 59 is a plan view illustrating a MIX bonded portion that is an electrical bonded portion between the substrate 1201 and the substrate 1211, which exchanges a voltage MIX, and a DET bonded portion that is an electrical bonded portion between the substrate 1201 and the substrate 1211, which exchanges a signal charge DET. Note that, in FIG. 59, some of the reference numerals of the MIX bonded portion 1251 and the DET bonded portion 1252 are omitted to prevent complication of the drawing.

As illustrated in FIG. 59, the MIX bonded portion 1251 for supplying the voltage MIX and the DET bonded portion 1252 for acquiring the signal charge DET are each provided in each pixel 51, for example. In this case, the voltage MIX and the signal charge DET are passed between the substrate 1201 and the substrate 1211 on a pixel basis.

Figure 60:
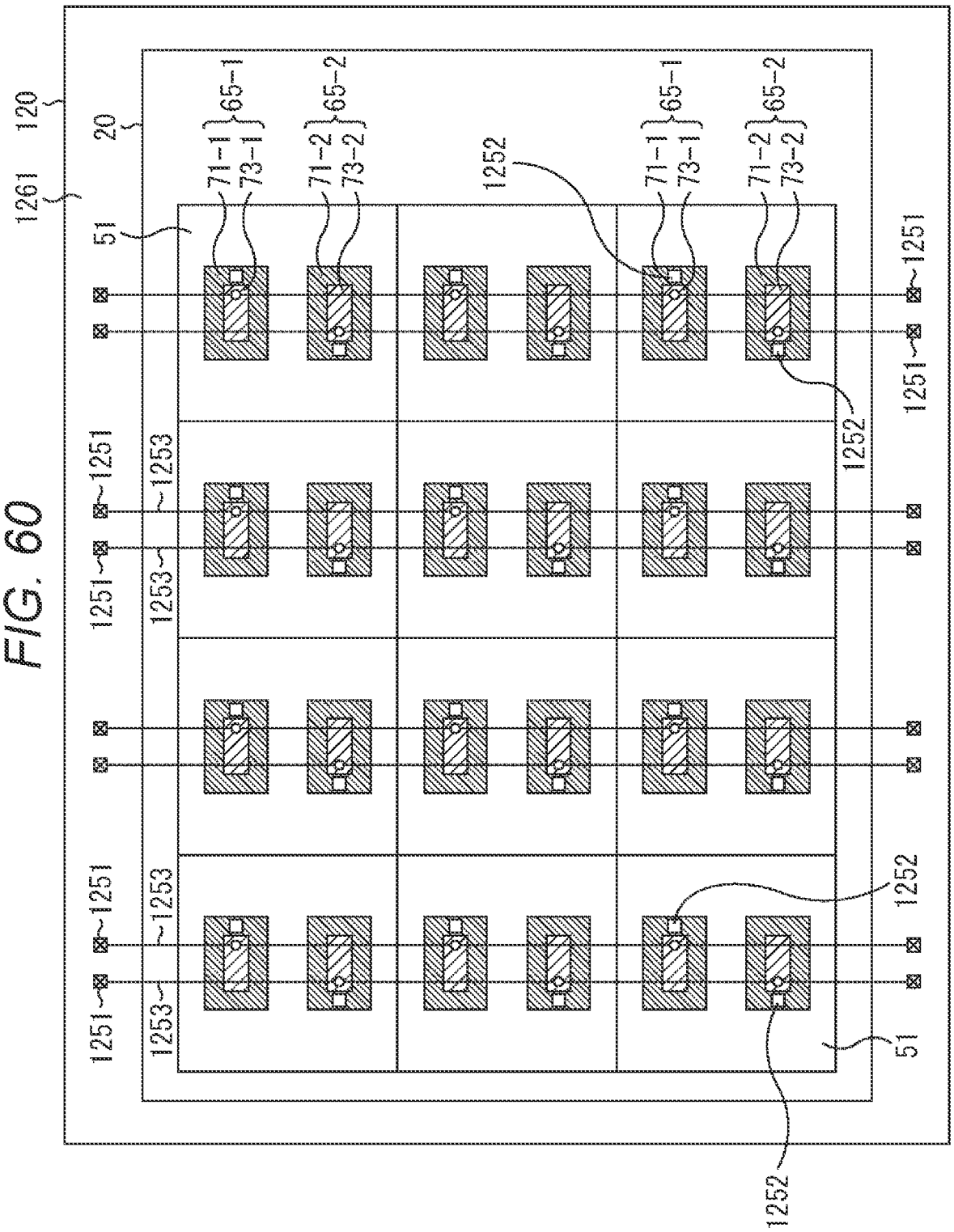
FIG. 60 is a plan view illustrating arrangement of a MIX bonded portion and a DET bonded portion.

Alternatively, as illustrated in FIG. 60, the DET bonded portion 1252 for acquiring the signal charge DET is provided in the pixel region on a pixel basis, but the MIX bonded portion 1251 for supplying the voltage MIX may be provided in a peripheral portion 1261 outside the pixel array unit 20, as illustrated in FIG. 60. In the peripheral portion 1261, the voltage MIX supplied from the substrate 1211 is supplied to the P+ semiconductor region 73 that is a voltage application portion of each pixel 51 via a voltage supply line 1253 wired in the vertical direction in the substrate 1201. By sharing the MIX bonded portion 1251 for supplying the voltage MIX by a plurality of pixels in this way, the number of MIX bonded portions 1251 on the entire substrate can be reduced, and the pixel size and chip size can be easily miniaturized.

Note that FIG. 60 illustrates an example in which the voltage supply line 1253 is wired in the vertical direction and is shared by a pixel column. However, the voltage supply line 1253 may be wired in the horizontal direction and shared by a pixel row.

Furthermore, in the above-described eighteenth embodiment, an example of electrically connecting the substrate 1201 and the substrate 1211 by Cu—Cu bonding has been described. However, another electrical connection method, for example, through chip via (TCV), or bump bonding using a micro bump may be used.

According to the above-described eighteenth embodiment, the light-receiving element 1 is configured by a stacked structure of the substrate 1201 and the substrate 1211, and all the pixel transistors that perform the operation of reading the signal charge DET of the N+ semiconductor region 71 as a charge detection portion, that is, the transfer transistor 721, the reset transistor 723, the amplification transistor 724, and the selection transistor 725, are arranged in the substrate 1211 different from the substrate 1201 having the P-type semiconductor region 1204 as a photoelectric conversion region. Thereby, the problem described with reference to FIGS. 55A and 55B can be solved.

That is, the area of the pixel 51 can be reduced regardless of the area of the pixel transistor wiring region 831, and high resolution can be achieved without changing an optical size. Furthermore, since the increase in current from the signal extraction portions 65 to the pixel transistor wiring region 831 is avoided, the current consumption can also be reduced.

Nineteenth Embodiment

Next, a nineteenth embodiment will be described.

Figure 61:
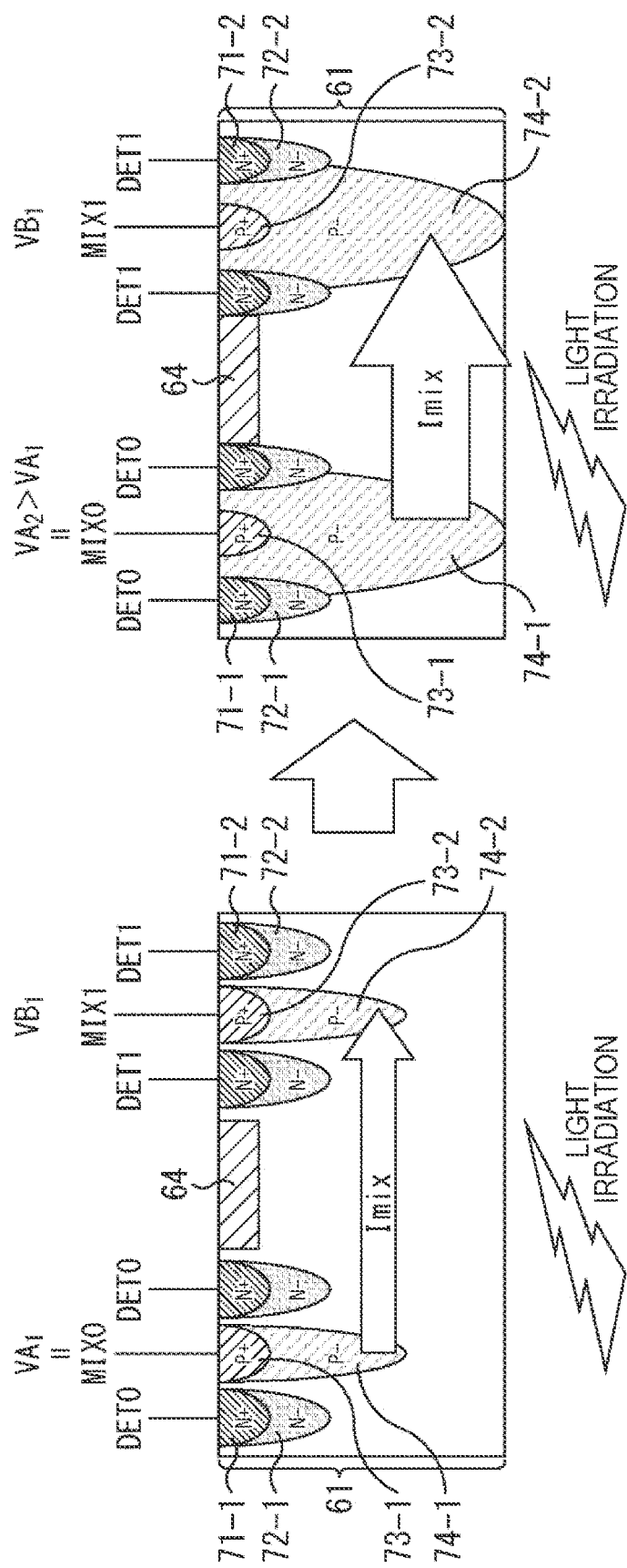
FIG. 61 is views for describing a problem of an increase in current consumption.

To increase charge separation efficiency Cmod of a CAPD sensor, it is necessary to strengthen a potential of a P+ semiconductor region 73 or a P– semiconductor region 74 as a voltage application portion. In particular, in a case of detecting long-wavelength light such as infrared light with high sensitivity, it is necessary to extend the P– semiconductor region 74 up to a deep position of a semiconductor layer or raise a positive voltage to be applied to a voltage VA$_2$ higher than a voltage VA$_1$, as illustrated in FIG. 61. In this case, a current Imix tends to flow due to a low resistance between the voltage application portions, and an increase in current consumption becomes a problem. Further, in a case of miniaturizing a pixel size in order to increase resolution, a distance between the voltage application portions is shortened, so that the resistance is lowered, and the increase in current consumption becomes a problem.

First Configuration Example of Nineteenth Embodiment

FIG. 62A is a plan view of a pixel according to a first configuration example of the nineteenth embodiment, and FIG. 62B is a cross-sectional view of the pixel according to the first configuration example of the nineteenth embodiment.

FIG. 62A is a plan view taken along the line B-B' in FIG. 62B, and FIG. 62B is a cross-sectional view taken along the line A-A' in FIG. 62A.

Note that FIGS. 62A and 62B illustrate only a portion formed in a substrate 61 of a pixel 51, and for example, illustration of an on-chip lens 62 formed on a light incident surface side, and a multilayer wiring layer 811 formed on an opposite side of the light incident surface and the like is omitted. The portion not illustrated can be configured similarly to the other embodiments described above. For example, a reflective member 631 or a light-shielding member 631' can be provided in the multilayer wiring layer 811 on an opposite side of the light incident surface.

In the first configuration example of the nineteenth embodiment, an electrode portion 1311-1 that functions as a voltage application portion that applies a predetermined voltage MIX0 and an electrode portion 1311-2 that functions as a voltage application portion that applies a predetermined voltage MIX1 are formed at predetermined positions of a P-type semiconductor region 1301 as a photoelectric conversion region of the substrate 61.

The electrode portion 1311-1 has an embedded portion 1311A-1 embedded in the P-type semiconductor region 1301 of the substrate 61 and a protruding portion 1311B-1 protruding above a first surface 1321 of the substrate 61.

Similarly, the electrode portion 1311-2 has an embedded portion 1311A-2 embedded in the P-type semiconductor region 1301 of the substrate 61 and a protruding portion 1311B-2 protruding above the first surface 1321 of the substrate 61. The electrode portions 1311-1 and 1311-2 are formed using, for example, a metal material such as tungsten (W), aluminum (Al), or copper (Cu), or a conductive material such as silicon or polysilicon.

As illustrated in FIG. 62A, (the embedded portion 1311A-1 of) the electrode portion 1311-1 and (the embedded portion 1311A-2 of) the electrode portion 1311-2 having a circular planar shape are arranged in a point-symmetrical manner with respect to a center point of the pixel as a symmetric point.

An N+ semiconductor region 1312-1 that functions as a charge detection portion is formed in an outer periphery of the electrode portion 1311-1, and an insulating film 1313-1 and a hole concentration strengthening layer 1314-1 are inserted between the electrode portion 1311-1 and the N+ semiconductor region 1312-1.

Similarly, an N+ semiconductor region 1312-2 that functions as a charge detection portion is formed in an outer periphery of the electrode portion 1311-2, and an insulating film 1313-2 and a hole concentration strengthening layer 1314-2 are inserted between the electrode portion 1311-2 and the N+ semiconductor region 1312-2.

The electrode portion 1311-1 and the N+ semiconductor region 1312-1 constitute the above-described signal extraction portion 65-1, and the electrode portion 1311-2 and the N+ semiconductor region 1312-2 constitute the above-described signal extraction portion 65-2.

The electrode portion 1311-1 is covered with the insulating film 1313-1, and the insulating film 1313-1 is covered with the hole concentration strengthening layer 1314-1 in the substrate 61, as illustrated in FIG. 62B. The above similarly applies to the relationship among the electrode portion 1311-2, the insulating film 1313-2, and the hole concentration strengthening layer 1314-2.

The insulating films 1313-1 and 1313-2 are formed using, for example, an oxide film ($SiO_2$) and are formed in the same process as an insulating film 1322 formed on the first surface 1321 of the substrate 61. Note that an insulating film 1332 is also formed on a second surface 1331 opposite to the first surface 1321 of the substrate 61.

The hole concentration strengthening layers 1314-1 and 1314-2 are formed using a P-type semiconductor region, and can be formed by, for example, an ion implantation method, a solid phase diffusion method, a plasma doping method, or the like.

Hereinafter, in a case where there is no need to distinguish the electrode portion 1311-1 and the electrode portion 1311-2, they are also simply referred to as electrode portion (s) 1311, and in a case where there is no need to distinguish the N+ semiconductor region 1312-1 and the N+ semiconductor region 1312-2, they are also simply referred to as N+ semiconductor region (s) 1312.

Furthermore, in a case where there is no need to distinguish the hole concentration strengthening layer 1314-1 and the hole concentration strengthening layer 1314-2, they are also simply referred to as hole concentration strengthening layer (s) 1314, and in a case where there is no need to distinguish the insulating film 1313-1 and the insulating film 1313-2, they are also simply referred to as insulating film (s) 1313.

The electrode portion 1311, the insulating film 1313, and the hole concentration strengthening layer 1314 can be formed by the following procedure. First, the P-type semiconductor region 1301 of the substrate 61 is etched from the first surface 1321 side, so that a trench is formed up to a predetermined depth. Next, the hole concentration strengthening layer 1314 is formed on an inner periphery of the formed trench by an ion implantation method, a solid phase diffusion method, a plasma doping method, or the like, and then the insulating film 1313 is formed. Next, a conductive material is embedded inside the insulating film 1313, so that the embedded portion 1311A is formed. Thereafter, a conductive material such as a metal material is formed on the entire surface of the first surface 1321 of the substrate 61, and then only an upper portion of the electrode portion 1311 is left by etching, so that the protruding portion 1311B-1 is formed.

The depth of the electrode portion 1311 is configured to be at least a position deeper than the N+ semiconductor region 1312 that is the charge detection portion, but favorably, the depth is configured to be a position deeper than half of the substrate 61.

According to the pixel 51 of the first configuration example of the nineteenth embodiment configured as described above, the trench is formed in the depth direction of the substrate 61, and the electrode portion 1311 embedded with the conductive material provides a charge distribution effect with respect to the charge photoelectrically converted in a wide region in the depth direction of the substrate 61, whereby the charge separation efficiency Cmod for long-wavelength light can be enhanced.

Furthermore, since the outer peripheral portion of the electrode portion 1311 is covered with the insulating film 1313, the current flowing between the voltage application portions is suppressed, and thus the current consumption can be reduced. Furthermore, when compared with the same current consumption, a high voltage can be applied to the voltage application portion. Moreover, since the current consumption can be suppressed even if the distance between the voltage application portions is shortened, high resolution becomes possible by miniaturizing the pixel size and increasing the number of pixels.

Note that, in the first configuration example of the nineteenth embodiment, the protruding portion 1311B of the electrode portion 1311 may be omitted. However, by providing the protruding portion 1311B, the electric field perpendicular to the substrate 61 is strengthened and the charges can be easily collected.

Furthermore, to increase the degree of modulation by an applied voltage and further enhance the charge separation efficiency Cmod, the hole concentration strengthening layer 1314 may be omitted. In the case provided with the hole concentration strengthening layer 1314, generated electrons caused by damage and contaminants generated during etching for forming a trench can be suppressed.

In the first configuration example of the nineteenth embodiment, either the first surface 1321 or the second surface 1331 of the substrate 61 may be the light incident surface, and both the back-illuminated type and the front-illuminated type are available. However, the back-illuminated type is more favorable.

Second Configuration Example of Nineteenth Embodiment

FIG. 63A is a plan view of a pixel according to a second configuration example of the nineteenth embodiment, and FIG. 63B is a cross-sectional view of the pixel according to the second configuration example of the nineteenth embodiment.

FIG. 63A is a plan view taken along the line B-B' in FIG. 63B, and FIG. 63B is a cross-sectional view taken along the line A-A' in FIG. 63A.

Note that, in the second configuration example in FIGS. 63A and 63B, a portion corresponding to FIGS. 62A and 62B is denoted by the same reference numeral, and description will be given focusing on portions different from the first configuration example in FIGS. 62A and 62B and description of common portions is omitted as appropriate.

The difference of the second configuration example in FIGS. 63A and 63B is that the embedded portion 1311A of the electrode portion 1311 penetrates the substrate 61 as a semiconductor layer, and the other points are common. The embedded portion 1311A of the electrode portion 1311 is formed from the first surface 1321 to the second surface 1331 of the substrate 61, and the insulating film 1313 and the hole concentration strengthening layer 1314 are formed on the outer peripheral portion of the electrode portion 1311. The entire surface of the second surface 1331 on the side where the N+ semiconductor region 1312 as a charge detection portion is not formed is covered with the insulating film 1332.

As in this second configuration example, the embedded portion 1311A of the electrode portion 1311 as a voltage application portion may be configured to penetrate the substrate 61. Even in this case, the charge distribution effect with respect to the charge photoelectrically converted in a wide region in the depth direction of the substrate 61 can be obtained, whereby the charge separation efficiency Cmod for long-wavelength light can be enhanced.

Furthermore, since the outer peripheral portion of the electrode portion 1311 is covered with the insulating film 1313, the current flowing between the voltage application portions is suppressed, and thus the current consumption can be reduced. Furthermore, when compared with the same current consumption, a high voltage can be applied to the voltage application portion. Moreover, since the current consumption can be suppressed even if the distance between the voltage application portions is shortened, high resolution becomes possible by miniaturizing the pixel size and increasing the number of pixels.

In the second configuration example of the nineteenth embodiment, either the first surface 1321 or the second surface 1331 of the substrate 61 may be the light incident surface, and both the back-illuminated type and the front-illuminated type are available. However, the back-illuminated type is more favorable.

<Other Examples of Planar Shape>

In the above-described first configuration example and second configuration example of the nineteenth embodiment, the electrode portion 1311 as a voltage application portion and the N+ semiconductor region 1312 as a charge detection portion are formed in a circular planar shape.

However, the planar shapes of the electrode portion 1311 and the N+ semiconductor region 1312 are not limited to the circular shape, and may be an octagonal shape illustrated in FIG. 11, a rectangular shape illustrated in FIG. 12, a square shape, or the like. Furthermore, the number of signal extraction portions 65 (taps) arranged in one pixel is not limited to two and may be, for example, four as illustrated in FIG. 17.

Figure 64A:
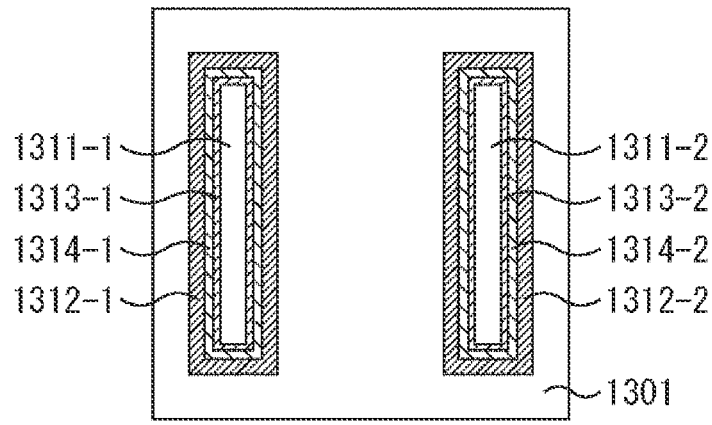
FIGS. 64A, 64B, and 64C are views illustrating other planar shapes of the first configuration example and the second configuration example of the nineteenth embodiment.
Figure 64B:
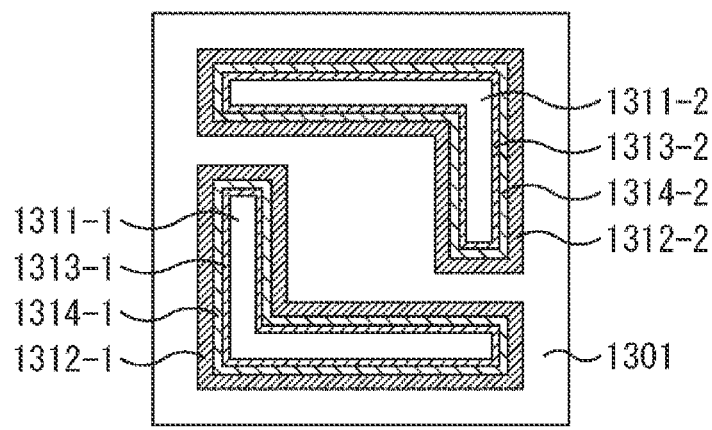
Figure 64C:
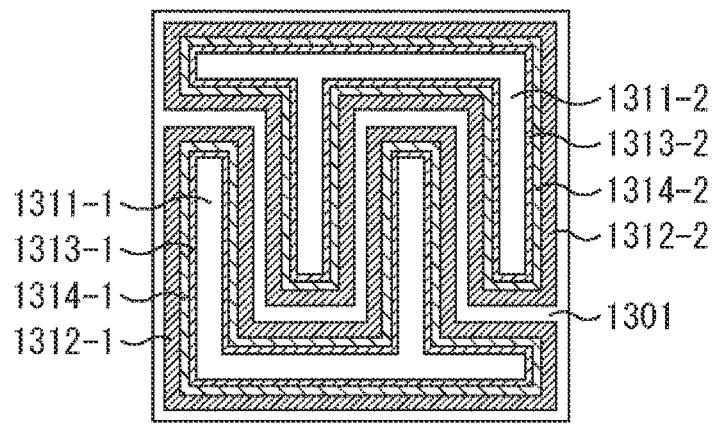

FIGS. 64A, 64B, and 64C are plan views corresponding to the line B-B' in FIG. 62B, and illustrate examples in which the number of signal extraction portions 65 is two, and the planar shapes of the electrode portion 1311 and the N+ semiconductor region 1312 constituting the signal extraction portion 65 are shapes other than the circular shapes.

FIG. 64A is an example in which the planar shapes of the electrode portion 1311 and the N+ semiconductor region 1312 are rectangular shapes long in the vertical direction.

In FIG. 64A, the electrode portion 1311-1 and the electrode portion 1311-2 are point-symmetrically arranged with respect to a center point of the pixel as a symmetric point. Furthermore, the electrode portion 1311-1 and the electrode portion 1311-2 are arranged to face each other. The shapes and positional relationship of the insulating film 1313, the hole concentration strengthening layer 1314, and the N+ semiconductor region 1312 formed on the outer periphery of the electrode portion 1311 are also similar to the electrode portion 1311.

FIG. 64B is an example in which the planar shapes of the electrode portion 1311 and the N+ semiconductor region 1312 are L shapes.

FIG. 64C is an example in which the planar shapes of the electrode portion 1311 and the N+ semiconductor region 1312 are comb shapes.

Even in FIGS. 64B and 64C, the electrode portion 1311-1 and the electrode portion 1311-2 are point-symmetrically arranged with respect to a center point of the pixel as a symmetric point. Furthermore, the electrode portion 1311-1 and the electrode portion 1311-2 are arranged to face each other. The shapes and positional relationship of the insulating film 1313, the hole concentration strengthening layer 1314, and the N+ semiconductor region 1312 formed on the outer periphery of the electrode portion 1311 are also similar.

Figure 65A:
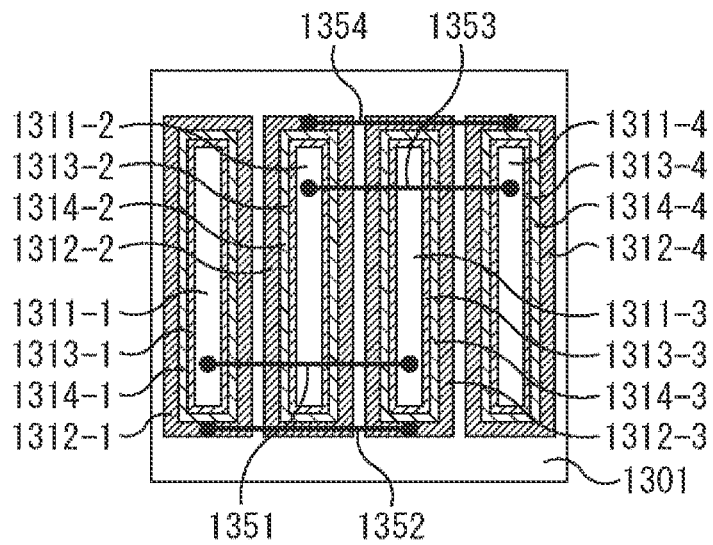
FIGS. 65A, 65B, and 65C are views illustrating other planar shapes of the first configuration example and the second configuration example of the nineteenth embodiment.
Figure 65B:
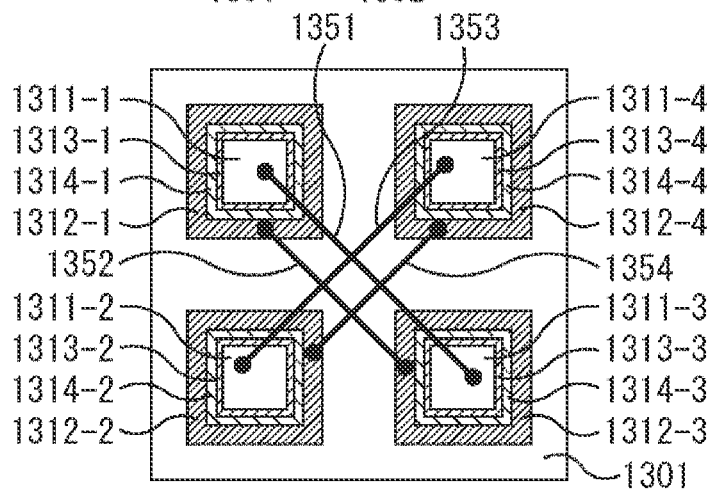
Figure 65C:
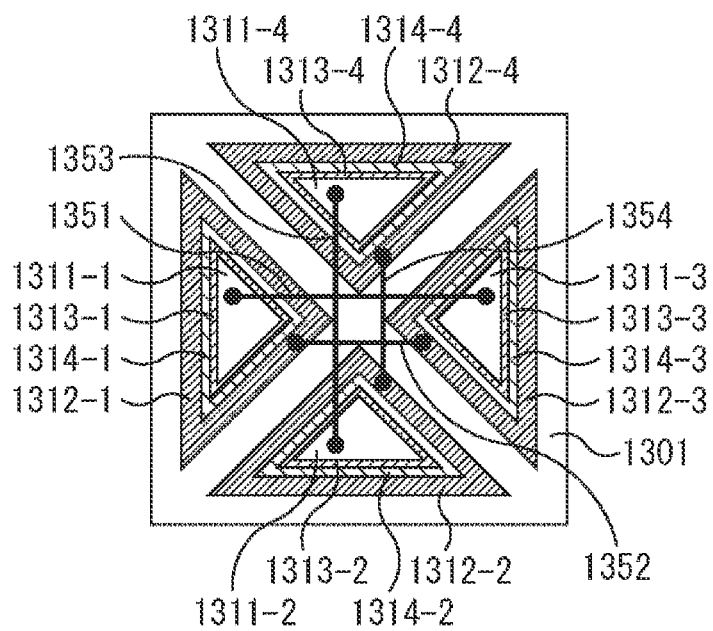

FIGS. 65A, 65B, and 65C are plan views corresponding to the line B-B' in FIG. 62B, and illustrate examples in which the number of signal extraction portions 65 is four, and the planar shapes of the electrode portion 1311 and the N+ semiconductor region 1312 constituting the signal extraction portion 65 are shapes other than the circular shapes.

FIG. 65A is an example in which the planar shapes of the electrode portion 1311 and the N+ semiconductor region 1312 are rectangular shapes long in the vertical direction.

FIG. 65A, the vertically long electrode portions 1311-1 to 1311-4 are arranged at predetermined intervals in the horizontal direction, and are point-symmetrically arranged with respect to a center point of the pixel as symmetric point. Furthermore, the electrode portions 1311-1 and 1311-2, and the electrode portions 1311-3 and 1311-4 are arranged to face each other.

The electrode portion 1311-1 and the electrode portion 1311-3 are electrically connected by wiring 1351, and constitute a voltage application portion of the signal extraction portion 65-1 (first tap TA) to which the voltage MIX0 is applied, for example. The N+ semiconductor region 1312-1 and the N+ semiconductor region 1312-3 are electrically connected by wiring 1352, and constitute a charge detection portion of the signal extraction portion 65-1 (first tap TA) for detecting the signal charge DET1.

The electrode portion 1311-2 and the electrode portion 1311-4 are electrically connected by wiring 1353, and constitute a voltage application portion of the signal extraction portion 65-2 (second tap TB) to which the voltage MIX1 is applied, for example. The N+ semiconductor region 1312-2 and the N+ semiconductor region 1312-4 are electrically connected by wiring 1354, and constitute a charge detection portion of the signal extraction portion 65-2 (second tap TB) for detecting the signal charge DET2.

Therefore, in other words, in the arrangement in FIG. 65A, the set of the voltage application portion and the charge detection portion of the signal extraction portion 65-1 having a rectangular planar shape, and the set of the voltage application portion and the charge detection portion of the signal extraction portion 65-2 having a rectangular planar shape are alternately arranged in the horizontal direction.

The shapes and positional relationship of the insulating film 1313 and the hole concentration strengthening layer 1314 formed on the outer periphery of the electrode portion 1311 are also similar.

FIG. 65B is an example in which the planar shapes of the electrode portion 1311 and the N+ semiconductor region 1312 are square shapes.

In the arrangement in FIG. 65B, sets of the voltage application portion and the charge detection portion of the signal extraction portion 65-1 having a rectangular planar shape are arranged to face each other in a diagonal direction of the pixel 51, and sets of the voltage application portion and the charge detection portion of the signal extraction portion 65-2 having a rectangular planar shape are arranged to face each other in a diagonal direction different from the signal extraction portion 65-1.

FIG. 65C is an example in which the planar shapes of the electrode portion 1311 and the N+ semiconductor region 1312 are triangular shapes.

In the arrangement in FIG. 65C, sets of the voltage application portion and the charge detection portion of the signal extraction portion 65-1 having a triangular planar shape are arranged to face each other in a first direction (horizontal direction) of the pixel 51, and sets of the voltage application portion and the charge detection portion of the signal extraction portion 65-2 having a triangular planar shape are arranged to face each other in a second direction (vertical direction) orthogonal to the first direction and different from the signal extraction portion 65-1.

Even in FIGS. 65B and 65C, the point that the four electrode portions 1311-1 to 1311-4 are point-symmetrically arranged with respect to a center point of the pixel as a symmetric point, the point that the electrode portion 1311-1 and the electrode portion 1311-3 are electrically connected by the wiring 1351, the point that the N+ semiconductor region 1312-1 and the N+ semiconductor region 1312-3 are electrically connected by the wiring 1352, the point that the electrode portion 1311-2 and the electrode portion 1311-4 are electrically connected by the wiring 1353, and the point that the N+ semiconductor region 1312-2 and the N+ semiconductor region 1312-4 are electrically connected by the wiring 1354 are similar. The shapes and positional relationship of the insulating film 1313 and the hole concentration strengthening layer 1314 formed on the outer periphery of the electrode portion 1311 are also similar to the electrode portion 1311.

Third Configuration Example of Nineteenth Embodiment

FIG. 66A is a plan view of a pixel according to a third configuration example of the nineteenth embodiment, and FIG. 66B is a cross-sectional view of the pixel according to the third configuration example of the nineteenth embodiment.

FIG. 66A is a plan view taken along the line B-B' in FIG. 66B, and FIG. 66B is a cross-sectional view taken along the line A-A' in FIG. 66A.

Note that, in the third configuration example in FIGS. 66A and 66B, a portion corresponding to the first configuration example in FIGS. 62A and 62B is denoted by the same reference numeral, and description will be given focusing on portions different from the first configuration example in FIGS. 62A and 62B and description of common portions is omitted as appropriate.

In the first configuration example in FIGS. 62A and 62B and the second configuration example in FIGS. 63A and 63B, the electrode portion 1311 as a voltage application portion and the N+ semiconductor region 1312 as a charge detection portion are arranged on the same plane side of the substrate 61, that is, around (near) the first surface 1321 side.

In contrast, in the third configuration example in FIGS. 66A and 66B, the electrode portion 1311 as a voltage application portion is arranged on a plane side opposite to the first surface 1321 of the substrate 61 where the N+ semiconductor region 1312 as a charge detection portion is formed, that is, on the second surface 1331 side. The protruding portion 1311B of the electrode portion 1311 is formed on the second surface 1331 of the substrate 61.

Furthermore, the electrode portion 1311 is arranged at a position where a center position overlaps with the N+ semiconductor region 1312 in plan view. The example in FIGS. 66A and 66B is an example in which the circular plane regions of the electrode portion 1311 and the N+ semiconductor region 1312 completely match but they do not necessarily completely match. One of the plane regions may be large as long as the center positions overlap. Furthermore, the center positions may not completely match as long as they can be regarded as substantially match.

The third configuration example is similar to the above-described first configuration example except for the positional relationship between the electrode portion 1311 and the N+ semiconductor region 1312. As in the third configuration example, the embedded portion 1311A of the electrode portion 1311 as a voltage application portion is formed up to a deep position near the N+ semiconductor region 1312 as a charge detection portion formed on the first surface 1321 opposite to the second surface 1331 where the electrode portion 1311 is formed. Even in this case, the charge distribution effect with respect to the charge photoelectrically converted in a wide region in the depth direction of the substrate 61 can be obtained, whereby the charge separation efficiency Cmod for long-wavelength light can be enhanced.

Furthermore, since the outer peripheral portion of the electrode portion 1311 is covered with the insulating film 1313, the current flowing between the voltage application portions is suppressed, and thus the current consumption can be reduced. Furthermore, when compared with the same current consumption, a high voltage can be applied to the voltage application portion. Moreover, since the current consumption can be suppressed even if the distance between the voltage application portions is shortened, high resolution becomes possible by miniaturizing the pixel size and increasing the number of pixels.

In the third configuration example of the nineteenth embodiment, either the first surface 1321 or the second surface 1331 of the substrate 61 may be the light incident surface, and both the back-illuminated type and the front-illuminated type are available. However, the back-illuminated type is more favorable. In the case where the third configuration example is configured as the back-illuminated type, the second surface 1331 becomes the surface on the side where the on-chip lens 62 is formed, and for example, the voltage supply line 1253 for supplying the applied voltage to the electrode portion 1311 is wired in the vertical direction of the pixel array unit 20, as illustrated in FIG. 60, and can be connected to the wiring on the front surface side in the peripheral portion 1261 outside the pixel array unit 20, by a through electrode penetrating the substrate 61.

<Other Examples of Planar Shape>

In the above-described third configuration example of the nineteenth embodiment, the electrode portion 1311 as a voltage application portion and the N+ semiconductor region 1312 as a charge detection portion are formed in a circular planar shape.

However, the planar shapes of the electrode portion 1311 and the N+ semiconductor region 1312 are not limited to the circular shape, and may be an octagonal shape illustrated in FIG. 11, a rectangular shape illustrated in FIG. 12, a square shape, or the like. Furthermore, the number of signal extraction portions 65 (taps) arranged in one pixel is not limited to two and may be, for example, four as illustrated in FIG. 17.

Figure 67A:
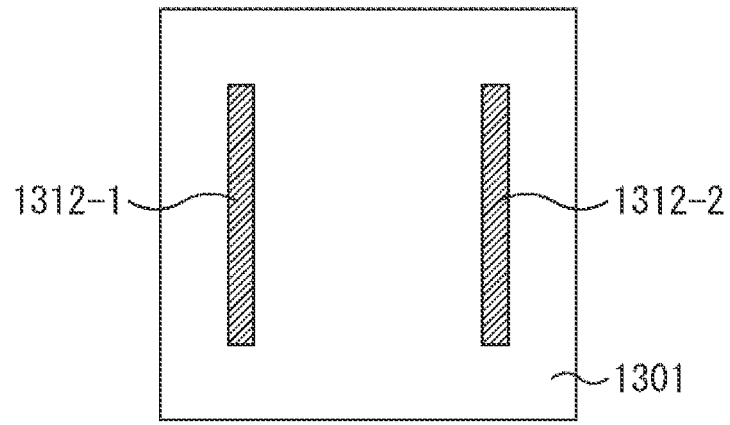
FIGS. 67A, 67B, and 67C are views illustrating other planar shapes of the third configuration example of the nineteenth embodiment.
Figure 67B:
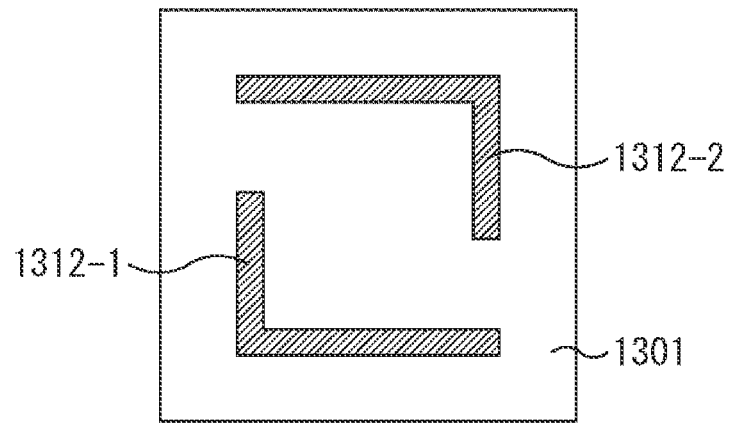
Figure 67C:
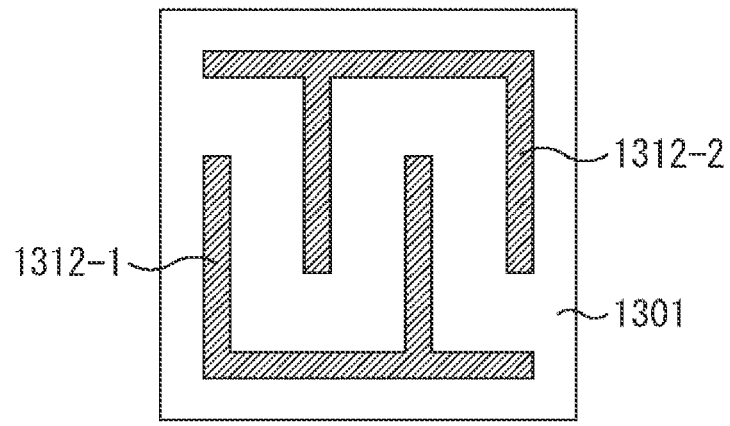

FIGS. 67A, 67B, and 67C are plan views corresponding to the line B-B' in FIG. 66B, and illustrate examples in which the number of signal extraction portions 65 is two, and the planar shapes of the electrode portion 1311 and the N+ semiconductor region 1312 constituting the signal extraction portion 65 are shapes other than the circular shapes.

FIG. 67A is an example in which the planar shapes of the electrode portion 1311 and the N+ semiconductor region 1312 are rectangular shapes long in the vertical direction.

In FIG. 67A, the N+ semiconductor region 1312-1 and the N+ semiconductor region 1312-2 as charge detection portions are point-symmetrically arranged with respect to a center point of the pixel as a symmetric point. Furthermore, the N+ semiconductor region 1312-1 and the N+ semiconductor region 1312-2 are arranged to face each other. The shapes and positional relationship of the electrode portion 1311 arranged on the second surface 1331 side opposite to the formation surface of the N+ semiconductor region 1312, the insulating film 1313 and the hole concentration strengthening layer 1314 formed on the outer periphery of the electrode portion 1311 are also similar to the N+ semiconductor region 1312.

FIG. 67B is an example in which the planar shapes of the electrode portion 1311 and the N+ semiconductor region 1312 are L shapes.

FIG. 67C is an example in which the planar shapes of the electrode portion 1311 and the N+ semiconductor region 1312 are comb shapes.

Even in FIGS. 67B and 67C, the N+ semiconductor region 1312-1 and the N+ semiconductor region 1312-2 as charge detection portions are point-symmetrically arranged with respect to a center point of the pixel as a symmetric point. Furthermore, the N+ semiconductor region 1312-1 and the N+ semiconductor region 1312-2 are arranged to face each other. The shapes and positional relationship of the electrode portion 1311 arranged on the second surface 1331 side opposite to the formation surface of the N+ semiconductor region 1312, the insulating film 1313 and the hole concentration strengthening layer 1314 formed on the outer periphery of the electrode portion 1311 are also similar to the N+ semiconductor region 1312.

Figure 68A:
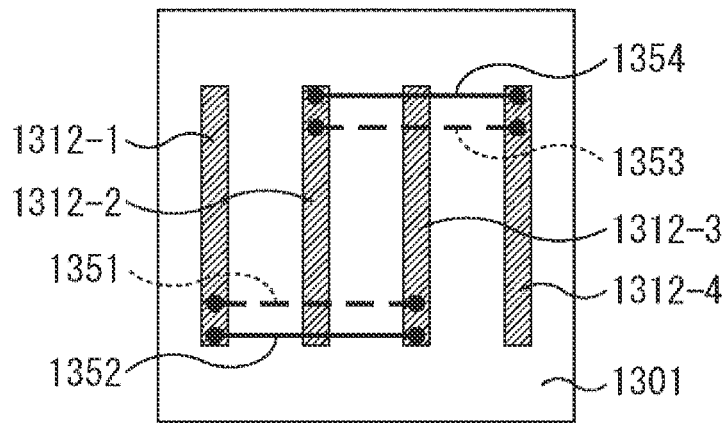
FIGS. 68A, 68B, and 68C are views illustrating other planar shapes of the third configuration example of the nineteenth embodiment.
Figure 68B:
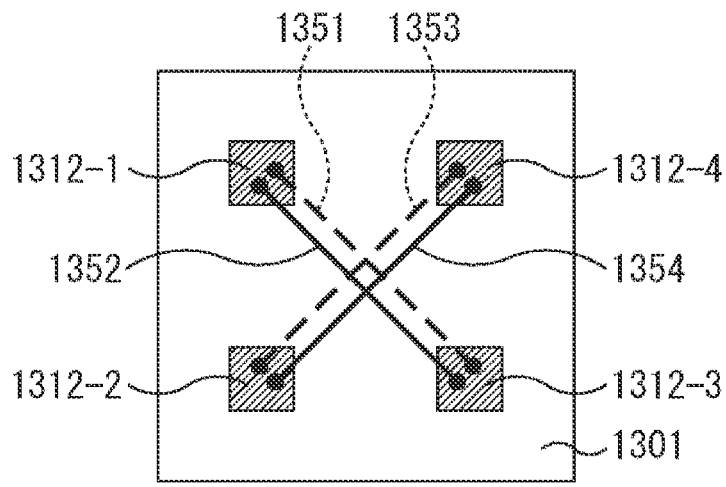

FIGS. 68A, 68B, and 69C are plan views corresponding to the line B-B' in FIG. 66B, and illustrate examples in which the number of signal extraction portions 65 is four, and the planar shapes of the electrode portion 1311 and the N+ semiconductor region 1312 constituting the signal extraction portion 65 are shapes other than the circular shapes.

FIG. 68A is an example in which the planar shapes of the electrode portion 1311 and the N+ semiconductor region 1312 are rectangular shapes long in the vertical direction.

In FIG. 68A, the vertically long N+ semiconductor regions 1312-1 to 1312-4 are arranged at predetermined intervals in the horizontal direction, and are point-symmetrically arranged with respect to a center point of the pixel as symmetric point. Furthermore, the N+ semiconductor regions 1312-1 and 1312-2, and the N+ semiconductor regions 1312-3 and 1312-4 are arranged to each other.

The electrode portion 1311-1 and the electrode portion 1311-3 (not illustrated) formed on the second surface 1331 side are electrically connected by the wiring 1351, and constitute a voltage application portion of the signal extraction portion 65-1 (first tap TA) to which the voltage MIX0 is applied, for example. The N+ semiconductor region 1312-1 and the N+ semiconductor region 1312-3 are electrically connected by wiring 1352, and constitute a charge detection portion of the signal extraction portion 65-1 (first tap TA) for detecting the signal charge DET1.

The electrode portion 1311-2 and the electrode portion 1311-4 (not illustrated) formed on the second surface 1331 side are electrically connected by the wiring 1353, and constitute a voltage application portion of the signal extraction portion 65-2 (second tap TB) to which the voltage MIX1 is applied, for example. The N+ semiconductor region 1312-2 and the N+ semiconductor region 1312-4 are electrically connected by wiring 1354, and constitute a charge detection portion of the signal extraction portion 65-2 (second tap TB) for detecting the signal charge DET2.

Therefore, in other words, in the arrangement in FIG. 68A, the set of the voltage application portion and the charge detection portion of the signal extraction portion 65-1 having a rectangular planar shape, and the set of the voltage application portion and the charge detection portion of the signal extraction portion 65-2 having a rectangular planar shape are alternately arranged in the horizontal direction.

The shapes and positional relationship of the insulating film 1313 and the hole concentration strengthening layer 1314 formed on the outer periphery of the electrode portion 1311 are also similar.

FIG. 68B is an example in which the planar shapes of the electrode portion 1311 and the N+ semiconductor region 1312 are square shapes.

In the arrangement in FIG. 68B, sets of the voltage application portion and the charge detection portion of the signal extraction portion 65-1 having a rectangular planar shape are arranged to face each other in a diagonal direction of the pixel 51, and sets of the voltage application portion and the charge detection portion of the signal extraction portion 65-2 having a rectangular planar shape are arranged to face each other in a diagonal direction different from the signal extraction portion 65-1.

Figure 68C:
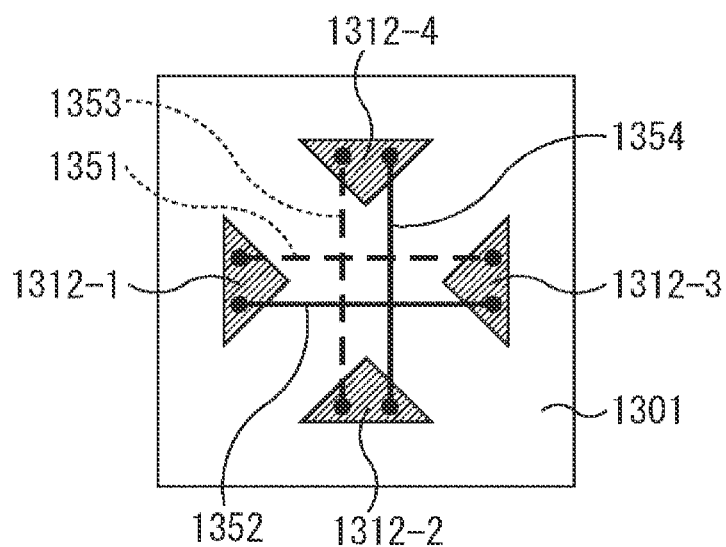

FIG. 68C is an example in which the planar shapes of the electrode portion 1311 and the N+ semiconductor region 1312 are triangular shapes.

In the arrangement in FIG. 68C, sets of the voltage application portion and the charge detection portion of the signal extraction portion 65-1 having a triangular planar shape are arranged to face each other in a first direction (horizontal direction), and sets of the voltage application portion and the charge detection portion of the signal extraction portion 65-2 having a triangular planar shape are arranged to face each other in a second direction (vertical direction) orthogonal to the first direction and different from the signal extraction portion 65-1.

Even in FIGS. 68B and 68C, the point that the four electrode portions 1311-1 to 1311-4 are point-symmetrically arranged with respect to a center point of the pixel as a symmetric point, the point that the electrode portion 1311-1 and the electrode portion 1311-3 are electrically connected by the wiring 1351, the point that the N+ semiconductor region 1312-1 and the N+ semiconductor region 1312-3 are electrically connected by the wiring 1352, the point that the electrode portion 1311-2 and the electrode portion 1311-4 are electrically connected by the wiring 1353, and the point that the N+ semiconductor region 1312-2 and the N+ semiconductor region 1312-4 are electrically connected by the wiring 1354 are similar. The shapes and positional relationship of the insulating film 1313 and the hole concentration strengthening layer 1314 formed on the outer periphery of the electrode portion 1311 are also similar to the electrode portion 1311.

<Other Examples of Wiring Layout>

In the above-described examples of the pixel circuits in FIGS. 31 and 32 and the metal film M3 in FIGS. 42A, 42B, and 42C, the configuration in which two vertical signal lines 29 are arranged for one pixel column, corresponding to the two signal extraction portions 65 (two taps TA and TB) have been described.

However, a configuration in which four vertical signal lines 29 are arranged for one pixel column, and pixel signals of a total of four taps of two pixels adjacent in the vertical direction are output at the same time can be adopted.

Figure 69:
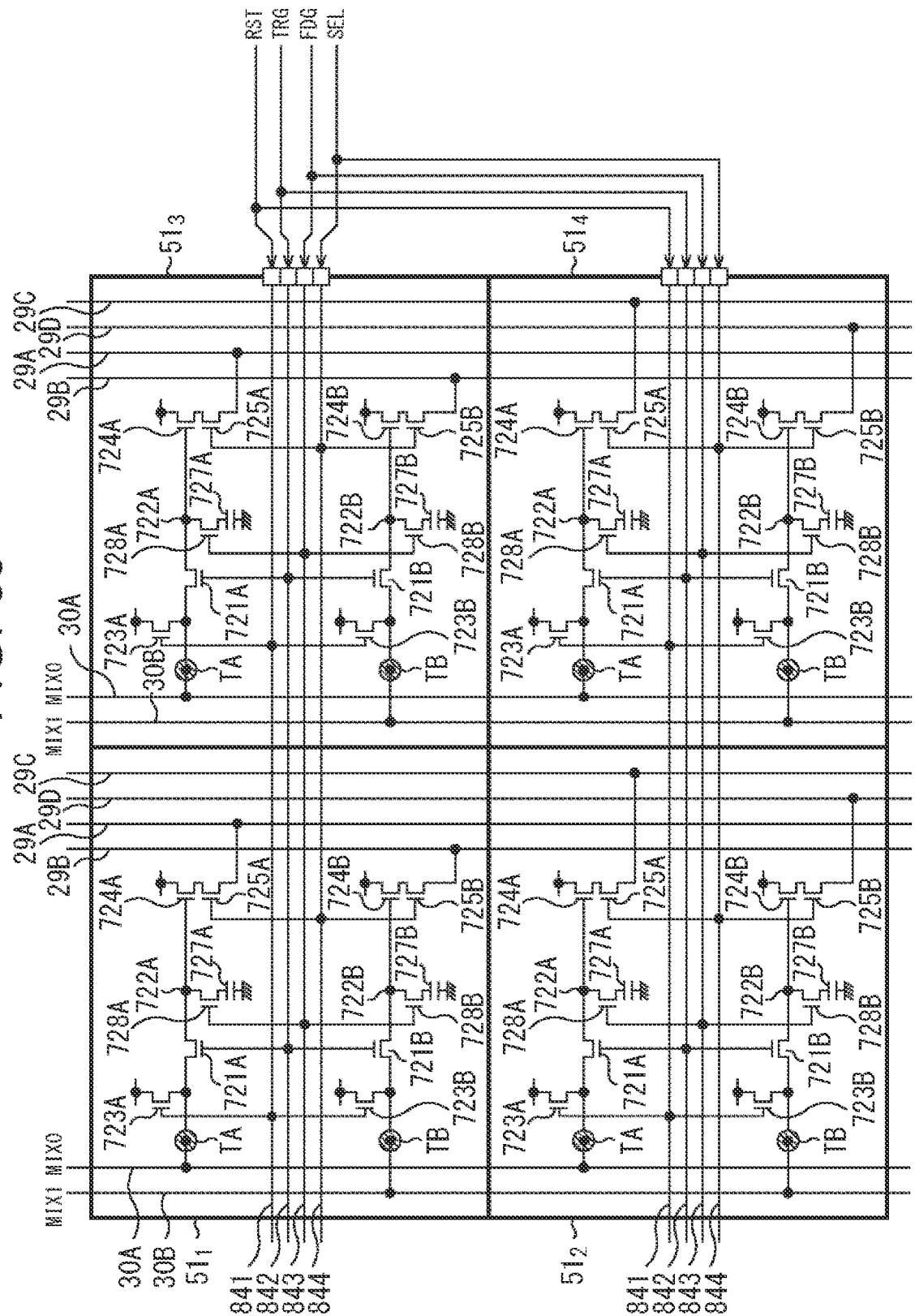
FIG. 69 is a diagram illustrating a circuit configuration example of a pixel array unit in a case of outputting 4-tap pixel signals at the same time.

FIG. 69 illustrates a circuit configuration example of the pixel array unit 20 in the case of outputting pixel signals of a total of four taps of two pixels adjacent in the vertical direction at the same time.

FIG. 69 illustrates a circuit configuration of 2×2 four pixels among a plurality of pixels 51 two-dimensionally arranged in a matrix in the pixel array unit 20. Note that, in a case of distinguishing the 2×2 four pixels 51 in FIG. 69, they are represented as pixels 511 to 514.

The circuit configuration of each pixel 51 is the circuit configuration provided with the additional capacitance 727 and the switching transistor 728 that controls the connection, which have been described with reference to FIG. 32. Redundant description of the circuit configuration is omitted.

Voltage supply lines 30A and 30B are vertically wired for one pixel column of the pixel array unit 20. Then, the predetermined voltage MIX0 is supplied to the first taps TA of the plurality of pixels 51 arrayed in the vertical direction via the voltage supply line 30A, and the predetermined voltage MIX1 is supplied to the second taps TB via the voltage supply line 30B.

Furthermore, the four vertical signal lines 29A to 29D are wired in the vertical direction for one pixel column of the pixel array unit 20.

In the pixel column of the pixel 511 and the pixel 512, for example, the vertical signal line 29A transmits the pixel column of the first tap TA of the pixel 511 to a column processing unit 23 (FIG. 1), the vertical signal line 29B transmits the pixel signal of the second tap TB of the pixel 511 to the column processing unit 23, the vertical signal line 29C transmits the pixel signal of the first tap TA of the pixel 512 adjacent to the pixel 511 in the same column to the column processing unit 23, and the vertical signal line 29D transmits the pixel signal of the second tap TB of the pixel 512 to the column processing unit 23.

In the pixel column of the pixel 513 and the pixel 514, for example, the vertical signal line 29A transmits the pixel column of the first tap TA of the pixel 513 to a column processing unit 23 (FIG. 1), the vertical signal line 29B transmits the pixel signal of the second tap TB of the pixel 513 to the column processing unit 23, the vertical signal line 29C transmits the pixel signal of the first tap TA of the pixel 514 adjacent to the pixel 513 in the same column to the column processing unit 23, and the vertical signal line 29D transmits the pixel signal of the second tap TB of the pixel 514 to the column processing unit 23.

Meanwhile, a control line 841 for transmitting the drive signal RST to the reset transistor 723, a control line 842 for transmitting the drive signal TRG to the transfer transistor 721, a control line 843 for transmitting the drive signal FDG to the switching transistor 728, and a control line 844 for transmitting the selection signal SEL to the selection transistor 725 are arranged on a pixel row basis in the horizontal direction of the pixel array unit 20.

As for the drive signal RST, the drive signal FDG, the drive signal TRG, and the selection signal SEL, the same signal is supplied from the vertical drive unit 22 to each pixel 51 in two rows adjacent in the vertical direction.

By arranging the four vertical signal lines 29A to 29D in one pixel column in the pixel array unit 20 in this way, the pixel signals can be read at the same time on a two-row basis.

Figure 70:
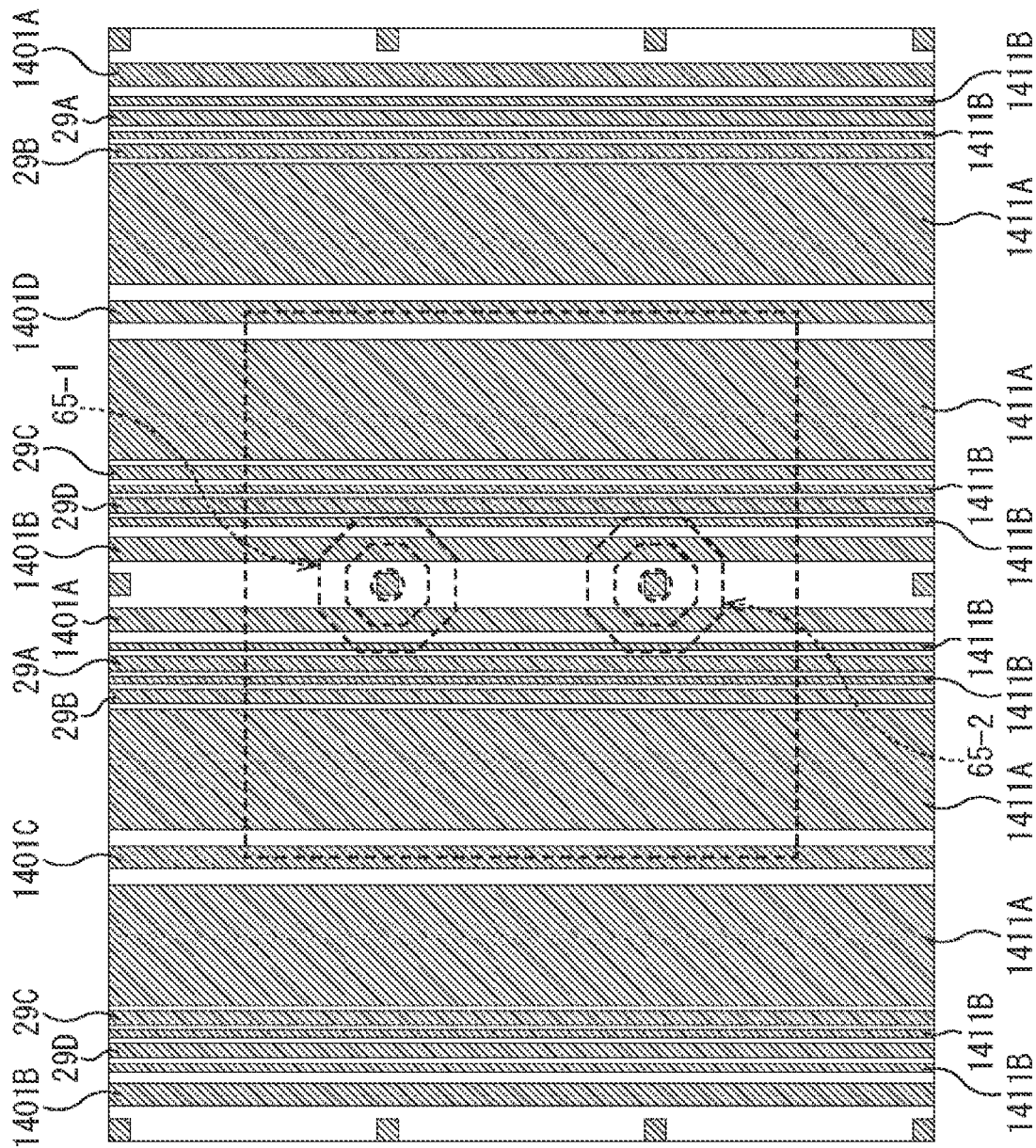
FIG. 70 is a view illustrating a wiring layout in which four vertical signal lines are arranged.

FIG. 70 illustrates a layout of the metal film M3 that is the third layer of the multilayer wiring layer 811 in the case of arranging the four vertical signal lines 29A to 29D in one pixel column.

In other words, FIG. 70 is a modification of the layout of the metal film M3 illustrated in FIG. 42C.

In the layout of the metal film M3 in FIG. 70, the four vertical signal lines 29A to 29D are arranged in one pixel column. Furthermore, four power supply lines 1401A to 1401D for supplying a power supply voltage VDD are arranged in one pixel column.

Note that, in FIG. 70, the region of the pixel 51 and the regions of the signal extraction portions 65-1 and 65-2 having an octagonal shape illustrated in FIG. 11 are illustrated by broken lines for reference. FIGS. 71, 72, 73A, 73B, 74, 75, and 76 to be described below are similarly illustrated.

In the layout of the metal film M3 in FIG. 70, a VSS wire (ground wiring) 1411 of a GND potential is arranged next to the vertical signal lines 29A to 29D and the power supply lines 1401A to 1401D. The VSS wire 1411 includes a VSS wire 1411B with a narrow line width arranged next to the vertical signal lines 29A to 29D, and a VSS wire 1411A with a wide line width arranged between the vertical signal line 29B and the power supply line 1401C in a pixel boundary portion and between the vertical signal line 29C and the power line 1401D in a pixel boundary portion.

It is effective to increase the power supply voltage VDD to be supplied to the power supply line 1401 or increase the voltages MIX0 and MIX1 to be supplied via the voltage supply lines 30A and 30B in order to improve signal stability. In the meantime, the current increases and wiring reliability deteriorates. Therefore, as illustrated in FIG. 70, by providing the VSS wire 1411A with a wider line width than the power supply line 1401 to one pixel column for at least one VSS wire 1411, current density is lowered and the wiring reliability can be improved. FIG. 70 illustrates an example of providing two VSS wires 1411A to one pixel column symmetrically in the pixel region.

Furthermore, in the layout in FIG. 70, the VSS wire 1411 (1411A or 1411B) is arranged next to each of the vertical signal lines 29A to 29D. Thereby, the vertical signal line 29 can be made less susceptible to potential fluctuation from the outside.

Note that not only the third-layer metal film M3 of the multilayer wiring layer 811 illustrated in FIG. 70 but also the metal films of other layers can have the VSS wires as wires adjacent to the signal line, power supply line, and control line. For example, the VSS wires can be arranged on both sides of each of the control lines 841 to 844 of the metal film M2 that is the second layer illustrated in FIG. 42B. Thereby, the control lines 841 to 844 can be less affected by the potential fluctuation from the outside.

Figure 71:
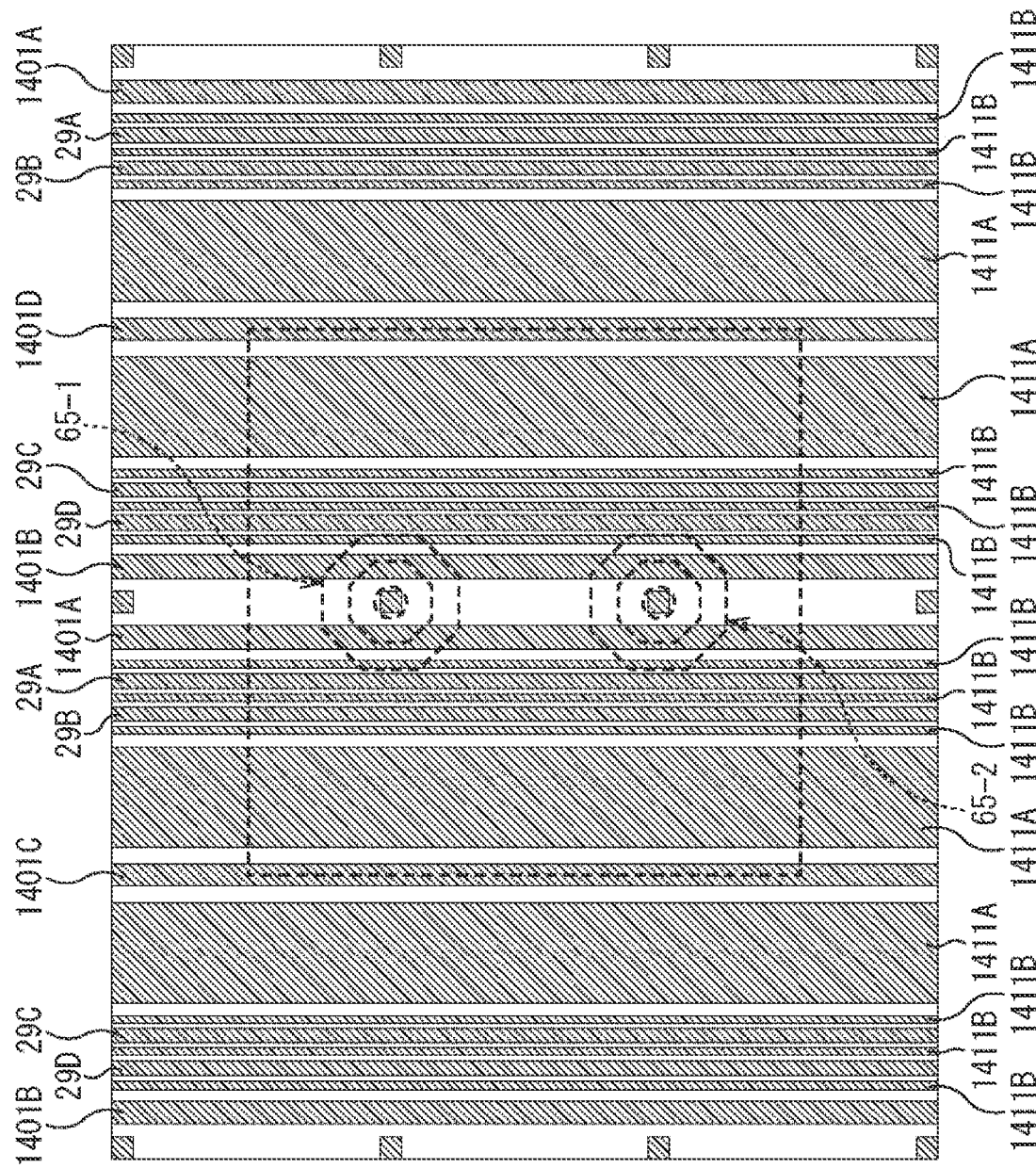
FIG. 71 is a view illustrating a first modification of the wiring layout in which four vertical signal lines are arranged.

FIG. 71 illustrates a first modification of the layout of the metal film M3 that is the third layer of the multilayer wiring layer 811 in the case of arranging the four vertical signal lines 29A to 29D in one pixel column.

The difference of the layout of the metal film M3 in FIG. 71 from the layout of the metal film M3 illustrated in FIG. 70 is that the VSS wires 1411 adjacent to each of the four vertical signal lines 29A to 29D have the same line width.

More specifically, in the layout of the metal film M3 in FIG. 70, the VSS wire 1411A with the wide line width and the VSS wire 1411B with the narrow line width are arranged on both sides of the vertical signal line 29C, and the VSS wire 1411A with the wide line width and the VSS wire 1411B with the narrow line width are also arranged on both sides of the vertical signal line 29B.

In contrast, in the layout of the metal film M3 in FIG. 71, the VSS wires 1411B with the narrow line width are arranged on both sides of the vertical signal line 29C, and the VSS wires 1411B with the narrow line width are arranged on both sides of the vertical signal line 29B. The VSS wires 1411B with the narrow line width are arranged on both sides of each of the other vertical signal lines 29A and 29D. The line widths of the VSS wire 1411B on both sides of the four vertical signal lines 29A to 29D are the same.

By making the line widths of the VSS wires 1411 on both sides of the vertical signal line 29 the same, the influence of crosstalk can be uniform, and characteristic variation can be reduced.

Figure 72:
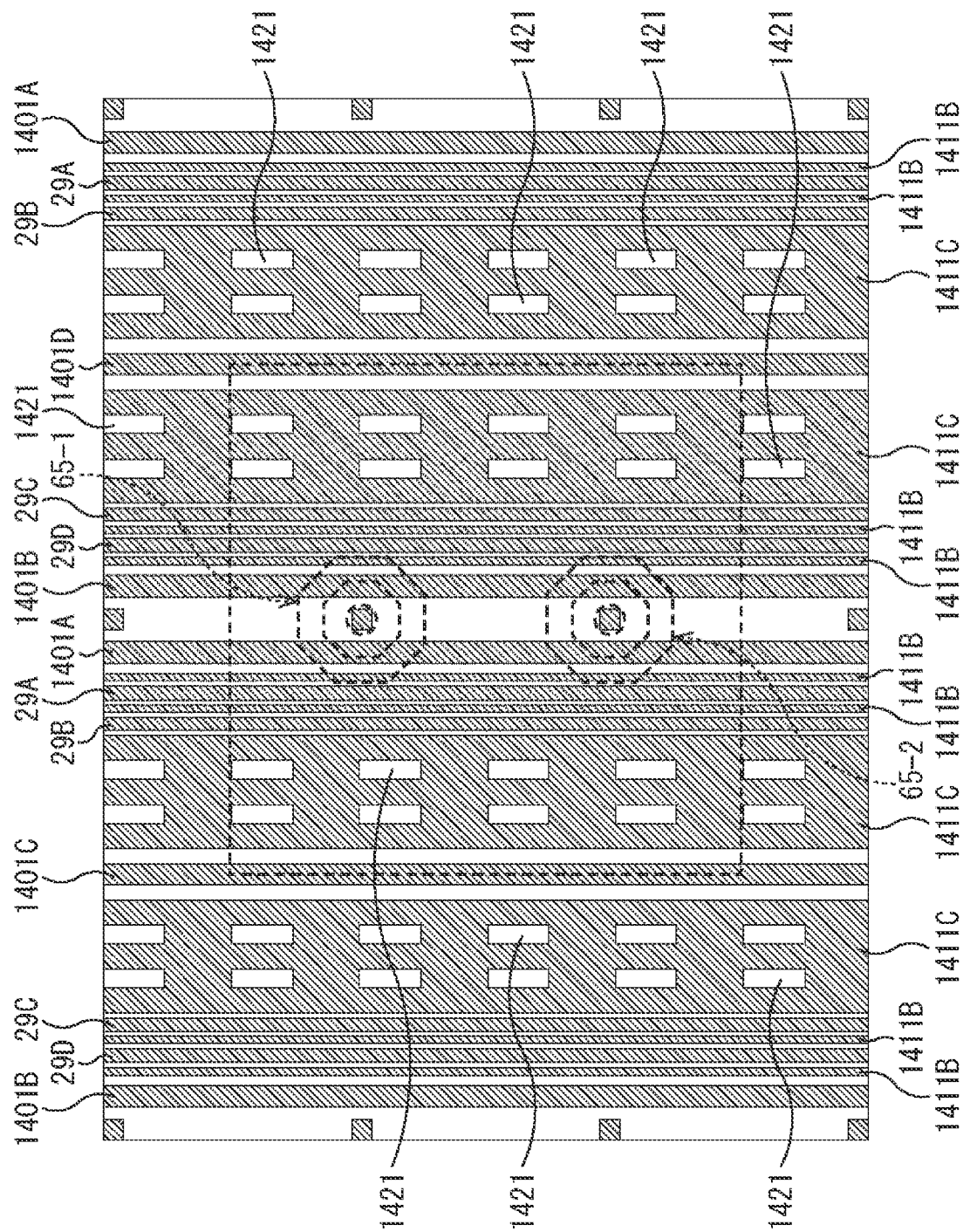
FIG. 72 is a view illustrating a second modification of the wiring layout in which four vertical signal lines are arranged.

FIG. 72 illustrates a second modification of the layout of the metal film M3 that is the third layer of the multilayer wiring layer 811 in the case of arranging the four vertical signal lines 29A to 29D in one pixel column.

The difference of the layout of the metal film M3 in FIG. 72 from the layout of the metal film M3 illustrated in FIG. 70 is that the VSS wire 1411A with the wide line width is replaced with a VSS wire 1411C regularly provided with a plurality of gaps 1421 therein.

That is, the VSS wire 1411C has a wider line width than the power supply line 1401, and has the plurality of gaps 1421 repeatedly arrayed with a predetermined cycle in the vertical direction therein. In the example in FIG. 72, the shape of the gap 1421 is a rectangle. However, the shape is not limited to the rectangle and may be a circle or a polygon.

By providing the plurality of gaps 1421 inside the wiring region, stability in forming (processing) the wide-width VSS wire 1411C can be improved.

Note that FIG. 72 illustrates the layout in which the VSS wire 1411A of the metal film M3 illustrated in FIG. 70 is replaced with the VSS wire 1411C. However, a layout in which the VSS wire 1411A of the metal film M3 illustrated in FIG. 71 is replaced with the VSS wire 1411C is also possible.

<Other Layout Examples of Pixel Transistors>

Next, modifications of the arrangement example of the pixel transistors illustrated in FIG. 44B will be described with reference to FIGS. 73A and 73B.

Figure 73B:
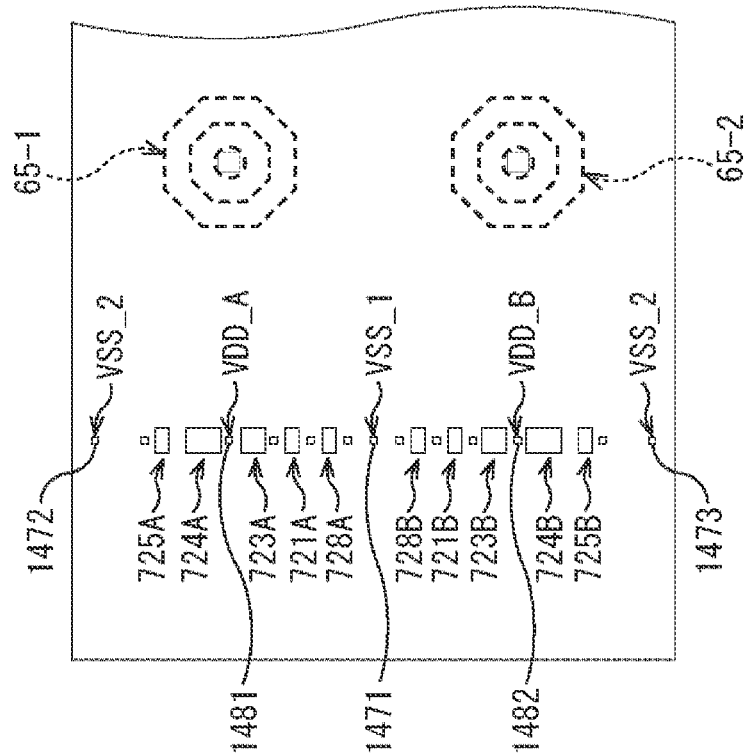
FIGS. 73A and 73B are views illustrating modifications of the arrangement example of a pixel transistor.
Figure 73A:
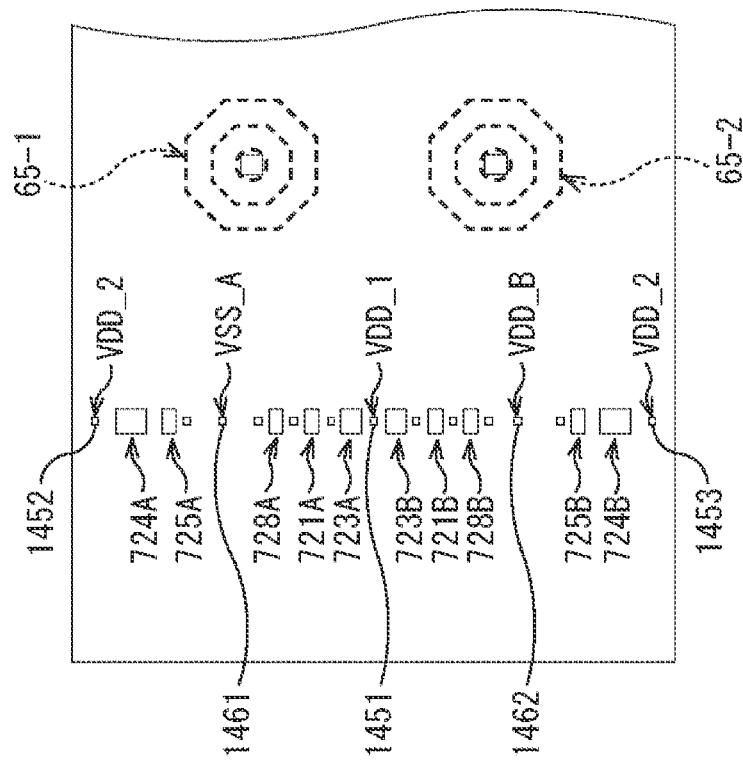

FIG. 73A is a diagram illustrating the arrangement of the pixel transistors illustrated in FIG. 44B again.

Meanwhile, FIG. 73B illustrates a modification of the arrangement of the pixel transistors.

In FIG. 73A, as described in FIG. 44B, gate electrodes of reset transistors 723A and 723B, transfer transistors 721A and 721B, switching transistors 728A and 728B, selection transistors 725A and 725B, and amplification transistors 724A and 724B are formed in order toward outside from a side close to an intermediate line (not illustrated) of the two signal extraction portions 65-1 and 65-2 with reference to the intermediate line.

In the case of this arrangement of the pixel transistors, a contact 1451 of a first power supply voltage VDD (VDD_1) is arranged between the reset transistors 723A and 723B, and contacts 1452 and 1453 of a second power supply voltage VDD (VDD_2) are respectively arranged outside the gate electrodes of the amplification transistors 724A and 724B.

Furthermore, a contact 1461 with a first VSS wire (VSS_A) is arranged between the gate electrodes of the selection transistor 725A and the switching transistor 728A, and a contact 1462 with a second VSS wire (VSS_B) is arranged between the gate electrodes of the selection transistor 725B and the switching transistor 728B.

In the case of such an arrangement of the pixel transistors, the four power supply lines 1401A to 1401D are required for one pixel column, as illustrated in FIGS. 70 to 72.

Meanwhile, in FIG. 73B, the gate electrodes of the switching transistors 728A and 728B, the transfer transistors 721A and 721B, the reset transistors 723A and 723B, the amplification transistors 724A and 724B, and the selection transistors 725A and 725B are formed in order toward outside from a side close to an intermediate line (not illustrated) of the two signal extraction portions 65-1 and 65-2 with reference to the intermediate line.

In the case of the arrangement of the pixel transistors, a contact 1471 with the first VSS wire (VSS_1) is arranged between the switching transistors 728A and 728B, and contacts 1472 and 1473 with the second VSS wire (VSS_2) are respectively arranged outside the gate electrodes of the selection transistors 725A and 725B.

Furthermore, a contact 1481 of the first power supply voltage VDD (VDD_A) is arranged between the gate electrodes of the amplification transistor 724A and the reset transistor 723A, and a contact 1482 of the second power supply voltage VDD (VDD_B) is arranged between the gate electrodes of the amplification transistor 724B and the reset transistor 723B.

In the case of such an arrangement of the pixel transistors, the number of contacts of the power supply voltage can be reduced as compared with the pixel transistor layout in FIG. 73A. Therefore, the circuit can be simplified. Furthermore, the number of power supply lines 1401 for wiring the pixel array unit 20 can be reduced, and the pixel array unit 20 can be configured by two power supply lines 1401 for one pixel column.

Moreover, in the pixel transistor layout in FIG. 73B, the contact 1471 with the first VSS wire (VSS_1) between the switching transistors 728A and 728B can be omitted. Thereby, the density of the pixel transistors in the vertical direction can be reduced. Furthermore, by reducing the contact with the VSS wire, the current flowing between the voltage supply line 741 (FIGS. 33A, 33B, 34A, and 34B) for applying the voltage MIX0 or MIX1 and the VSS wire can be reduced.

In the case where the contact 1471 with the first VSS wire (VSS_1) is omitted, the amplification transistors 724A and 724B can be formed to be large in the vertical direction. Thereby, the noise of the pixel transistors can be reduced, and signal variation can be reduced.

Alternatively, in the pixel transistor layout in FIG. 73B, the contacts 1472 and 1473 with the second VSS wire (VSS_2) may be omitted. Thereby, the density of the pixel transistors in the vertical direction can be reduced. Furthermore, by reducing the contact with the VSS wire, the current flowing between the voltage supply line 741 (FIGS. 33A, 33B, 34A, and 34B) for applying the voltage MIX0 or MIX1 and the VSS wire can be reduced.

In the case where the contacts 1472 and 1473 with the second VSS wire (VSS_2) are omitted, the amplification transistors 724A and 724B can be formed to be large in the vertical direction. Thereby, the noise of the pixel transistors can be reduced, and signal variation can be reduced.

Figure 74:
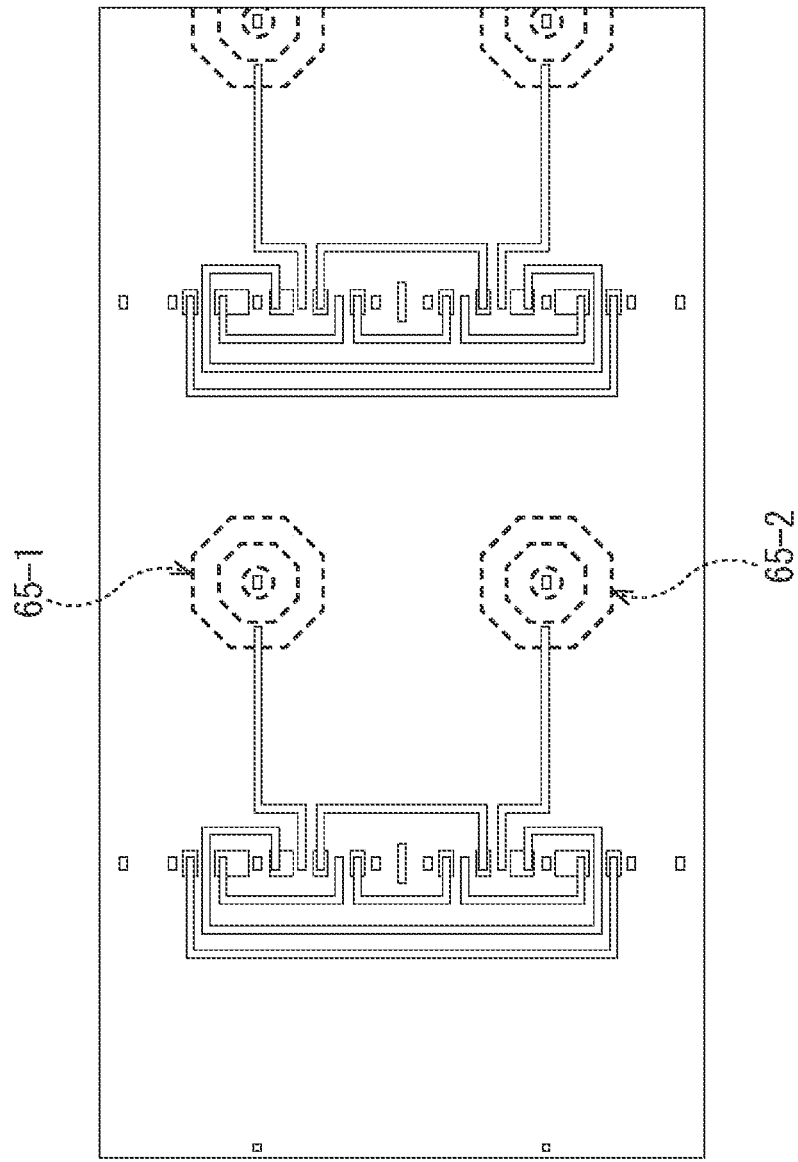
FIG. 74 is a view illustrating a connection layout in the pixel transistor layout in FIG. 73B.

FIG. 74 illustrates a wiring layout for connecting the pixel transistors Tr in the metal film M1, in the pixel transistor layout in FIG. 73B. FIG. 74 corresponds to the wiring connecting the pixel transistors Tr in the metal film M1 illustrated in FIG. 44C. The wiring connecting the pixel transistors Tr may be connected across other wiring layers such as the metal films M2 and M3.

Figure 75:
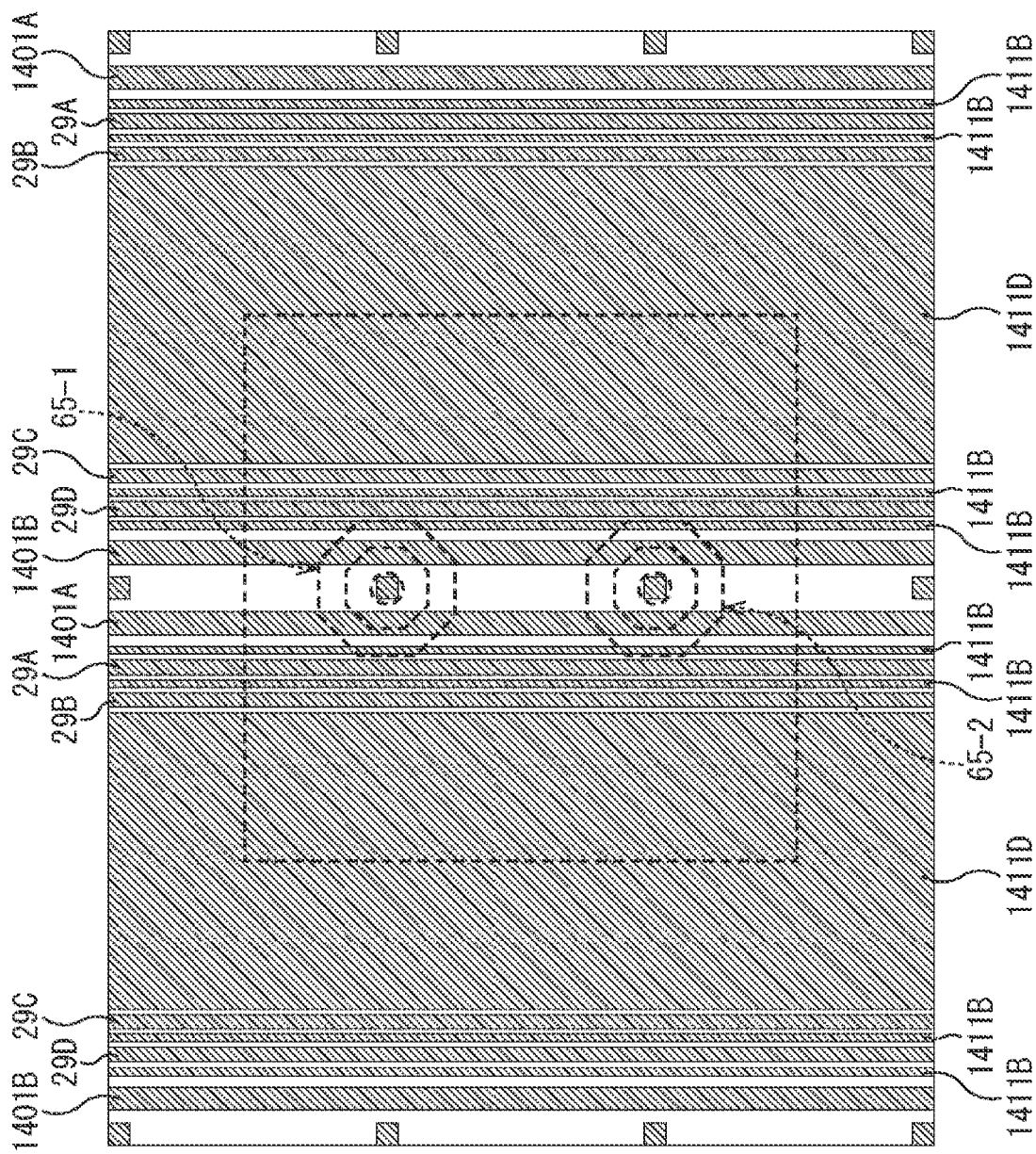
FIG. 75 is a view illustrating a wiring layout in the pixel transistor layout in FIG. 73B.

FIG. 75 illustrates a layout of the metal film M3 as the third layer of the multilayer wiring layer 811 in the case of adopting the pixel transistor layout in FIG. 73B and arranging two power supply lines 1401 for one pixel column.

In FIG. 75, a portion corresponding to FIG. 70 is denoted by the same reference numeral, and description thereof is omitted as appropriate.

When comparing the layout of the metal film M3 in FIG. 75 with the layout of the metal film M3 in FIG. 70, the two power supply lines 1401C and 1401D, of the four power supply lines 1401A to 1401D in FIG. 70, are omitted, and the VSS wire 1411A with the wide line width is replaced with a VSS wire 1411D with a wider line width.

By increasing the area (line width) of the VSS wire 1411 in this way, the current density is further reduced, and the wiring reliability can be improved.

Figure 76:
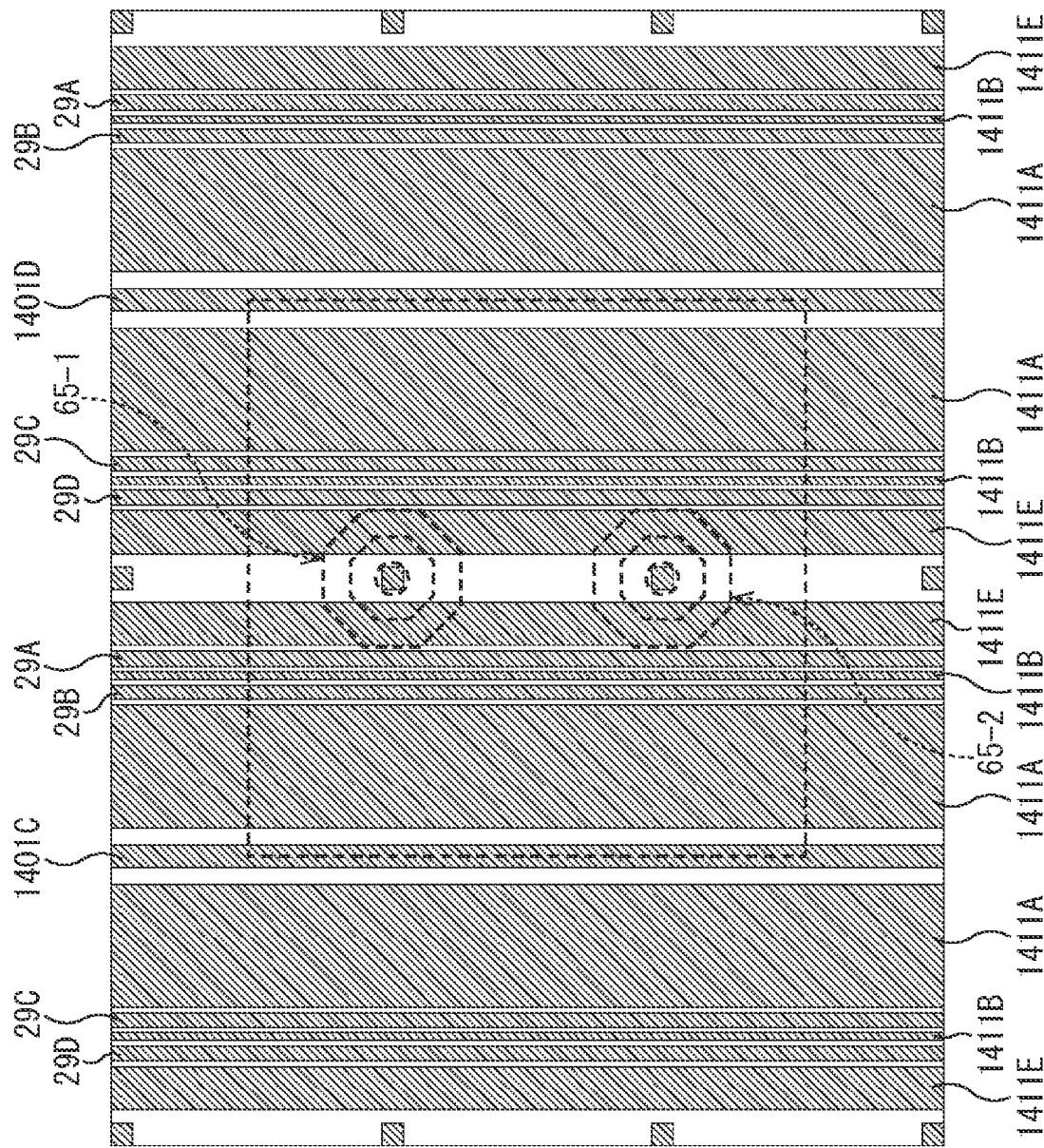
FIG. 76 is a view illustrating a wiring layout in which two power supply lines are arranged in one pixel column.

FIG. 76 illustrates another layout of the metal film M3 as the third layer of the multilayer wiring layer 811 in the case of adopting the pixel transistor layout in FIG. 73B and arranging two power supply lines 1401 for one pixel column.

In FIG. 76, a portion corresponding to FIG. 70 is denoted by the same reference numeral, and description thereof is omitted as appropriate.

When comparing the layout of the metal film M3 in FIG. 76 with the layout of the metal film M3 in FIG. 70, the two power supply lines 1401A and 1401B, of the four power supply lines 1401A to 1401D in FIG. 70, are omitted and replaced with VSS wires 1411E with a wide line width.

By increasing the area (line width) of the VSS wire 1411 in this way, the current density is further reduced, and the wiring reliability can be improved.

Note that the layouts of the metal film M3 illustrated in FIGS. 75 and 76 are examples obtained by changing the power supply lines 1401 in the layout of the metal film M3 illustrated in FIG. 70 to the two power supply lines 1401. Further, examples obtained by changing the power supply lines 1401 in the layouts of the metal film M3 illustrated in FIGS. 71 and 72 to the two power supply lines 1401 are also similarly possible.

That is, the configuration in which the power supply lines 1401 are changed to the two power supply lines 1401 is possible for the layout of the metal film M3 in FIG. 71 in which the VSS wires 1411 adjacent to each of the four vertical signal lines 29A to 29D are the same line width, and for the layout of the metal film M3 in FIG. 72 having the VSS wire 1411C provided with the plurality of gaps 1421.

Thereby, the influence of crosstalk can be made uniform, and the characteristic variation can be reduced, similarly to FIG. 71, or the stability in forming the wide-width VSS wire 1411C can be improved, similarly to FIG. 72.

<Wiring Examples of Power Supply Line and VSS Wire>

Figure 77:
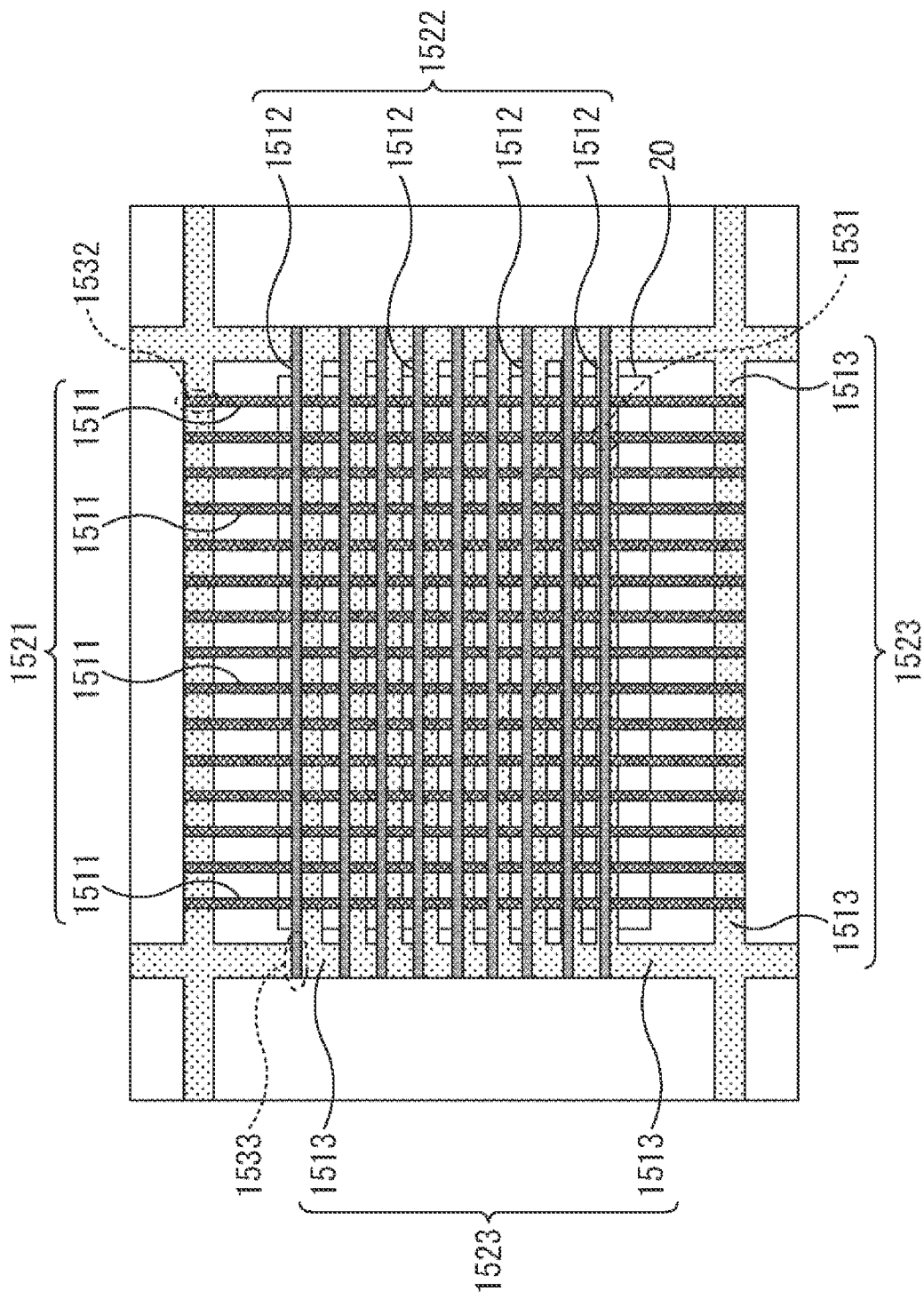
FIG. 77 is a plan view illustrating a wiring example of VSS wires.

FIG. 77 is a plan view illustrating a wiring example of VSS wires in the multilayer wiring layer 811.

The VSS wires can be formed in a plurality of wiring layers such as a first wiring layer 1521, a second wiring layer 1522, and a third wiring layer 1523 in the multilayer wiring layer 811, as illustrated in FIG. 77.

In the first wiring layer 1521, a plurality of vertical wires 1511 extending in the vertical direction in the pixel array unit 20 is arranged at predetermined intervals in the horizontal direction, for example. In the second wiring layer 1522, a plurality of horizontal wires 1512 extending in the horizontal direction in the pixel array unit 20 is arranged at predetermined intervals in the vertical direction, for example. In the third wiring layer 1523, wires 1513 extending in the vertical direction or the horizontal direction are arranged to surround at least the outside of the pixel array unit 20, with a wider line width than the vertical wire 1511 and the horizontal wire 1512, for example, and are connected to the GND potential. The wires 1513 are also wired inside the pixel array unit 20 to connect the facing wires 1513 in the outer peripheral portion.

The vertical wire 1511 of the first wiring layer 1521 and the horizontal wire 1512 of the second wiring layer 1522 are connected by a via or the like at each superimposition portion 1531 where the vertical wire 1511 and the horizontal wire 1512 overlap with each other in plan view.

Furthermore, the vertical wire 1511 of the first wiring layer 1521 and the wire 1513 of the third wiring layer 1523 are connected by a via or the like at each superimposition portion 1532 where the vertical wire 1511 and the wire 1513 overlap with each other in plan view.

Furthermore, the horizontal wire 1512 of the second wiring layer 1522 and the wire 1513 of the third wiring layer 1523 are connected by a via or the like at each superimposition portion 1533 where the horizontal wire 1512 and the wire 1513 overlap with each other in plan view.

Note that, in FIG. 77, to prevent complication of the drawing, the reference numeral is given in only one portion for each of the superimposition portions 1531 to 1533.

As described above, the VSS wires are formed in the plurality of wiring layers of the multilayer wiring layer 811, and the vertical wires 1511 and the horizontal wires 151 can be wired in a grid-like manner in plan view in the pixel array unit 20. Thereby, a propagation delay in the pixel array unit 20 can be reduced and the characteristic variation can be suppressed.

Figure 78:
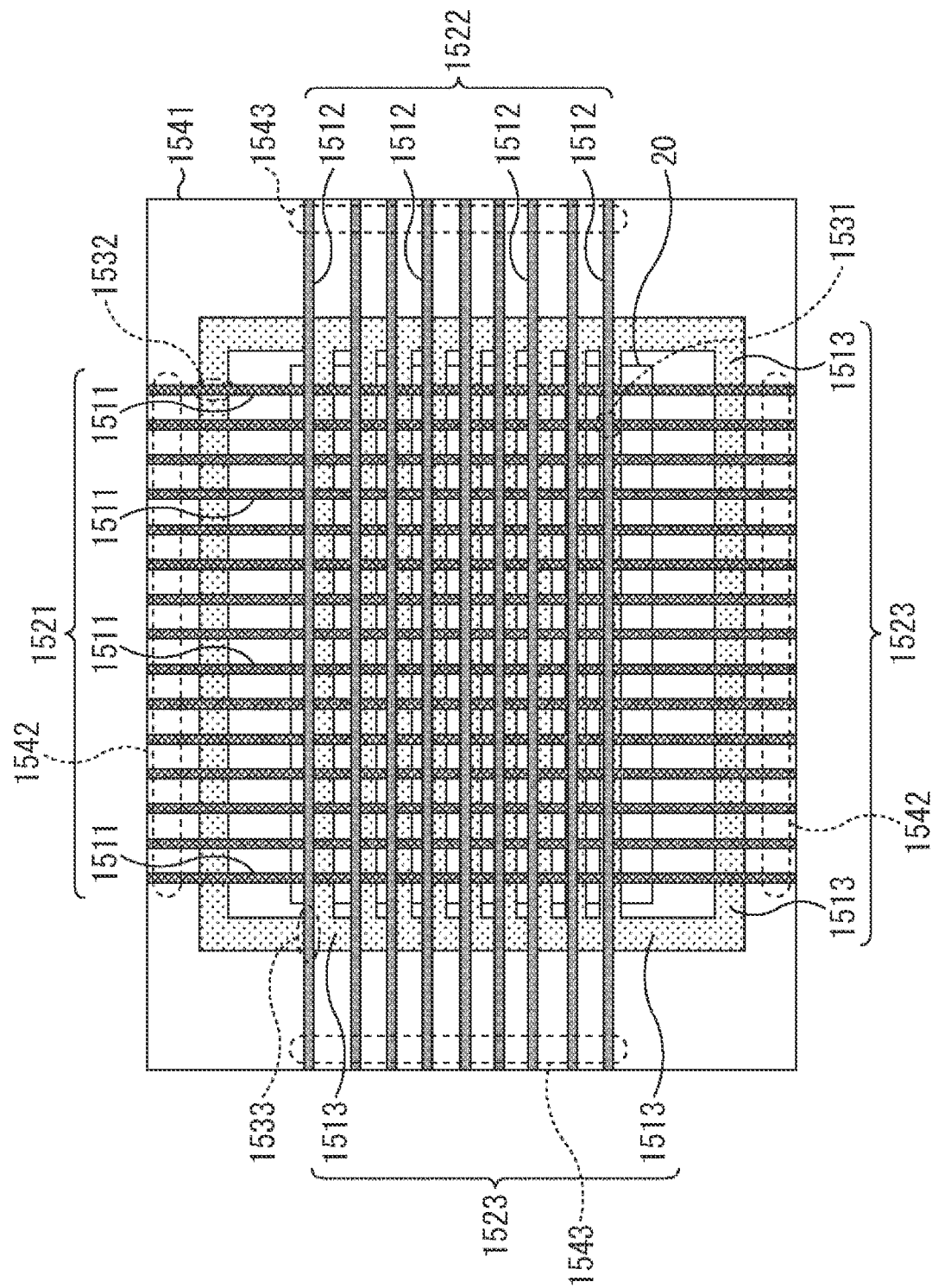
FIG. 78 is a plan view illustrating a wiring example of VSS wires.

FIG. 78 is a plan view illustrating another wiring example of the VSS wires in the multilayer wiring layer 811.

Note that, in FIG. 78, a portion corresponding to FIG. 77 is denoted by the same reference numeral, and description thereof is omitted as appropriate.

In FIG. 77, the vertical wires 1511 of the first wiring layer 1521 and the horizontal wires 1512 of the second wiring layer 1522 are not formed outside the wires 1513 formed in the outer periphery of the pixel array unit 20, whereas in FIG. 78, the vertical wires 1511 and the horizontal wires 1512 are formed to extend to the outside of the wires 1513 in the outer periphery of the pixel array unit 20. Then, each of the vertical wires 1511 is connected to the GND potential in an outer peripheral portion 1542 of a substrate 1541 outside the pixel array unit 20, and each of the horizontal wires 1512 is connected to the GND potential in an outer peripheral portion 1543 of the substrate 1541 outside the pixel array unit 20.

In other words, in FIG. 77, the vertical wires 1511 of the first wiring layer 1521 and the horizontal wires 1512 of the second wiring layer 1522 are connected to the GND potential via the outer peripheral wires 1513, whereas in FIG. 78, the vertical wires 1511 and the horizontal wires 1512 themselves are directly connected to the GND potential. Note that the regions where the vertical wires 1511 and the horizontal wires 1512 themselves are directly connected to the GND potential may be four sides of the substrate 1541 such as the outer peripheral portions 1542 and 1543 in FIG. 78 or may be predetermined one side, two sides, or three sides.

As described above, the VSS wires are formed in the plurality of wiring layers of the multilayer wiring layer 811, and can be wired in a grid-like manner in plan view in the pixel array unit 20. Thereby, a propagation delay in the pixel array unit 20 can be reduced and the characteristic variation can be suppressed.

Note that FIGS. 77 and 78 are described as wiring examples of the VSS wires. However, the power supply lines can also be similarly wired.

The VSS wires 1411 and the power supply lines 1401 described in FIGS. 70, 71, 72, 73A, 73B, 74, 75, and 76 can be arranged like the VSS wires or the power supply lines illustrated in FIGS. 77 and 78 in the plurality of wiring layers of the multilayer wiring layer 811. The VSS wires 1411 and the power supply lines 1401 described in FIGS. 70, 71, 72, 73A, 73B, 74, 75, and 76 can be applied to any of the embodiments described in the present specification.

<First Method of Pupil Correction>

Next, a first method of pupil correction in the light-receiving element 1 will be described.

The light-receiving element 1 as a CAPD sensor can perform pupil correction of shifting the on-chip lens 62 or the inter-pixel light-shielding film 63 toward a plane center of the pixel array unit 20 according to a difference in an incident angle of a main light beam according to an in-plan position of the pixel array unit 20, similarly to an image sensor.

Figure 79:
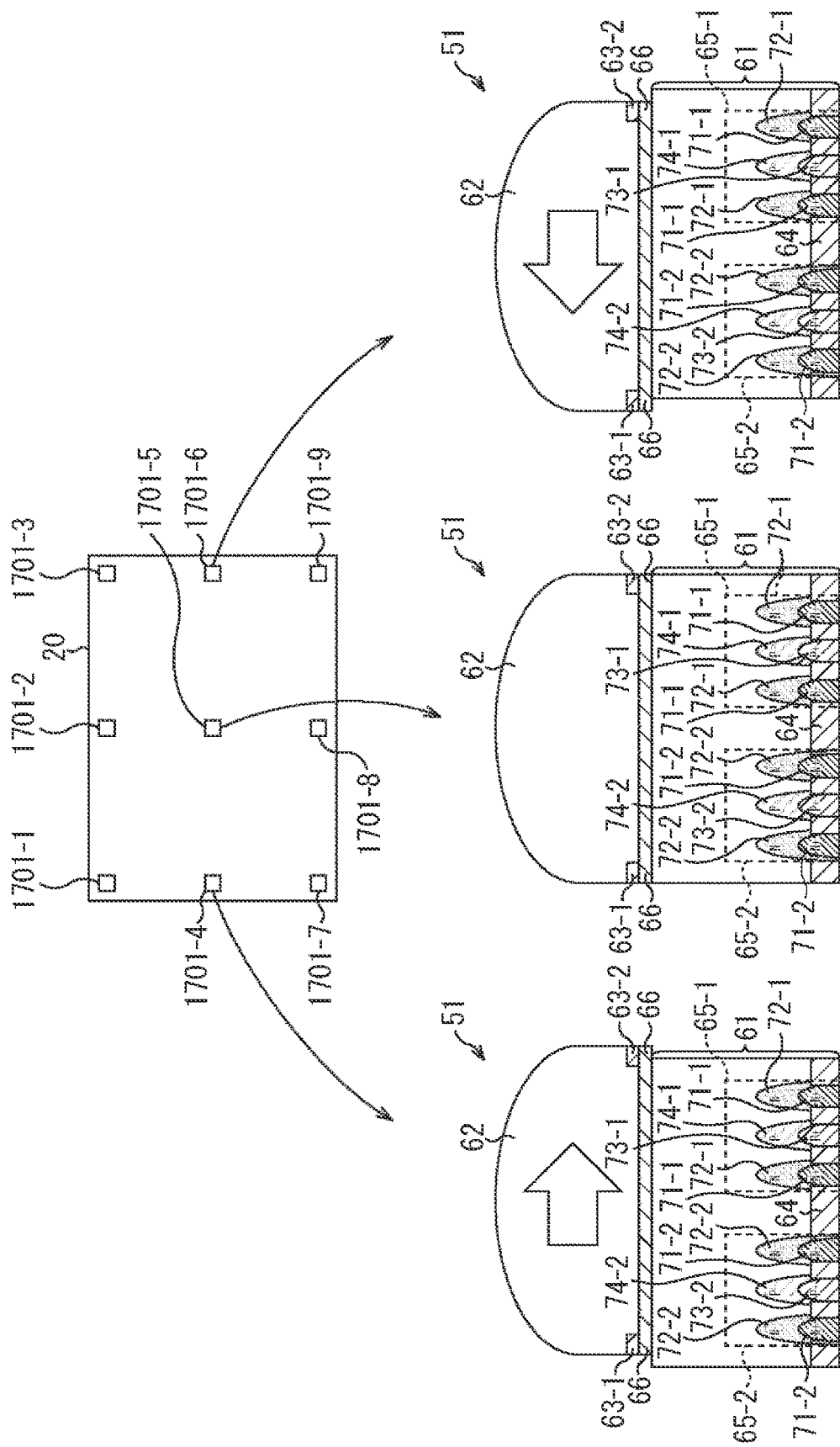
FIG. 79 is a view for describing a first method of pupil correction.

Specifically, as illustrated in FIG. 79, in the pixel 51 at a position 1701-5 in a central portion of the pixel array unit 20, the center of the on-chip lens 62 coincides with the center between the signal extraction portions 65-1 and 65-2 formed in the substrate 61, whereas in the pixels 51 at positions 1701-1 to 1701-4 and 1701-6 to 1701-9 in the peripheral portion of the pixel array unit 20, the center of the on-chip lens 62 is shifted toward a plane center side of the pixel array unit 20, of the respective positions 1701-1 to 1701-9 of the pixel array unit 20. The inter-pixel light-shielding films 63-1 and 63-2 are also shifted toward the plane center of the pixel array unit 20, similarly to the on-chip lens 62.

Figure 80:
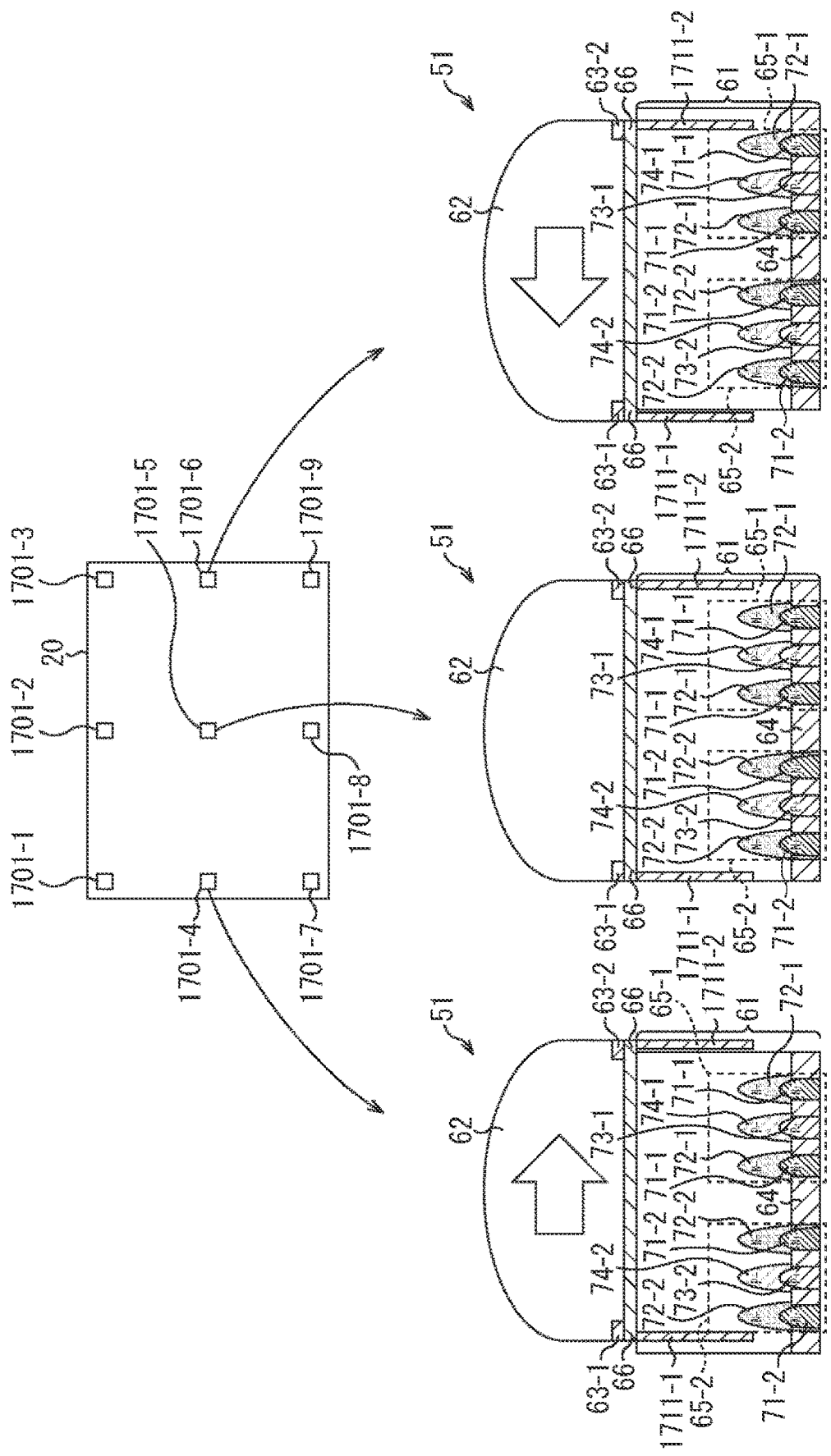
FIG. 80 is a view for describing the first method of pupil correction.

Furthermore, as illustrated in FIG. 80, in the pixel 51, in a case where DTIs 1711-1 and 1711-2 are formed in the pixel boundary portion, which are trenches (grooves) formed up to a predetermined depth in the substrate depth direction from the back surface side as the on-chip lens 62 side of the substrate 61, in order to prevent incident light from entering an adjacent pixel, the DTIs 1711-1 and 1711-2 are also shifted toward the plane center of the pixel array unit 20, in addition to the on-chip lens 62 and the inter-pixel light-shielding films 63-1 and 63-2, in the pixels 51 at the positions 1701-1 to 1701-4 and 1701-6 to 1701-9 in the peripheral portion of the pixel array unit 20.

Figure 81:
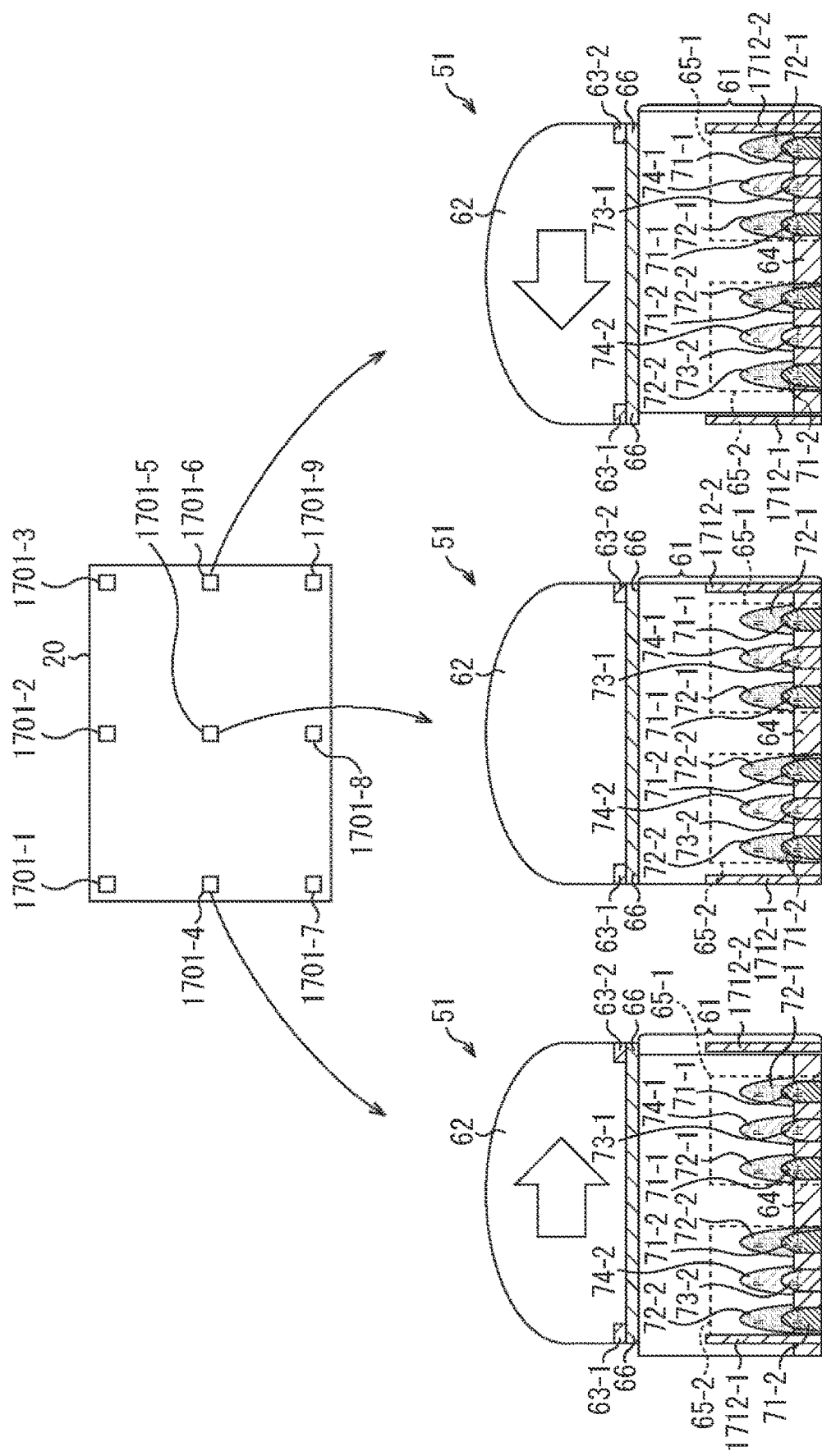
FIG. 81 is a view for describing the first method of pupil correction.

Alternatively, as illustrated in FIG. 81, in the pixel 51, in a case where DTIs 1712-1 and 1712-2 are formed in the pixel boundary portion, which are trenches (grooves) formed up to a predetermined depth in the substrate depth direction from the front surface side as the multilayer wiring layer 811 side of the substrate 61, in order to prevent incident light from entering an adjacent pixel, the DTIs 1712-1 and 1712-2 are also shifted toward the plane center of the pixel array unit 20, in addition to the on-chip lens 62 and the inter-pixel light-shielding films 63-1 and 63-2, in the pixels 51 at the positions 1701-1 to 1701-4 and 1701-6 to 1701-9 in the peripheral portion of the pixel array unit 20.

Note that, as a pixel separation portion for separating the substrate 61 of adjacent pixels to prevent the incident light from entering the adjacent pixel, a configuration providing a through separation portion that penetrates the substrate 61 to separate the adjacent pixels is also possible instead of the DTIs 1711-1, 1711-2, 1712-1, and 1712-2. Even in this case, the through separation portion is similarly shifted toward the plane center of the pixel array unit 20 in the pixels 51 at the positions 1701-1 to 1701-4 and 1701-6 to 1701-9 in the peripheral portion of the pixel array unit 20.

As illustrated in FIGS. 79 to 81, the main light beam can be caused to coincide with the center in each pixel by shifting the on-chip lens 62 toward the plane center of the pixel array unit 20 together with the inter-pixel light-shielding film 63 and the like. However, since the light-receiving element 1 as a CAPD sensor is modulated by providing a voltage between the two signal extraction portions 65 (taps) to cause a current to flow, an optimum incident position in each pixel is different. Therefore, an optimum pupil correction technique for distance measurement is required in the light-receiving element 1, unlike optical pupil correction performed in an image sensor.

The difference between the pupil correction performed by the light-receiving element 1 as a CAPD sensor and the pupil correction performed by an image sensor will be described with reference to FIGS. 82A, 82B, and 82C.

In FIGS. 82A, 82B, and 82C, 3×3 nine pixels 51 correspond to the pixels 51 at the positions 1701-1 to 1701-9 of the pixel array unit 20 in FIGS. 79 to 81.

Figure 82:
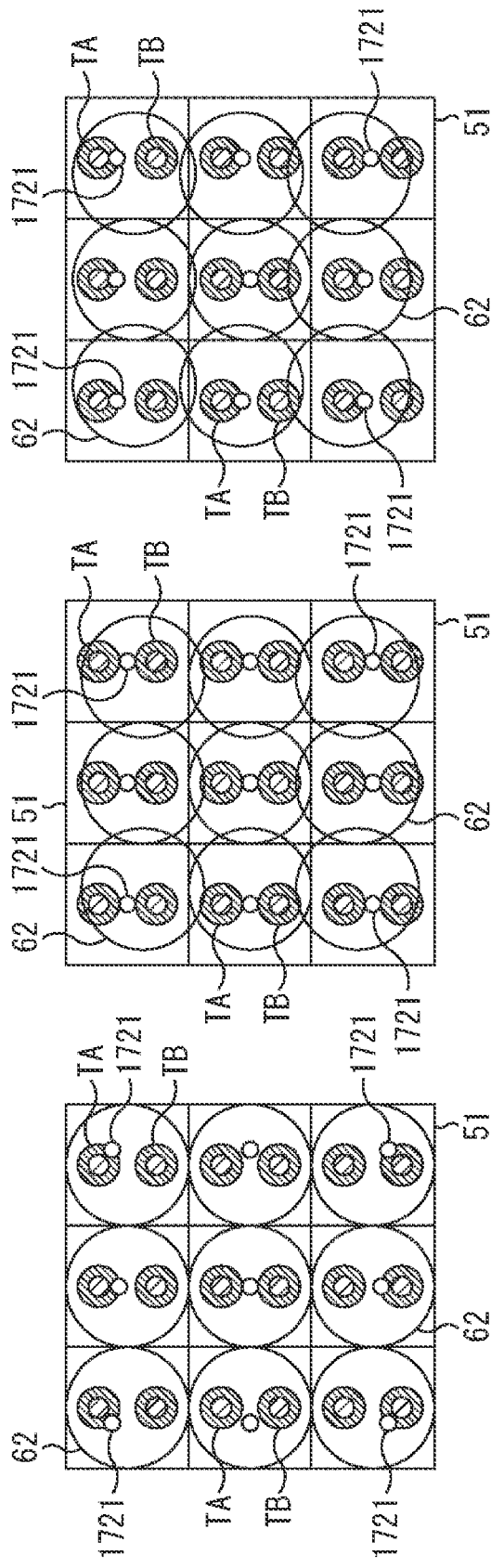
FIGS. 82A, 82B, and 82C are views for describing the first method of pupil correction.

FIG. 82A illustrates the position of the on-chip lens 62 in the case where no pupil correction is performed and a position 1721 of the main light beam on the substrate front surface side.

In the case where no pupil correction is performed, the on-chip lens 62 is arranged such that the center of the on-chip lens 62 coincides with the center of the two taps in the pixel, that is, the center of the first tap TA (signal extraction portion 65-1) and the second tap TB (signal extraction portion 65-2) in the pixel 51 at any of the positions 1701-1 to 1701-9 in the pixel array unit 20. In this case, the position 1721 of the main light beam on the substrate front surface side is different depending on the positions 1701-1 to 1701-9 in the pixel array unit 20, as illustrated in FIG. 82A.

In the pupil correction performed in an image sensor, the on-chip lens 62 is arranged such that the position 1721 of the main light beam coincides with the center of the first tap TA and the second tap TB in the pixel 51 at any of the positions 1701-1 to 1701-9 in the pixel array unit 20, as illustrated in FIG. 82B. More specifically, the on-chip lens 62 is arranged to be shifted toward the plane center of the pixel array unit 20, as illustrated in FIGS. 79 to 81.

In contrast, in the pupil correction performed in the light-receiving element 1, as illustrated in FIG. 82C, the on-chip lens 62 is shifted further toward the first tap TA side from the position of the on-chip lens 62 with which the position 1721 of the main light beam is located at the center position of the first tap TA and the second tap TB illustrated in FIG. 82B. The shift amount of the position 1721 of the main light beam between FIGS. 82B and 82C becomes larger as going toward the outer peripheral portion from the center position of the pixel array unit 20.

Figure 83:
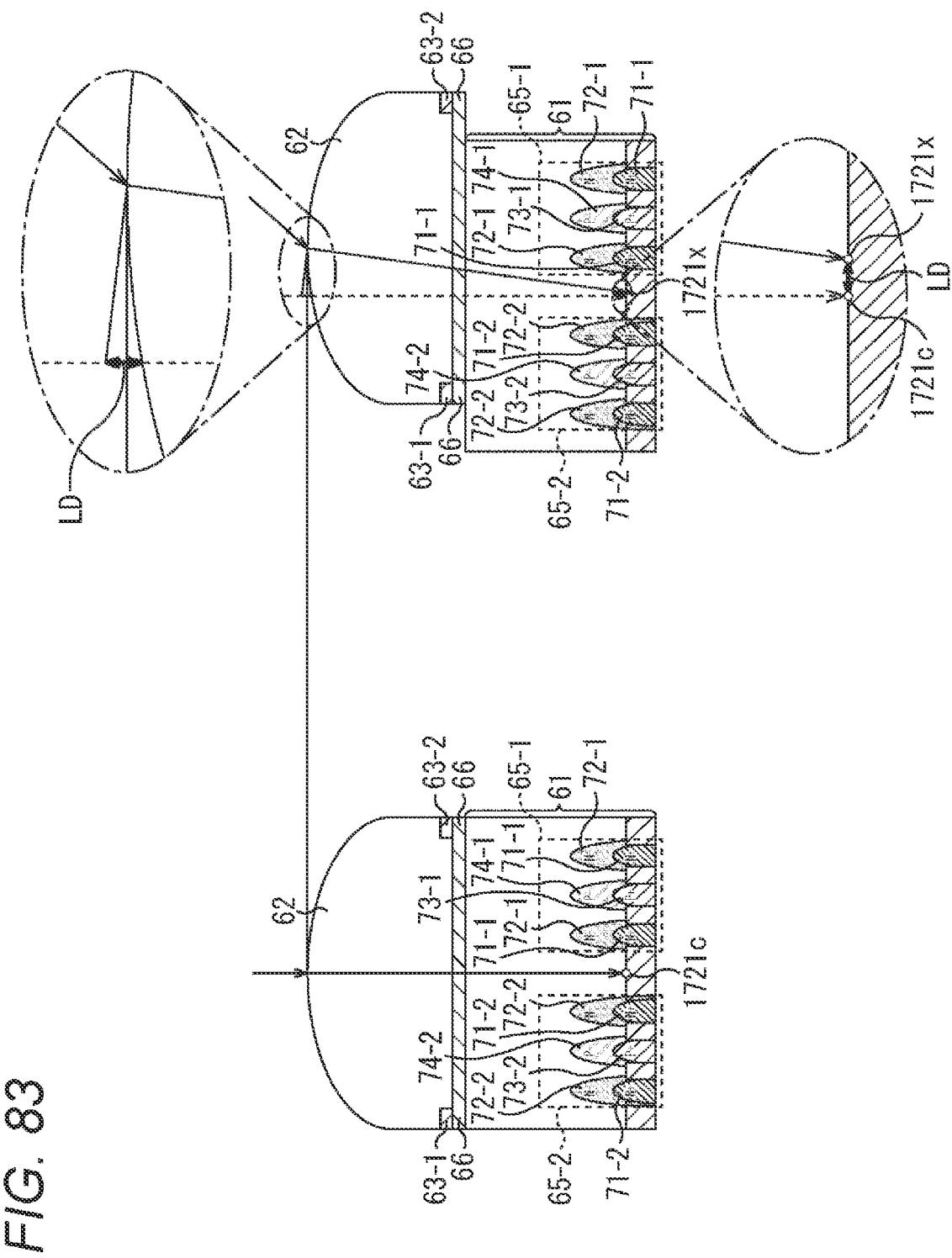
FIG. 83 is a diagram for describing a shift amount of an on-chip lens in the first method of pupil correction.

FIG. 83 is a diagram for describing the shift amount of the on-chip lens 62 when shifting the position 1721 of the main light beam toward the first tap TA side.

For example, a shift amount LD between a position $1721_c$ of the main light beam at the portion 1701-5 in the central portion of the pixel array unit 20 and a position $1721x$ of the main light beam at the position 1701-4 in the peripheral portion of the pixel array unit 20 is equal to an optical path difference LD for the pupil correction at the position 1701-4 in the peripheral portion of the pixel array unit 20.

In other words, the main light beam is shifted from the center position of the first tap TA (signal extraction portion 65-1) and the second tap TB (signal extraction portion 65-2) toward the first tap TA side such that an optical path length of the main light beam matches among the respective pixels in the pixel array unit 20.

Here, shifting the main light beam toward the first tap TA side is premised on adopting a method of setting light-receiving timing to 4Phase, and calculating a phase shift (Phase) corresponding to a delay time ΔT according to the distance to an object, using only an output value of the first tap TA.

Figure 84:
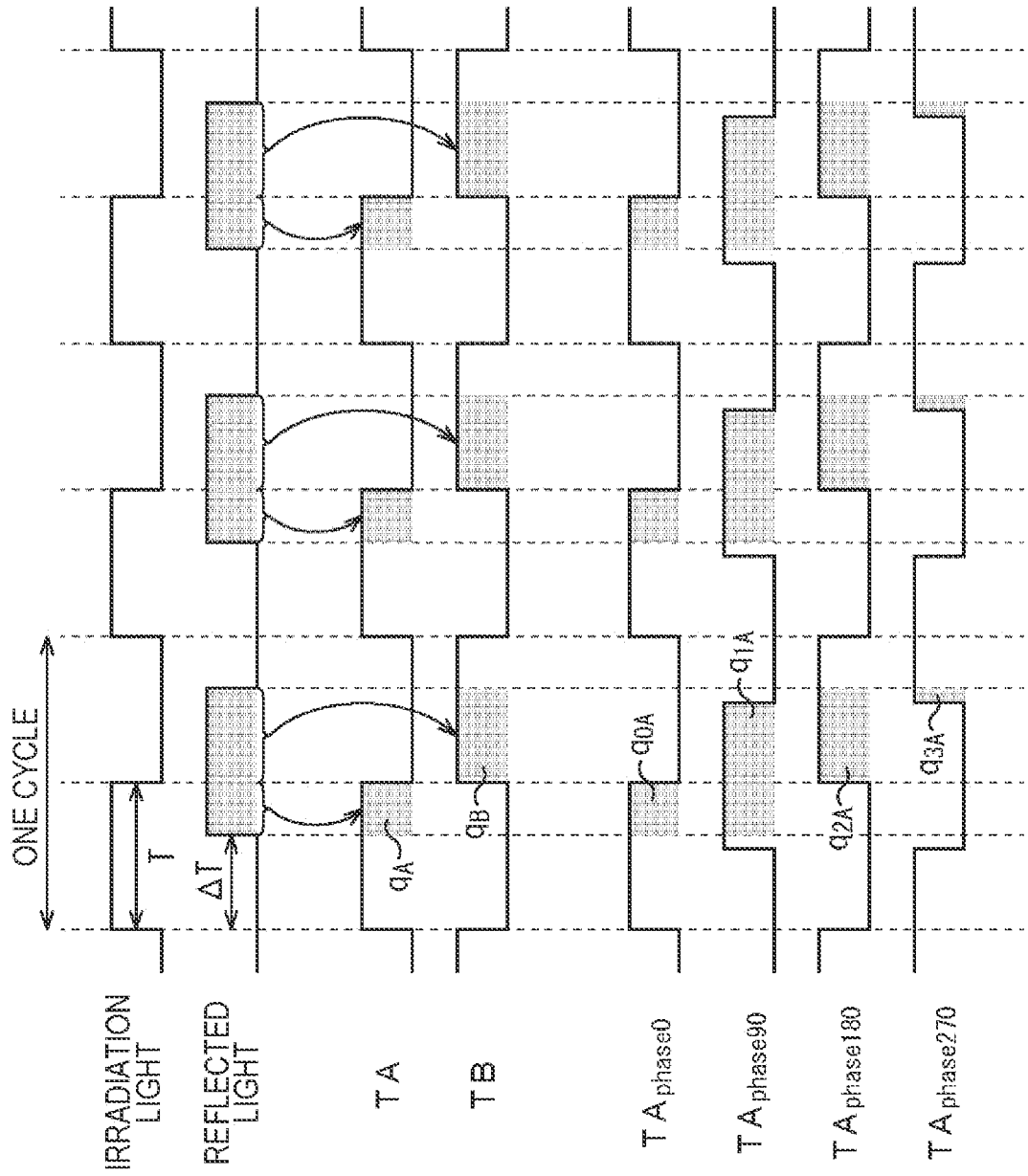
FIG. 84 is a diagram for describing a 2Phase method and a 4Phase method.

FIG. 84 illustrates a timing chart for describing a detection method by 2Phase (2Phase method) and a detection method by 4Phase (4Phase method) in a ToF sensor using an indirect ToF method.

Irradiation light modulated (one cycle=2T) to repeat on/off of irradiation at irradiation time T is output from a predetermined light source, and the light-receiving element 1 receives reflected light at timing delayed by the delay time ΔT according to the distance to the object.

In the 2Phase method, the light-receiving element 1 receives light at the first tap TA and the second tap TB at timings in which the phase is shifted by 180 degrees. A phase shift amount e corresponding to the delay time ΔT can be detected at a distribution ratio of a signal value $q_A$ received at the first tap TA and a signal value $q_B$ received at the second tap TB.

In contrast, in the 4Phase method, the light-receiving element 1 receives light at four timings of a phase same as the irradiation light (that is, Phase0), a phase shifted by 90 degrees (Phase90), a phase shifted by 180 degrees (Phase180), and a phase shifted by 270 degrees (Phase270). In this method, a signal value $TA_{phase180}$ detected at the phase shifted by 180 degrees becomes the same as the signal value $q_B$ received at the second tap TB in the 2Phase method. Therefore, by detecting the light by the 4Phase method, the phase shift amount e corresponding to the delay time ΔT can be detected by the signal value of only one of the first tap TA or the second tap TB. In the 4Phase method, the tap that detects the phase shift amount e is called phase shift detection tap.

Here, in the case where the first tap TA, of the first tap TA and the second tap TB, is the phase shift detection tap that detects the phase shift amount 0, the main light beam is shifted toward the first tap TA side such that the optical path length of the main light beam substantially matches among the respective pixels in the pixel array unit 20 in the pupil correction.

A phase shift amount OA detected at the first tap TA is calculated by the following expression (2), where the signal values detected at Phase0, Phase90, Phase180, and Phase270 at the first tap TA by the 4Phase method are $q_{0A}$, $q_{1A}$, $q_{2A}$, and $q_{3A}$, respectively.

[Math. 1]

$$\theta_A = \tan^{-1}\frac{q_{1A} - q_{3A}}{q_{0A} - q_{2A}} \qquad (2)$$

Furthermore, $Cmod_A$ in the 4Phase method in the case of detecting the light at the first tap TA is calculated by the following expression (3).

[Math. 2]

$$Cmod_A = \text{Max}\left(\frac{q_{0A} - q_{2A}}{q_{0A} + q_{2A}}, \frac{q_{1A} - q_{3A}}{q_{1A} + q_{3A}}\right) \qquad (3)$$

As illustrated in the expression (3), $Cmod_A$ in the 4Phase method is $(q_{0A}-q_{2A})/(q_{0A}+q_{2A})$ or $(q_{1A}-q_{3A})/(q_{1A}+q_{3A})$, whichever is larger.

As described above, the light-receiving element 1 changes the positions of the on-chip lens 62 and the inter-pixel light-shielding film 63, and performs the pupil correction such that the optical path length of the main light beam becomes substantially the same among the respective pixels in the plane of the pixel array unit 20. In other words, the light-receiving element 1 performs the pupil correction such that the phase shift amount OA at the first tap TA that is the phase shift detection tap becomes substantially the same among the respective pixels in the plane of the pixel array unit 20. As a result, in-plane dependence of the chip can be eliminated, and the distance measurement accuracy can be improved. Here, the above-described substantially match or substantially the same means exactly match or exactly the same, or being equal within a predetermined range that can be regarded as the same. The first method of pupil correction can be applied to any of the embodiments described in the present specification.

<Second Method of Pupil Correction>

Next, a second method of pupil correction in the light-receiving element 1 will be described.

The above-described first method of pupil correction is favorable in a case where it is determined to use the signal of the first tap TA, of the first tap TA and the second tap TB, to calculate the phase shift (Phase). However, there are some cases where it may not be possible to determine which of the taps is used. In such a case, the pupil correction can be performed by the following second method.

In the second method of pupil correction, the positions of the on-chip lens 62 and the inter-pixel light-shielding film 63 are shifted toward the plane center side such that DC contrast $DC_A$ of the first tap TA and DC contrast $DC_B$ of the second tap TB become substantially the same among the respective pixels in the pixel array unit 20. In the case where there is the DTI 1711 formed in the substrate 61 from the on-chip lens 62 side or the DTI 1712 formed from the front surface side, the position of the DTI is shifted similarly to the first method.

The DC contrast $DC_A$ of the first tap TA and the DC contrast $DC_B$ of the second tap TB are calculated by the following expressions (4) and (5).

[Math. 3]

$$DC_A = \frac{A_H - B_L}{A_H + B_L} \qquad (4)$$

$$DC_B = \frac{B_H - A_L}{B_H + A_L} \qquad (5)$$

In the expression (4), $A_H$ represents the signal value detected by the first tap TA of a case where the light-receiving element 1 is directly irradiated with continuous light that is continuously emitted without interruption, and to which a positive voltage is applied, and $B_L$ represents the signal value detected by the second tap TB to which 0 or negative voltage is applied. In the expression (5), $B_H$ represents the signal value detected by the second tap TB of a case where the light-receiving element 1 is directly irradiated with continuous light that is continuously emitted without interruption, and to which a positive voltage is applied, and $A_L$ represents the signal value detected by the first tap TA to which 0 or negative voltage is applied.

It is desirable that the DC contrast $DC_A$ of the first tap TA and the DC contrast $DC_B$ of the second tap TB are equal, and the DC contrast $DC_A$ of the first tap TA and the DC contrast $DC_B$ of the second tap TB substantially match at any of the positions in the plane of the pixel array unit 20. However, in the case where the DC contrast $DC_A$ of the first tap TA and the DC contrast $DC_B$ of the second tap TB are different depending on the position in the plane of the pixel array unit 20, the positions of the on-chip lens 62, the inter-pixel light-shielding film 63, and the like are arranged to be shifted toward the plane center side such that a shift amount of the DC contrast $DC_A$ of the first tap TA between the central portion and the outer peripheral portion of the pixel array unit 20, and a shift amount of the DC contrast $DC_B$ of the second tap TB between the central portion and the outer peripheral portion of the pixel array unit 20 substantially match.

As described above, the light-receiving element 1 changes the positions of the on-chip lens 62 and the inter-pixel light-shielding film 63, and performs the pupil correction such that the DC contrast $DC_A$ of the first tap TA and the DC contrast $DC_B$ of the second tap TB substantially match among the respective pixels in the plane of the pixel array unit 20. As a result, in-plane dependence of the chip can be eliminated, and the distance measurement accuracy can be improved. Here, the above-described substantially match or substantially the same means exactly match or exactly the same, or being equal within a predetermined range that can be regarded as the same. The second method of pupil correction can be applied to any of the embodiments described in the present specification.

Note that the light-receiving timings of the first tap TA and the second tap TB illustrated in FIG. 84 are controlled by the voltage MIX0 and the voltage MIX1 supply from the tap drive unit 21 via the voltage supply line 30. Since the voltage supply line 30 is commonly wired to one pixel column in the vertical direction of the pixel array unit 20, a delay due to an RC component occurs as the distance from the tap drive unit 21 becomes longer.

Figure 85:
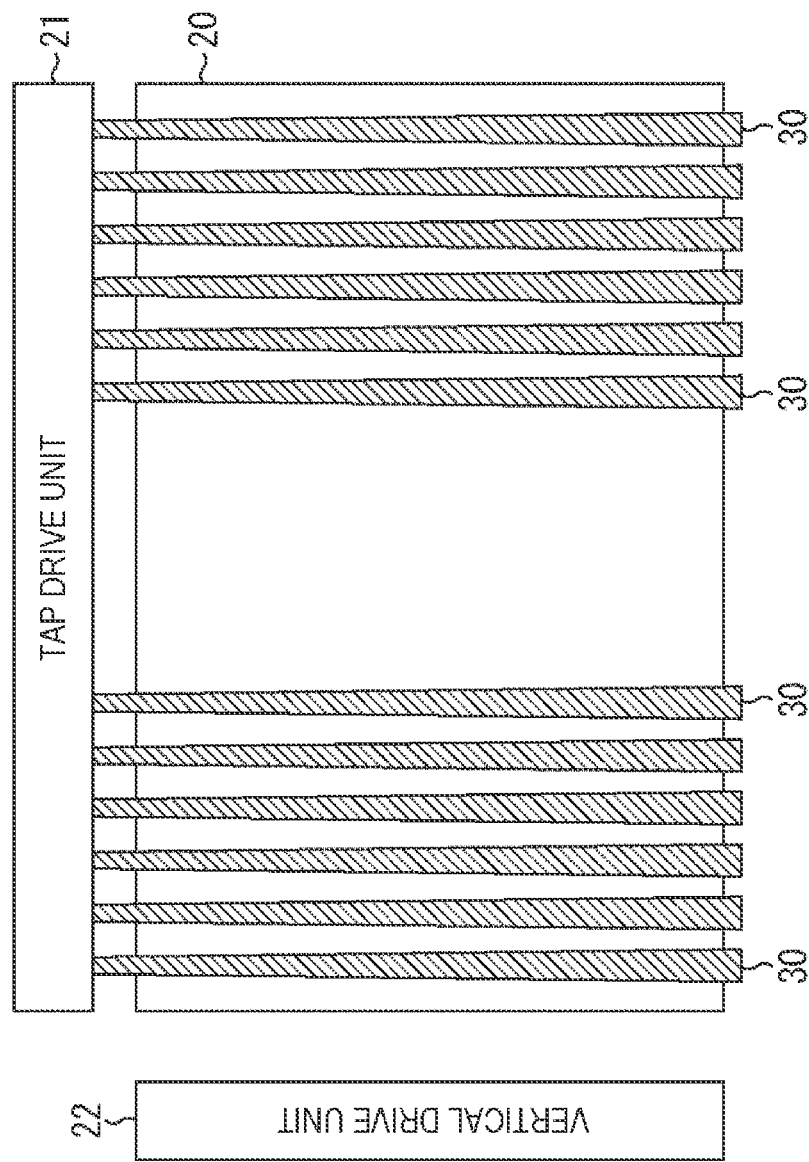
FIG. 85 is a diagram for describing a wiring example of voltage supply lines.

Therefore, as illustrated in FIG. 85, the resistance and capacitance of the voltage supply line 30 are changed according to the distance from the tap drive unit 21 to make the drive capability of the respective pixels 51 to be substantially uniform, so that the correction can be performed such that the phase shift (Phase) or the DC contrast DC becomes substantially uniform in the plane of the pixel array unit 20. Specifically, the voltage supply line 30 is arranged such that the line width becomes wider according to the distance from the tap drive unit 21.

Twentieth Embodiment

In the following twentieth to twenty-second embodiments, configuration examples of a light-receiving element 1 capable of acquiring auxiliary information other than distance measurement information, which is obtained from a distribution ratio of signals of a first tap TA and a second tap TB will be described.

First, a configuration example of the light-receiving element 1 capable of acquiring phase difference information as auxiliary information other than distance measurement information, which is obtained from a distribution ration of signals of the first tap TA and the second tap TB will be described.

First Configuration Example of Twentieth Embodiment

Figure 86A:
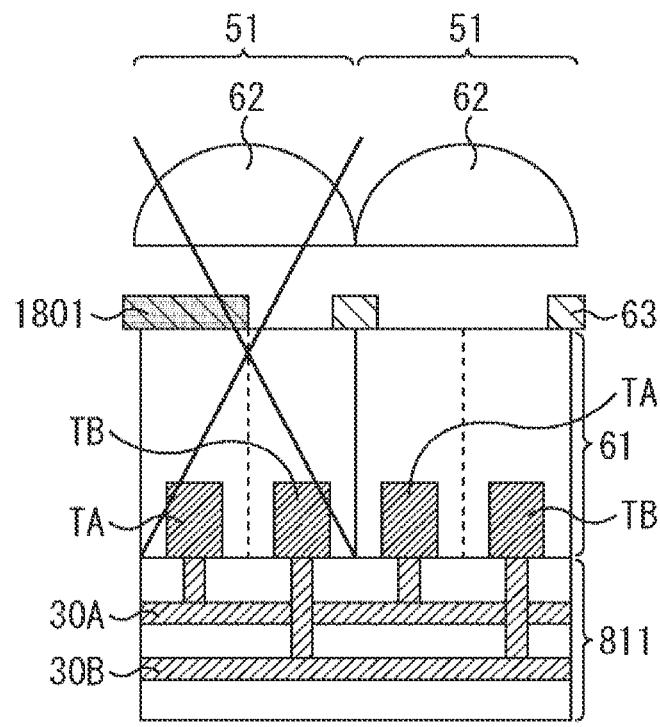
FIGS. 86A, 86B, and 86C are cross-sectional views and a plan view of a pixel according to a first configuration example of a twentieth embodiment.
Figure 86B:
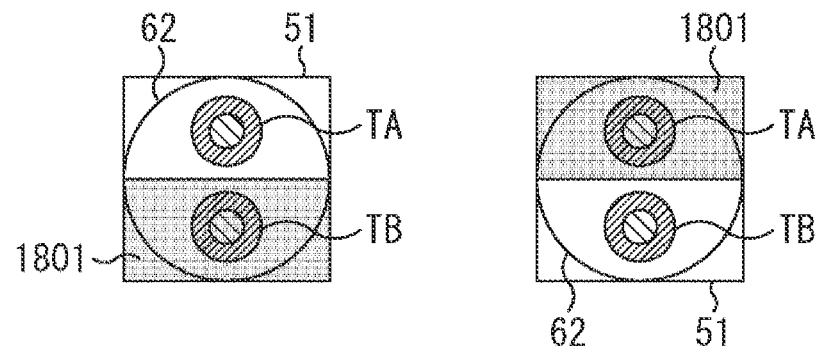
Figure 86C:
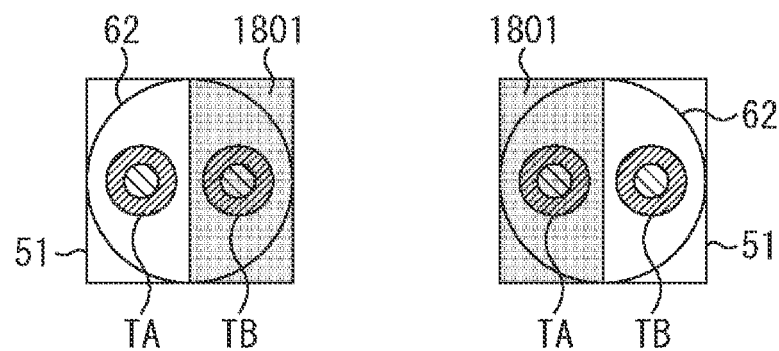

FIG. 86A is a cross-sectional view of pixels according to a first configuration example of the twentieth embodiment, and FIGS. 86B and 86C are plan views of the pixels according to the first configuration example of the twentieth embodiment.

In the cross-sectional view FIG. 86A, a portion corresponding to the above-described other embodiments is denoted by the same reference numeral, and description thereof is omitted as appropriate.

In FIGS. 86A, 86B, and 86C, some pixel 51 is newly provided with a phase difference light-shielding film 1801 for phase difference detection on an upper surface of a substrate 61 on an on-chip lens 62 side. The phase difference light-shielding film 1801 shields light of one-side half of a pixel region on either the first tap TA side or the second tap TB side, as illustrated in FIGS. 86B and 86C, for example. FIG. 86B is an example of a pixel 51 in which the first tap TA and the second tap TB are arrayed in an up-down direction (vertical direction), and FIG. 86C is an example of a pixel 51 in which the first tap TA and the second tap TB are arrayed in a right-left direction (horizontal direction).

The pixels 51 according to the first configuration example of the twentieth embodiment can be arrayed in any of arrangements FIGS. 87A, 87B, 87C, 87D, 87E, and 87F in a pixel array unit 20.

Figure 87A:
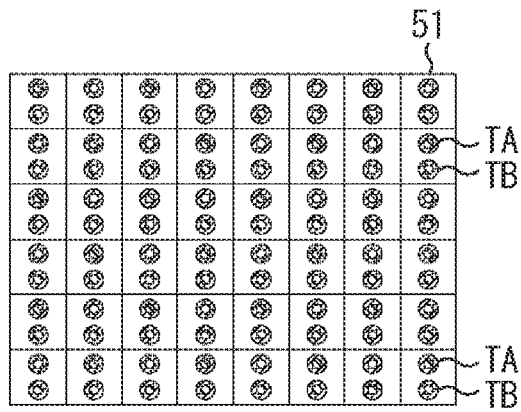
FIGS. 87A, 87B, 87C, 87D, 87E, and 87F are views illustrating arrangement examples of first and second taps.

FIG. 87A illustrates an array example of pixels 51, in which the pixels 51 each having the first tap TA and the second tap TB arranged in the up-down direction are arrayed in a matrix.

Figure 87B:
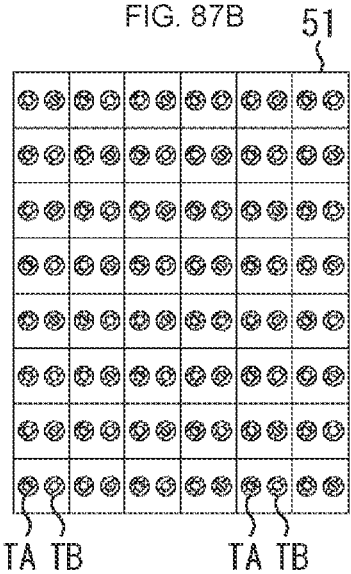

FIG. 87B illustrates an array example of pixels 51, in which the pixels 51 each having the first tap TA and the second tap TB arranged in the right-left direction are arrayed in a matrix.

Figure 87C:
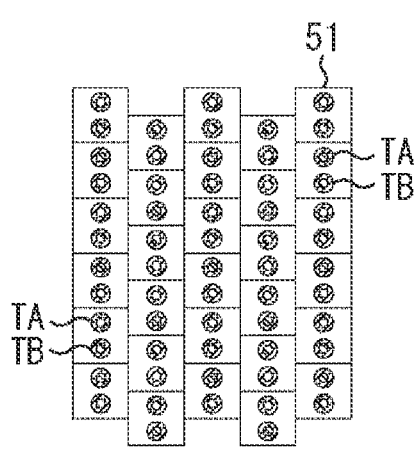

FIG. 87C illustrates an array example of pixels 51 in which the pixels 51 having the first tap TA and the second tap TB arranged in the up-down direction are arrayed in a matrix, and pixel positions are shifted by half pixel in the up-down direction between adjacent columns.

Figure 87D:
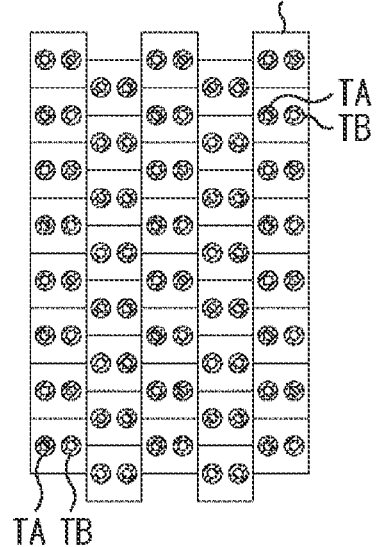

FIG. 87D illustrates an array example of pixels 51 in which the pixels 51 having the first tap TA and the second tap TB arranged in the right-left direction are arrayed in a matrix, and pixel positions are shifted by half pixel in the up-down direction between adjacent columns.

Figure 87E:
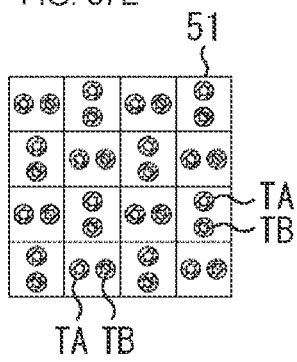
Figure 87F:
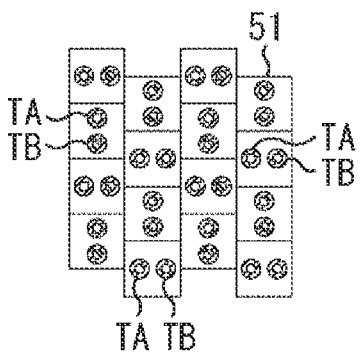

FIG. 87E illustrates an array example of pixels 51 in which a pixel 51 having the first tap TA and the second tap TB arranged in the up-down direction and a pixel 51 having the first tap TA and the second tap TB arranged in the right-let direction are alternately arrayed in a row direction and in a column direction.

FIG. 87E illustrates an array example of pixels 51 in which a pixel 51 having the first tap TA and the second tap TB arranged in the up-down direction and a pixel 51 having the first tap TA and the second tap TB arranged in the right-let direction are alternately arrayed in a row direction and in a column direction, and pixel positions are shifted by half pixel in the up-down direction between adjacent columns.

The pixels 51 in FIGS. 86A, 86B, and 86C are arrayed in any of arrangements FIGS. 87A, 87B, 87C, 87D, 87E, and 87F, and in the pixel array unit 20, the pixel 51 in which one-side half of the first tap TA is shielded, and the pixel 51 in which one-side half of the second tap TB is shielded are arranged at nearby positions, as in FIG. 86B or 86C. Furthermore, a plurality of sets of the pixel 51 in which one-side half of the first tap TA is shielded and the pixel 51 in which one-side half of the second tap TB is shielded is arranged in the pixel array unit 20 in a scattered manner.

The first configuration example according to the twentieth embodiment is configured similarly to the first embodiment illustrated in FIG. 2 or the fourteenth or fifteenth embodiment described in FIG. 36 except that some pixel 51 is provided with the phase difference light-shielding film 1801. In FIGS. 86A, 86B, and 86C, other configurations are illustrated in a simplified manner.

When briefly describing a configuration other than the phase difference light-shielding film 1801 in FIGS. 86A, 86B, and 86C, the pixel 51 includes a substrate 61 including a P-type semiconductor layer and an on-chip lens 62 formed on the substrate 61. An inter-pixel light-shielding film 63 and the phase difference light-shielding film 1801 are formed between the on-chip lens 62 and the substrate 61. In the pixel 51 in which the phase difference light-shielding film 1801 is formed, the inter-pixel light-shielding film 63 adjacent to the phase difference light-shielding film 1801 is continuously (integrally) formed with the phase difference light-shielding film 1801. A fixed charge film 66 illustrated in FIG. 2 is also formed on a lower surface of the inter-pixel light-shielding film 63 and the phase difference light-shielding film 1801 although illustration is omitted.

The first tap TA and the second tap TB are formed on a surface of the substrate 61, the surface being opposite to a light incident surface side where the on-chip lens 62 is formed. The first tap TA corresponds to the above-described signal extraction portion 65-1, and the second tap TB corresponds to the signal extraction portion 65-2. A predetermined voltage MIX0 is supplied from a tap drive unit 21 (FIG. 1) to the first tap TA via a voltage supply line 30A formed in a multilayer wiring layer 811, and a predetermined voltage MIX1 is supplied to the second tap TB via a voltage supply line 30B.

FIG. 88 illustrates a table summarizing driving modes when the tap drive unit 21 drives the first tap TA and the second tap TB in the first configuration example of the twentieth embodiment.

The pixel 51 including the phase difference light-shielding film 1801 can detect a phase difference by five types of driving methods including mode 1 to mode 5 illustrated in FIG. 88.

Mode 1 is the same drive as another pixel 51 not including the phase difference light-shielding film 1801. In mode 1, the tap drive unit 21 applies a positive voltage (for example, 1.5 V) to the first tap TA to be an active tap and applies 0 V voltage to the second tap TB to be an inactive tap during a predetermined light-receiving period. In the next light-receiving period, the tap drive unit 21 applies a positive voltage (for example, 1.5 V) to the second tap TB to be an active tap and applies 0 V voltage to the first tap TA to be an inactive tap. 0 V (VSS potential) is applied to pixel transistors Tr (FIG. 37) such as a transfer transistor 721 and a reset transistor 723 formed in a pixel boundary region of the multilayer wiring layer 811 with the substrate 61.

In mode 1, the phase difference can be detected from a signal obtained when the second tap TB is the active tap in the pixel 51 in which one-side half of the first tap TA is shielded, and a signal obtained when the first tap TA is the active tap in the pixel 51 in which one-side half of the second tap TB is shielded.

In mode 2, the tap drive unit 21 applies a positive voltage (for example, 1.5 V) to both the first tap TA and the second tap TB. 0 V (VSS potential) is applied to the pixel transistors Tr formed in the pixel boundary region of the multilayer wiring layer 811 with the substrate 61.

In mode 2, since the signals can be evenly detected by both the first tap TA and the second tap TB, the phase difference can be detected from the signal of the pixel 51 in which one-side half of the first tap TA is shielded and the signal of the pixel 51 in which one-side half of the second tap TB is shielded.

Mode 3 is drive of weighting applied voltages of the first tap TA and the second tap TB according to an image height in the pixel array unit 20 in the drive in mode 2. More specifically, a difference in potential applied to the first tap TA and the second tap TB is provided as the image height (distance from an optical center) in the pixel array unit 20 becomes larger. Moreover, the applied voltage on the tap side inside (central portion side) of the pixel array unit 20 becomes larger as the image height in the pixel array unit 20 becomes larger. Thereby, the pupil correction can be performed according to the potential difference between voltages to be applied to the taps.

Mode 4 is a mode of applying a negative bias (for example, −1.5 V), instead of 0 V (VSS potential), to the pixel transistors Tr formed in the pixel boundary region with the substrate 61 in the drive in mode 2. By applying the negative bias to the pixel transistors Tr formed in the pixel boundary region, an electric field from the pixel transistors Tr to the first tap TA and the second tap TB can be strengthened, and electrons as a signal charge can be easily drawn into the taps.

Mode 5 is a mode of applying a negative bias (for example, −1.5 V), instead of 0 V (VSS potential), to the pixel transistors Tr formed in the pixel boundary region with the substrate 61 in the drive in mode 3. Thereby, an electric field from the pixel transistors Tr to the first tap TA and the second tap TB can be strengthened, and electrons as a signal charge can be easily drawn into the taps.

In any of the five types of driving method of mode 1 to mode 5, the phase difference (image shift) occurs between the read signals of the pixel 51 in which one-side half of the first tap TA is shielded and the pixel 51 in which one-side half of the second tap TB is shielded according to the difference in the shielded region. Therefore, the phase difference can be detected.

According to the first configuration example of the twentieth embodiment configured as described above, in the light-receiving element 1, some pixels 51 of the pixel array unit 20 in which a plurality of pixels 51 each including the first tap TA and the second tap TB is arrayed include the pixel 51 in which one-side half of the first tap TA is shielded by the phase difference light-shielding film 1801, and the pixel 51 in which one-side half of the second tap TB is shielded by the phase difference light-shielding film 1801. Thereby, the phase difference information can be acquired as the auxiliary information other than distance measurement information, which is obtained from a distribution ratio of signals of the first tap TA and the second tap TB. A focal position is determined according to the detected phase difference information, and accuracy in the depth direction can be improved.

Second Configuration Example of Twentieth Embodiment

Figure 89:
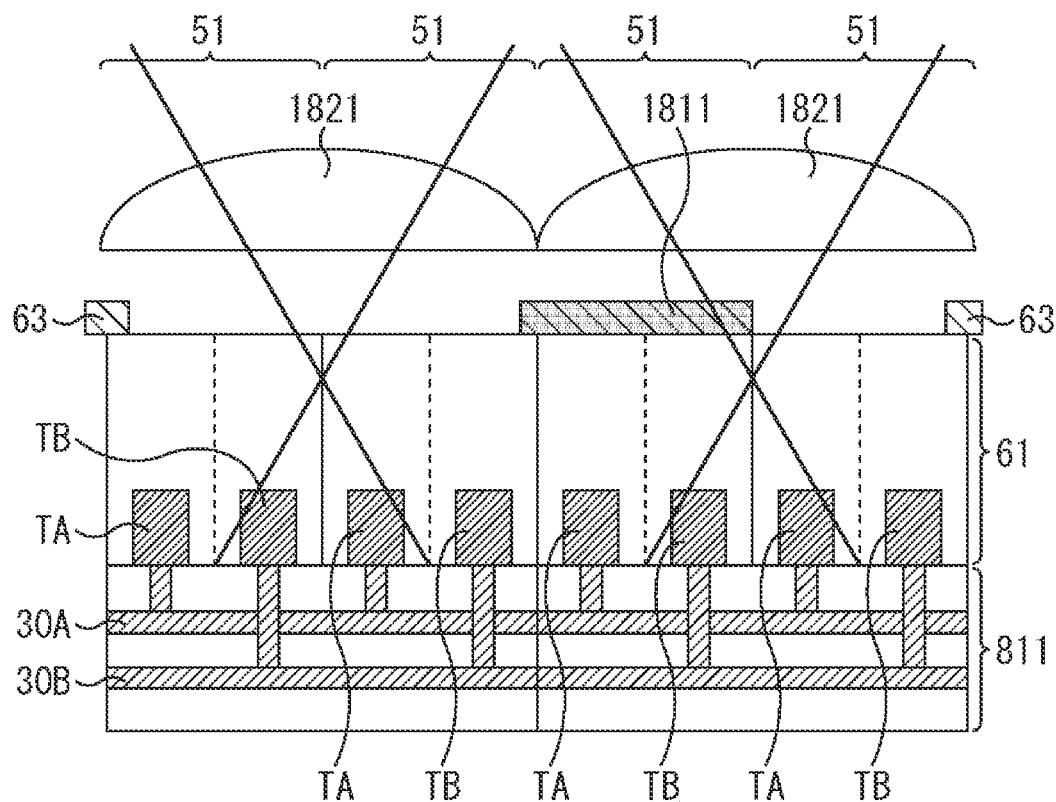
FIG. 89 is a cross-sectional view and a plan view of a pixel according to a second configuration example of the twentieth embodiment.

FIG. 89 illustrates a cross-sectional view of pixels according to a second configuration example of the twentieth embodiment.

In the cross-sectional view in FIG. 89, a portion corresponding to the first configuration example of the twentieth embodiment is denoted by the same reference numeral, and description thereof is omitted as appropriate.

In the first configuration example illustrated in FIGS. 86A, 86B, and 86C, the on-chip lens 62 is formed on a pixel basis, whereas in the second configuration example in FIG. 89, one on-chip lens 1821 is formed for a plurality of pixels 51. Some pixel 51 is newly provided with a phase difference light-shielding film 1811 for phase difference detection on an upper surface of the substrate 61 on the on-chip lens 1821 side. The phase difference light-shielding film 1811 is formed in a predetermined pixel 51 among a plurality of pixels 51 sharing the same on-chip lens 1821. An inter-pixel light-shielding film 63 adjacent to the phase difference light-shielding film 1811 is similar to the first configuration example in being continuously (integrally) formed with the phase difference light-shielding film 1811.

FIGS. 90A, 90B, 90C, 90D, 90E, and 90F are plan views illustrating arrangement of the phase difference light-shielding film 1811 and the on-chip lens 1821, which can be adopted in the second configuration example of the twentieth embodiment.

Figure 90A:
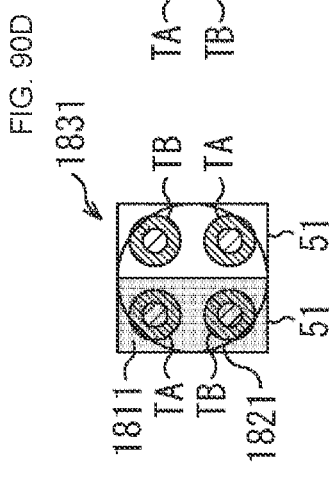
FIGS. 90A, 90B, 90C, 90D, 90E, and 90F are views illustrating arrangement examples of a phase difference light-shielding film and an on-chip lens.

FIG. 90A illustrates a first arrangement example of the phase difference light-shielding film 1811 and the on-chip lens 1821.

A pixel set 1831 illustrated in FIG. 90A includes two pixels 51 arrayed in the up-down direction (vertical direction), and one on-chip lens 1821 is arranged for the two pixels 51 arrayed in the up-down direction. Furthermore, arrangements of the first tap TA and the second tap TB of the two pixels 51 sharing the one on-chip lens 1821 are the same. Then, a phase difference is detected using two pixels 51 in which the phase difference light-shielding film 1811 is not formed, of two pixel sets 1831 having symmetrical formation positions of the phase difference light-shielding film 1811.

Figure 90B:
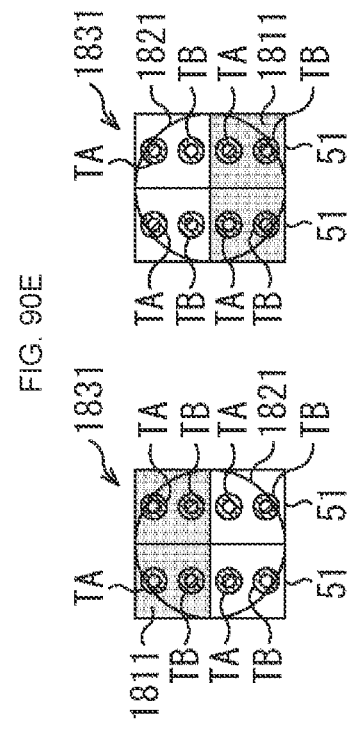

FIG. 90B illustrates a second arrangement example of the phase difference light-shielding film 1811 and the on-chip lens 1821.

A pixel set 1831 illustrated in FIG. 90A includes two pixels 51 arrayed in the up-down direction (vertical direction), and one on-chip lens 1821 is arranged for the two pixels 51 arrayed in the up-down direction. Furthermore, arrangements of the first tap TA and the second tap TB of the two pixels 51 sharing the one on-chip lens 1821 are opposite. Then, a phase difference is detected using two pixels 51 in which the phase difference light-shielding film 1811 is not formed, of two pixel sets 1831 having symmetrical formation positions of the phase difference light-shielding film 1811.

Figure 90C:
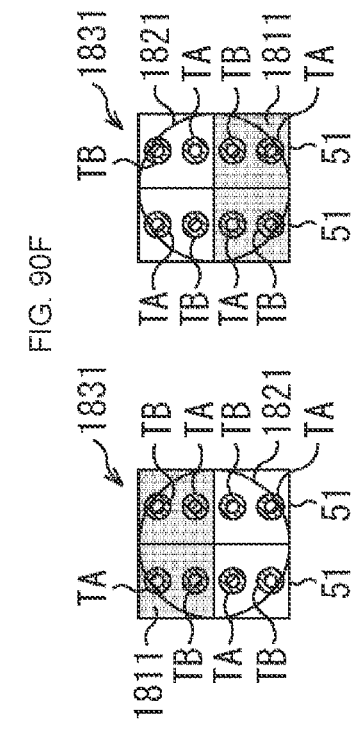

FIG. 90C illustrates a third arrangement example of the phase difference light-shielding film 1811 and the on-chip lens 1821.

A pixel set 1831 illustrated in FIG. 90C includes two pixels 51 arrayed in the right-left direction (horizontal direction), and one on-chip lens 1821 is arranged for the two pixels 51 arrayed in the right-left direction. Furthermore, arrangements of the first tap TA and the second tap TB of the two pixels 51 sharing the one on-chip lens 1821 are the same. Then, a phase difference is detected using two pixels 51 in which the phase difference light-shielding film 1811 is not formed, of two pixel sets 1831 having symmetrical formation positions of the phase difference light-shielding film 1811.

Figure 90D:
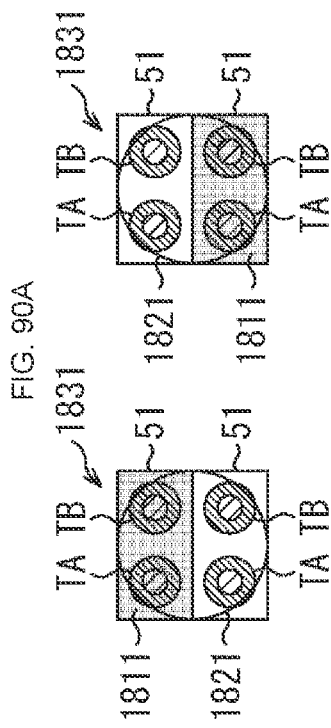

FIG. 90D illustrates a fourth arrangement example of the phase difference light-shielding film 1811 and the on-chip lens 1821.

A pixel set 1831 illustrated in FIG. 90D includes two pixels 51 arrayed in the right-left direction (horizontal direction), and one on-chip lens 1821 is arranged for the two pixels 51 arrayed in the right-left direction. Furthermore, arrangements of the first tap TA and the second tap TB of the two pixels 51 sharing the one on-chip lens 1821 are opposite. Then, a phase difference is detected using two pixels 51 in which the phase difference light-shielding film 1811 is not formed, of two pixel sets 1831 having symmetrical formation positions of the phase difference light-shielding film 1811.

Figure 90E:
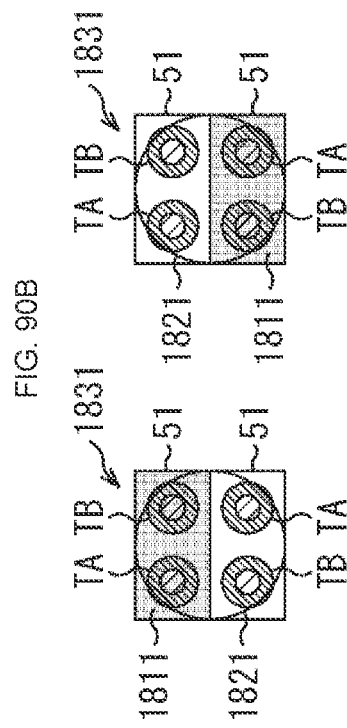
Figure 90F:
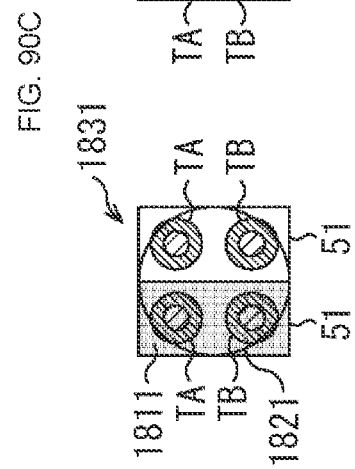

FIG. 90E illustrates a fifth arrangement example of the phase difference light-shielding film 1811 and the on-chip lens 1821.

A pixel set 1831 illustrated in FIG. 90E includes four pixels 51 arrayed in 2×2, and one on-chip lens 1821 is arranged for the four pixels 51. Furthermore, arrangements of the first tap TA and the second tap TB of the four pixels 51 sharing the one on-chip lens 1821 are the same. Then, a phase difference is detected using four pixels 51 in which the phase difference light-shielding film 1811 is not formed, of two pixel sets 1831 having symmetrical formation positions of the phase difference light-shielding film 1811.

FIG. 90E illustrates a sixth arrangement example of the phase difference light-shielding film 1811 and the on-chip lens 1821.

A pixel set 1831 illustrated in FIG. 90E includes four pixels 51 arrayed in 2×2, and one on-chip lens 1821 is arranged for the four pixels 51. Furthermore, arrangements of the first tap TA and the second tap TB of the four pixels 51 sharing the one on-chip lens 1821 are opposite between the right and left pixels. Then, a phase difference is detected using four pixels 51 in which the phase difference light-shielding film 1811 is not formed, of two pixel sets 1831 having symmetrical formation positions of the phase difference light-shielding film 1811.

As described above, arrangements in the case of forming one on-chip lens 1821 for a plurality of pixels 51 includes the arrangement of forming one on-chip lens 1821 for two pixels, and the arrangement of forming one on-chip lens 1821 for four pixels, and both can be adopted. The phase difference light-shielding film 1811 shields a plurality of pixels that is one-side half under one on-chip lens 1821.

As the driving mode in the second configuration example, the five types of driving methods of mode 1 to mode 5 described with reference to FIG. 88 are available.

Therefore, according to the second configuration example of the twentieth embodiment, in the light-receiving element 1, some pixels 51 of the pixel array unit 20 in which a plurality of pixels 51 each provided with the first tap TA and the second tap TB is arrayed include two pixel sets 1831 having symmetrical formation positions of the phase difference light-shielding film 1811. Thereby, the phase difference information can be acquired as the auxiliary information other than distance measurement information, which is obtained from a distribution ratio of signals of the first tap TA and the second tap TB. A focal position is determined according to the detected phase difference information, and accuracy in the depth direction can be improved.

Note that as the plurality of pixels 51 constituting the pixel array unit 20, the pixel 51 of the first configuration example in the twentieth embodiment and the pixel 51 of the second configuration example of the twentieth embodiment may be mixed.

<Modification without Phase Difference Light-Shielding Film>

In the first configuration example and the second configuration example of the twentieth embodiment, the configuration in which the phase difference light-shielding film 1801 or 1811 is formed between the on-chip lens 62 and the substrate 61 has been described.

However, even the pixel 51 not including the phase difference light-shielding film 1801 or 1811 can acquire the phase difference information by using the driving methods of mode 2 to mode 5 of applying the positive voltage to both the first tap TA and the second tap TB at the same time, of the five types of driving methods of mode 1 to mode 5. For example, the phase difference information can be acquired by driving one-side half pixels 51 in mode 2 to mode 5, of the plurality of pixels under one on-chip lens 1821. The phase difference information can be acquired by driving even the configuration in which one on-chip lens 62 is arranged for one pixel in mode 2 to mode 5.

Therefore, the phase difference information may be acquired by driving the pixel 51 not including the phase difference light-shielding film 1801 or 1811 in mode 2 to mode 5. Even in this case, a focal position is determined according to the detected phase difference information, and the accuracy in the depth direction can be improved.

Note that, in the case of acquiring the phase difference information using driving in mode 1, in the pixel 51 not including the phase difference light-shielding film 1801 or 1811, the phase difference information can be acquired by adopting continuous light that is continuously emitted without interruption as the irradiation light emitted from the light source.

Twenty-first Embodiment

Next, a configuration example of a light-receiving element 1 capable of acquiring polarization degree information as auxiliary information other than distance measurement information, which is obtained from a distribution ration of signals of a first tap TA and a second tap TB, will be described.

Figure 91:
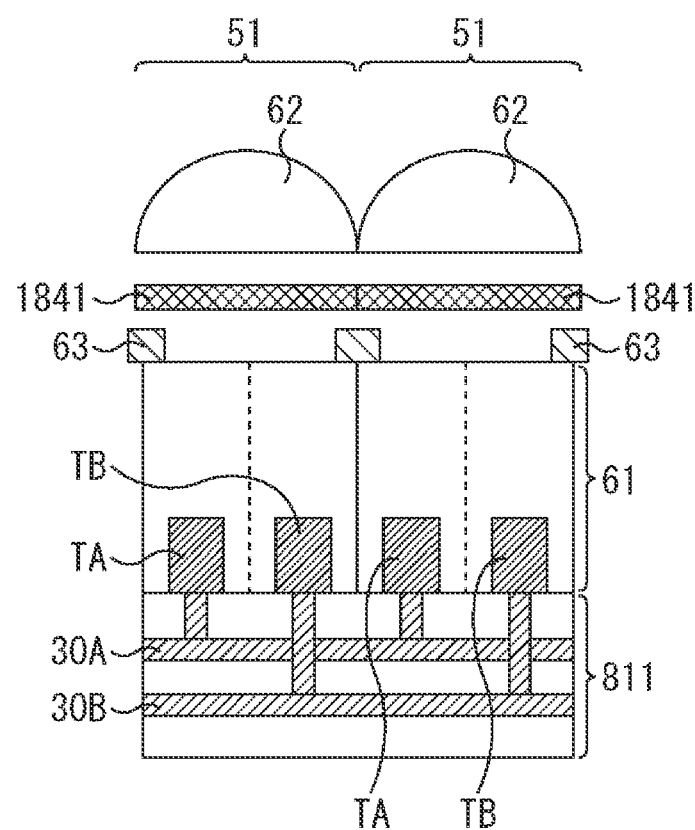
FIG. 91 is a cross-sectional view of pixels according to a twenty-first embodiment.

FIG. 91 illustrates a cross-sectional view of pixels according to a twenty-first embodiment.

In FIG. 91, a portion corresponding to the twentieth embodiment is denoted by the same reference numeral, and description thereof is omitted as appropriate.

In the twenty-first embodiment in FIG. 91, a polarizer filter 1841 is formed between an on-chip lens 62 and a substrate 61. A pixel 51 according to the twenty-first embodiment is configured similarly to that in the first embodiment illustrated in FIG. 2 or that in the fourteenth or fifteenth embodiment described in FIG. 36, for example, except that the polarizer filter 1841 is provided.

Figure 92A:
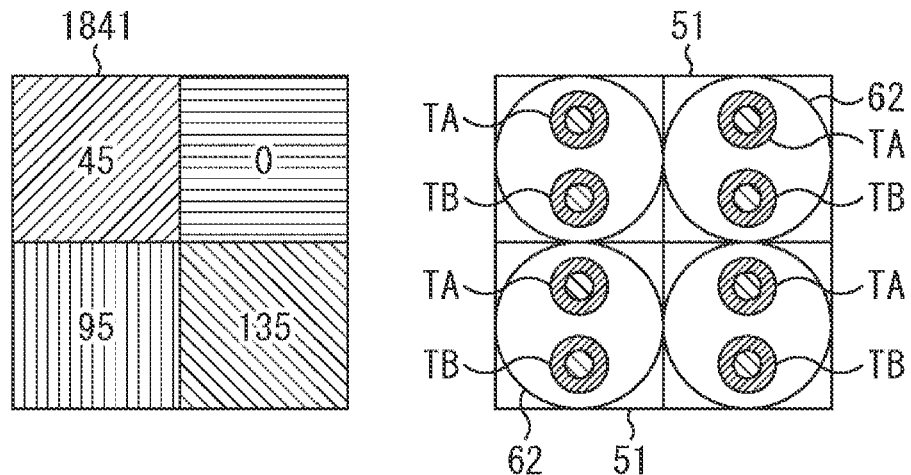
FIGS. 92A and 92B are plan views of the pixels according to the twenty-first embodiment.
Figure 92B:
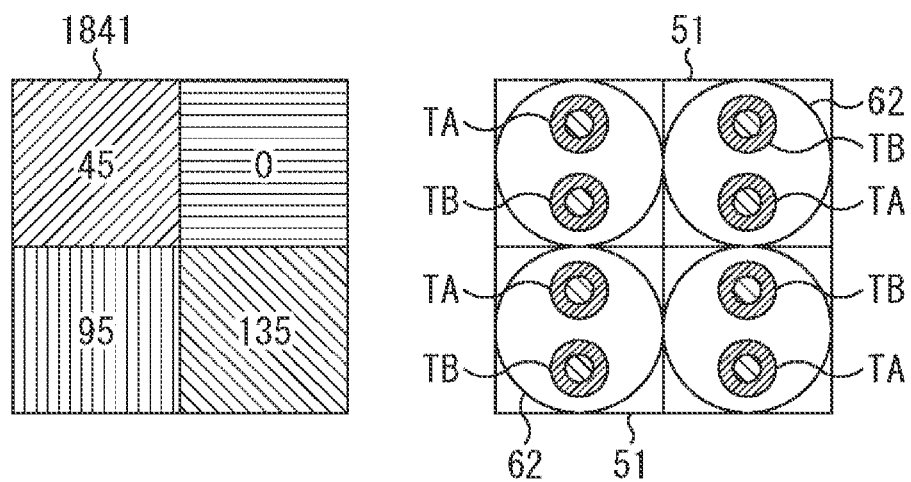

The polarizer filter 1841, the on-chip lens 62, and the first tap TA and the second tap TB are arranged in either FIG. 92A or 92B.

FIG. 92A is a plan view illustrating a first arrangement example of the polarizer filter 1841, the on-chip lens 62, and the first tap TA and the second tap TB according to the twenty-first embodiment.

As illustrated in FIG. 92A, the polarizer filter 1841 has a polarizing direction of any of 0 degrees, 45 degrees, 135 degrees, or 135 degrees, and four types of polarizer filters 1841 each having a polarizing direction different by 45 degrees are formed in a predetermined pixel 51 in a pixel array unit 20 on a 2×2 four-pixel basis.

The on-chip lens 62 is provided on a pixel basis, and the positional relationship between the first tap TA and the second tap TB is the same in all the pixels.

FIG. 92B is a plan view illustrating a second arrangement example of the polarizer filter 1841, the on-chip lens 62, and the first tap TA and the second tap TB according to the twenty-first embodiment.

As illustrated in FIG. 92B, the polarizer filter 1841 has a polarizing direction of any of 0 degrees, 45 degrees, 135 degrees, or 135 degrees, and four types of polarizer filters 1841 each having a polarizing direction different by 45 degrees are formed in a predetermined pixel 51 in a pixel array unit 20 on a 2×2 four-pixel basis.

The on-chip lens 62 is provided on a pixel basis, and the positional relationship between the first tap TA and the second tap TB is opposite between pixels adjacent to each other in a horizontal direction. In other words, pixel columns in which arrangement of the first tap TA and the second tap TB are opposite are alternately arranged in the horizontal direction.

As a method of driving the pixel 51 including the polarizer filter 1841, five types of driving methods of mode 1 to mode 5 described with reference to FIG. 88 in the twentieth embodiment are available.

In the twenty-first embodiment, some pixels 51 of a plurality of pixels 51 arrayed in the pixel array unit 20 include the polarizer filter 1841 as illustrated in FIG. 91 or 92.

The polarization degree information can be acquired by driving the pixel 51 including the polarizer filter 1841 in any of mode 1 to mode 5. The acquired polarization degree information enables acquisition of information regarding a surface state (unevenness) of an object surface as an object and a relative distance difference, calculation of a reflection direction, or acquisition of distance measurement information of a transparent object itself such as glass or an object beyond the transparent object.

Furthermore, by setting a plurality of types of frequencies of irradiation light emitted from a light source and making the polarizing direction different for each frequency, parallel ranging of multiple frequencies becomes possible. For example, by simultaneously emitting four types of irradiation light of 20 MHz, 40 MHz, 60 MHz, and 100 MHz, and setting the respective polarizing directions to 0 degrees, 45 degrees, 135 degrees, and 135 degrees according to the polarization directions of the polarizer filter 1841, reflected light of the four types of irradiation light is simultaneously received, and the distance measurement information can be acquired.

Note that all the pixels 51 of the pixel array unit 20 of the light-receiving element 1 may be the pixels 51 provided with the polarizer filter 1841.

Twenty-Second Embodiment

Next, a configuration example of a light-receiving element 1 capable of acquiring sensitivity information for each RGB wavelength as auxiliary information other than distance measurement information, which is obtained from a distribution ration of signals of a first tap TA and a second tap TB, will be described.

FIGS. 93A and 93B illustrate a cross-sectional view of pixels according to a twenty-second embodiment.

In the twenty-second embodiment, the light-receiving element 1 includes pixels 51 of at least one of FIGS. 93A and 93B as part of pixels 51 of a pixel array unit 20.

In FIG. 93A or 93B, a portion corresponding to the twentieth embodiment is denoted by the same reference numeral, and description thereof is omitted as appropriate.

In the pixel 51 illustrated in FIG. 93A, a color filter 1861 that transmits a wavelength of any of red (R), green (G), or blue (B) is formed between an on-chip lens 62 and a substrate 61. The pixel 51 illustrated in FIG. 93A is configured similarly to that in the first embodiment illustrated in FIG. 2 or that in the fourteenth or fifteenth embodiment described in FIG. 36, for example, except that the color filter 1861 is provided.

Meanwhile, in FIG. 93B, a pixel 51 in which an IR cut filter 1871 that cuts infrared light and a color filter 1872 are stacked, and a pixel 51 in which the IR cut filter 1871 and the color filter 1872 are not formed are arranged adjacent to each other between the on-chip lens 62 and the substrate 61. Then, a photodiode 1881, instead of a first tap TA and a second tap TB, is formed in the substrate 61 of the pixel 51 in which the IR cut filter 1871 and the color filter 1872 are formed. Moreover, a pixel separation portion 1882 for separating the adjacent pixel and the substrate 61 is formed in a pixel boundary portion of the pixel 51 in which the photodiode 1881 is formed. The pixel separation portion 1882 is formed by covering an outer periphery of a metal material such as tungsten (W), aluminum (Al), or copper (Cu) or a conductive material such as polysilicon with an insulating film. The pixel separation portion 1882 limits movement of electrons to/from the adjacent pixel. The pixel 51 including the photodiode 1881 is separately driven via control wiring from the pixel 51 including the first tap TA and the second tap TB. Other configurations are similar to those in the first embodiment illustrated in FIG. 2 or those in the fourteenth embodiment illustrated in FIG. 36, for example.

Figure 94A:
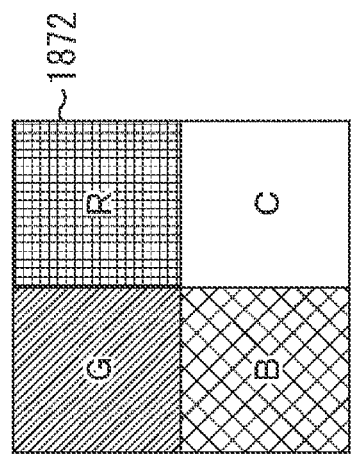
FIGS. 94A, 94B, 94C, and 94D are plan views of the pixels according to the twenty-second embodiment.

FIG. 94A is a plan view illustrating an arrangement of the color filter 1861 in a four-pixel region in which the pixels 51 illustrated in A in FIG. 93 are arrayed in 2×2.

The color filter 1861 has a configuration in which four types of filters including a filter that transmits G, a filter that transmits R, a filter that transmits B, and a filter that transmits IR are arrayed in 2×2 in the 2×2 four-pixel region.

Figure 94B:
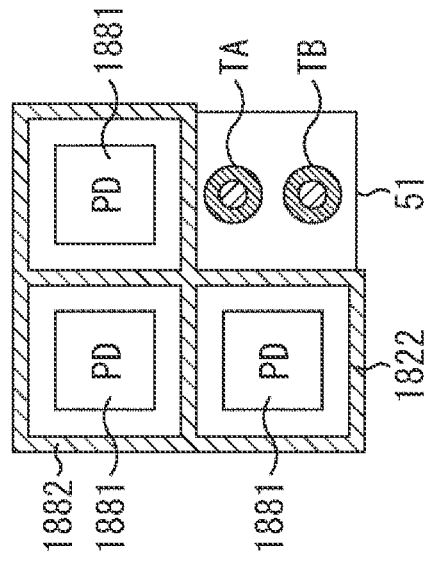

FIG. 94B is a plan view taken along the line A-A' in FIG. 93A regarding the four-pixel region in which the pixels 51 illustrated in FIG. 93A are arrayed in 2×2.

In the pixel 51 illustrated in FIG. 93A, the first tap TA and the second tap TB are arranged on a pixel basis.

Figure 94C:
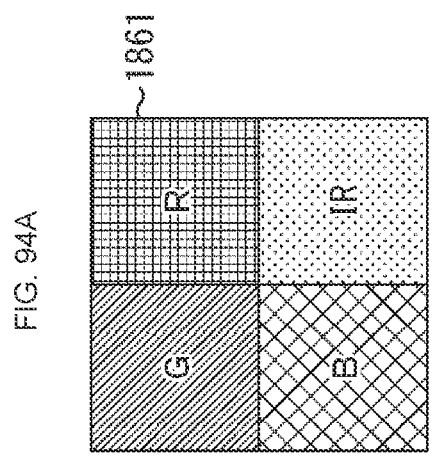

FIG. 94C is a plan view illustrating an arrangement of the color filter 1872 in a four-pixel region in which the pixels 51 illustrated in FIG. 93B are arrayed in 2×2.

The color filter 1872 has a configuration in which four types of filters including a filter that transmits G, a filter that transmits R, a filter that transmits B, and air (no filter) are arrayed in 2×2 in the 2×2 four-pixel region. Note that a clear filter that transmits all the wavelengths (R, G, B, and IR) may be arranged instead of the air.

In the color filter 187, the IR cut filter 1871 is arranged on an upper layer of the filter that transmits G, the filter that transmits R, and the filter that transmits B, as illustrated in FIG. 93B.

Figure 94D:
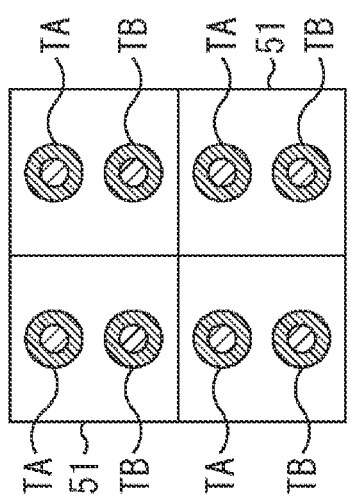

FIG. 94D is a plan view taken along the line B-B' in FIG. 93B regarding the four-pixel region in which the pixels 51 illustrated in FIG. 93B are arrayed in 2×2.

In the substrate 61 portion of the 2×2 four-pixel region, the photodiode 1881 is formed in the pixel 51 including the filter that transmits G, R, or B, and the first tap TA and the second tap TB are formed in the pixel 51 including the air (no filter). Furthermore, the pixel separation portion 1882 for separating the adjacent pixel and the substrate 61 is formed in the pixel boundary portion of the pixel 51 in which the photodiode 1881 is formed.

As described above, the pixel 51 illustrated in FIG. 93A includes a combination of the color filter 1861 illustrated in FIG. 94A and the photoelectric conversion region illustrated in FIG. 94B, and the pixel 51 illustrated in FIG. 93B includes a combination of the color filter 1872 illustrated in FIG. 94C and the photoelectric conversion region illustrated in FIG. 94D.

However, the combinations of the color filters in FIGS. 94A and 94C, and the photoelectric conversion region in FIGS. 94B and 94D may be interchanged. That is, as the configuration of the pixel 51 according to the twenty-second embodiment, a configuration of a combination of the color filter 1861 illustrated in FIG. 94A and the photoelectric conversion region illustrated in FIG. 94D, or a configuration of a combination of the color filter 1872 illustrated in FIG. 94C and the photoelectric conversion region illustrated in FIG. 94B can be adopted.

As a method of driving the pixel 51 including the first tap TA and the second tap TB, the five types of driving methods of mode 1 to mode 5 described with reference to FIG. 88 are available.

The drive of the pixel 51 including the photodiode 1881 is performed similarly to the drive of a pixel of a normal image sensor, separately from the drive of the pixel 51 including the first tap TA and the second tap TB.

According to the twenty-second embodiment, the light-receiving element 1 can include the pixel 51 provided with the color filter 1861 on the light incident surface side of the substrate 61 in which the first tap TA and the second tap TB are formed, as illustrated in FIG. 93A, as a part of the pixel array unit 20 in which a plurality of pixels 51 each including the first tap TA and the second tap TB is arrayed. As a result, a signal can be acquired for each of the wavelengths of G, R, B, and IR, and object discrimination ability can be improved.

Furthermore, according to the twenty-second embodiment, the light-receiving element 1 can include the pixel 51 including the photodiode 1881 in the substrate 61 instead of the first tap TA and the second tap TB, and provided with the color filter 1872 on the light incident surface side, as illustrated in FIG. 93B, as a part of the pixel array unit 20 in which a plurality of pixels 51 each including the first tap TA and the second tap TB is arrayed. As a result, a G signal, an R signal, and a B signal similar to an image sensor can be acquired, and the object discrimination ability can be improved.

Moreover, both the pixel 51 provided with the first tap TA, the second tap TB, and the color filter 1861 illustrated in FIG. 93A, and the pixel 51 provided with the photodiode 1881 and the color filter 1872 illustrated in FIG. 93B may be formed inside the pixel array unit 20.

Furthermore, all the pixels 51 in the pixel array unit 20 of the light-receiving element 1 may be configured by at least one type of a pixel by the combination of FIGS. 94A and 94B, a pixel by the combination of FIGS. 94C and 94D, a pixel by the combination of FIGS. 94A and 94D, or a pixel by the combination of FIGS. 94B and 94C.

<Configuration Example of Distance-Measuring Module>

Figure 95:
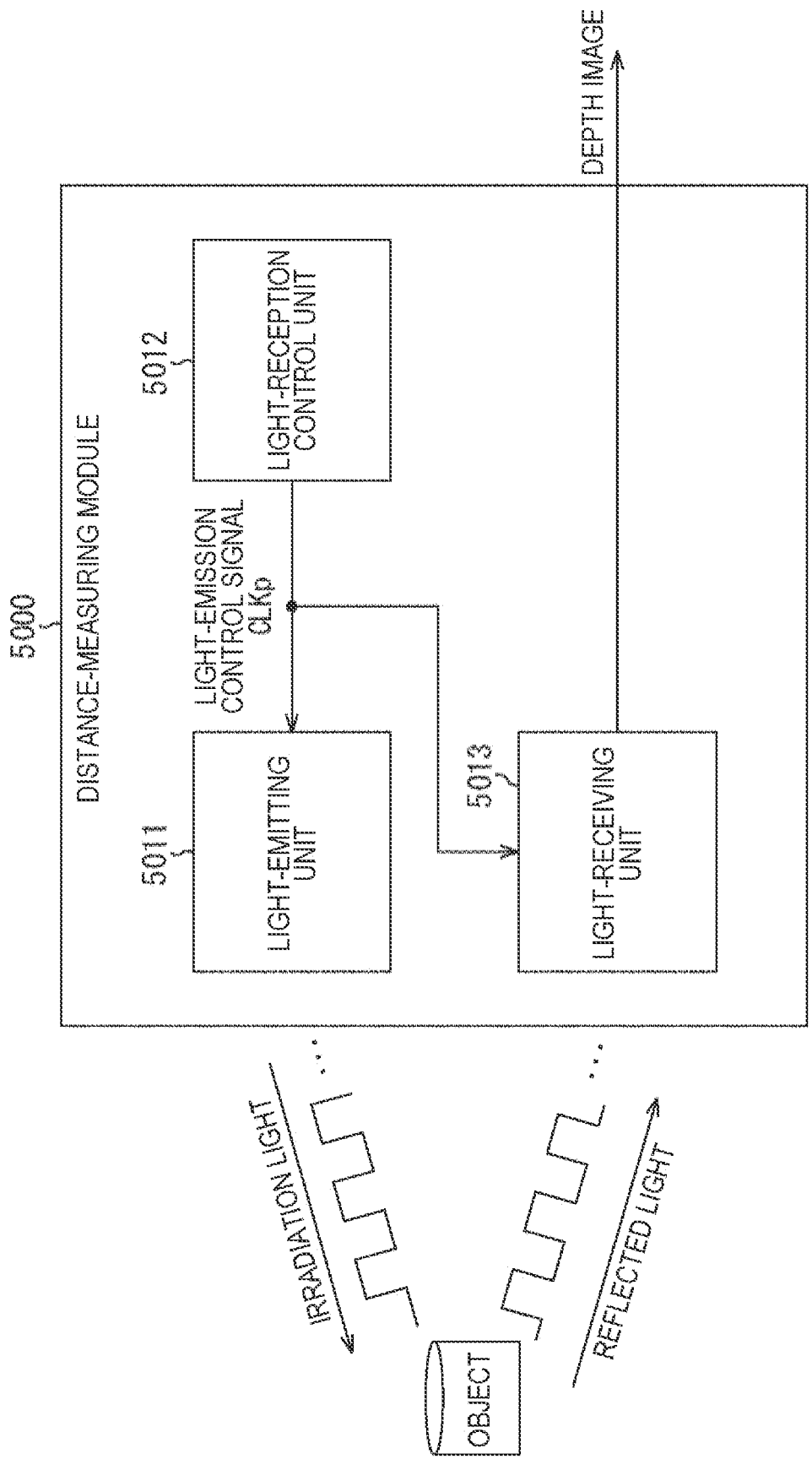
FIG. 95 is a block diagram illustrating a configuration example of a distance-measuring module.

FIG. 95 is a block diagram illustrating a configuration example of a distance-measuring module that outputs distance measurement information using the light-receiving element 1 in FIG. 1.

A distance-measuring module 5000 includes a light-emitting unit 5011, a light-emission control unit 5012, and a light-receiving unit 5013.

The light-emitting unit 5011 includes a light source that emits light of a predetermined wavelength, and emits irradiation light having brightness that periodically varies and irradiates an object with the irradiation light. For example, the light-emitting unit 5011 includes a light-emitting diode that emits infrared light having a wavelength of 780 nm to 1000 nm as the light source, and generates the irradiation light in synchronization with a light-emission control signal CLKp having a square wave supplied from the light-emission control unit 5012.

Note that the light-emission control signal CLKp is not limited to the square wave as long as the light-emission control signal is a periodic signal. For example, the light-emission control signal CLKp may be a sine wave.

The light-emission control unit 5012 supplies the light-emission control signal CLKp to the light-emitting unit 5011 and the light-receiving unit 5013 to control irradiation timing of the irradiation light. The frequency of the light-emission control signal CLKp is, for example, 20 megahertz (MHz). Note that the frequency of the light-emission control signal CLKp is not limited to 20 megahertz (MHz) and may be 5 megahertz (MHz) or the like.

The light-receiving unit 5013 receives reflected light reflected from the object, calculates distance information for each pixel according to a light-receiving result, and generates and outputs a depth image representing the distance to the object using a gradation value for each pixel.

The above-described light-receiving element 1 is used as the light-receiving unit 5013, and the light-receiving element 1 as the light-receiving unit 5013 calculates the distance information for each pixel from signal strength detected in a charge detection portion (N+ semiconductor region 71) of each of signal extraction portions 65-1 and 65-2 of each pixel 51 of a pixel array unit 20 on the basis of the light-emission control signal CLKp.

As described above, the light-receiving element 1 in FIG. 1 can be incorporated as the light-receiving unit 5013 of the distance-measuring module 5000 that obtains and outputs the distance information to the object by an indirect ToF method. As the light-receiving unit 5013 of the distance-measuring module 5000, the light-receiving element 1 in one of the above-described embodiments, specifically, a back-illuminated light-receiving element with improved pixel sensitivity is adopted, whereby the distance-measuring characteristics as the distance-measuring module 5000 can be improved.

<Application Example to Moving Bodies>

The technology according to the present disclosure (present technology) can be applied to various products. For example, the technology according to the present disclosure may be realized as a device mounted on any type of moving bodies including an automobile, an electric automobile, a hybrid electric automobile, a motorcycle, a bicycle, a personal mobility, an airplane, a drone, a ship, a robot, and the like.

Figure 96:
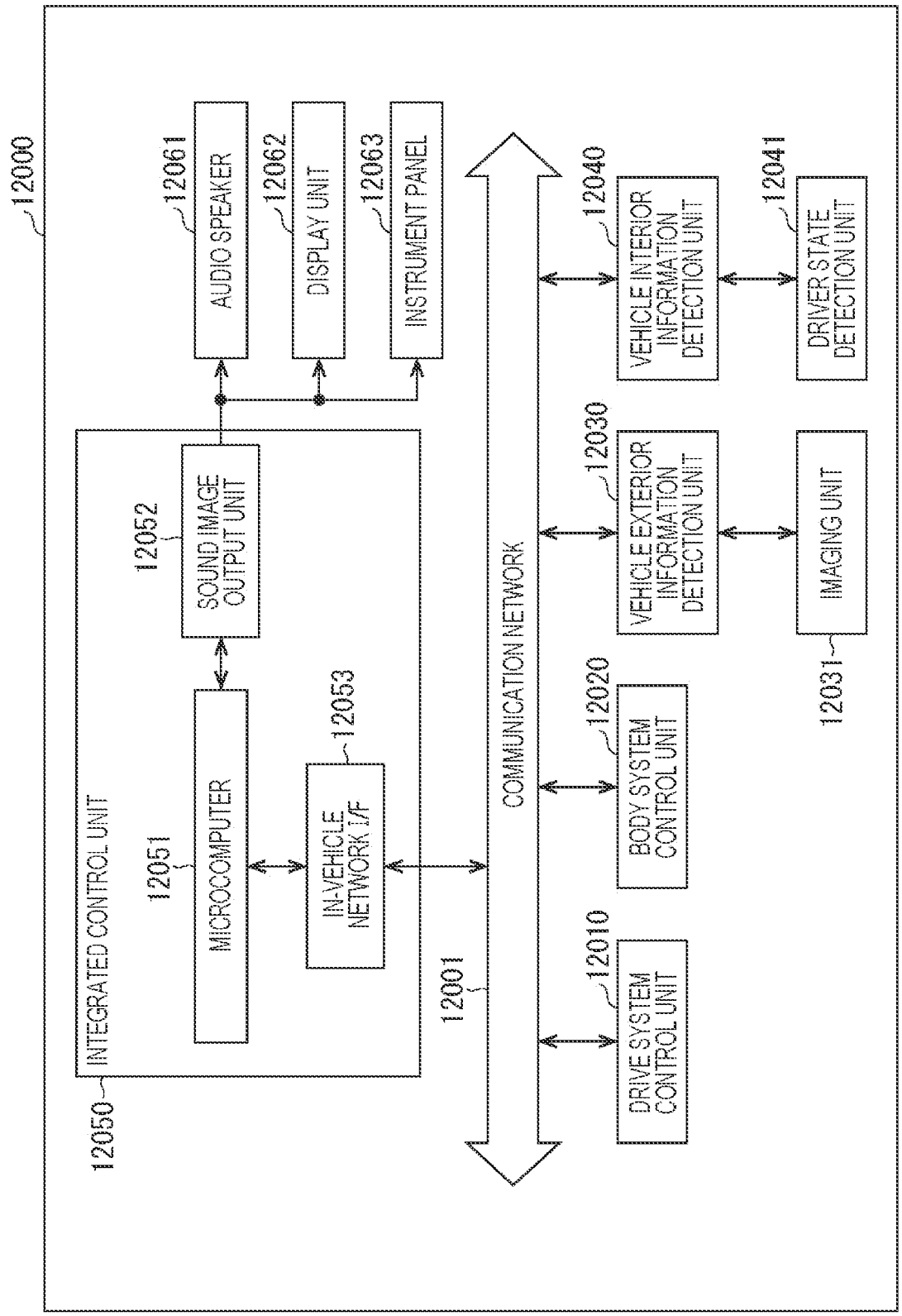
FIG. 96 is a block diagram illustrating an example of a schematic configuration of a vehicle control system.

FIG. 96 is a block diagram illustrating a schematic configuration example of a vehicle control system as an example of a moving body control system to which the technology according to the present disclosure is applicable.

A vehicle control system 12000 includes a plurality of electronic control units connected through a communication network 12001. In the example illustrated in FIG. 96, the vehicle control system 12000 includes a drive system control unit 12010, a body system control unit 12020, a vehicle exterior information detection unit 12030, a vehicle interior information detection unit 12040, and an integrated control unit 12050. Furthermore, as functional configurations of the integrated control unit 12050, a microcomputer 12051, a sound image output unit 12052, and an in-vehicle network interface (I/F) 12053 are illustrated.

The drive system control unit 12010 controls operations of devices regarding a drive system of a vehicle according to various programs. For example, the drive system control unit 12010 functions as a control device of a drive force generation device for generating drive force of a vehicle, such as an internal combustion engine or a drive motor, a drive force transmission mechanism for transmitting drive force to wheels, a steering mechanism that adjusts a steering angle of a vehicle, a braking device that generates braking force of a vehicle, and the like.

The body system control unit 12020 controls operations of various devices equipped in a vehicle body according to various programs. For example, the body system control unit 12020 functions as a control device of a keyless entry system, a smart key system, an automatic window device, and various lamps such as head lamps, back lamps, brake lamps, turn signals, and fog lamps. In this case, radio waves transmitted from a mobile device substituted for a key or signals of various switches can be input to the body system control unit 12020. The body system control unit 12020 receives an input of the radio waves or the signals, and controls a door lock device, the automatic window device, the lamps, and the like of the vehicle.

The vehicle exterior information detection unit 12030 detects information outside the vehicle that mounts the vehicle control system 12000. For example, an imaging unit 12031 is connected to the vehicle exterior information detection unit 12030. The vehicle exterior information detection unit 12030 causes the imaging unit 12031 to capture an image outside the vehicle, and receives the captured image. The vehicle exterior information detection unit 12030 may perform object detection processing or distance detection processing of persons, vehicles, obstacles, signs, letters on a road surface, or the like on the basis of the received image.

The imaging unit 12031 is an optical sensor that receives light and outputs an electrical signal according to an amount of the received light. The imaging unit 12031 can output the electrical signal as an image and can output the electrical signal as information of distance measurement. Furthermore, the light received by the imaging unit 12031 may be visible light or may be non-visible light such as infrared light.

The vehicle interior information detection unit 12040 detects information inside the vehicle. A driver state detection unit 12041 that detects a state of a driver is connected to the vehicle interior information detection unit 12040, for example. The driver state detection unit 12041 includes a camera that captures the driver, for example, and the vehicle interior information detection unit 12040 may calculate the degree of fatigue or the degree of concentration of the driver, or may determine whether or not the driver falls asleep on the basis of the detection information input from the driver state detection unit 12041.

The microcomputer 12051 calculates a control target value of the drive force generation device, the steering mechanism, or the braking device on the basis of the information outside and inside the vehicle acquired in the vehicle exterior information detection unit 12030 or the vehicle interior information detection unit 12040, and can output a control command to the drive system control unit 12010. For example, the microcomputer 12051 can perform cooperative control for the purpose of realization of an advanced driver assistance system (ADAS) function including collision avoidance or shock mitigation of the vehicle, following travel based on a vehicular gap, vehicle speed maintaining travel, collision warning of the vehicle, lane out warning of the vehicle, and the like.

Furthermore, the microcomputer 12051 controls the drive force generation device, the steering mechanism, the braking device, or the like on the basis of the information of a vicinity of the vehicle acquired in the vehicle exterior information detection unit 12030 or the vehicle interior information detection unit 12040 to perform cooperative control for the purpose of automatic drive of autonomous travel without depending on an operation of the driver or the like.

Furthermore, the microcomputer 12051 can output a control command to the body system control unit 12020 on the basis of the information outside the vehicle acquired in the vehicle exterior information detection unit 12030. For example, the microcomputer 12051 can perform cooperative control for the purpose of achievement of non-glare such as by controlling the head lamps according to the position of a leading vehicle or an oncoming vehicle detected in the vehicle exterior information detection unit 12030, and switching high beam light to low beam light.

The sound image output unit 12052 transmits an output signal of at least one of a sound or an image to an output device that can visually and aurally notify a passenger of the vehicle or an outside of the vehicle of information. In the example in FIG. 96, as the output device, an audio speaker 12061, a display unit 12062, and an instrument panel 12063 are exemplarily illustrated. The display unit 12062 may include, for example, at least one of an on-board display or a head-up display.

Figure 97:
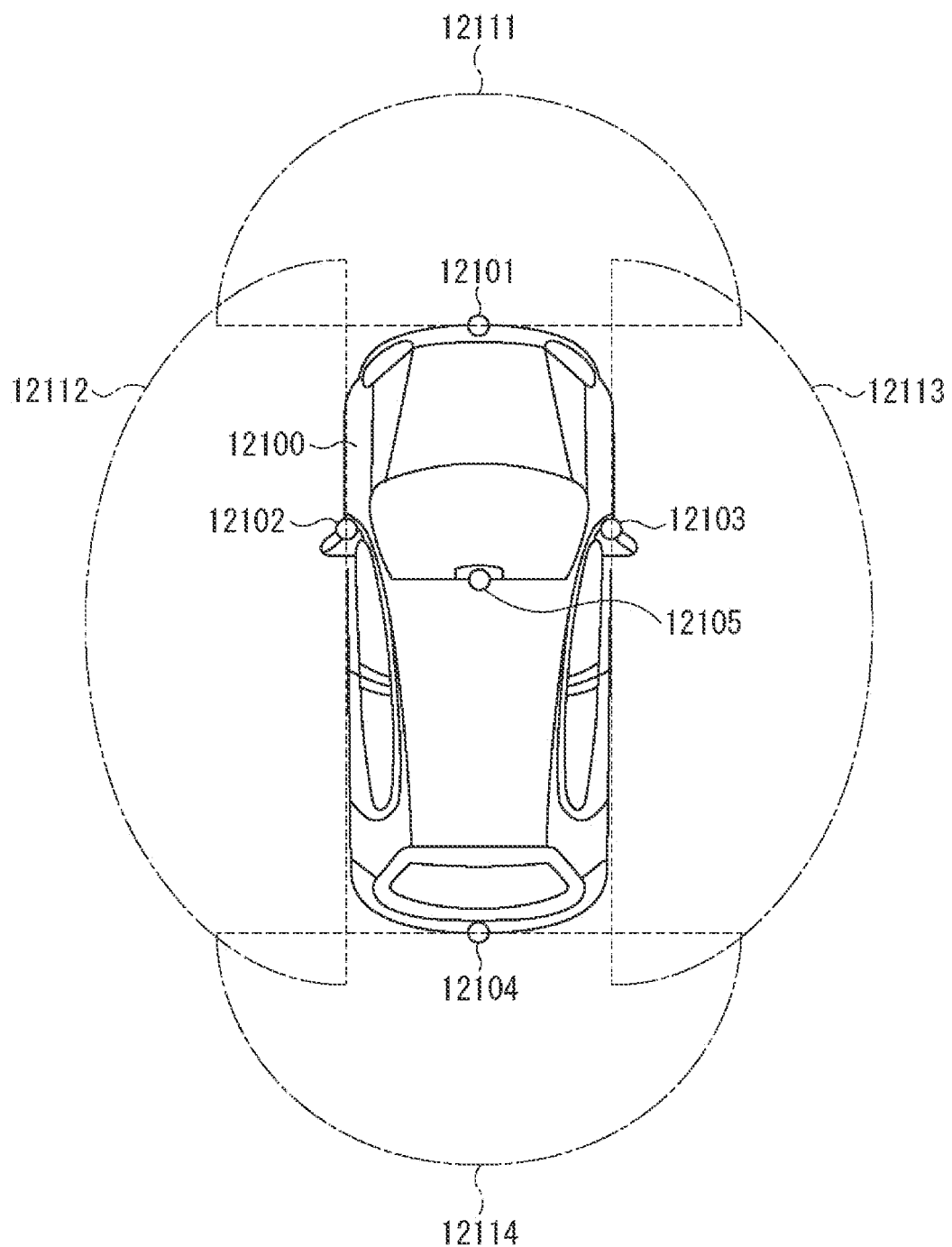
FIG. 97 is an explanatory view illustrating an example of installation positions of a vehicle exterior information detection unit and an imaging unit.

FIG. 97 is a view illustrating an example of an installation position of the imaging unit 12031.

In FIG. 97, a vehicle 12100 includes, as the imaging unit 12031, imaging units 12101, 12102, 12103, 12104, and 12105.

The imaging units 12101, 12102, 12103, 12104, and 12105 are provided at positions of a front nose, side mirrors, a rear bumper or a back door, an upper portion of a windshield, and the like in an interior of the vehicle 12100, for example. The imaging unit 12101 provided at the front nose and the imaging unit 12105 provided at an upper portion of the windshield in an interior of the vehicle mainly acquire images in front of the vehicle 12100. The imaging units 12102 and 12103 provided at the side mirrors mainly acquire images on sides of the vehicle 12100. The imaging unit 12104 provided at the rear bumper or the back door mainly acquires a rear image of the vehicle 12100. The front images acquired in the imaging units 12101 and 12105 are mainly used for detection of a leading vehicle, a pedestrian, an obstacle, a traffic light, a traffic sign, a lane, or the like.

Note that FIG. 97 illustrates an example of imaging ranges of the imaging units 12101 to 12104. An imaging range 12111 indicates the imaging range of the imaging unit 12101 provided at the front nose, imaging ranges 12112 and 12113 respectively indicate the imaging ranges of the imaging units 12102 and 12103 provided at the side mirrors, and an imaging range 12114 indicates the imaging range of the imaging unit 12104 provided at the rear bumper or the back door. For example, a bird's-eye view image of the vehicle 12100 as viewed from above can be obtained by superimposing image data captured by the imaging units 12101 to 12104.

At least one of the imaging units 12101 to 12104 may have a function to acquire distance information. For example, at least one of the imaging units 12101 to 12104 may be a stereo camera including a plurality of imaging elements or may be an image sensor having pixels for phase difference detection.

For example, the microcomputer 12051 obtains distances to each of the three-dimensional objects in the imaging ranges 12111 to 12114 and temporal change of the distances (relative speeds to the vehicle 12100) on the basis of the distance information obtained from the imaging units 12101 to 12104, thereby to extract particularly a three-dimensional object closest to the vehicle 12100 on a traveling road and traveling at a predetermined speed (for example, 0 km/h or more) in substantially the same direction as the vehicle 12100 as a leading vehicle. Moreover, the microcomputer 12051 can set an inter-vehicle distance to be secured from the leading vehicle in advance and perform automatic braking control (including following stop control) and automatic acceleration control (including following start control), and the like. In this way, the cooperative control for the purpose of automatic driving of autonomous travel without depending on an operation of the driver, and the like can be performed.

For example, the microcomputer 12051 classifies three-dimensional object data regarding three-dimensional objects into two-wheeled vehicles, ordinary cars, large vehicles, pedestrians, and other three-dimensional objects such as electric poles to be extracted, on the basis of the distance information obtained from the imaging units 12101 to 12104, and can use the data for automatic avoidance of obstacles. For example, the microcomputer 12051 discriminates obstacles around the vehicle 12100 into obstacles visually recognizable by the driver of the vehicle 12100 and obstacles visually unrecognizable by the driver. The microcomputer 12051 then determines a collision risk indicating a risk of collision with each of the obstacles, and can perform drive assist for collision avoidance by outputting warning to the driver through the audio speaker 12061 or the display unit 12062, and performing forced deceleration or avoidance steering through the drive system control unit 12010, in a case where the collision risk is a set value or more and there is a collision possibility.

At least one of the imaging units 12101 to 12104 may be an infrared camera that detects infrared light. For example, the microcomputer 12051 determines whether or not a pedestrian exists in the captured images of the imaging units 12101 to 12104, thereby to recognize the pedestrian. Such recognition of a pedestrian is performed by a process of extracting characteristic points in the captured images of the imaging units 12101 to 12104, as the infrared camera, for example, and by a process of performing pattern matching processing for the series of characteristic points indicating a contour of an object and determining whether or not the object is a pedestrian. When the microcomputer 12051 determines that a pedestrian exists in the captured images of the imaging units 12101 to 12104 and recognizes the pedestrian, the sound image output unit 12052 causes the display unit 12062 to superimpose and display a square contour line for emphasis on the recognized pedestrian. Furthermore, the sound image output unit 12052 may cause the display unit 12062 to display an icon or the like representing the pedestrian at a desired position.

An example of the vehicle control system to which the technology according to the present disclosure is applicable has been described. The technology according to the present disclosure is applicable to the imaging unit 12031 in the above-described configurations. Specifically, for example, by applying the light-receiving element 1 illustrated in FIG. 1 to the imaging unit 12031, characteristics such as sensitivity can be improved.

Embodiments of the present technology are not limited to the above-described embodiments, and various modifications can be made without departing from the gist of the present technology.

For example, the above-described two or more embodiments can be combined as appropriate. That is, the following specification can be appropriately selected according to which characteristic such as the sensitivity of the pixel is prioritized: the number and location of the signal extraction portions provided in the pixel, the shape of the signal extraction portion, whether or not to adopt a shared structure, presence or absence of the on-chip lens, presence or absence of the inter-pixel light-shielding portion, presence or absence of the separation region, the thickness of the on-chip lens and the substrate, the type of the substrate and film design, presence or absence of a bias to the light incident surface, or presence or absence of the reflective member.

Furthermore, in the above-described embodiments, the examples of using electrons as the signal carrier have been described. However, holes generated by photoelectric conversion may be used as the signal carrier. In such a case, the charge detection portion for detecting the signal carrier is configured by the P+ semiconductor region and the voltage application portion for generating the electric field in the substrate is configured by the N+ semiconductor region, and the holes are detected as the signal carrier in the charge detection portion provided in the signal extraction portion.

According to the present technology, the distance-measuring characteristics can be improved by configuring the CAPD sensor as the back-illuminated light-receiving element.

Note that, the above embodiments have been described using the drive method of directly applying the voltage to the P+ semiconductor region 73 formed in the substrate 61 to move the charges photoelectrically converted by the generated electric field. However, the present technology is not limited to the drive method and can be applied to other drive methods. For example, it may be a drive method of using first and second transfer transistors and first and second floating diffusion regions formed in the substrate 61, distributing and accumulating the charges photoelectrically converted by applying a predetermined voltage to each of the gates of the first and second transfer transistors to the first floating diffusion region via the first transfer transistor or the second floating diffusion region via the second transfer transistor, respectively. In that case, the first and second transfer transistors formed in the substrate 61 function as the first and second voltage application portions, respectively, to which a predetermined voltage is applied and the first and second floating diffusion regions formed in the substrate 61 function as the first and second charge detection portions, respectively, that detect the charges generated by photoelectric conversion.

Furthermore, in other words, in the drive method of directly applying the voltage to the P+ semiconductor regions 73 formed in the substrate 61 to move the charges photoelectrically converted by the generated electric field, the two P+ semiconductor regions 73 functioning as the first and second voltage application portions are control nodes to which a predetermined voltage is applied, and the two N+ semiconductor regions 71 functioning as the first and second charge detection portions are detection nodes for detecting the charges. In the drive method of applying a predetermined voltage to gates of the first and second transfer transistors formed in the substrate 61 and distributing and accumulating the photoelectrically converted charges to the first floating diffusion region or the second floating diffusion region, the gates of the first and second transfer transistors are control nodes to which a predetermined voltage is applied, and the first and second diffusion regions formed in the substrate 61 are detection nodes for detecting the charges.

Furthermore, the effects described in the present specification are merely examples and are not limited, and other effects may be exhibited.

Note that the present technology can also have the following configurations.

(1)
A light-receiving element including:
an on-chip lens;
a wiring layer; and
a semiconductor layer arranged between the on-chip lens and the wiring layer, in which
the semiconductor layer includes
a first voltage application portion to which a first voltage is applied,
a second voltage application portion to which a second voltage different from the first voltage is applied,
a first charge detection portion arranged near the first voltage application portion, and
a second charge detection portion arranged near the second voltage application portion, and
each of the first voltage application portion and the second voltage application portion is covered with an insulating film in the semiconductor layer.

(2)
The light-receiving element according to (1), in which
the wiring layer includes at least one layer provided with a reflective member, and
the reflective member is provided to overlap with the first charge detection portion or the second charge detection portion in plan view.

(3)
The light-receiving element according to (1) or (2), in which
the wiring layer includes at least one layer provided with a light-shielding member, and
the light-shielding member is provided to overlap with the first charge detection portion or the second charge detection portion in plan view.

(4)
The light-receiving element according to any one of (1) to (3), in which
the first and second voltage application portions and the first and second charge detection portions are arranged on a same plane side of the semiconductor layer.

(5)
The light-receiving element according to any one of (1) to (4), in which
the first and second voltage application portions are configured to penetrate the semiconductor layer.

(6)
The light-receiving element according to any one of (1) to (5), in which
the first charge detection portion is arranged around the first voltage application portion, and
the second charge detection portion is arranged around the second voltage application portion.

(7)
The light-receiving element according to any one of (1) to (3), in which
the first and second voltage application portions are arranged on a plane side opposite to a surface of the semiconductor layer where the first and second charge detection portions are formed.

(8)

The light-receiving element according to (7), in which
the first voltage application portion is arranged at a position where a center position of the first voltage application portion overlaps with the first charge detection portion in plan view, and
the second voltage application portion is arranged at a position where a center position of the second voltage application portion overlaps with the second charge detection portion in plan view.

(9)

The light-receiving element according to any one of (1) to (6), in which
each depth of the first voltage application portion and the second voltage application portion is configured to be deeper than the first and second charge detection portions.

(10)

The light-receiving element according to any one of (1) to (9), in which
the first and second voltage application portions include protruding portions formed on an upper surface above an interface of the semiconductor layer.

(11)

The light-receiving element according to any one of (1) to (10), further including:
a hole concentration strengthening layer on an outer periphery of the insulating film of each of the first voltage application portion and the second voltage application portion.

(12)

The light-receiving element according to any one of (1) to (11), in which
planar shapes of the first voltage application portion, the second voltage application portion, the first charge detection portion, and the second charge detection portion are any of circular, rectangular, or triangular, and are point-symmetrically arranged with respect to a pixel center.

(13)

The light-receiving element according to any one of (1) to (11), in which
planar shapes of the first voltage application portion, the second voltage application portion, the first charge detection portion, and the second charge detection portion are either L-shaped or comb-shaped, and are arranged to face each other.

(14)

The light-receiving element according to any one of (1) to (13), in which
a set of the first voltage application portion and the first charge detection portion having a rectangular planar shape, and a set of the second voltage application portion and the second charge detection portion having a rectangular planar shape are alternately arranged.

(15)

The light-receiving element according to any one of (1) to (12), in which
a set of the first voltage application portion and the first charge detection portion having a rectangular planar shape is arranged to face each other in a diagonal direction of a pixel, and a set of the second voltage application portion and the second charge detection portion having a rectangular planar shape is arranged to face each other in a diagonal direction different from the first voltage application portion and the first charge detection portion.

(16)

The light-receiving element according to any one of (1) to (12), in which
the first voltage application portion and the first charge detection portion having a triangular planar shape are arranged to face each other in a first direction of a pixel, and the second voltage application portion and the second charge detection portion having a triangular planar shape are arranged to face each other in a second direction orthogonal to the first direction.

(17)

The light-receiving element according to any one of (1) to (16), in which
the first voltage application portion and the second voltage application portion are formed using silicon, polysilicon, or a metal material.

(18)

The light-receiving element according to any one of (1) to (17), in which
the first and second voltage application portions are respectively configured by first and second P-type semiconductor regions formed in the semiconductor layer.

(19)

The light-receiving element according to any one of (1) to (17), in which
the first and second voltage application portions are respectively configured by first and second transfer transistors formed in the semiconductor layer.

(20)

A distance-measuring module including:
a light-receiving element including
an on-chip lens,
a wiring layer, and
a semiconductor layer arranged between the on-chip lens and the wiring layer,
the semiconductor layer including
a first voltage application portion to which a first voltage is applied,
a second voltage application portion to which a second voltage different from the first voltage is applied,
a first charge detection portion arranged around the first voltage application portion, and
a second charge detection portion arranged around the second voltage application portion, and
each of the first voltage application portion and the second voltage application portion being covered with an insulating film in the semiconductor layer;
a light source configured to radiate irradiation light in which brightness periodically varies; and
a light-emission control unit configured to control irradiation timing of the irradiation light.

REFERENCE SIGNS LIST

1 Light-receiving element
20 Pixel array unit
21 Tap drive unit
22 Vertical drive unit
29 Vertical signal line
30 Voltage supply line
51 Pixel
51X Light-shielding pixel
61 Substrate
62 On-chip lens
63 Inter-pixel light-shielding film
64 Oxide film 65, 65-1, 65-2 Signal extraction portion
66 Fixed charge film
71-1, 71-2, 71 N+ semiconductor region
73-1, 73-2, 73 P+ semiconductor region
441-1, 441-2, 441 Separation region
471-1, 471-2, 471 Separation region
631 Reflective member
721 Transfer transistor
722 FD
723 Reset transistor
724 Amplification transistor
725 Selection transistor
727 Additional capacitance
728 Switching transistor
741 Voltage supply line
811 Multilayer wiring layer
812 Interlayer insulating film
813 Power supply line
814 Voltage application wiring
815 Reflective member
816 Voltage application wiring
817 Control line
M1 to M5 Metal film
1021 P-well region
1022 P-type semiconductor region
1031 P-well region
1032, 1033 Oxide film
1051 Effective pixel region
1052 Ineffective pixel region
1061 N-type diffusion layer
1071 Pixel separation portion
1101 Charge discharge region
1102 OPB region
1121 Aperture pixel region
1122 Light-shielding pixel region
1123 N-type region
1131 N-type diffusion layer
1201, 1211 Substrate
1231 Pixel array region
1232 Area control circuit
1251 MIX bonded portion
1252 DET bonded portion
1253 Voltage supply line
1261 Peripheral portion
1311 Electrode portion
1311A Embedded portion
1311B Protruding portion
1312 P+ semiconductor region
1313 Insulating film
1314 Hole concentration strengthening layer
1401, and 1401A to 1401D Power supply line
1411, and 1411A to 1411E VSS wire
1421 Gap
1511 Vertical wire
1512 Horizontal wire
1513 Wire
1521 First wiring layer
1522 Second wiring layer
1523 Third wiring layer
1542, 1543 Outer peripheral portion
1801
1811 Phase difference light-shielding film
1821 On-chip lens
1841 Polarizer filter
1861 Color filter
1871 IR cut filter
1872 Color filter
1881 Photodiode
1882 Pixel separation portion
5000 Distance-measuring module
5011 Light-emitting unit
5012 Light-emission control unit
5013 Light-receiving unit

The invention claimed is:

1. A light-receiving element, comprising:
an on-chip lens;
a wiring layer; and
a semiconductor layer between the on-chip lens and the wiring layer, wherein
the semiconductor layer includes:
a first voltage application portion configured to receive a first voltage,
a second voltage application portion configured to receive a second voltage different from the first voltage,
a first charge detection portion around the first voltage application portion, and
a second charge detection portion around the second voltage application portion,
an insulating film that covers each of the first voltage application portion and the second voltage application portion, and
a hole concentration strengthening layer on an outer periphery of the insulating film.

2. The light-receiving element according to claim 1, wherein
the wiring layer includes at least one layer with a reflective member, and
the reflective member overlaps with one of the first charge detection portion or the second charge detection portion in plan view.

3. The light-receiving element according to claim 1, wherein
the wiring layer includes at least one layer with a light-shielding member, and
the light-shielding member overlaps with one of the first charge detection portion or the second charge detection portion in plan view.

4. The light-receiving element according to claim 1, wherein
the first voltage application portion, the second voltage application portion, the first charge detection portion, and the second charge detection portion are on a same plane side of the semiconductor layer.

5. The light-receiving element according to claim 1, wherein
the first voltage application portion and the second voltage application portion are configured to penetrate the semiconductor layer.

6. The light-receiving element according to claim 1, wherein
the first voltage application portion and the second voltage application portion are on a plane side opposite to a surface of the semiconductor layer having the first charge detection portion and the second charge detection portion.

7. The light-receiving element according to claim 6, wherein
the first voltage application portion is at a position where a center position of the first voltage application portion overlaps with the first charge detection portion in plan view, and the second voltage application portion is at a position where a center position of the second voltage application portion overlaps with the second charge detection portion in plan view.

8. The light-receiving element according to claim 1, wherein
each of the first voltage application portion and the second voltage application portion has a depth deeper than the first charge detection portion and the second charge detection portion.

9. The light-receiving element according to claim 1, wherein
the first voltage application portion and the second voltage application portion include protruding portions formed on an upper surface above an interface of the semiconductor layer.

10. The light-receiving element according to claim 1, wherein
planar shapes of the first voltage application portion, the second voltage application portion, the first charge detection portion, and the second charge detection portion are one of circular, rectangular, or triangular,
the first voltage application portion and the second voltage application portion are point-symmetrical with respect to a pixel center, and
the first charge detection portion and the second charge detection portion are point-symmetrical with respect to the pixel center.

11. The light-receiving element according to claim 1, wherein
planar shapes of the first voltage application portion, the second voltage application portion, the first charge detection portion, and the second charge detection portion are either L-shaped or comb-shaped,
the first voltage application portion and the second voltage application portion faces each other,
the first charge detection portion and the second charge detection portion faces each other.

12. The light-receiving element according to claim 1, wherein
a set of the first voltage application portion and the first charge detection portion having a rectangular planar shape, and a set of the second voltage application portion and the second charge detection portion having a rectangular planar shape are alternately arranged.

13. The light-receiving element according to claim 1, wherein
the first voltage application portion having a rectangular planar shape and the first charge detection portion having a rectangular planar shape face each other in a diagonal direction of a pixel, and
the second voltage application portion having a rectangular planar shape and the second charge detection portion having a rectangular planar shape face each other in a diagonal direction different from the diagonal direction of the first voltage application portion and the first charge detection portion.

14. The light-receiving element according to claim 1, wherein
the first voltage application portion having a triangular planar shape and the first charge detection portion having a triangular planar shape face each other in a first direction of a pixel, and
the second voltage application portion having a triangular planar shape and the second charge detection portion having a triangular planar shape face each other in a second direction orthogonal to the first direction.

15. The light-receiving element according to claim 1, wherein
the first voltage application portion and the second voltage application portion comprise one of silicon, polysilicon, or a metal material.

16. The light-receiving element according to claim 1, wherein
the first voltage application portion and the second voltage application portion are respectively configured by a first P-type semiconductor region and a second P-type semiconductor region in the semiconductor layer.

17. The light-receiving element according to claim 1, wherein
the first voltage application portion and the second voltage application portion are respectively configured by first transfer transistor and second transfer transistor in the semiconductor layer.

18. A distance-measuring module, comprising:
a light-receiving element including:
an on-chip lens;
a wiring layer; and
a semiconductor layer between the on-chip lens and the wiring layer, the semiconductor layer including
a first voltage application portion configured to receive a first voltage,
a second voltage application portion configured to receive a second voltage different from the first voltage,
a first charge detection portion around the first voltage application portion, and
a second charge detection portion around the second voltage application portion,
an insulating film that covers each of the first voltage application portion and the second voltage application portion, and
a hole concentration strengthening layer on an outer periphery of the insulating film;
a light source configured to radiate irradiation light in which brightness periodically varies; and
a light-emission control unit configured to control irradiation timing of the irradiation light.

* * * * *